US012633338B2

(12) United States Patent
Lin et al.

(10) Patent No.: US 12,633,338 B2
(45) Date of Patent: May 19, 2026

(54) FIELD PROGRAMMABLE MULTICHIP PACKAGE BASED ON FIELD-PROGRAMMABLE-GATE-ARRAY (FPGA) INTEGRATED-CIRCUIT (IC) CHIP

(71) Applicant: iCometrue Company Ltd., Zhubei (TW)

(72) Inventors: Mou-Shiung Lin, Hsinchu (TW); Jin-Yuan Lee, HsinChu (TW)

(73) Assignee: iCometrue Company Ltd., Hsinchu County (TW)

( * ) Notice: Subject to any disclaimer, the term of this patent is extended or adjusted under 35 U.S.C. 154(b) by 451 days.

(21) Appl. No.: 17/952,249

(22) Filed: Sep. 24, 2022

(65) Prior Publication Data

US 2023/0187365 A1 Jun. 15, 2023

Related U.S. Application Data

(60) Provisional application No. 63/279,672, filed on Nov. 15, 2021, provisional application No. 63/248,386, filed on Sep. 24, 2021.

(51) Int. Cl.
H01L 23/48 (2006.01)
G11C 11/418 (2006.01)
(Continued)

(52) U.S. Cl.
CPC .......... G11C 11/418 (2013.01); G11C 11/419 (2013.01); H03K 3/037 (2013.01);
(Continued)

(58) Field of Classification Search
CPC .......................... H01L 23/481; H01L 23/5384
See application file for complete search history.

(56) References Cited

U.S. PATENT DOCUMENTS 4,870,302 A 9/1989 Freeman
5,265,045 A * 11/1993 Nishio ..................... G11C 8/16
365/189.04
(Continued)

FOREIGN PATENT DOCUMENTS

CN 103681367 3/2014
CN 104078453 10/2014
(Continued)

*Primary Examiner* — Thao P Le
(74) *Attorney, Agent, or Firm* — Mack Teng

(57) ABSTRACT

A semiconductor IC chip comprising: a silicon substrate; a first transistor at a top surface of the silicon substrate; a first through silicon via (TSV) vertically in the silicon substrate; a second through silicon via (TSV) vertically in the silicon substrate; a first interconnection scheme on the top surface of the silicon substrate, wherein the first interconnection scheme comprises an insulating dielectric layer, a metal via in the insulating dielectric layer, a metal pad on a bottom surface of the insulating dielectric layer and a bottom surface of the metal via and coupling to the first TSV, and a first metal interconnect coupling the second TSV to the first transistor; and a second interconnection scheme on a bottom surface of the silicon substrate, wherein the second interconnection scheme comprises a second metal interconnect coupling the first TSV to the second TSV; and a first metal contact at a top of the semiconductor IC chip and on a top surface of the first interconnection scheme, wherein the first metal contact couples to the first transistor through, in sequence, the metal via, metal pad, first TSV, second metal interconnect, second TSV and first metal interconnect, wherein the first metal contact is configured for coupling to a voltage of power supply.

32 Claims, 52 Drawing Sheets

(51) Int. Cl.

| | |
|---|---|
| *G11C 11/419* | (2006.01) |
| *H03K 3/037* | (2006.01) |
| *H03K 17/687* | (2006.01) |
| *H10B 80/00* | (2023.01) |
| *H10W 20/00* | (2026.01) |
| *H10W 20/20* | (2026.01) |
| *H10W 70/60* | (2026.01) |
| *H10W 70/63* | (2026.01) |
| *H10W 90/00* | (2026.01) |
| *H10W 90/20* | (2026.01) |

(52) U.S. Cl.
CPC ..... *H03K 17/6872* (2013.01); *H03K 17/6874* (2013.01); *H10B 80/00* (2023.02); *H10W 20/023* (2026.01); *H10W 20/20* (2026.01); *H10W 70/611* (2026.01); *H10W 70/635* (2026.01); *H10W 90/00* (2026.01); *H10W 90/297* (2026.01)

(56) References Cited

U.S. PATENT DOCUMENTS

| | | | |
|---|---|---|---|
| 5,272,368 | A | 12/1993 | Turner et al. |
| 5,587,603 | A | 12/1996 | Kowshik |
| 5,592,102 | A | 1/1997 | Lane et al. |
| 5,689,195 | A | 11/1997 | Cliff et al. |
| 5,796,662 | A | 8/1998 | Kalter et al. |
| 6,020,633 | A | 2/2000 | Erikson |
| 6,034,542 | A | 3/2000 | Ridgeway |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,952,114 | B2 | 10/2005 | Turner |
| 6,998,872 | B1 | 2/2006 | Chirania et al. |
| 7,030,652 | B1 | 4/2006 | Lewis et al. |
| 7,053,652 | B1 * | 5/2006 | de Jong ................ G11C 11/412 |
| | | | 327/217 |
| 7,061,271 | B1 | 6/2006 | Young et al. |
| 7,126,214 | B2 | 10/2006 | Huppenthal |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,511,299 | B1 | 3/2009 | Alexander et al. |
| 7,550,994 | B1 | 6/2009 | Camarota |
| 7,579,681 | B2 | 8/2009 | Chia et al. |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 7,977,783 | B1 | 7/2011 | Park et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,254 | B2 | 3/2016 | Yu et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,331,062 | B1 | 5/2016 | Lane et al. |
| 9,343,442 | B2 | 5/2016 | Chen et al. |
| 9,349,703 | B2 | 5/2016 | Chiu et al. |
| 9,349,713 | B2 | 5/2016 | Kim et al. |
| 9,362,187 | B2 | 6/2016 | Ossimitz |
| 9,368,458 | B2 | 6/2016 | Wu et al. |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Ooi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 | 2/2017 | Rahman |
| 9,593,009 | B2 | 3/2017 | Fuergut et al. |
| 9,601,471 | B2 | 3/2017 | Zhai et al. |
| 9,607,967 | B1 | 3/2017 | Shih |
| 9,612,615 | B2 | 4/2017 | Lin et al. |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,722,584 | B1 | 8/2017 | Chang et al. |
| 9,735,113 | B2 | 8/2017 | Chi et al. |
| 9,763,329 | B1 | 9/2017 | Mason |
| 9,768,145 | B2 | 9/2017 | Yu et al. |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |
| 9,859,896 | B1 | 1/2018 | Gaide et al. |
| 9,881,850 | B2 | 1/2018 | Yu et al. |
| 9,887,206 | B2 | 2/2018 | Su et al. |
| 9,893,732 | B1 | 2/2018 | Lewis |
| 9,899,248 | B2 | 2/2018 | Yu et al. |
| 9,899,355 | B2 | 2/2018 | Yuan et al. |
| 9,935,113 | B2 | 4/2018 | Wu et al. |
| 9,966,325 | B2 | 5/2018 | Beyne |
| 9,985,006 | B2 | 5/2018 | Jeng et al. |
| 9,997,464 | B2 | 6/2018 | Hsieh et al. |
| 10,015,916 | B1 | 7/2018 | Karp |
| 10,026,681 | B2 | 7/2018 | Ko et al. |
| 10,033,383 | B1 | 7/2018 | Richter et al. |
| 10,037,963 | B2 | 7/2018 | Chen et al. |

(56)                    References Cited

U.S. PATENT DOCUMENTS

| | | |
|---|---|---|
| 10,038,647 B1 | 7/2018 | Lesea |
| 10,043,768 B2 | 8/2018 | Meyer et al. |
| 10,056,351 B2 | 8/2018 | Yu et al. |
| 10,056,907 B1 | 8/2018 | Asnaashari |
| 10,062,648 B2 | 8/2018 | Hsieh et al. |
| 10,062,651 B2 | 8/2018 | Liang et al. |
| 10,079,243 B2 | 9/2018 | Ramkumar |
| 10,109,559 B2 | 10/2018 | Lin et al. |
| 10,109,588 B2 | 10/2018 | Jeong et al. |
| 10,109,617 B2 | 10/2018 | Lee et al. |
| 10,153,222 B2 | 12/2018 | Yu et al. |
| 10,153,239 B2 | 12/2018 | Wang et al. |
| 10,157,828 B2 | 12/2018 | Hsu et al. |
| 10,157,849 B2 | 12/2018 | Huang et al. |
| 10,162,139 B1 | 12/2018 | Wang et al. |
| 10,163,798 B1 | 12/2018 | Alur et al. |
| 10,163,802 B2 | 12/2018 | Lin et al. |
| 10,177,188 B2 | 1/2019 | Kang et al. |
| 10,204,684 B2 | 2/2019 | Widjaja |
| 10,211,070 B2 | 2/2019 | Lee et al. |
| 10,211,182 B2 | 2/2019 | Meyer et al. |
| 10,256,219 B2 | 4/2019 | Chew |
| 10,262,974 B2 | 4/2019 | Yeh et al. |
| 10,276,382 B2 | 4/2019 | Hunt et al. |
| 10,290,611 B2 | 5/2019 | Yu et al. |
| 10,325,882 B2 | 6/2019 | Kang et al. |
| 10,333,623 B1 | 6/2019 | Liao et al. |
| 10,340,249 B1 | 7/2019 | Yu et al. |
| 10,347,606 B2 | 7/2019 | Yu et al. |
| 10,373,885 B2 | 8/2019 | Yu et al. |
| 10,418,350 B2 * | 9/2019 | Das .................... H01L 23/481 |
| 10,419,001 B2 | 9/2019 | Jo et al. |
| 10,431,536 B2 | 10/2019 | Kim et al. |
| 10,447,274 B2 | 10/2019 | Lee et al. |
| 10,476,505 B2 | 11/2019 | Ngai |
| 10,490,521 B2 | 11/2019 | Hu et al. |
| 10,490,540 B2 | 11/2019 | Yu et al. |
| 10,504,835 B1 | 12/2019 | Wang et al. |
| 10,510,634 B2 | 12/2019 | Lin et al. |
| 10,510,650 B2 | 12/2019 | Yu et al. |
| 10,510,721 B2 | 12/2019 | Bhagavat et al. |
| 10,522,449 B2 | 12/2019 | Chen et al. |
| 10,529,666 B2 | 1/2020 | Yu et al. |
| 10,535,638 B2 | 1/2020 | Yeh et al. |
| 10,541,227 B2 | 1/2020 | Yeh et al. |
| 10,541,228 B2 | 1/2020 | Chen et al. |
| 10,622,321 B2 | 4/2020 | Yu et al. |
| 10,741,537 B2 | 8/2020 | Lu et al. |
| 10,784,248 B2 | 9/2020 | Yu et al. |
| 10,797,031 B2 | 10/2020 | Liao et al. |
| 10,867,965 B2 | 12/2020 | Shih et al. |
| 10,867,978 B2 | 12/2020 | Bhagavat et al. |
| 10,892,011 B2 | 1/2021 | Lin et al. |
| 10,892,291 B2 | 1/2021 | Chhun et al. |
| 10,943,869 B2 | 3/2021 | Zhai et al. |
| 10,991,686 B2 * | 4/2021 | Chang .................. H10D 84/811 |
| 11,056,463 B2 | 7/2021 | Takahashi et al. |
| 11,114,408 B2 | 9/2021 | Shen et al. |
| 11,127,728 B2 * | 9/2021 | Zhou .................... H01L 25/18 |
| 11,133,254 B2 | 9/2021 | Lai et al. |
| 11,139,300 B2 * | 10/2021 | Gomes ............... H01L 23/5226 |
| 11,158,580 B2 | 10/2021 | Sio et al. |
| 11,211,334 B2 | 12/2021 | Lin et al. |
| 11,217,368 B2 | 1/2022 | Choa et al. |
| 11,276,661 B2 | 3/2022 | Fang |
| 11,521,957 B1 * | 12/2022 | Lee ........................ H01L 21/78 |
| 11,545,438 B2 | 1/2023 | Hsieh et al. |
| 11,587,894 B2 | 2/2023 | Chen et al. |
| 11,637,056 B2 * | 4/2023 | Lin .................... H01L 23/49833 |
| | | 257/773 |
| 11,728,254 B2 | 8/2023 | Hou et al. |
| 12,051,692 B2 | 7/2024 | Shi et al. |
| 12,150,308 B2 * | 11/2024 | Young .................. H10B 53/40 |
| 12,369,365 B2 | 7/2025 | Yu et al. |
| 2001/0045844 A1 | 11/2001 | New et al. |
| 2001/0051426 A1 | 12/2001 | Pozder et al. |
| 2002/0092307 A1 | 7/2002 | Ghoshal |
| 2003/0023945 A1 * | 1/2003 | Wang ................. H03K 19/1776 |
| | | 326/38 |
| 2003/0122578 A1 | 7/2003 | Masui et al. |
| 2004/0041584 A1 | 3/2004 | Sunaga et al. |
| 2004/0145850 A1 | 7/2004 | Fukumoto et al. |
| 2004/0222817 A1 | 11/2004 | Madurawe |
| 2005/0046002 A1 | 3/2005 | Lee et al. |
| 2005/0073897 A1 * | 4/2005 | Miyatake ............... G11C 11/16 |
| | | 365/222 |
| 2005/0185457 A1 | 8/2005 | Kim et al. |
| 2005/0218929 A1 | 10/2005 | Wang et al. |
| 2005/0226041 A1 * | 10/2005 | Nejad ..................... G11C 11/16 |
| | | 365/158 |
| 2006/0138509 A1 | 6/2006 | Lee et al. |
| 2007/0037379 A1 | 2/2007 | Enquist et al. |
| 2007/0164279 A1 | 7/2007 | Lin et al. |
| 2007/0166912 A1 | 7/2007 | Fenigstein et al. |
| 2007/0279987 A1 | 12/2007 | Fang et al. |
| 2009/0114971 A1 | 5/2009 | Cai et al. |
| 2009/0243650 A1 | 10/2009 | Madurawe |
| 2009/0243652 A1 | 10/2009 | Dorairaj et al. |
| 2009/0267238 A1 | 10/2009 | Joseph |
| 2010/0039136 A1 | 2/2010 | Chua-Eoan et al. |
| 2010/0133704 A1 | 6/2010 | Marimuthu et al. |
| 2010/0157669 A1 | 6/2010 | Audzeyeu |
| 2010/0283085 A1 | 11/2010 | Bemanian |
| 2011/0026232 A1 | 2/2011 | Lin et al. |
| 2011/0221470 A1 | 9/2011 | Javerliac et al. |
| 2012/0193785 A1 | 8/2012 | Lin et al. |
| 2012/0217549 A1 | 8/2012 | Widjaja |
| 2013/0082399 A1 | 4/2013 | Kim et al. |
| 2013/0257477 A1 | 10/2013 | Yasuda et al. |
| 2013/0285253 A1 | 10/2013 | Aoki et al. |
| 2014/0017882 A1 | 1/2014 | Lei |
| 2014/0070380 A1 | 3/2014 | Chiu et al. |
| 2014/0070403 A1 | 3/2014 | Pan et al. |
| 2014/0112066 A1 | 4/2014 | Chow et al. |
| 2014/0131858 A1 | 5/2014 | Pan et al. |
| 2014/0183731 A1 | 7/2014 | Lin et al. |
| 2014/0185264 A1 | 7/2014 | Chen et al. |
| 2014/0203412 A1 | 7/2014 | Wang et al. |
| 2014/0210097 A1 | 7/2014 | Chen |
| 2014/0254232 A1 | 9/2014 | Wu |
| 2014/0302659 A1 | 10/2014 | Phatak |
| 2014/0339692 A1 | 11/2014 | Kim et al. |
| 2015/0008957 A1 | 1/2015 | Olgiati et al. |
| 2015/0014844 A1 | 1/2015 | Wu et al. |
| 2015/0085560 A1 | 3/2015 | Candelier et al. |
| 2015/0116965 A1 | 4/2015 | Kim et al. |
| 2015/0227662 A1 | 8/2015 | Lepercq |
| 2015/0279453 A1 * | 10/2015 | Fujiwara ............... H10B 10/18 |
| | | 365/154 |
| 2015/0287672 A1 | 10/2015 | Yazdani |
| 2015/0327367 A1 | 11/2015 | Shen |
| 2016/0079205 A1 | 3/2016 | Lin et al. |
| 2016/0093572 A1 | 3/2016 | Chen |
| 2016/0118390 A1 | 4/2016 | Liaw |
| 2016/0133571 A1 | 5/2016 | Lee et al. |
| 2016/0141228 A1 | 5/2016 | Leobandung |
| 2016/0173101 A1 | 6/2016 | Gao et al. |
| 2016/0190113 A1 | 6/2016 | Sharan et al. |
| 2016/0217835 A1 | 7/2016 | Blott et al. |
| 2016/0351626 A1 | 12/2016 | McCollum |
| 2016/0372449 A1 | 12/2016 | Rusu et al. |
| 2017/0071552 A1 | 3/2017 | Harpe et al. |
| 2017/0117263 A1 | 4/2017 | Yeh et al. |
| 2017/0271248 A1 | 9/2017 | Chen et al. |
| 2017/0301650 A1 | 10/2017 | Yu |
| 2017/0358557 A1 | 12/2017 | Che et al. |
| 2018/0053730 A1 | 2/2018 | Shao |
| 2018/0061742 A1 | 3/2018 | Ananiev |
| 2018/0068937 A1 | 3/2018 | Marimuthu et al. |
| 2018/0076179 A1 | 3/2018 | Hsu et al. |
| 2018/0102776 A1 | 4/2018 | Chandrasekar et al. |
| 2018/0138101 A1 | 5/2018 | Yu et al. |
| 2018/0150667 A1 | 5/2018 | Yu et al. |
| 2018/0151477 A1 | 5/2018 | Yu et al. |

(56) References Cited

U.S. PATENT DOCUMENTS

| | | | |
|---|---|---|---|
| 2018/0151501 A1 | 5/2018 | Yu et al. | |
| 2018/0158746 A1 | 6/2018 | Lin | |
| 2018/0165396 A1 | 6/2018 | Lin et al. | |
| 2018/0174865 A1 | 6/2018 | Yu et al. | |
| 2018/0204810 A1 | 7/2018 | Yu et al. | |
| 2018/0204828 A1 | 7/2018 | Yu et al. | |
| 2018/0210799 A1 | 7/2018 | Gao | |
| 2018/0226349 A1 | 8/2018 | Yu et al. | |
| 2018/0226371 A1 | 8/2018 | Enquist | |
| 2018/0247905 A1 | 8/2018 | Yu et al. | |
| 2018/0269188 A1 | 9/2018 | Yu et al. | |
| 2018/0275193 A1 | 9/2018 | Rouge et al. | |
| 2018/0284186 A1 | 10/2018 | Chadha | |
| 2018/0286776 A1 | 10/2018 | Yu et al. | |
| 2018/0301351 A1 | 10/2018 | Yu et al. | |
| 2018/0301376 A1 | 10/2018 | Shih et al. | |
| 2018/0350629 A1 | 12/2018 | Liu et al. | |
| 2018/0350763 A1 | 12/2018 | Yu et al. | |
| 2018/0358312 A1 | 12/2018 | Yu et al. | |
| 2018/0374824 A1 | 12/2018 | Yu et al. | |
| 2019/0013276 A1 | 1/2019 | Lee et al. | |
| 2019/0019756 A1 | 1/2019 | Yu et al. | |
| 2019/0020343 A1 | 1/2019 | Lin et al. | |
| 2019/0051641 A1 | 2/2019 | Lin et al. | |
| 2019/0057931 A1 | 2/2019 | Hsu et al. | |
| 2019/0057932 A1 | 2/2019 | Wu et al. | |
| 2019/0067152 A1 | 2/2019 | Wuu et al. | |
| 2019/0097304 A1 | 3/2019 | Hsiao et al. | |
| 2019/0129817 A1 | 5/2019 | Zhuo | |
| 2019/0164834 A1 | 5/2019 | Or-Bach et al. | |
| 2019/0221547 A1 | 7/2019 | Drab et al. | |
| 2019/0238134 A1 | 8/2019 | Lin et al. | |
| 2019/0238135 A1 | 8/2019 | Lin et al. | |
| 2019/0245543 A1 | 8/2019 | Lin et al. | |
| 2019/0253056 A1 | 8/2019 | Lin et al. | |
| 2019/0304803 A1 | 10/2019 | Hu et al. | |
| 2019/0333871 A1 | 10/2019 | Chen et al. | |
| 2019/0347790 A1 | 11/2019 | Lin et al. | |
| 2019/0363715 A1 | 11/2019 | Lin et al. | |
| 2019/0371763 A1 | 12/2019 | Agarwal et al. | |
| 2019/0372574 A1 | 12/2019 | Lin et al. | |
| 2019/0393130 A1* | 12/2019 | Mahnkopf | H01L 23/3677 |
| 2019/0393153 A1 | 12/2019 | Wang et al. | |
| 2020/0006274 A1 | 1/2020 | Chiang et al. | |
| 2020/0043853 A1 | 2/2020 | Kim et al. | |
| 2020/0058617 A1 | 2/2020 | Wu et al. | |
| 2020/0058626 A1 | 2/2020 | Tai et al. | |
| 2020/0082885 A1 | 3/2020 | Lin et al. | |
| 2020/0111734 A1 | 4/2020 | Lin et al. | |
| 2020/0144224 A1 | 5/2020 | Lin et al. | |
| 2020/0161242 A1 | 5/2020 | Lin et al. | |
| 2020/0211922 A1 | 7/2020 | Chun et al. | |
| 2020/0243422 A1 | 7/2020 | Kim et al. | |
| 2020/0294923 A1 | 9/2020 | Bhagavat et al. | |
| 2020/0373215 A1 | 11/2020 | Wu et al. | |
| 2020/0395350 A1 | 12/2020 | Wu et al. | |
| 2020/0411443 A1 | 12/2020 | Guo et al. | |
| 2021/0005592 A1 | 1/2021 | Lin et al. | |
| 2021/0043557 A1* | 2/2021 | Lee | H01L 21/76898 |
| 2021/0050300 A1 | 2/2021 | Lin et al. | |
| 2021/0090983 A1 | 3/2021 | Lin et al. | |
| 2021/0159180 A1 | 5/2021 | Zhai et al. | |
| 2021/0217702 A1 | 7/2021 | Dabral et al. | |
| 2021/0232744 A1 | 7/2021 | Lin et al. | |
| 2021/0335791 A1* | 10/2021 | Gomes | G11C 11/404 |
| 2021/0358901 A1 | 11/2021 | Liu | |
| 2022/0013504 A1 | 1/2022 | Dabral et al. | |
| 2022/0020729 A1 | 1/2022 | Gao et al. | |
| 2022/0130823 A1 | 4/2022 | Su et al. | |
| 2022/0328401 A1* | 10/2022 | Huang | H01L 23/5226 |
| 2023/0014913 A1 | 1/2023 | Chen et al. | |
| 2023/0061189 A1* | 3/2023 | Lo | H01L 25/50 |
| 2023/0095654 A1* | 3/2023 | Elsherbini | H01L 25/0657 257/713 |
| 2023/0161120 A1 | 5/2023 | Yu et al. | |
| 2023/0352439 A1 | 11/2023 | Chen et al. | |
| 2023/0352471 A1 | 11/2023 | Yu et al. | |
| 2023/0387038 A1 | 11/2023 | Hsieh et al. | |
| 2023/0420429 A1* | 12/2023 | Chang | H01L 25/50 |
| 2024/0014111 A1 | 1/2024 | Han et al. | |
| 2024/0096405 A1* | 3/2024 | Gaide | G11C 11/417 |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | 2018004092 | 1/2018 |

* cited by examiner

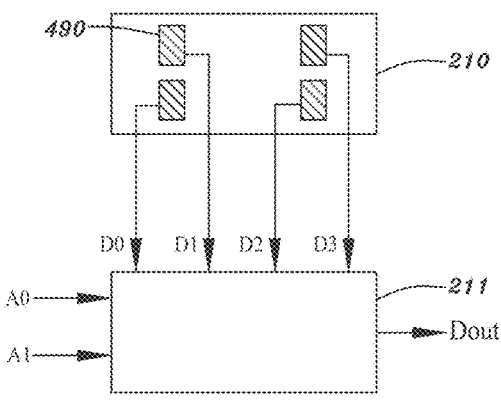
Fig. 1A
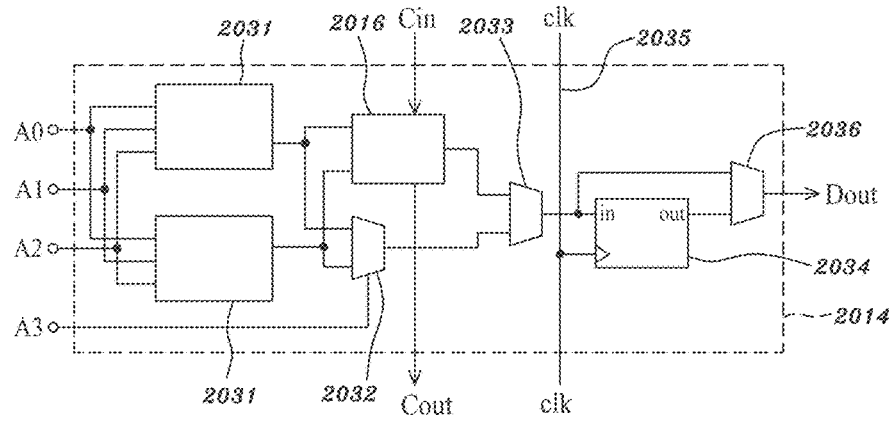
Fig. 1B
Fig. 1C

Fig. 32

FIELD PROGRAMMABLE MULTICHIP PACKAGE BASED ON FIELD-PROGRAMMABLE-GATE-ARRAY (FPGA) INTEGRATED-CIRCUIT (IC) CHIP

PRIORITY CLAIM

This application claims priority benefits from U.S. provision al application No. 63/248,386, filed on Sep. 24, 2021 and entitled "MULTICHIP PACKAGE COMPRISING FIELD PROGRAMMABLE IC CHIP BASED ON COARSE-GRAINED RECONFIGURABLE ARCHITEC-TURE", and U.S. provision al application No. 63/279,672, filed on Nov. 15, 2021 and entitled "LOGIC DRIVE BASED ON MULTICHIP PACKAGE COMPRISING FIELD PROGRAMMABLE IC CHIP AND NON-VOLA-TILE MEMORY IC CHIP".

BACKGROUND OF THE DISCLOSURE

Field of the Disclosure

The present invention relates to a cryptography method, I/O or control circuits, hard macros and power supply for a programmable logic IC chip in a chip package (including single-chip or multichip package) based on the coarse-grained reconfigurable architecture.

Brief Description of the Related Art

The Field Programmable Gate Array (FPGA) semicon-ductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor tech-nology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 32. The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semicon-ductor technology nodes or generations. A new approach or technology is needed to inspire the continuing innovation and to lower down the barrier for implementing the inno-vation in the semiconductor IC chips using the advanced and powerful semiconductor technology nodes or generations.

SUMMARY OF THE DISCLOSURE

One aspect of the disclosure provides a logic drive in a multichip package comprising a standard commodity FPGA IC chip, a NVM IC chip, and one or a plurality of cooperating or supporting IC chips, wherein the one or a plurality of cooperating or supporting IC chips provide one or more than one of any combined functions provided by the cryp-tography or security IC chip, the I/O or control chip, the hard macro IC chip, the power management IC chip, and/or the IAC chip, as described and specified above. The functions of cryptography or security, I/O or control, hard macros, power management and IAC may be combined in one cooperating or supporting IC chip, or partitioned into two, three or four cooperating or supporting IC chips, or separated in five cooperating or supporting IC chips. Any of the functions of cryptography or security, I/O or control, hard macros, power management and IAC not included in the one or the plurality of cooperating or supporting IC chips may be included and kept in the one or the plurality of standard commodity FPGA IC chips in the logic drive. The FPGA IC chip, NVM IC chip, and one or the plurality of cooperating or supporting IC chips may be disposed on a same horizontal plane in the 2D multichip package or may be stacked vertically in 2 layers or 3 layers in the 3D multichip package. The purposes, functions and specifications of the FPGA IC chip, NVM IC chip and the one or the plurality of cooperating or supporting IC chips in the multichip package are as described above.

Another aspect of the disclosure provides the multichip package in a 2D format with IC chips disposed on the same horizontal plane or in a 3D stacked format with the IC chips stacked vertically for the logic drive as described above. The logic drive may be in 3 types of the multichip packages: (i) the first type of the multichip package comprises one or a plurality of standard commodity FPGA IC chips and one or a plurality of NVM IC chip, wherein the one or the plurality of standard commodity FPGA IC chips may comprise cir-cuits providing functions of cryptography or security, I/O or control, hard macros, power management and/or IAC; (ii) the second type of the multichip package comprises one or a plurality of standard commodity FPGA IC chips, one or a plurality of NVM IC chips and a cooperating or supporting IC chip, wherein the cooperating or supporting IC chip is one of the cryptography or security IC chip, I/O or control chip, hard macro IC chip, power management IC chip, or IAC chip, as described and specified above. For the second type, functions of the cryptography or security, I/O or control, hard macros, power management and IAC not included in the cooperating or supporting IC chip may be included and kept in the one or the plurality of standard commodity FPGA IC chips in the logic drive; or (iii) the third type of the multichip package comprises one or a plurality of standard commodity FPGA IC chips, one or a plurality of NVM IC chip and a plurality of cooperating or supporting IC chips, wherein the plurality of cooperating or supporting IC chips each provides one or more than one of any combined functions provided by the cryptography or security IC chip, I/O or control chip, hard macro IC chip, power management IC chip, and/or IAC chip, as described and specified above. For the third type, functions of cryp-tography or security, I/O or control, hard macros, power management and IAC not included in the plurality of cooperating or supporting IC chips may be included and kept in the one or the plurality of standard commodity FPGA IC chips in the logic drive. The functions of cryptography or security, I/O or control, hard macros, power management and IAC may be combined in one cooperating or supporting IC chip, or partitioned into two, three or four cooperating or supporting IC chips, or separated in five cooperating or supporting IC chips respectively.

Another aspect of the disclosure provides a logic drive in a multichip package comprising a standard commodity FPGA IC chip, an NVM IC chip, and a cooperating or supporting IC chip, wherein the cooperating or supporting IC chip comprises circuits for cooperating or supporting the FPGA IC chips packaged in the same multichip package. The multiple chips in the multichip package may be disposed on a same horizontal plane in the 2D multichip package or may be stacked vertically in the 3D multichip package, wherein the 2D and 3D multichip packages will be described below. The cooperating or supporting IC chip may comprise cooperating and supporting circuits separated and moved from the FPGA IC chips. The cooperating or supporting IC chip may be the cryptography or security IC chip, I/O or control chip, hard macro IC chip, power management IC chip, and/or IAC chip as described and specified above. The cooperating and supporting circuits on the cooperating and supporting IC chip are communicating or coupling to the LUTs/multiplexers or programmable interconnections of the FPGA IC chip to perform certain functions and/or operations, through interconnection schemes (in the 2D or 3D multichip package). The cooperating or supporting IC chips provide functions related to the FPGA IC chips packaged in the same multichip package. For example, (i) the cryptography or security IC chip provides security functions for protecting configuration data or information stored in the SRAM cells of the FPGA IC chip, (ii) the I/O or control chip provides high speed, high bandwidth, low power I/O interfaces between the FPGA IC chip and the I/O or control chip, and further between the FPGA IC chip and the external circuits of the logic drive, (iii) the hard macro IC chip provides high speed, high efficiency computing, processing or logic operation collectively with the LUTs/multiplexers and programmable interconnection of the FPGA IC chip, therefore, resulting in high yield, low manufacturing cost for the FPGA IC chip and enabling the standard commodity FPGA IC chip, (iv) the power management IC chip provides power supply and management for the FPGA IC chip, and/or (v) the IAC chip provides customized and personalized circuits and functions for the FPGA IC chip.

The multichip package in the 2D format with IC chips disposed on the same horizontal plane for the logic drive, mentioned above, may be formed by a method using a Fan-out Interconnection Technology (FOIT). The FOIT package comprises the Front Interconnection Scheme of logic Drive (FISD) formed after the IC chips (one or a plurality of standard commodity FPGA IC chips, one or a plurality of NVM IC chips, and/or one or a plurality of cooperating or supporting IC chips mentioned above) are molded with a molding compound (an epoxy or polymer compound), wherein the molding compound are in a space outside and beyond a sidewall of the IC chips and/or in a gap between the IC chips mentioned above. The FISD is formed on or over (i) the one or the plurality of standard commodity FPGA IC chips, the one or the plurality of NVM IC chips, and/or the one or the plurality of cooperating or supporting IC chips; (ii) the molding compound, and (iii) the exposed micro copper bumps of the IC chips mentioned above. The FISD comprises 1 to 6 metal interconnection layers with an insulating dielectric layer (for example, polyimide) between two neighboring metal interconnection layers. The metal lines or traces are formed by an embossing copper electroplating process, wherein the copper layer is electroplated only in the openings in a photoresist layer. The metal lines or traces comprise an electroplated copper layer on a sputtered copper seed layer, and the sputtered copper seed layer on an adhesion layer (for example a Ti, or TiN layer). The adhesion/seed layer is at the bottom of the electroplated copper layer, but not at a sidewall of the electroplated copper layer. The thicknesses of fan-out interconnection metal lines or traces is between 0.5 μm and 10 μm or 0.5 μm and 5 μm. The metal lines or traces of the FISD are used to interconnect the IC chips in the multichip package, for example, the data in the non-volatile memory cells of a NVM IC chip (in the logic drive) is passing to the SRAM cells of a FPGA IC chip (in the logic drive) to configure the FPGA IC chip through the metal lines or traces of the FISD. In the multichip logic drive, a top surface of the molding compound is coplanar with a top surface of the micro copper bump on the top of the FPGA IC chip. The metal pads, pillars or bumps on the FISD are used for assembly or packaging of the finished logic drive to a next level assembly. The interaction, communication and relationship between the one or the plurality of FPGA IC chips, the one or the plurality of NVM IC chips and the one or the plurality of cooperating or supporting IC chips in the multichip package are as described above, and are through the metal lines or traces of the FISD. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the metal lines or traces of the FISD of the FOIT multichip package.

The multichip package of the logic drive in the 2D format with IC chips disposed on the same horizontal plane for the logic drive, mentioned above, may be formed based on a multiple-Chips-On-an-Interposer (COIP) flip-chip packaging method. The interposer in the COIP multichip package comprises: (1) high density interconnects for fan-out and interconnection between IC chips flip-chip-assembled, bonded or packaged on or over the interposer. The high-density interconnects comprise a First Interconnection Scheme on or of the Interposer (FISIP) and/or a Second Interconnection Scheme on or of the Interposer (SISIP). The FISIP is formed by processes comprising a damascene copper electroplating process, and the SISIP is formed by processes comprising an embossing copper electroplating process. The FISIP comprises 1 to 8 metal interconnection layers with an insulating dielectric layer (for example, low k compound comprising Si, O, C) between two neighboring metal interconnection layers. The metal lines or traces are formed by damascene copper electroplating process, wherein a copper layer is electroplated in openings in an insulating dielectric layer and over the insulating dielectric layer; the un-wanted electroplated copper layer over the insulating dielectric layer is then removed by a chemical-mechanical polishing (CMP) process. The metal lines or traces comprises an electroplated copper layer on a sputtered copper seed layer, and a sputtered copper seed layer on an adhesion layer (for example a Ti, or TiN layer). The adhesion/seed layer is at both the bottom and sidewall of the electroplated copper layer. The SISIP comprises 1 to 6 metal interconnection layers with an insulating dielectric layer (for example, polyimide) between two neighboring metal interconnection layers. The metal lines or traces are formed by the embossing copper electroplating process, wherein the copper layer is electroplated only in openings in the photoresist layer. The metal lines or traces comprise an electroplated copper layer on a sputtered copper seed layer, and a sputtered copper seed layer on an adhesion layer (for example a Ti or TiN layer). The adhesion/seed layer is at the bottom of the electroplated copper layer, but not at a sidewall of the electroplated copper layer. The thicknesses of interconnection metal lines or traces of FISIP is between 0.1 µm and 5 µm, and the thicknesses of interconnection metal lines or traces of SISIP is between 0.5 µm and 10 µm; (2) micro metal pads, bumps or pillars on or over the high density interconnects (FISIP and/or SISIP); (3) Trough-Silicon-Vias (TSVs) in the silicon substrate of the interposer. The interposer comprises FISIP and/or SISIP comprising fan-out interconnection metal lines or traces, TSVs, and micro metal pads, pillars or bumps. The IC chips (the one or the plurality of standard commodity FPGA IC chips, the one or the plurality of NVM IC chips, and/or the one or the plurality of cooperating or supporting IC chips) are flip-chip assembled, bonded or packaged to the interposer. The micro copper pillars or solder bumps on the IC chips are bonded to the micro metal pads, bumps or pillars on the interposer. The metal lines or traces of the FISIP and/or SISIP are used to interconnect the IC chips in the multichip package, for example, the data in the non-volatile memory cells of a NVM IC chip (in the logic drive) is passing to the SRAM cells of a FPGA IC chip (in the logic drive) to configure the FPGA IC chip through the metal lines or traces of the FISIP and/or SISIP. The IC chips to be flip-chip assembled, bonded or packaged, to the interposer include the IC chips described and specified above. The interaction, communication and relationship between the one or the plurality of FPGA IC chips, the one or the plurality of NVM IC chip and the one or the plurality of cooperating or supporting IC chips in the multichip package are as described above, and are through the metal lines or traces of the FISIP and/or SISIP. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the metal lines or traces of the FISIP and/or SISIP of the COIP multichip package.

The multichip package in the 2D format with IC chips disposed on the same horizontal plane for the logic drive, mentioned above, may be formed based on a Chip-On-Interconnection-Substrate (COIS) flip-chip packaging method using an Interconnection Substrate (IS), wherein the IS comprises (i) an interconnection scheme of a Printed Circuit Board (PCB) substrate or a Ball Grid Array (BGA) substrate (ISPB) and (ii) a silicon Fineline Interconnection Bridges (FIB) embedded in the ISPB. The FIB is used for high speed, high density interconnection between IC chips assembled on the IS. The FIBS comprise First Interconnection Schemes on the substrates of FIBs (FISIB) and/or Second Interconnection Schemes on the substrates of FIBS (SISIB). The FISIB is formed by the damascene copper electroplating processes as described above in forming the FISIP of the interposer, and the SISIB is formed by the embossing copper electroplating processes as described above in forming the SISIP of the interposer. The description, fabrication processes, specifications and features of the FISIB is as described and specified above in the FISIP of the interposers used in the COIP logic drives, and the description, fabrication processes, specifications and features of the SISIB is as described and specified above in the SISIP of the interposers used in the COIP logic drives. The FIBs are then embedded in the ISPB. The ISPB is formed by the PCB or BGA processes, for example, a semi-additive process using laminated insulating dielectric layers and copper foils. The insulating dielectric layers may comprise FR4 (a composite material composed of woven fiberglass cloth with an epoxy resin binder) or BT (Bismaleimide Triazine Resin).

The COIS packages are the same as the COIP package except that Interconnection Substrates (IS) are used instead of the InterPosers (IP). The interconnection schemes of IS comprises the interconnection Scheme of the Printed Circuit Board (PCB) substrate or Ball Grid Array (BGA) substrate (ISPB) and silicon Fineline Interconnection Bridges (FIB) embedded in the ISPB, wherein FIB comprise the FISIB and/or SISIB. The purposes and functions of the interconnections schemes of the IS are same as that of interconnection schemes (FISIP and/or SISIP) of the interposers; and are also same as that of interconnection schemes of the FISD in the FOIT logic drives, as described above. The IC chips (the one or the plurality of standard commodity FPGA IC chips, the one or the plurality of NVM IC chips, and/or the one or the plurality of cooperating or supporting IC chips) are flip-chip assembled, bonded or packaged to the Interconnection Substrate (IS). The copper pillars or solder bumps on the IC chips are bonded to the metal pads or bumps on the Interconnection Substrate (IS). The metal lines or traces of (i) the FISIP and/or SISIP of the FIB, and/or (ii) the ISPB, are used to interconnect the IC chips in the multichip package, for example, the data in the non-volatile memory cells of a NVM IC chip (in the logic drive) is passing to the SRAM cells of a FPGA IC chip (in the logic drive) to configure the FPGA IC chip through the metal lines or traces of the FISIP and/or SISIP. The IC chips to be flip-chip assembled, bonded or packaged, to the IS include the IC chips described and specified above. The interaction, communication and relationship between the one or the plurality of FPGA IC chips, the one or the plurality of NVM IC chips and the one or the plurality of cooperating or supporting IC chips in the multichip package are as described above, and are through the metal lines or traces of the FISIB and/or SISIB; and/or the interconnection Schemes of the Printed Circuit Board (PCB) substrate or Ball Grid Array (BGA) substrate (ISPB). The IC chips to be assembled, bonded or packaged to the IS include the chips mentioned, described and specified above. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the metal lines or traces of the FISIB and/or SISIB of the FIB; and/or the interconnection Schemes of the Printed Circuit Board (PCB) substrate or Ball Grid Array (BGA) substrate of the COIS multichip package.

The multichip package of the logic drive in the 3D format, mentioned above, comprises IC chips stacked vertically at least 2 layers for the logic drive. The 3D multichip package may be formed by a method based on stacking either (i) bare-die IC chips or (ii) IC chip packages on or over a package formed by Fan-out Interconnection Technology (FOIT), as described and specified above, wherein the FOIT package comprises Through-Polymer-Vias (TPVs) in the molding compound. In the 3D logic drive, the one or the plurality of FPGA IC chips may be packaged in a first FOIT package, and the one or the plurality of NVM IC chips, and/or the one or the plurality of cooperating or supporting IC chips may be stacked on or over the first FOIT package, wherein the one or the plurality of NVM IC chips, and/or the one or the plurality of cooperating or supporting IC chips may be in a bare die format or in a package format, wherein the package format comprises, for example, TSOP (Thin Small Outline Package based on lead-frames), BGA package (based on wire-bonding or flip-chip bonding on a Ball Grid Array substrate), or a second FOIT package. In the multichip logic drive, the one or the plurality of NVM IC chips, and/or the one or the plurality of cooperating or supporting IC chips may couple or connect to the first FOIT package comprising the one or plurality of FPGA IC chips, through the TPVs and metal lines or traces of the FISD in the first FOIT package. For example, the data in the non-volatile memory cells of a NVM IC chip (in the logic drive) are passing to the SRAM cells of a FPGA IC chip (in the logic drive) to configure the FPGA IC chip through the TPVs and metal lines or traces of the FISD of the first FOIT. The interaction, communication and relationship between the one or the plurality of FPGA IC chips, the one or the plurality of NVM IC chips and the one or a plurality cooperating or supporting IC chips in the 3D vertical stacked multichip package are as described above, and are through the TPVs and metal lines or traces of the FISD. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through the TPVs and metal lines or traces of the FISD.

Alternatively, the FOIT package may further comprise a Backside Interconnection Scheme of the logic Drive (BISD) at the backside of the one or the plurality of FPGA IC chips, wherein the FISD is at the front-side (the side having transistors) of the one or the plurality of FPGA IC chips. The BISD comprises 1 to 4 metal interconnection layers with an insulating dielectric layer (for example, polyimide) between two neighboring metal interconnection layers. The specification and the method of forming the BISD is the same as that of FISD. In the multichip logic drive, the one or the plurality of NVM IC chips, and/or the one or the plurality of cooperating or supporting IC chips may couple or connect to the FOIT package comprising the one or plurality of FPGA IC chips, through the metal lines or traces of the BISD, TPVs and metal lines or traces of the FISD in the FOIT package. For example, the data in the non-volatile memory cells of a NVM IC chip (in the logic drive) are passing to the SRAM cells of a of FPGA IC chip (in the logic drive) to configure the FPGA IC chip through the metal lines or traces of the BISD, TPVs and metal lines or traces of the FISD. The interaction, communication and relationship between the one or the plurality of FPGA IC chips, the one or the plurality of NVM IC chips and the one or the plurality cooperating or supporting IC chips in the 3D vertical stacked multichip package are as described above, and are through the metal lines or traces of the BISD, TPVs and metal lines or traces of the FISD. The cooperating and supporting circuits on the cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through metal lines or traces of the BISD, TPVs and metal lines or traces of the FISD.

The multichip package of the logic drive in the 3D format, mentioned and specified above, comprises IC chips stacked vertically at least 2 layers for the logic drive. The 3D multichip package may be formed by a method based on stacking either (i) bare-die IC chips or (ii) IC chip packages on or over a package formed by Fan-out Interconnection Technology (FOIT), as described and specified above, wherein the FOIT package comprises Through-Polymer-Vias (TPVs) in the molding compound. In the 3D logic drive, the one or the plurality of NVM IC chips, and/or the one or the plurality of cooperating or supporting IC chips may be packaged in a first FOIT package, and the one or the plurality of FPGA IC chips may be stacked on or over the first FOIT package, wherein the one or the plurality of FPGA IC chips may be in a bare die format or in a package format comprising, for example, a second FOIT package. The one or the plurality of NVM IC chips, and/or the one or the plurality of cooperating or supporting IC chips in the first FOIT have the front sides with the transistors facing up, and the one or plurality of FPGA IC chips have the front sides with the transistors facing down (that is facing the first FOIT). The one or the plurality of NVM IC chips, and/or the one or the plurality of cooperating or supporting IC chips may comprising TSVs in their silicon substrates. The first FOIT may comprise TPVs in the molding compound or polymer, the FISD at its top, and the BISD at its bottom. Alternatively, the FISD may be omitted. The one or the plurality of NVM IC chips, and/or the one or the plurality of cooperating or supporting IC chips in the first FOIT may couple or connect to the one or plurality of FPGA IC chips, in bare die or packages. The one or plurality of FPGA IC chips or packages may be flipped assembled or bonded to the first FOIT using the solder reflow bonding, thermal compressing bonding, or the oxide-to-oxide metal-to-metal direct bonding. The cooperating and supporting circuits on the one or the plurality of cooperating and supporting IC chip (the cryptography or security IC chip, I/O or control chip, hard macro IC chip, power management IC chip, and/or IAC chip as described and specified above) are communicating or coupling to the LUTs/multiplexers or programmable interconnections of the FPGA IC chip to perform certain functions and/or operations, through metal bonds between the first FOIT and the one or plurality of FPGA IC chips. The power supply or ground reference voltage for the one or the plurality of FPGA IC chips and the one or the plurality of cooperating and supporting IC chips may be through the TPVs in the first FOIT.

The FOIT packages comprising the one or the one or plurality of FPGA IC chips, the one or the plurality of NVM IC chips, or the one or the plurality of cooperating and supporting IC chips (as described and specified above), may alternatively use a vertical silicon connector or elevator with Through-Silicon-Vias (TSVs) in a silicon substrate of the vertical silicon connector or elevator. The vertical silicon connector or elevator is disposed on the same horizontal plane as the other chip or chips in a same FOIT package. The TSVs in the silicon substrate of the vertical silicon connector or elevator are used as an alternative for the TPVs. The functions and purposes of the TSVs in the vertical silicon connector or elevator are the same as that of TPVs in the molding compound or polymer of a FOIT package, as described and specified above.

The multichip package of the logic drive in the 3D format comprises IC chips stacked vertically at least 2 layers for the logic drive. The multichip package may be formed by a method based on stacking either (i) bare-IC chips or (ii) IC chip packages on or over a package formed by Chips-On-an-Interposer (COIP) flip-chip packaging method, as described and specified above. In the 3D logic drive, the one or the plurality of FPGA IC chips may be packaged in the COIP package, and the one or the plurality of NVM IC chips, and/or the one or the plurality of cooperating or supporting IC chips may be stacked on or over the COIP package, wherein the one or the plurality of NVM IC chips, and/or the one or a plurality of cooperating or supporting IC chips may be in a bare die format or in a package format, wherein the package format comprises, for example, TSOP (Thin Small Outline Package based on lead-frames), BGA package (based on wire-bonding or flip-chip bonding on a Ball Grid Array substrate), or FOIT package. The COIP package comprises a molding compound over the interposer and in a space outside and beyond a side wall of the one or the plurality of the FPGA IC chips, and/or between in a space between two neighboring FPGA IC chips. Through-Polymer-Vias (TPVs) are in the molding compound. All description, specification, purposes or functions (including the alternatives of the BISD and the vertical silicon connector or elevator with TSVs) for the logic drive in the 3D format using the FOIT package comprising the one or the plurality of FPGA IC chips, as described and specified above, are applied for the logic drive in the 3D format using the COIP package comprising the one or the plurality of FPGA IC chips.

The multichip package of the logic drive in the 3D format comprises IC chips stacked vertically at least 2 layers for the logic drive. The multichip package may be formed by a method based on stacking either (i) bare-IC chips or (ii) IC chip packages on or over a package formed by Chip-On-Interconnection-Substrate (COIS) packaging method, as described and specified above. In the 3D logic drive, the one or plurality of FPGA IC chips may be packaged in the COIS package, and the one or the plurality of NVM IC chips, and/or the one or the plurality of cooperating or supporting IC chips may be stacked on or over the COIS package, wherein the one or the plurality of NVM IC chips, and/or the one or a plurality of cooperating or supporting IC chips may be in a bare die format or in a package format, wherein the package format comprises, for example, TSOP (Thin Small Outline Package based on lead-frames), BGA package (based on wire-bonding or flip-chip bonding on a Ball Grid Array substrate), or FOIT package. The COIS package comprises a molding compound over the Interconnection Substrate (IS), and in a space outside and beyond a side wall of the one or the plurality of the FPGA IC chips, and/or in a space between two neighboring FPGA IC chips. Through-Polymer-Vias (TPVs) are in the molding compound. All description, specification, purposes or functions (including the alternatives of the BISD and the vertical silicon connector or elevator with TSVs) for the logic drive in the 3D format using the FOIT package comprising the one or the plurality of FPGA IC chips, as described above, are applied for the logic drive in the 3D format using the COIS package comprising the one or the plurality of FPGA IC chips.

Another aspect of the disclosure provides a method of forming the 3D vertical stacked logic drive in a multichip package comprising the one or the plurality of standard commodity FPGA IC chips, the one or the plurality of NVM IC chips and/or the one or the plurality of cooperating or supporting IC chips. The stacked logic drive using the single-layer-packaged package with the BISD and TPVs may be formed using by the following process steps: (i) providing a first single-layer-packaged package with both TPVs and the BISD, either separated or still in the wafer or panel format, and with its copper pillars or bumps, or solder bumps faced down at the bottom, and with the exposed copper pads at its top; (ii) Package-On-Package (POP) stacking assembling, by surface-mounting and/or flip-package methods, a second separated single-layer-packaged package (also with both TPVs and the BISD) on top of the provided first single-layer-packaged package. The surface-mounting process is similar to the Surface-Mount Technology (SMT) used in the assembly of components on or to the Printed Circuit Boards (PCB), by first printing solder or solder cream, or flux on the surfaces of the exposed copper pads (at the top of the a first single-layer-packaged package), and then flip-package assembling, connecting or coupling the copper pillars or bumps, or solder bumps on or of the second separated single-layer-packaged package to the solder or solder cream or flux printed surfaces of the exposed copper pads of the first single-layer-packaged package. The flip-package process is performed, similar to the Package-On-Package technology (POP) used in the IC stacking-package technology, by flip-package assembling, connecting or coupling the copper pillars or bumps, or solder bumps on or of the second separated single-layer-packaged package to the surfaces of copper pads of the first single-layer-packaged package. Note that the copper pillars or bumps, or solder bumps on or of the second separated single-layer-packaged package bonded to the surfaces of copper pads of the first single-layer-packaged package may be located vertically over or above locations where IC chips are placed in the first single-layer-packaged package. An underfill material may be filled in the gaps between the first and second single-layer-packaged packages. A third separated single-layer-packaged package (also with both TPVs and the BISD) may be flip-package assembled, connected or coupled to the exposed surfaces of copper pads of the second single-layer-packaged package. In an application, the first single-layer-packaged package may comprise the one or the plurality of FPGA IC chips, the second single-layer-packaged package may comprise the one or the plurality of NVM IC chips, and the third single-layer-packaged package may comprise the one or the plurality of cooperating or supporting IC chips. The purposes, functions and specifications of the one or the plurality of FPGA IC chips, the one or the plurality NVM IC chips and the one or a plurality of cooperating or supporting IC chips in the multichip package logic drive are as described above. The interaction, communication and relationship between the one or the plurality of FPGA IC chips, the one or the plurality of NVM IC chips and the one or a plurality of cooperating or supporting IC chips in the 3D vertical stacked multichip packaged logic drive are as described above. The Package-On-Package stacking assembling process may be repeated for assembling more separated single-layer-packaged packages (for example, up to more than or equal to n separated single-layer-packaged packages, wherein n is greater than or equal to 2, 3, 4, 5, 6, 7, 8) to form the finished stacking logic drive. All the above single-layer-packaged packages may be packages based on the FOIT, COIP or COIS packaging technology as described and specified above. When the first single-layer-packaged packages are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged package are still in the wafer or panel format, the wafer or panel may be used directly as the carrier or substrate for performing POP stacking processes, in the wafer or panel format, for forming the stacked logic drives. The wafer or panel is then cut or diced to obtain the separated stacked finished logic drives.

Another aspect of the disclosure provides the logic drive in the 2D or 3D multichip package comprising the one or the plurality of standard commodity FPGA IC chips, the one or the plurality of NVM IC chips and/or the one or the plurality of cooperating or supporting IC chips (as described and specified above), further comprising one or a plurality of processing and/or computing IC chips, for example, a Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip, Artificial Intelligent Unit (AIU), Machine Learning Unit (MLU) and/or Application Specific IC (ASIC) chip. The interaction, communication and relationship between the one or the plurality of FPGA IC chips, the one or the plurality of NVM IC chip and the one or a plurality of cooperating or supporting IC chips in the multichip packaged logic drive are as described above.

Another aspect of the disclosure provides the logic drive in the 2D or 3D multichip package comprising the one or the plurality of standard commodity FPGA IC chips, the one or the plurality of NVM IC chips and/or the one or the plurality of cooperating or supporting IC chips (as described and specified above), further comprising high speed, wide bit width, high bandwidth memory (HBM) SRAM or DRAM IC chips. The HBM IC chip may have a data bit width of equal to or greater than 64, 128, 256, 512, 1024, 2048, 4096, 8K, or 16K. The interaction, communication and relationship between the one or the plurality of FPGA IC chips, the one or the plurality of NVM IC chip and the one or a plurality of cooperating or supporting IC chips in the multichip packaged logic drive are as described above.

Another aspect of the disclosure provides a standard commodity Field Programmable IC (FPIC) chips or chiplets (comprising the FGFPGA, CGRA and/or CGFP IC chips) for use in the standard commodity logic drive. The standard commodity FPIC chip or chiplet is designed, implemented and fabricated using an advanced semiconductor technology node or generation, for example, more advanced than or equal to, or below or equal to 20 nm or 10 nm; with a chip size and manufacturing yield optimized for the minimum manufacturing cost based on the fabrication semiconductor technology node or generation. The standard commodity FPIC chip or chiplet may have an area between 100 mm² and 9 mm², 75 mm² and 16 mm², 50 mm² and 16 mm², or 25 mm² and 9 mm². Transistors used in the advanced semiconductor technology node or generation may be a FIN Field-Effect-Transistor (FINFET), a Gate-All-Around Field-Effect-Transistor (GAAFET), a FINFET on Silicon-On-Insulator (FINFET SOI), or a GAAFET on Silicon-On-Insulator (GAAFET SOI). Since the standard commodity FPGA IC chip or chiplet may couple or communicate directly only with other chip or chips in the logic drive, its I/O circuits may require only small I/O drivers or receivers, and small or without Electrostatic Discharge (ESD) devices. The driving capability, loading, output capacitance of I/O drivers or the input capacitance of I/O receivers may be between 0.1 pF and 2 pF or 0.1 pF and 1 pF; or smaller than 2 pF or 1 pF. The size of the ESD device may be between 0.05 pF and 2 pF or 0.05 pF and 1 pF; or smaller than 2 pF, 1 pF or 0.5 pF. For example, a bi-directional (or tri-state) I/O pad or circuit may comprise an ESD circuit, a receiver, and a driver, and has an input capacitance or output capacitance between 0.1 pF and 2 pF or 0.1 pF and 1 pF; or smaller than 2 pF or 1 pF. All or most of control and Input/Output (I/O) circuits or units (for example, the off-logic-drive I/O circuits, i.e., large I/O circuits, communicating or coupling with circuits or components external or outside of the logic drive) are outside of, or not included in, the standard commodity FPIC chip or chiplet, but are included in another dedicated control chip, dedicated I/O chip, or dedicated control and I/O chip, packaged in the same logic drive. None or minimal area of the standard commodity FPGA IC chip or chiplet is used for the control or I/O circuits, for example, less than 15%, 10%, 5%, 2%, 1%, 0.5% or 0.1% area is used for the control or I/O circuits; or, none or minimal transistors of the standard commodity FPGA IC chip or chiplet are used for the control or I/O circuits, for example, less than 15%, 10%, 5%, 2%, 1%, 0.5% or 0.1% of the total number of transistors are used for the control or I/O circuits; or all or most area of the standard commodity FPIC chip or chiplet is used for (i) logic blocks, cells or elements comprising logic gate arrays, computing or processing units, and/or Look-Up-Tables (LUTs) and multiplexers, and/or (ii) programmable interconnection. For example, greater than 85%, 90%, 95%, 98%, 99%, 99.5% or 99.9% area is used for logic blocks, cells or elements, and/or programmable interconnection; or, all or most transistors of the standard commodity FPIC chip or chiplet are used for logic blocks, cells or elements, and/or programmable interconnection, for example, greater than 85%, 90%, 95%, 98%, 99%, 99.5% or 99.9% of the total number of transistors are used for logic blocks, cells or elements, and/or programmable interconnection Another aspect of the disclosure provides the standard commodity logic drive in a multi-chip package comprising one or a plurality of standard commodity FPIC chips or chiplets and one or a plurality of non-volatile memory IC chips, for use in different applications requiring logic, computing and/or processing functions by field programming, wherein each of the standard commodity FPIC chips or chiplets is in a bare-die format or in a single-chip or multi-chip package. Each of standard commodity FPIC chips or chiplets may have standard common features, counts, functions or specifications, for example: (1) the power supply voltage: the voltage may be between 0.1V and 8V, 0.1V and 6V, 0.1V and 2.5V, 0.1V and 2V, 0.1V and 1.5V, 0.1V and 1V or 0.1 V and 0.5V, or, smaller than 2V, 1V or 0.5V; (2) the I/O pads, in terms of layout, location, number and function. Since the FPIC chips or chiplets are standard commodity IC chips or chiplets, the number of FPIC chip or chiplet designs or products is reduced to a small number, therefore, the number of expensive photo mask sets for fabricating the FPIC chips or chiplets using an advanced semiconductor node or generation is reduced to a small number, for example, reduced down to a number between 1 and 5 or 1 and 3 for a specific technology node or generation. The NRE and production expenses are therefore greatly reduced. With just a few number of designs and products at an advanced semiconductor node or generation, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPIC chip or chiplet delivery time and becoming very cost-effective.

Another aspect of the disclosure provides a standard general-purpose commodity system, device or logic drive based on the method, algorithm and/or architecture to optimize its performance in the 2D or 3D multichip package, wherein the 2D or 3D multichip package is as described and specified above, and comprises the one or the plurality of standard commodity FPIC chips, the one or the plurality of NVM IC chips, the one or the plurality of memory IC chips or multichip packages (SRAM, DRAM, HBM (High Bandwidth Memory)), the one or the plurality of cooperating or supporting IC chips (as described and specified above), and/or one or a plurality of processing and/or computing IC chips, for example, a Central Processing Unit (CPU) IC chip, Graphic Processing Unit (GPU) IC chip, Data Processing Unit (DPU) chip, Digital Signal Processing (DSP) IC chip, Tensor Processing Unit (TPU) IC chip, Application Processing Unit (APU) IC chip and/or Application Specific IC (ASIC) chip, wherein the FPIC chip comprises FGFPGA, CGRA and CGFP IC chips, as described and specified above. IC chips as specified above in the 2D or 3D multichip packages may be a lower power IC chip having a voltage supply $V_{dd}$ equal to or smaller than 0.5 V, 0.4 V, 0.3 V, or 0.2 V; or between 0.1 and 0.5 V, 0.1 and 0.4 V or 0.1 V and 0.3 V, wherein the IC chips may be fabricated using and implemented in a technology node equal to or more advanced than 10 nm or 5 nm, for example, in 10 nm, 7 nm, 5 nm, 3 nm, or 2 nm, and the transistors in the IC chips are in a 3D structure for example, a FINFET or GAAFET, with a threshold voltage (defined when the drain current is at 30 nano-amperes when the drain voltage is at $V_{dd}$) equal to or smaller than 0.4 V, 0.3 V, or 0.2V, or between 0.1 and 0.4 V, 0.1 and 0.3 V or 0.1 V and 0.2 V. The FINFET or GAAFET has a low supply voltage $V_{dd}$ because its threshold voltage is low. The low threshold voltage of the FINFET or GAAFET is due to (i) the much larger effective channel width ($W_{eff}$). For a FINFET, $W_{eff}=W+2H$, wherein W is the physical channel width of the FET transistor (the channel is in the protruding silicon FIN) and H is the physical height of the protruding silicon FIN. For a GAAFET, $W_{eff}=2\lambda(W+T)$, wherein $\lambda$ is the number of channel layers each is surrounded by a gate oxide and a gate material on the gate oxide, W is the physical width of each channel layer and T is the physical thickness of each channel layer. As an example, if a GAAFET has $\lambda=3$, then $W_{eff}=6 W+6T$; (ii) the smaller sub-threshold leakage current. The low power IC chip with the low supply voltage provides possibility to package multiple chips in a small area or small volume either on the same plane (2D) or in a stacked format (3D). The low power IC chip with the low supply voltage is suitable for a 3D multichip stacked package, wherein the backside of the IC chip is not exposed or free for attaching a heat spreader or heat sink for thermal remove thereon or thereover. As an example, in a multichip package, a FPIC, CPU, GPU/DPU, APU, ASIC or logic IC chip with the low voltage supply $V_{dd}$ is sandwiched between two components, with an interconnection scheme or component (for example, the interposer in the COIP multichip package, the FISD in the FOIT package, or the BGA substrate) at or under its bottom, and with an IC chip or package (for example, SRAM, NVM, DRAM, HBM, logic chip, ASIC chip, or the cooperating or supporting IC chip) at or over its top, wherein no space to add or insert a heat spreader or heat sink between the FPIC, CPU, GPU/DPU, APU, ASIC or logic IC chip and the interconnection scheme or component under, and between the FPIC, CPU, GPU/DPU, APU, ASIC or logic IC chip and the IC chip or package over.

Usually, a supplier may redesign electronic circuits (hardware) of the IC chip or IC chips in the 2D or 3D chip or multichip package, as described above, to upgrade or improve functions or performance of the electronic device frequently. For example, the current smart mobile phone supplier may redesign and sell a new hardware every year to upgrade or improve functions or performance. By doing this way, it is not environmentally friendly to dispose away a one-year-old hardware device and replace by a new hardware. In our disclosure, the upgrading and improvement of functions and performance may be achieved through the field programmable circuits of the FPIC chip, (including the FGFPGA, CGRA and CGFP IC chip) in the 2D or 3D chip or multichip package, or through the field programmable circuits embedded in the logic chip, for example, the Application Processing Unit (APU) chip, Application Specific IC (ASIC) chip and/or Central Processing Unit (CPU) chip, in the same 2D or 3D chip or multichip package, wherein the field programmable circuits are as described and specified above comprising programmable logic circuits (LUTs and multiplexers) and programmable interconnection (switches). The hardware circuits can be altered or changed by software configuration of field programmable circuits, without changing the hardware of the smart mobile phone. The field programmable circuits provide a method to upgrade or improve performance of the smart mobile phone, therefore extending the lifetime of the smart mobile phone, by using programmable configuration/re-configuration software to define, re-define or alter the hardware of the field programmable circuits in the IC chip or chips in the smart mobile phone.

Another aspect of the disclosure provides a chip-on-chip package for use in the standard general-purpose commonalty system, device or logic drive based on the method, algorithm and/or architecture to optimize its performance in the 2D or 3D multichip package, wherein the chip-on-chip package comprises the one or the plurality of standard commodity FPIC chips, the one or the plurality of NVM IC chips (NAND flash, NOR flash, RRAM, FRAM and/or MRAM IC chips) (as described and specified above), one or the plurality of volatile memory IC chips (SRAM or DRAM IC chips), the one or the plurality of cooperating or supporting IC chips (as described and specified above), and/or one or a plurality of processing and/or computing IC chips, for example, a Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip and/or Application Specific IC (ASIC) chip, wherein the one or the plurality of standard commodity FPIC chips comprises FGFPGA, CGRA and/or CGFP IC chips, as described and specified above. The chip-on-chip package is formed by a hybrid bonding process to bond the copper pads and silicon oxide layer of the bottom and top chips together, wherein the bottom and top chips may be arranged as: (i) the one or the plurality of standard commodity FPIC chips is at the bottom and one or a plurality of other chips are at the top, wherein the one or a plurality of other chips comprises the one or the plurality of NVM IC chips (as described and specified above), the one or the plurality of volatile memory IC chips, the one or the plurality of cooperating or supporting IC chips (as described and specified above), and/or one or a plurality of processing and/or computing IC chips, for example, a Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip and/or Application Specific IC (ASIC) chip; (ii) the one or the plurality of standard commodity FPIC chips is at the top and one or a plurality of other chips are at the bottom, wherein the one or a plurality of other chips comprises the one or the plurality of NVM IC chips, the one or the plurality of volatile memory IC chips, the one or the plurality of cooperating or supporting IC chips (as described and specified above), and/or one or a plurality of processing and/or computing IC chips, for example, a Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip and/or Application Specific IC (ASIC) chip; (iii) the one or the plurality of standard commodity FPIC chips, and/or the one or a plurality of processing and/or computing IC chips are at the bottom, and the one or a plurality of other chips are at the top, wherein the one or a plurality of processing and/or computing IC chips at the bottom comprise the Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip and/or Application Specific IC (ASIC) chip; wherein the one or a plurality of other chips at the top comprise the one or the plurality of NVM IC chips, the one or the plurality of volatile memory IC chips, the one or the plurality of cooperating or supporting IC chips (as described and specified above); or (iv) the one or the plurality of standard commodity FPIC chips, and/or the one or a plurality of processing and/or computing IC chips are at the top, and the one or a plurality of other chips are at the bottom, wherein the one or a plurality of processing and/or computing IC chips at the top comprise the Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip and/or Application Specific IC (ASIC) chip; wherein the one or a plurality of other chips at the bottom comprise the one or the plurality of NVM IC chips, the one or the plurality of volatile memory IC chips, the one or the plurality of cooperating or supporting IC chips (as described and specified above).

The chip-on-chip package is formed by a hybrid bonding process to bond the copper pads and silicon oxide layer of the bottom chip or chips to those of top chip or chips. The dimension, in a horizontal direction, of each of the copper pads for hybrid bonding of each of the top and bottom chip or chips is smaller than 5, 3, 1 or 0.5 µm, or, between 0.1 and 5 µm, 0.1 and 3 µm, 0.1 and 1 µm, or 0.1 and 0.5 µm. The pitch between neighboring two of the copper pads for hybrid bonding of each of the top and bottom chip or chips is smaller than 10, 5, 2 or 1 µm, or, between 0.2 and 10 µm, 0.2 and 5 µm, 0.2 and 2 µm, or 0.2 and 1 µm. The hybrid bonding may be performed in the wafer-to-wafer bonding process with the top wafer (comprising the top chip or chips of the chip-on-chip package) bonded to the bottom wafer (comprising the bottom chip or chips of the chip-on-chip package). Alternatively, the separated/diced top chip or chips of the chip-on-chip package may be hybrid bonded to the bottom wafer comprising the bottom chip or chips of the chip-on-chip package; in this alternative case, a silicon vertical connector with silicon through vias (TSVs) in its silicon substrate may be in addition hybrid bonded to the wafer comprising bottom chip or chips. Each of the bottom chip or chips and the top chip or chips comprises a silicon substrate and through silicon vias (TSVs) and/or through field-oxide vias (TFOVs) in the silicon substrate, wherein the silicon substrate has a thickness thinner than 20, 10, 5, or 3 µm, or, between 0.5 and 20 µm, 0.5 and 10 µm, 0.3 and 5 µm or 0.3 and 3 µm, and the TSVs and/or TFOVs have a maximum dimension, in a horizontal direction, smaller than 20, 10, 5, 1 or 0.1 µm.

The bottom chip may comprise a power/ground distribution network, planes or scheme at its bottom for delivering and distributing power/ground supply voltage/current through the TSVs and/or TFOVs in its silicon substrate. The power/ground supply voltage/current of the top chip may be also from the power/ground distribution network, planes or scheme at the bottom of the bottom chip. The power/ground distribution network, planes or scheme may comprise a power layer or plane, a ground layer or plane and a power/ground distribution layer, each comprises an adhesion layer and a copper layer on the adhesion layer. Decoupling capacitor or capacitors may be formed using the power layer/plane and ground layer/plane as electrodes of the decoupling capacitor or capacitors; wherein an insulating dielectric layer between the power layer/plane and ground layer/plane with a high dielectric constant (for example, equal to or greater than 3, 5, 10, 30, 50 or 100) may be used, for example, the insulating dielectric material comprising silicon oxide, silicon nitride, oxynitride, hafnium silicate, zirconium silicate, hafnium dioxide or zirconium dioxide. The chip-on-chip package may comprise a top interconnection scheme on or over the back side (top) of the top chip, wherein metal contact pads, pillars or bumps are at the top of the chip-on-chip package. The signals for the top and bottom chips may be from the metal contact pads, pillars or bumps at top of the chip-on-chip package through the TSVs in the silicon connectors or the TSVs in the silicon substrate of the top chip; and the power/ground supply voltage/current for the top and bottom chips may be from the bottom of the chip-on-chip package. A heat spreader or sink may be attached to the backside (bottom) of the bottom chip. The heat spreader or sink may have openings or holes for the power/ground supply voltage/current to pass through, wherein metal contact pads, pillars or bumps are at or vertically under the bottom of the openings and holes of the heat spreader or sink, and at the bottom of the chip-on-chip package. Alternatively, the power/ground supply voltage/current for the top and bottom chips may be from the metal contact pads, pillars or bumps at top of the chip-on-chip package through the TSVs in the silicon connectors or the TSVs in the silicon substrate of the top chip; in this case, the heat spreader or sink may have no openings or holes for the power/ground supply voltage/current to pass through.

Another aspect of the disclosure provides a chip-on-chip package for use in the standard general-purpose commonalty system, device or logic drive based on the method, algorithm and/or architecture to optimize its performance in the 2D or 3D multichip package, wherein the chip-on-chip package comprises the one or the plurality of standard commodity FPIC chips, the one or the plurality of NVM IC chips (NAND flash, NOR flash, RRAM, FRAM and/or MRAM IC chips), the one or the plurality of volatile memory IC chips (SRAM or DRAM IC chips), and wherein the one or the plurality of standard commodity FPIC chips comprise FGFPGA, CGRA and/or CGFP IC chips, as described and specified above. The chip-on-chip package (including structures and method of formation) are as described and specified above, wherein the bottom and top chips may be arranged as: (i) the standard commodity FPIC chip is at the bottom, (ii) a first volatile memory IC (SRAM or DRAM) chip over and hybrid bonded to the standard commodity FPIC chip, (iii) a second volatile memory IC (SRAM or DRAM) chip over and hybrid bonded to the first volatile memory IC chip and/or (iv) the NVM IC chip (NAND flash, NOR flash, RRAM, FRAM and/or MRAM IC chip) over and hybrid bonded to the second volatile memory IC. The programmable, configurable and re-configurable circuits (for example, the programmable, configurable and re-configurable logic circuits and/or the programmable, configurable and re-configurable interconnection circuits) are now split and partitioned in two separated chips: the standard commodity FPIC chip and the first volatile memory IC (SRAM or DRAM) chip over and hybrid bonded to the standard commodity FPIC chip. The dimension, in a horizontal direction, of each of the copper pads for hybrid bonding of each of the standard commodity FPIC chip and first volatile memory IC chip is smaller than 5, 3, 1 or 0.5 μm, or, between 0.1 and 5 μm, 0.1 and 3 μm, 0.1 and 1 μm, or 0.1 and 0.5 μm. The pitch between neighboring two of the copper pads for hybrid bonding of each of the standard commodity FPGA IC chip and first volatile memory IC chip is smaller than 10, 5, 2 or 1 μm, or, between 0.2 and 10 μm, 0.2 and 5 μm, 0.2 and 2 μm, or 0.2 and 1 μm. Each of the standard commodity FPIC chip and the first volatile memory IC chip comprises a silicon substrate and through silicon vias (TSVs) and/or through field-oxide vias (TFOVs) in the silicon substrate, wherein the silicon substrate has a thickness thinner than 20, 10, 5 or 3 μm, or, between 0.5 and 20 μm, 0.5 and 10 μm, 0.3 and 5 μm, or 0.3 and 3 μm and the TSVs and/or TFOVs have a maximum dimension, in a horizontal direction, smaller than 20, 10, 5, 1 or 0.1 μm. The first volatile memory IC chip comprises memory cells for storing the programmable, configurable and re-configurable data or codes for programming, configurating and/or re-configurating the programmable, configurable and re-configurable logic and/or interconnection circuits on the standard commodity FPIC chip in the same chip-on-chip package. Each of the output points of the volatile memory cells (SRAM or DRAM) couples to an input point of the programmable, configurable and re-configurable logic and/or interconnection circuits on the standard commodity FPIC chip in the same chip-on-chip package, through the copper pads for hybrid bonding between the standard commodity FPIC chip and the first volatile memory chip. The second volatile memory IC (SRAM or DRAM) chip over and hybrid bonded to the first volatile memory IC chip may be used as the cache memory for the configured standard commodity FPIC chip, in the operating mode. The SRAM IC chip may comprise 6T SRAM cells. Alternatively, a third volatile memory IC chip may be, in addition, hybrid boded over and on the second volatile memory IC chip (and under the NVM IC chip) to increase the density or size of the cache memory. The NVM IC chip (NAND flash, NOR flash, RRAM, FRAM and/or MRAM IC chip) over and hybrid bonded to the second volatile memory IC is used for non-volatile storing and back-up the programmable, configurable and re-configurable data or codes in the volatile memory cells of the first volatile memory IC chip, and/or the operating data in the cache memory cells of the second volatile memory IC chip.

As a first example, for the case that the standard commodity FPIC chip is a FGFPGA IC chip (as described and specified above), the standard commodity FPIC chip now comprises: (i) the programmable, configurable and re-configurable interconnection circuits comprising configurable switches including pass/no-pass switching circuits or cross-point switches comprising pass/no-pass switching buffers and/or multiplexers, and/or (ii) the programmable, configurable and re-configurable logic circuits comprising multiplexers and/or selection circuits. The first volatile memory IC chip over and hybrid bonded to the standard commodity FPIC chip may comprises 6T SRAM cells for storing the programming, configuration and re-configuration data or codes for programming, configurating and re-configurating the pass/no-pass switching circuits or cross-point switches comprising pass/no-pass buffers and/or multiplexers and/or selection circuits on the standard commodity FPIC chip, through the copper pads for hybrid bonding between the standard commodity FPIC chip and the first volatile memory chip. The 6T SRAM cells on the first volatile memory chip may be arranged as the LUT for storing the resulting data or values, and the multiplexers or selection circuits on the standard commodity FPIC chip select one of the resulting data of values stored in the LUT as the output of a logic operation. The second and/or third volatile memory IC (SRAM or DRAM) chip, and the NVM IC chip are as described and specified above.

As a second example, for the case that the standard commodity FPIC chip is a CGRA IC chip, (as described and specified above), the standard commodity FPIC chip now comprises: (i) the array of a large number of function unit blocks, cells or elements (FUBs), each FUB comprises (a) a function unit (FU), (b) a register or flip-flop for temporarily storing the computing or processing output or result of the FU, (c) a register files for temporarily storing, updating, recycling or looping the computing or processing output data or result of the FU for use as input data at the FU input points, (d) a program counter (PC) used as an instruction address or an address pointer, wherein the program counter (PC) contains the address (location) of the instruction in the instruction memory section; and (ii) the programmable, configurable and re-configurable interconnection circuits comprising configurable switches including pass/no-pass switching circuits or cross-point switches comprising pass/no-pass buffers and/or multiplexers. The first volatile memory IC chip comprises the instruction memory sections comprising a plurality of volatile (for example, 6T SRAM) memory cells for storing programming software or codes comprising operation instructions for the FUs, as described and specified above. The instruction memory cells store the varieties of programming software or codes comprising the operation instructions in the instruction set, as described and specified above, for programming, configuring or reconfiguring the FUs in the FUBs of the standard commodity FPIC chip for varieties functions or applications, through the copper pads for hybrid bonding between the standard commodity FPIC chip and the first volatile memory chip. The second and/or third volatile memory IC (SRAM or DRAM) IC chip, and the NVM IC chip are as described and specified above.

As a third example, for the case that the standard commodity FPIC chip is a CGFP IC chip, (as described and specified above), the standard commodity CGFP IC chip now comprises: (i) the selection circuit programmed, configured or reconfigured for selecting resulting data or values stored in the CGLUT through and by the local row and column decoders as output data of a logic operation, (ii) the programmable, configurable and re-configurable interconnection circuits comprising configurable switches including pass/no-pass switching circuits or cross-point switches comprising pass/no-pass buffers and/or multiplexers. The first volatile memory IC chip comprises: (i) the plurality of dual-port SRAM cells, as described and specified above, in an array with m rows and n columns; (ii) a local row decoder and a local column decoder for selecting a group or set of resulting data stored in the Dual-Port SRAM cells located in the array at (x, y) addresses of the CGLUT, and (iii) a global row decoder and a global column decoder, as described and specified above. The Dual-Port SRAM cells on the first volatile IC chip, in addition, store the programming, configuration and/or re-configuration data to programming, configurating and/or re-configurating the multiplexers or the selection circuits, and programmable, configurable and re-configurable interconnection circuits on the standard commodity FPIC chip, as described and specified above. The second and/or third volatile memory IC (SRAM or DRAM) IC chip, and the NVM IC chip are as described and specified above.

Another aspect of the disclosure provides a standardized commodity logic drive in a multichip package comprising one or a plurality of FPIC chips or chiplets and one or a plurality of non-volatile memory IC chips or package for use in different algorithms, architectures and/or applications requiring logic, computing and/or processing functions by field programming, wherein data stored in the one or the plurality of non-volatile memory IC chips are used for configuring the one or the plurality of FPIC chips in the same multichip package. In some applications, the one or the plurality of FPIC chips or chiplets may be packaged in a package or packages first before packaged in the multichip package). Uses of the standardized commodity logic drive is analogues to the uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, but differs in that the latter has memory functions for data storage, while the former stores logic functions for processing and/or computing. The multichip package may be in a 2D format with IC chips disposed on the same horizontal plane or in a 3D stacked format having chips stacked vertically with at least two stacking layers. Alternatively, the multichip package may be in a format with IC chips both disposed in a horizontal plane (the 2D format) and stacked in the vertical direction (the 3D format).

The multichip packages in the 2D and 3D formats, when mentioned, include all types of multichip package disclosed in this invention, wherein one or the plurality of FPIC chips may be one of all types described and specified in this invention, for example, (i) the FPIC chip using on-chip SRAM cells for configuration and/or reconfiguration; (ii) the FPIC chip using on-chip non-volatile memory cells for configuration and/or reconfiguration; (iii) the FPIC chip using both on-chip SRAM cells and on-chip non-volatile memory cells for configuration and/or reconfiguration, wherein the configuration data in the on-chip SRAM cells is loaded from and backup in the on-chip non-volatile memory cells; (iv) the FPIC chip using off-chip SRAM cells (in a separated SRAM chip packaged in the same multichip package) for configuration and/or reconfiguration; (v) the FPIC chip using non-volatile memory cells in a separated non-volatile memory chip packaged in the same multichip package for configuring and/or reconfiguring the FPIC's on-chip SRAM cells, wherein the one or the plurality of non-volatile memory IC chips may comprise NAND Flash memory cells, NOR flash memory cells, Magnetoresistive Random Access Memory (MRAM) cells, Resistive Random Access Memory (RRAM) cells, or Ferroelectric Random Access Memory (FRAM) cells, (as described and specified above); (vi) the FPIC chip using non-volatile memory cells in a separated non-volatile memory chip packaged in the same multichip package for configuring and/or reconfiguring the SRAM cells in a separated SRAM chip packaged in the same multichip package, wherein the separated non-volatile memory chip may comprise NAND flash memory cells, NOR flash memory cells, Magnetoresistive Random Access Memory (MRAM) cells, Resistive Random Access Memory (RRAM) cells, or Ferroelectric Random Access Memory (FRAM) cells. The standardized commodity logic drive in multichip package (in all types of 2D and 3D formats) may further comprise the one or the plurality of cooperating or supporting (CS) IC chips (as described and specified above), and/or computing and processing IC chips comprising Digital Signal Processor (DSP), Graphic Processing Unit (GPU), Data Processing Unit (DPU), Tensor flow Processing Unit (TPU), Micro-Control Unit (MCU), Artificial Intelligent Unit (MU), Machine Learning Unit (MLU), and/or Application Specific IC (ASIC) chip.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIGS. 1A-1C are a schematic view showing block diagrams of various types of field programmable logic cells or elements in accordance with an embodiment of the present application

Figure 32:
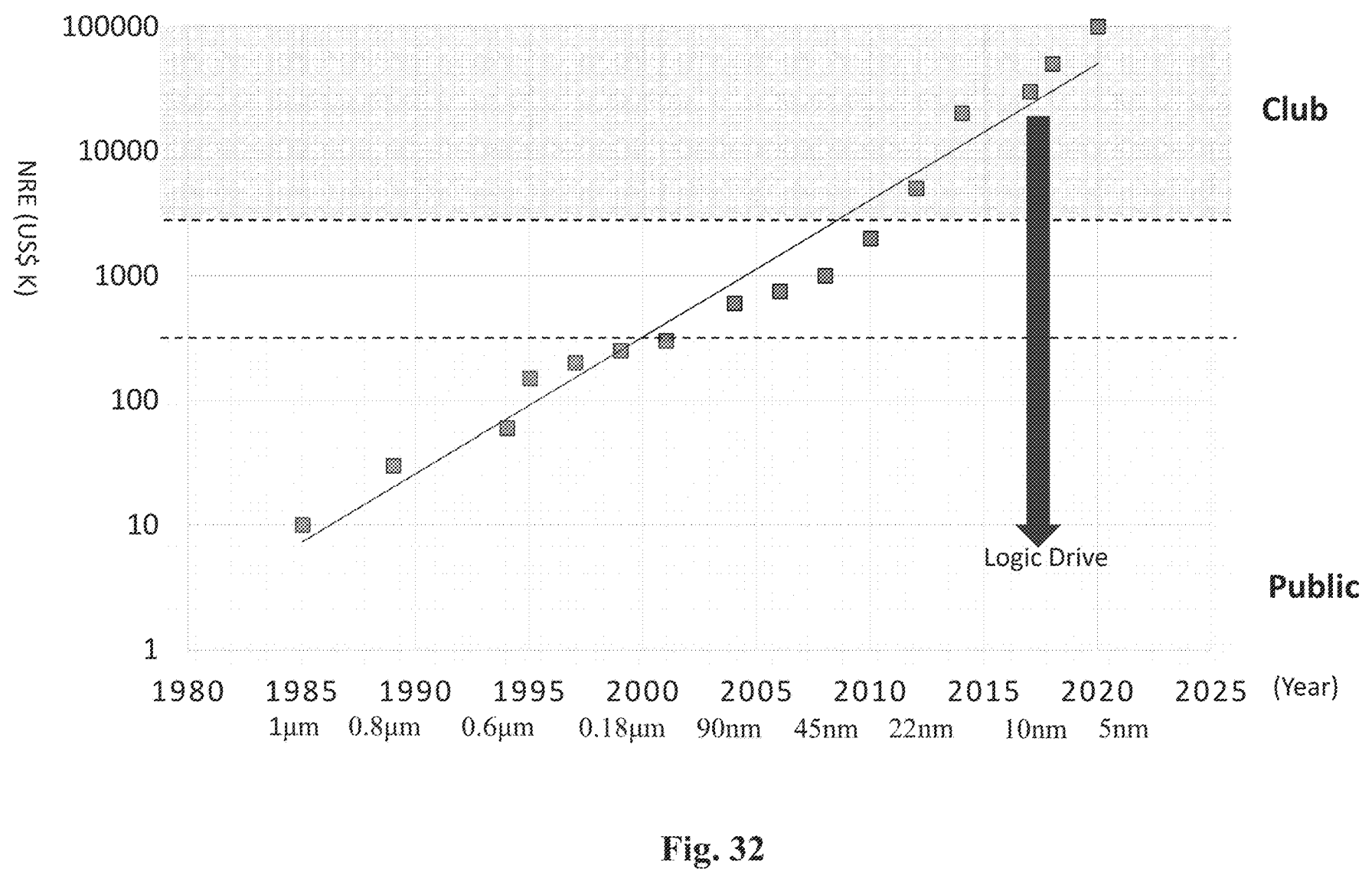

FIG. 32 is a chart showing a trend of relationship between non-recurring engineering (NRE) costs and technology nodes.

Figures 2A, 2B:
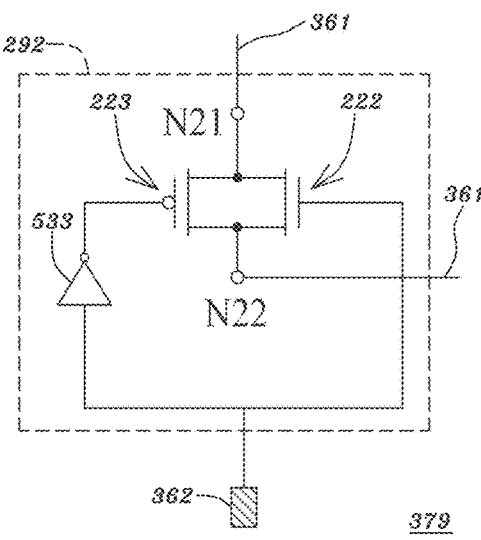
FIGS. 2A and 2B are circuit diagrams illustrating various types of of field programmable switch cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE
DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Field Programmable Logic Cell or Element
1. First Type of Field Programmable Logic Cell or Element FIG. 1A is a schematic view showing a block diagram of a first type of field programmable logic cell or element in accordance with an embodiment of the present application. Referring to FIG. 1A, the first type of field programmable logic cell or element (LCE) 2014, i.e., field configurable logic cell or element, may be configured to perform logic operation on its input data set, i.e., A0 and A1. The first type of field programmable logic cell or element (LCE) 2014, i.e., logic gate or circuit, may include (1) multiple memory cells 490, i.e., configuration-programming-memory (CPM) cells, each configured to save or store one of resulting values or programming codes, e.g., D0, D1, D2 and D3, of its look-up table (LUT) 210, i.e., CPM data, and (2) a selection circuit 211, such as multiplexer, coupling to its memory cells 490 and configured to receive the resulting values of its look-up table (LUT) 210. For the field programmable logic cell or element (LCE) 2014, its selection circuit 211 may include a first set of two input points arranged in parallel for a first input data set of its selection circuit 211 associated with the input data set, i.e., A0 and A1, of the first type of field programmable logic cell or element (LCE) and a second set of four input points arranged in parallel for a second input data set, e.g., D0, D1, D2 and D3, of its selection circuit 211 each associated with one of the resulting values or programming codes of its look-up table (LUT) 210 saved or stored in its memory cells 490. Its selection circuit 211 is configured to select, in accordance with the first input data set, e.g., A0 and A1, of its selection circuit 211, a data input from the second input data set, e.g., D0, D1, D2 and D3, of its selection circuit 211 as a data output, i.e., Dout, of its selection circuit 211 for output data of the first type of field programmable logic cell or element (LCE) 2014. Each of its memory cells 490 may be (1) a volatile memory cell, such as static-random-access-memory (SRAM) cell, or (2) a non-volatile memory cell, such as magnetoresistive random-access-memory (MRAM) cell, resistive random-access-memory (RRAM) cell or floating-gate containing memory cell.

2. Second Type of Field Programmable Logic Cell or Element

FIG. 1B is a schematic view showing a block diagram of a second type of field programmable logic cell or element in accordance with an embodiment of the present application. Referring to FIG. 1B, the second type of field programmable logic cell or element (LCE) 2014 may be configured to perform logic operation on its input data set, i.e., A0-A3, including (1) two logic gates or circuits 2031 each provided with (i) a selection circuit (not shown), such as multiplexer, having a first set of three data inputs coupling to three data inputs A0-A2 of the input data set A0-A3 of the second type of field programmable logic cell or element (LCE) 2014 and (ii) multiple memory cells, i.e., configuration-programming-memory (CPM) cells, (not shown) for storing multiple resulting values, i.e., CPM data, therein respectively, coupling to a second set of data inputs of the selection circuit, wherein each of the memory cells of each of its two logic gates or circuits 2031 may be a volatile memory cell, such as static-random-access-memory (SRAM) cell, or a non-volatile memory cell, such as magnetoresistive random-access-memory (MRAM) cell, resistive random-access-memory (RRAM) cell or floating-gate containing memory cell, wherein the selection circuit may select, in accordance with the first set of three data inputs of the selection circuit, input data from the second set of data inputs of the selection circuit as a data output of the selection circuit, (2) a fixed-wired adding unit 2016, i.e., full adder, having two-bit data inputs each coupling to the data output of the selection circuit of one of its two logic gates or circuits 2031, wherein its fixed-wired adding unit 2016 may be configured to take a carry-in data input of its fixed-wired adding unit 2016 coupling to a data input Cin of the second type of field programmable logic cell or element (LCE) 2014, which passes from a carry-out data output, i.e., Cout, of another fixed-wired adding unit 2016 of another second type of field programmable logic cell or element (LCE) 2014 in a previous stage, into account to add the two-bit data inputs of its fixed-wired adding unit 2016 as a first data output of its fixed-wired adding unit 2016 for a sum of addition and a second data output, i.e., carry-out data output, of its fixed-wired adding unit 2016 for a carry of addition coupling to a data output Cout of the second type of field programmable logic cell or element (LCE) 2014, which passes to a carry-in data input, i.e., Cin, of another adding unit 2016 of another second type of field programmable logic cell or element (LCE) 2014 in a next stage, (3) a multiplexer 2032, i.e., LUT selection multiplexer, having a first set of data input coupling to a data input A3 of the input data set A0-A3 of the second type of field programmable logic cell or element (LCE) 2014 and a second set of two data inputs each coupling to the data output of the selection circuit of one of its two logic gate or circuits 2031, wherein its multiplexer 2032 may select, in accordance with the first set of data input of its multiplexer 2032, input data from the second set of two data inputs of its multiplexer 2032 as a data output of its multiplexer 2032, (4) a multiplexer 2033, i.e., addition-selection multiplexer, having a first set of data input coupling to a programming code stored in a memory cell (not shown) of the second type of field programmable logic cell or element (LCE) 2014, which may be a volatile memory cell, such as static-random-access-memory (SRAM) cell, or a non-volatile memory cell, such as magnetoresistive random-access-memory (MRAM) cell, resistive random-access-memory (RRAM) cell or floating-gate containing memory cell, and a second set of two data inputs coupling to the first data output of its fixed-wired adding unit 2016 and the data output of its multiplexer 2032 respectively, wherein its multiplexer 2033 may select, in accordance with the first set of data input of its multiplexer 2033, input data from the second set of two data inputs of its multiplexer 2033 as a data output of its multiplexer 2033 that may be asynchronous, (5) a D-type flip-flop circuit 2034 having a first data input coupling to the data output of its multiplexer 2033 to be registered or stored therein and a second data input coupling to a clock signal clk on a clock bus 2035, wherein its D-type flip-flop circuit 2034 may synchronously generate, in accordance with the second data input of its D-type flip-flop circuit 2034, a data output associated with the first data input of its D-type flip-flop circuit 2034, wherein the data output of its D-type flip-flop circuit 2034 may be synchronous with the clock signal clk, and (6) a multiplexer 2036, i.e., synchronization-selection multiplexer, having a first set of data input coupling to a memory cell (not shown) of the second type of field programmable logic cell or element (LCE) 2014, which may be a volatile memory cell, such as static-random-access-memory (SRAM) cell, or a non-volatile memory cell, such as magnetoresistive random-access-memory (MRAM) cell, resistive random-access-memory (RRAM) cell or floating-gate containing memory cell, and a second set of two data inputs coupling to the data output of its multiplexer 2033 and the data output of its D-type flip-flop circuit 2034 respectively, wherein its multiplexer 2036 may select, in accordance with the first set of data input of its multiplexer 2036, input data from the second set of two data inputs of its multiplexer 2036 as a data output, i.e., Dout, of its multiplexer 2036 for output data of the second type of field programmable logic cell or element (LCE) 2014.

3. Third Type of Field Programmable Logic Cell or Element

FIG. 1C is a schematic view showing a block diagram of a third type of field programmable logic cell or element in accordance with an embodiment of the present application. Referring to FIG. 1C, the third type of field programmable logic cell or element (LCE) 2014 may be configured to perform logic operation on its input data set, i.e., A0-A3 and Cin, including a logic operator or circuit 2037 having (1) a selection circuit (not shown), such as multiplexer, having a first set of data inputs coupling to four-bit data inputs, i.e., A0-A3, of the input data set of the third type of field programmable logic cell or element (LCE) 2014 and a carry-in data input, i.e., Cin, of the input data set of the third type of field programmable logic cell or element (LCE) 2014 respectively, (2) a first set of memory cells, i.e., configuration-programming-memory (CPM) cells, (not shown), for storing multiple resulting values, i.e., CPM data, therein respectively, coupling to a second set of data inputs of the selection circuit and (3) a second set of memory cells, i.e., configuration-programming-memory (CPM) cells, (not shown), for storing multiple resulting values, i.e., CPM data, therein respectively, coupling to a third set of data inputs of the selection circuit, wherein each of the first and second sets of memory cells of the logic operator or circuit 2037 may be a volatile memory cell, such as static-random-access-memory (SRAM) cell, or a non-volatile memory cell, such as magnetoresistive random-access-memory (MRAM) cell, resistive random-access-memory (RRAM) cell or floating-gate containing memory cell, wherein the selection circuit is configured to select, in accordance with the first set of data inputs of the selection circuit, input data from the second set of data inputs of the selection circuit as a first data output of the selection circuit and select, in accordance with the first set of data inputs of the selection circuit, input data from the third set of data inputs of the selection circuit as a second data output of the selection circuit. In an example, when its logic operator or circuit 2037 performs an addition operation, its logic operator or circuit 2037 may be configured to take the carry-in data input, i.e., Cin, of the input data set of the third type of field programmable logic cell or element (LCE) 2014 from a carry-out data output Cout of another third type of field programmable logic cell or element (LCE) 2014 in a previous stage into account to add two-bit digits (A0, A1) of the input data set of the third type of field programmable logic cell or element (LCE) 2014 and two-bit digits (A2, A3) of the input data set of the input data set of the third type of field programmable logic cell or element (LCE) 2014 as a sum of addition of the two two-bit digits (A0, A1) and (A2, A3) at the first data output of the selection circuit and a carry of addition of the two two-bit digits (A0, A1) and (A2, A3) at the second data output of the selection circuit for a carry-out data output, i.e., Cout, of output data of the third type of field programmable logic cell or element (LCE) 2014, which may be associated with a carry-in data input Cin of another third type of field programmable logic cell or element (LCE) 2014 in a next stage. In another example, when its logic operator or circuit 2037 performs a logic operation, its logic operator or circuit 2037 may be configured to select, in accordance with the four-bit data inputs, i.e., A0-A3, of the input data set of the third type of field programmable logic cell or element (LCE) 2014, input data from the second set of data inputs of the selection circuit as a data output of the logic operation at the first data output of the selection circuit.

Referring to FIG. 1C, the third type of field programmable logic cell or element (LCE) 2014 may further include (1) a cascade circuit 2038 provided with a logic gate having a first data input associated with a data input, i.e., Cas_in, of the third type of field programmable logic cell or element (LCE) 2014 for cascade data passed through one or more hard wires from a data output, i.e., Cas_out, of another third type of field programmable logic cell or element (LCE) 2014 in a previous stage and a second data input associated with the first data output of the selection circuit of its logic operator or circuit 2037, wherein the logic gate of its cascade circuit 2038 may perform AND or OR logic operation on the first and second data inputs of its cascade circuit 2038 as a data output of its cascade circuit 2038, wherein the data output of its cascade circuit 2038 may be asynchronous, (2) a D-type flip-flop circuit 2039 having a first data input coupling to the data output of its cascade circuit 2038 to be registered or stored therein and a second data input coupling to a clock signal on a clock bus 2040, wherein its D-type flip-flop circuit 2039 may synchronously generate, in accordance with the second data input of its D-type flip-flop circuit 2039, a data output associated with the first data input of its D-type flip-flop circuit 2039, wherein the data output of its D-type flip-flop circuit 2039 may be synchronous with the clock signal, (3) a set-reset control circuit 2041 coupling to its D-type flip-flop circuit 2039 to set, reset or unchange its D-type flip-flop circuit 2039 in accordance with two data inputs of its set-reset control circuit 2041 coupling respectively to two data inputs, i.e., F0 and F1, of the third type of field programmable logic cell or element (LCE) 2014, and (4) a clock control circuit 2042 coupling to its D-type flip-flop circuit 2039 through the clock bus 2040, wherein its clock control circuit 2042 is configured to generate, in accordance with two data inputs of its clock control circuit 2042 coupling to two data inputs, i.e., CLK0 and CLK1, of the third type of field programmable logic cell or element (LCE) 2014 respectively, the clock signal on the clock bus 2040 in one of various modes. For example, its clock control circuit 2042 may be controlled to be enabled or disabled in accordance with the data input, i.e., CLK0, of the third type of field programmable logic cell or element (LCE) 2014. The clock signal may be controlled in a mode to be the same as a reference clock in accordance with the data input, i.e., CLK1, of the third type of field programmable logic cell or element (LCE) 2014, or the clock signal may be controlled in another mode to be inverted to the reference clock in accordance with the data input, i.e., CLK1, of the third type of field programmable logic cell or element (LCE) 2014.

Referring to FIG. 1C, the third type of field programmable logic cell or element (LCE) 2014 may further include a multiplexer 2043, i.e., synchronization-selection multiplexer, having a first set of data input coupling to a memory cell (not shown) of the third type of field programmable logic cell or element (LCE) 2014, which may be a volatile memory cell, such as static-random-access-memory (SRAM) cell, or a non-volatile memory cell, such as magnetoresistive random-access-memory (MRAM) cell, resistive random-access-memory (RRAM) cell or floating-gate containing memory cell, and a second set of two data inputs coupling to the data output of its cascade circuit 2038 and the data output of its D-type flip-flop circuit 2039 respectively, wherein its multiplexer 2043 may select, in accordance with the first set of data input of its multiplexer 2043, input data from the second set of two data inputs of its multiplexer 2043 as a data output, i.e., Dout, of its multiplexer 2043 for output data of the third type of field programmable logic cell or element (LCE) 2014. The third type of field programmable logic cell or element (LCE) 2014 may further include a data output, i.e., Cas_out, for cascade data coupling to the data output of its cascade circuit 2038, wherein the data output, i.e., Cas_out, of the third type of field programmable logic cell or element (LCE) 2014 may be passed through one or more hard wires to the data input, i.e., Cas_in, of another third type of field programmable logic cell or element (LCE) 2014 in a next stage.

Specification for Field Programmable Switch Cell

1. First Type of Field Programmable Switch Cell

FIG. 2A is a circuit diagram illustrating programmable interconnects controlled by a first type of field programmable switch cell in accordance with an embodiment of the present application. Referring to FIG. 2A, the first type of field programmable switch cell 379, i.e., field-programmable interconnection (FPI) circuits or configurable switch cell, is configured to control coupling of its multiple nodes, i.e., N21 and N22, including (1) a pass/no-pass switch 292 composed of an N-type metal-oxide-semiconductor (MOS) transistor 222, a P-type metal-oxide-semiconductor (MOS) transistor 223 coupling in parallel to the N-type metal-oxide-semiconductor (MOS) transistor 222, wherein each of the N-type and P-type metal-oxide-semiconductor (MOS) transistors 222 and 223 may be configured to form a channel between two opposites nodes N21 and N22 of the first type of field programmable switch cell 379 coupling to two programmable interconnects 361 respectively, and an inverter 533 having an input point coupling to a gate terminal of the N-type MOS transistor 222 and an output point coupling to a gate terminal of the P-type MOS transistor 223, wherein the inverter 533 is configured to invert a data input of the inverter 533 at the input point of the inverter 533 as a data output of the inverter 533 at the output point of the inverter 533, and (2) a memory cell 362, i.e., configuration-programming-memory (CPM) cell, configured for storing or saving a programming code, i.e., CPM data, therein, wherein its memory cell 362 couples to the input point of the inverter 533 of its pass/no-pass switch 292 and the gate terminal of the N-type MOS transistor 222 of its pass/no-pass switch 292. Thereby, its pass/no-pass switch 292 is configured to control, in accordance with a data input of its pass/no-pass switch 292 associated with the programming code stored or saved in its memory cell 362, coupling between the two programmable interconnects 361.

2. Second Type of Field Programmable Switch Cell

FIG. 2B is a circuit diagram illustrating programmable interconnects controlled by a second type of field programmable switch cell in accordance with an embodiment of the present application. Referring to FIG. 2B, the second type of field programmable switch cell 379, i.e., field-programmable interconnection (FYI) circuits or configurable switch cell, is configured to control coupling of its multiple nodes, i.e., N23-N26, including (1) four sets of memory cells 362, i.e., configuration-programming-memory (CPM) cells, at its front, rear, left and right sides respectively, wherein each set of its four sets of memory cells 362 is configured to store or save first and second sets of programming code, i.e., CPM data, (2) four selection circuits 211, such as multiplexer, at its front, rear, left and right sides respectively, wherein each of its four selection circuits 211 may be configured to select, in accordance with a first input data set thereof at a first set of input points thereof associated with a first set of programming codes saved or stored in a set of its four sets of memory cells 362, a data input from a second input data set thereof at a second set of three input points thereof as a data output thereof at an output point thereof, and (2) four pass/no-pass switches 292 at its front, rear, left and right sides respectively, wherein each of its four pass/no-pass switches 292 may have an input point coupling to the output point of one of its four selection circuits 211 to be configured to control, in accordance with a first data input thereof associated with a second set of programming codes saved or stored in a set of its four sets of memory cells 362, coupling between the input point thereof for a second data input thereof associated with the data output of said one of its four selection circuits 211 and an output point thereof for a data output thereof and amplify the second data input thereof as the data output thereof at the output point thereof to act as one of four data outputs of the second type of field programmable switch cell 379 at one of its four nodes N23, N24, N25 and N26. Each of the second set of three input points of each of its four selection circuits 211 may couple to one of the second set of three input points of each of another two of its four selection circuits 211 and to the output point of one of its four pass/no-pass switches 292, the input point of which couples to the output point of the other of its four pass/no-pass switches 292. Thereby, each of its four selection circuits 211 may select, in accordance with the first input data set thereof at the first set of input points thereof associated with a first set of programming codes saved or stored in a specific set of its four sets of memory cells 362, a data input from the second input data set thereof at the second set of three input points thereof coupling respectively to three of its four nodes N23, N24, N25 and N26 coupling respectively to four programmable interconnects 361 extending in four different directions respectively, and one of its four pass/no-pass switches 292, the input point of which couples to the output point of said each of its four pass/no-pass switches 292, may be switched, in accordance with the first data input thereof associated with a second set of programming codes saved or stored in the specific set of its four sets of memory cells 362, to pass the second data input thereof as the data output thereof at the other of its four nodes N23, N24, N25 and N26. For example, a front one of its selection circuits 211 may select, in accordance with the first input data set thereof at the first set of input points thereof associated with a first set of programming codes saved or stored in a front set of its four sets of memory cells 362, a data input from the second input data set thereof at the second set of three input points thereof coupling respectively to three nodes N24, N25 and N26 of its four nodes N23, N24, N25 and N26 at its left, rear and right sides, and a front one of its four pass/no-pass switches 292 may be switched, in accordance with the first data input thereof associated with a second set of programming codes saved or stored in the front set of its four sets of memory cells 362, to pass the second data input thereof as the data output thereof at the other node N23 of its four nodes N23, N24, N25 and N26. Accordingly, data from one of the four programmable interconnects 361 coupling respectively to its four nodes N23, N24, N25 and N26 may be switched by the second type of field programmable switch cell 379 to be passed to another one, two or three of the four programmable interconnects 361. Each of its four sets of memory cells 362 may be (1) a volatile memory cell, such as static-random-access-memory (SRAM) cell, or (2) a non-volatile memory cell, such as magnetoresistive random-access-memory (MRAM) cell, resistive random-access-memory (RRAM) cell or floating-gate containing memory cell.

Specification for Semiconductor Integrated-Circuit (IC) Chip

1. First Type of Semiconductor Integrated-Circuit (IC) Chip

Figure 3A:
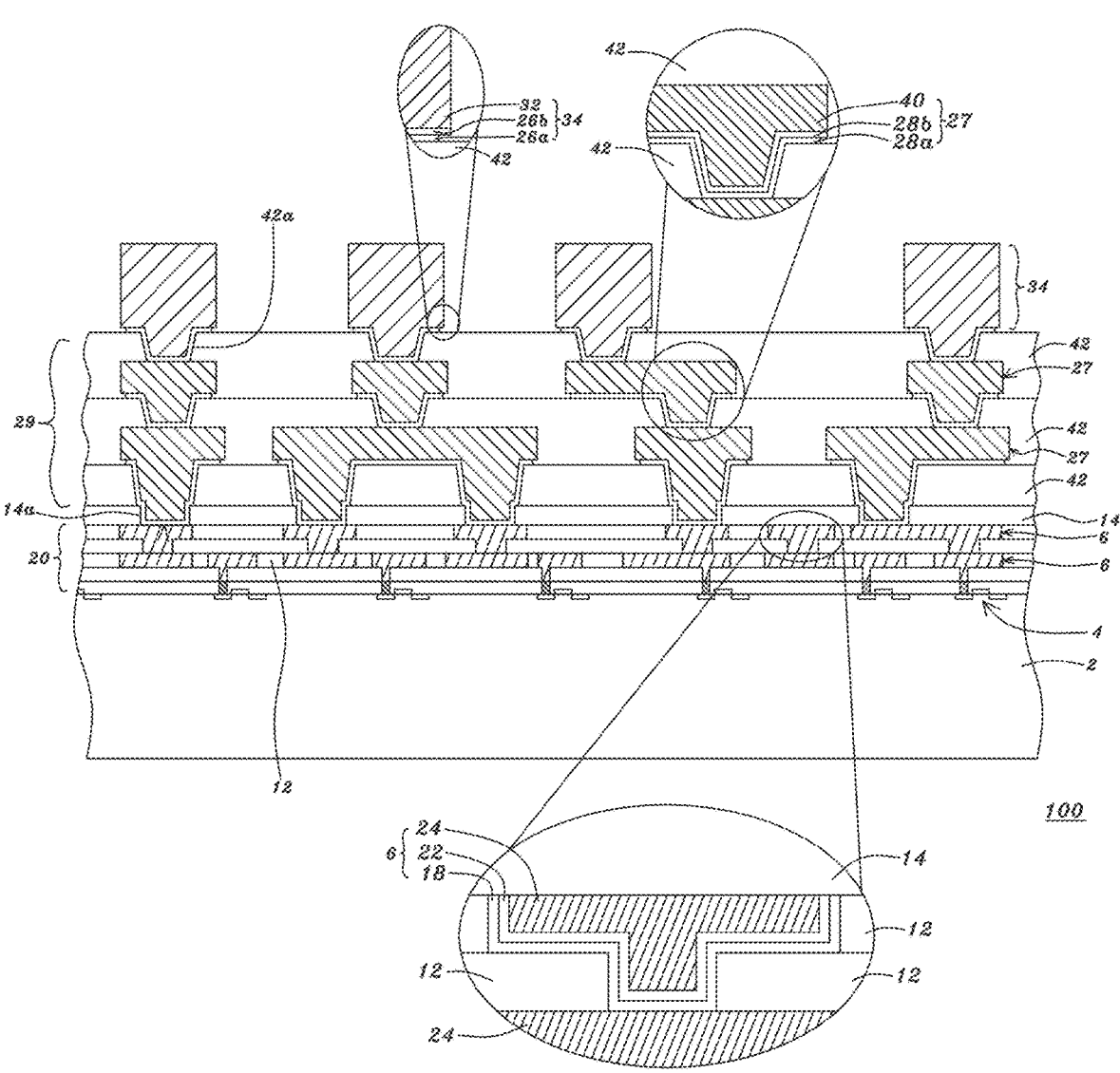
FIGS. 3A-3F are schematically cross-sectional views showing various types of semiconductor integrated-circuit (IC) chips in accordance with an embodiment of the present application.

FIG. 3A is a schematically cross-sectional view showing a first type of semiconductor IC chip in accordance with an embodiment of the present application. Referring to FIG. 3A, the first type of semiconductor IC chip 100 may include (1) a semiconductor substrate 2, such as silicon substrate, GaAs substrate, SiGe substrate or silicon-on-insulator (SOI) substrate, having a thickness in a vertical direction between 0.3 and 300 micrometers or between 0.3 and 10 micrometers; (2) multiple semiconductor devices 4, such as planar metal-oxide-semiconductor (MOS) transistors, fin field effective transistors (FINFETs), gate-all-around field effective transistors (GAAFETs) or passive devices, at a top surface of its semiconductor substrate 2; (3) a first interconnection scheme for a chip (FISC) 20 over its semiconductor substrate 2, provided with one or more interconnection metal layers 6 coupling to its semiconductor devices 4 and one or more insulating dielectric layers 12 each between neighboring two of its interconnection metal layers 6, wherein each of its one or more interconnection metal layers 6 may have a thickness between 0.1 and 2 micrometers; (4) a passivation layer 14 over its first interconnection scheme for a chip (FISC) 20, wherein multiple openings 14a in its passivation layer 14 may be aligned with and over multiple metal pads of the topmost one of the interconnection metal layers 6 of its first interconnection scheme for a chip (FISC) 20; (5) a second interconnection scheme for a chip (SISC) 29 optionally provided over its passivation layer 14, provided with one or more interconnection metal layers 27 coupling to the topmost one of the interconnection metal layers 6 of its first interconnection scheme for a chip (FISC) 20 through the openings 14*a* in its passivation layer 14 and one or more polymer layers 42, i.e., insulating dielectric layers, each between neighboring two of its interconnection metal layers 27, under a bottommost one of its interconnection metal layers 27 or over a topmost one of its interconnection metal layers 27, wherein multiple openings 42*a* in the topmost one of its polymer layers 42 may be aligned with and over multiple metal pads of the topmost one of the interconnection metal layers 27 of its second interconnection scheme for a chip (SISC) 29, wherein each of the interconnection metal layers 27 of its second interconnection scheme for a chip (SISC) 29 may have a thicknesses between 3 and 5 microm- eters; and (6) multiple micro-bumps, micro-pillars or micro- pads 34 on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20.

For the first type of semiconductor IC chip 100 in case for a field-programmable-gate-array (FPGA) IC chip or chiplet mentioned in the following paragraphs, its semiconductor devices 4 may be provided with (1) a first group thereof for any type of the first, second and third types of field pro- grammable logic cells or elements (LCEs) 2014 as illus- trated in FIGS. 1A-1C to be arranged in the first type of semiconductor IC chip 100 and (2) a second group thereof for either type of the first and second types of field pro- grammable switch cell 379 as illustrated in FIGS. 2A and 2B to be arranged in the first type of semiconductor IC chip 100.

Referring to FIG. 3A, for the first type of semiconductor IC chip 100, each of the interconnection metal layers 6 of its first interconnection scheme for a chip (FISC) 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. Each of the interconnection metal layers 6 of its first intercon- nection scheme for a chip (FISC) 20 may be patterned with a metal line or trace having a thickness between 0.05 and 2 micrometers, 0.05 and 1 micrometers, 0.1 and 2 microm- eters, 0.05 and 1 micrometers, between 3 nm and 1,000 nm or between 10 nm and 500 nm, or thinner than or equal to 5 nm, 10 nm, 30 nm, 50 nm, 100 nm, 200 nm, 300 nm, 500 nm or 1,000 nm and a width between 3 nm and 1,000 nm, 0.05 and 1 micrometers or 10 nm and 500 nm, or narrower than 5 nm, 10 nm, 20 nm, 30 nm, 70 nm, 100 nm, 300 nm, 500 nm or 1,000 nm, for example. Alternatively, the metal line or trace of each of the interconnection metal layers 6 of its first interconnection scheme for a chip (FISC) 20 may have the copper layer 24 with a thickness between 0.05 and 1 micrometers. Each of the insulating dielectric layers 12 of its first interconnection scheme for a chip (FISC) 20 may be made of a layer of silicon oxide or silicon oxycarbide having a thickness between 0.1 and 2 micrometers, between 3 nm and 1,000 nm or between 10 nm and 500 nm, or thinner than 5 nm, 10 nm, 30 nm, 50 nm, 100 nm, 200 nm, 300 nm, 500 nm or 1,000 nm. Alternatively, the topmost one of the interconnection metal layers 6 of its first interconnection scheme for a chip (FISC) 20 may be made of a layer of aluminum having a thickness between 1 and 5 micrometers.

Referring to FIG. 3A, for the first type of semiconductor IC chip 100, its passivation layer 14 containing a silicon- nitride, SiON or SiCN layer having a thickness greater than 0.3 μm for example and, alternatively, a polymer layer having a thickness between 1 and 10 μm may protect the semiconductor devices 4 and the interconnection metal layers 6 from being damaged by moisture foreign ion contamination, or from water moisture or contamination form external environment, for example sodium mobile ions. Each of the openings 14*a* in its passivation layer 14 may have a transverse dimension, from a top view, of between 0.5 and 20 μm.

Referring to FIG. 3A, for the first type of semiconductor IC chip 100, each of the interconnection metal layers 27 of its second interconnection scheme for a chip (SISC) 29 may include (1) a copper layer 40 having lower portions in openings in one of the polymer layers 42 having a thickness of between 0.3 μm and 20 μm, and upper portions having a thickness between 0.2 μm and 20 μm, 0.2 μm and 5 μm or 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 of its second interconnection scheme for a chip (SISC) 29 may be patterned with a metal line or trace having a thickness between, for example, 0.2 μm and 20 μm, 0.2 μm and 5 μm, 0.3 μm and 20 μm, 0.5 μm and 10 μm, 1 μm and 5 μm, 1 μm and 10 μm, or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm, or 2 μm and 10 μm, or wider than or equal to 0.3 μm, 0.5 μm, 0.7 μm, 1 μm, 1.5 μm, 2 μm or 3 μm, wherein the metal line or trace of each of the interconnection metal layers 27 of its second inter- connection scheme for a chip (SISC) 29 may have a copper layer 40 with a thickness in a vertical direction between 0.2 and 5 micrometers. Each of the polymer layers 42 of its second interconnection scheme for a chip (SISC) 29 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm. The combination of the interconnection metal layers 27 of its second interconnection scheme for a chip (SISC) 29 and the interconnection metal layers 6 of its first interconnection scheme for a chip (FISC) 20 may be formed for any of the programmable interconnects 361 as illustrated in FIGS. 2A and 2B.

Referring to FIG. 3A, for the first type of semiconductor IC chip 100, each of its micro-bumps, micro-pillars or micro-pads 34 may be of one type of various types, i.e., first through fourth types. A first type of micro-bumps, micro- pillars or micro-pads 34 may include, as seen in FIG. 3A, (1) an adhesion layer 26*a*, such as titanium (Ti) or titanium nitride (TiN) layer having a thickness of between 1 nm and 50 nm, on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20, (2) a seed layer 26b, such as copper, on its adhesion layer 26a and (3) a copper layer 32 having a thickness of between 1 μm and 60 μm on its seed layer 26b.

Alternatively, a second type of micro-bumps, micro-pillars or micro-pads 34 may include the adhesion layer 26a, seed layer 26b and copper layer 32 as mentioned above, and may further include a tin-containing solder cap made 33 (shown in other figures) of tin or a tin-silver alloy, which has a thickness of between 1 μm and 50 μm on its copper layer 32.

Alternatively, its third type of micro-bumps, micro-pillars or micro-pads 34 may be thermal compression bumps, each including the adhesion layer 26a and seed layer 26b as mentioned above for its first type of micro-bumps, micro-pillars or micro-pads 34, and further including (1) a copper layer having a thickness between 2 μm and 20 μm, such as 3 μm, and a largest transverse dimension w3, such as diameter in a circular shape, between 1 μm and 15 μm, such as 3 μm, on the seed layer 26b of its third type of micro-bumps, micro-pillars or micro-pads 34 and (2) a solder cap made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, between 1 μm and 15 μm, such as 3 μm, on the copper layer of its third type of micro-bumps, micro-pillars or micro-pads 34. Its third type of micro-bumps, micro-pillars or micro-pads 34 are formed respectively on multiple metal pads provided by a frontmost one of the interconnection metal layers 27 of its second interconnection scheme for a chip (SISC) 29 or by, if the second interconnection scheme for a chip (SISC) 29 is not provided, a frontmost one of the interconnection metal layers 6 of its first interconnection scheme for a chip (FISC) 20, wherein each of the metal pads may have a thickness between 1 and 10 micrometers or between 2 and 10 micrometers and a largest transverse dimension, such as diameter in a circular shape, between 1 μm and 15 μm, such as 5 μm. A pitch between neighboring two of its third type of micro-bumps, micro-pillars or micro-pads 34 may be between 3 μm and 20 μm.

Alternatively, its fourth type of micro-bumps, micro-pillars or micro-pads 34 may be thermal compression pads, each including the adhesion layer 26a and seed layer 26b as mentioned above doe its first type of micro-bumps, micro-pillars or micro-pads 34, and further including (1) a copper layer having a thickness between 1 μm and 10 μm or between 2 and 10 micrometers and a largest transverse dimension w2, such as diameter in a circular shape, between 1 μm and 15 μm, such as 5 μm, on the seed layer 26b of its fourth type of micro-bumps, micro-pillars or micro-pads 34 and (2) a metal cap made of a tin-silver alloy, a tin-gold alloy, a tin-copper alloy, a tin-indium alloy, indium, tin or gold, which has a thickness of between 0.1 μm and 5 μm, such as 1 μm, on the copper layer of its fourth type of micro-bumps, micro-pillars or micro-pads 34. Neighboring two of its fourth type of micro-bumps, micro-pillars or micro-pads 34 may have a pitch between 3 μm and 20 μm.

2. Second Type of Semiconductor IC Chip

Figure 3B:
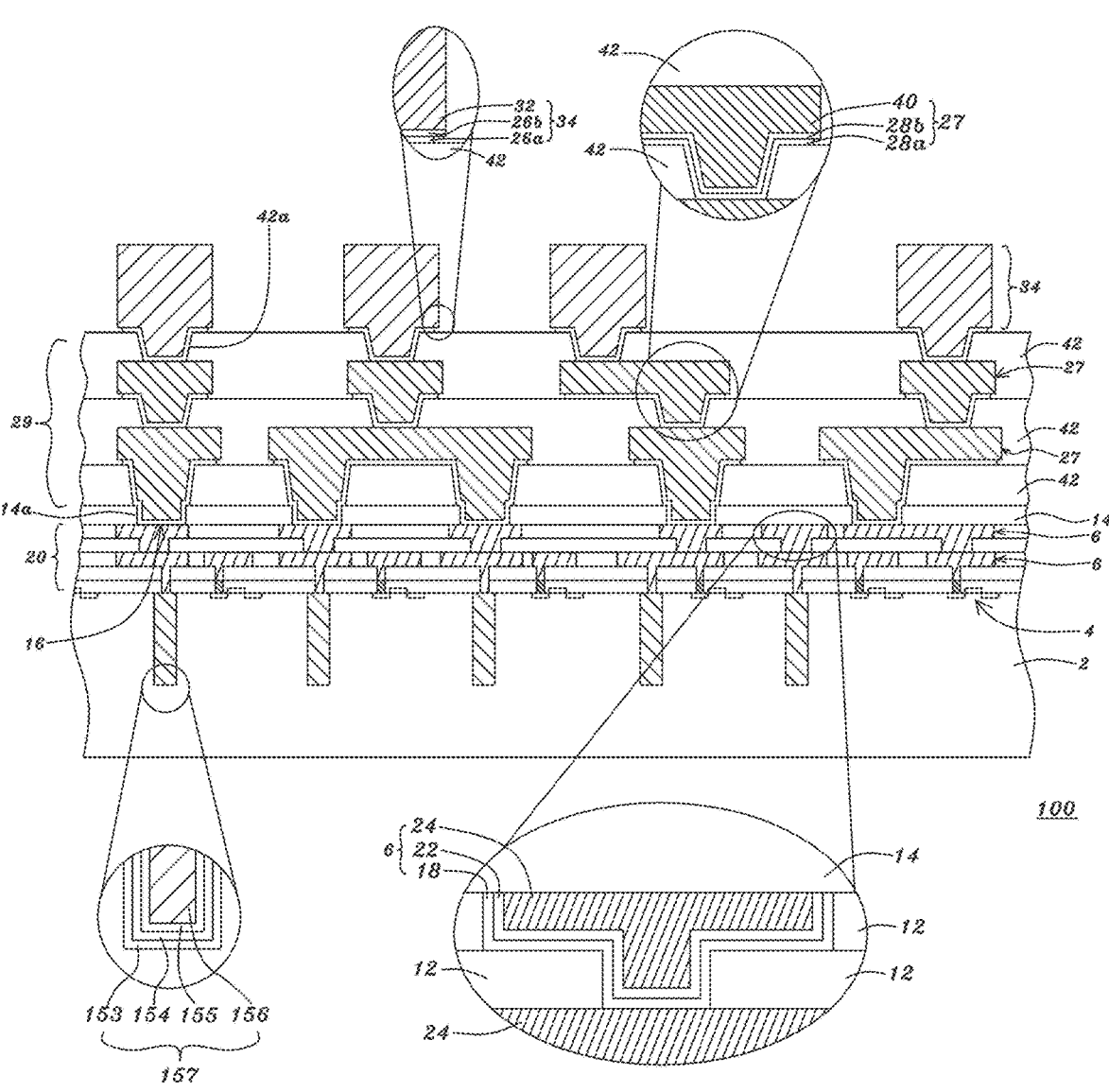

FIG. 3B is a schematically cross-sectional view showing a second type of semiconductor IC chip in accordance with an embodiment of the present application. Referring to FIG. 3B, the second type of semiconductor IC chip 100 may have a similar structure as illustrated in FIG. 3A. For an element indicated by the same reference number shown in FIGS. 3A and 3B, the specification of the element as seen in FIG. 3B may be referred to that of the element as illustrated in FIG. 3A. The difference between the first and second types of semiconductor IC chips 100 is that the second type of semiconductor IC chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of its through silicon vias (TSVs) 157 may have a depth between 30 μm and 200 μm and a largest transverse dimension, such as diameter or width, between 2 μm and 20 μm or between 4 μm and 10 μm. In some case, for the second type of semiconductor IC chip 100, each of its through silicon vias (TSV) 157 may pass through a layer of field oxide at a top surface of its semiconductor substrate 2, and thus may be called a through field-oxide via (TFOV).

Referring to FIG. 3B, each of the through silicon vias (TSV) 157 of the second type of semiconductor IC chip 100 may include (1) an electroplated copper layer 156 having a depth or thickness between 0.3 and 200 micrometers, between 0.3 and 10 micrometers, between 30 and 200 micrometers and a largest transverse dimension, such as diameter or width, between 0.05 and 20 micrometers, between 0.05 and 0.5 micrometers, between 4 and 10 micrometers, between 2 and 20 micrometers or between 4 and 10 micrometers in the semiconductor substrate 2 of the second type of semiconductor IC chip 100, (2) an insulating lining layer 153, such as thermally grown silicon oxide ($SiO_2$) and/or CVD silicon nitride ($Si_3N_4$) at a bottom and sidewall of its electroplated copper layer 156, (3) an adhesion layer 154, such as titanium (Ti) or titanium nitride (TiN) layer having a thickness between 1 and 50 nanometers, at the bottom and sidewall of its electroplated copper layer 156 and between its electroplated copper layer 156 and its insulating lining layer 153, and (4) an electroplating seed layer 155, such as copper seed layer 155 having a thickness between 3 and 200 nanometers, at the bottom and sidewall of its electroplated copper layer 156 and between its electroplated copper layer 156 and its adhesion layer 154.

3. Third Type of Semiconductor IC Chip

Figure 3C:
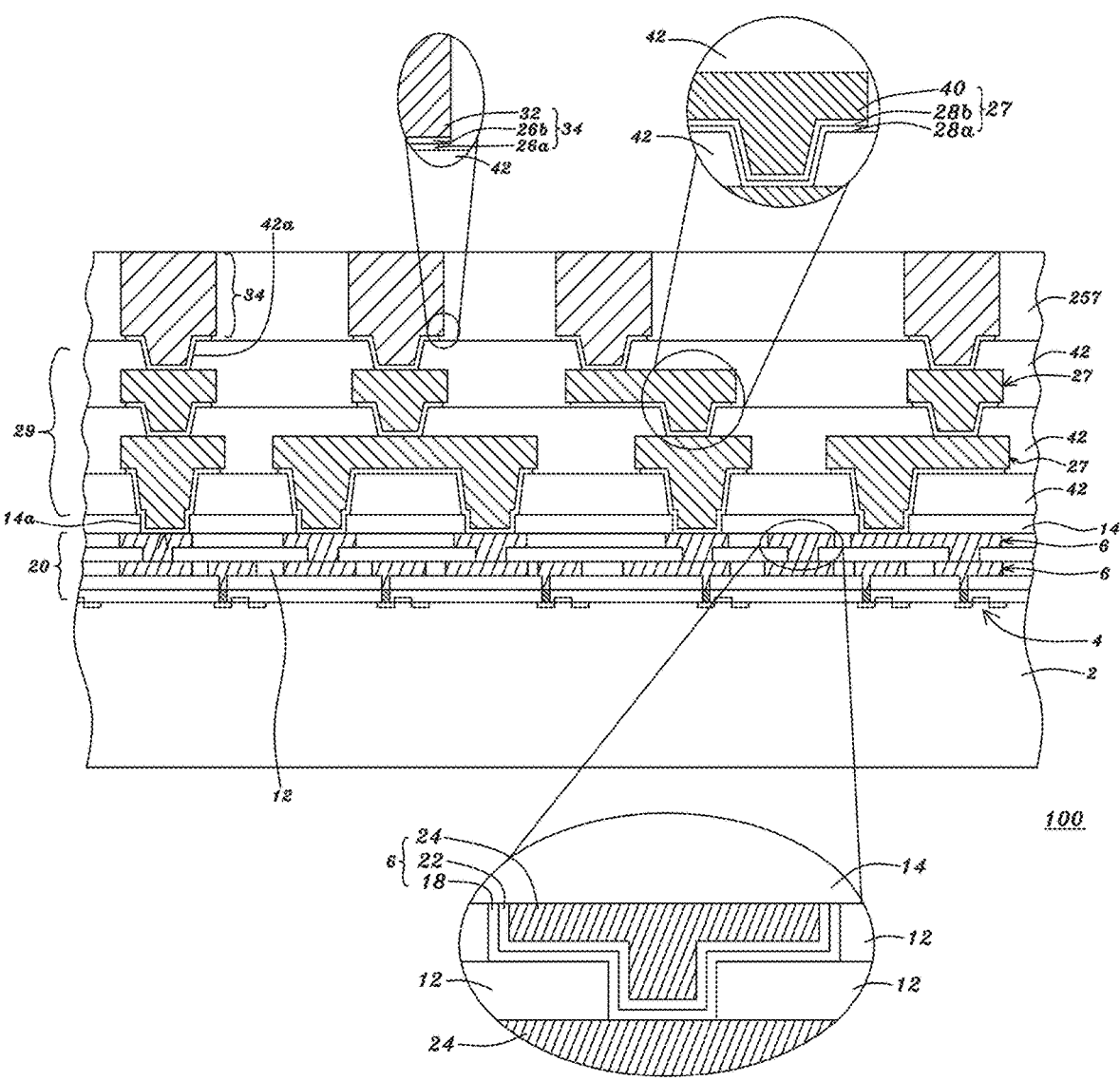

FIG. 3C is a schematically cross-sectional view showing a third type of semiconductor IC chip in accordance with an embodiment of the present application. Referring to FIG. 3C, the third type of semiconductor IC chip 100 may have a similar structure as illustrated in FIG. 3A. For an element indicated by the same reference number shown in FIGS. 3A and 3C, the specification of the element as seen in FIG. 3C may be referred to that of the element as illustrated in FIG. 3A. The difference between the first and third types of semiconductor IC chips 100 is that the third type of semiconductor IC chip 100 may be provided with the first type of micro-bumps, micro-pillars or micro-pads 34 at its top and a polymer layer 257, i.e., insulating dielectric layer, on the topmost one of the polymer layers 42 of its second interconnection scheme for a chip (SISC) 29 or, if the second interconnection scheme for a chip (SISC) 29 is not provided, on its passivation layer 14, wherein its polymer layer 257 may be horizontally around each of its first type of micro-bumps, micro-pillars or micro-pads 34 and may have a top surface substantially coplanar with a top surface of each of its first type of micro-bumps, micro-pillars or micro-pads 34, i.e., a top surface of the copper layer 32 thereof, wherein its polymer layer 257 is not extending over the top surface of each of its first type of micro-bumps, micro-pillars or micro-pads 34.

4. Fourth Type of Semiconductor IC Chip

Figure 3D:
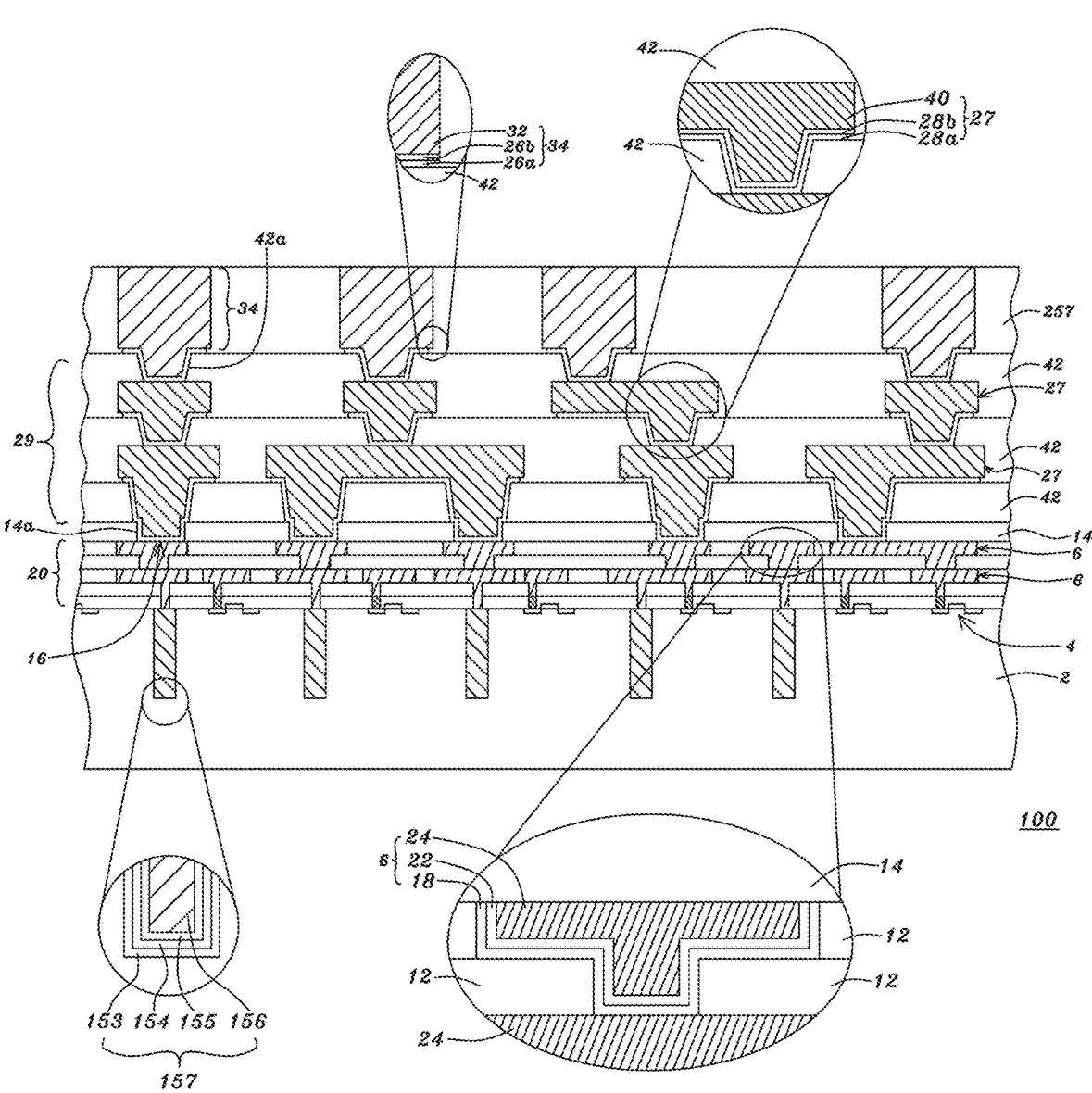

FIG. 3D is a schematically cross-sectional view showing a fourth type of semiconductor IC chip in accordance with an embodiment of the present application. Referring to FIG. 3D, the fourth type of semiconductor IC chip 100 may have a similar structure as illustrated in FIG. 3B. For an element indicated by the same reference number shown in FIGS. 3A, 3B and 3D, the specification of the element as seen in FIG. 3D may be referred to that of the element as illustrated in FIGS. 3A and 3B. The difference between the second and fourth types of semiconductor IC chips 100 is that the fourth type of semiconductor IC chip 100 may be provided with the first type of micro-bumps, micro-pillars or micro-pads 34 at its top and a polymer layer 257, i.e., insulating dielectric layer, on the topmost one of the polymer layers 42 of its second interconnection scheme for a chip (SISC) 29 or, if the second interconnection scheme for a chip (SISC) 29 is not provided, on its passivation layer 14, wherein its polymer layer 257 may be horizontally around each of its first type of micro-bumps, micro-pillars or micro-pads 34 and may have a top surface substantially coplanar with a top surface of each of its first type of micro-bumps, micro-pillars or micro-pads 34, i.e., a top surface of the copper layer 32 thereof, wherein its polymer layer 257 is not extending over the top surface of each of its first type of micro-bumps, micro-pillars or micro-pads 34.

5. Fifth Type of Semiconductor IC Chip

Figure 3E:
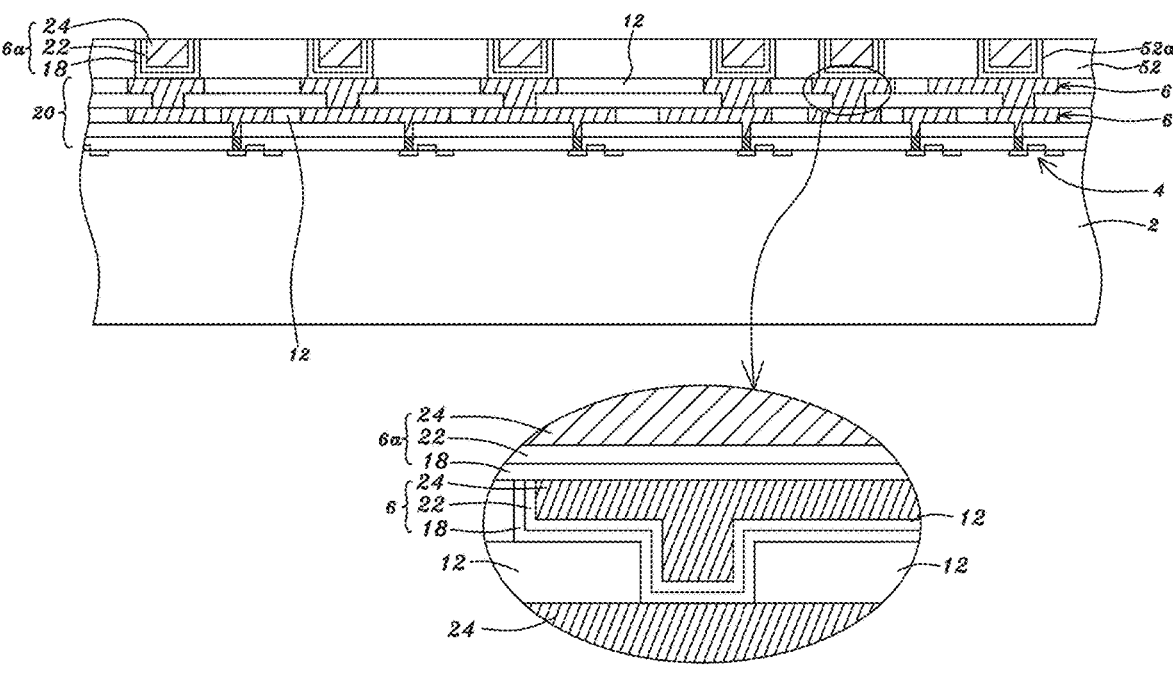

FIG. 3E is a schematically cross-sectional view showing a fifth type of semiconductor IC chip in accordance with an embodiment of the present application. Referring to FIG. 3E, the fifth type of semiconductor IC chip 100 may have a similar structure as illustrated in FIG. 3A. For an element indicated by the same reference number shown in FIGS. 3A and 3E, the specification of the element as seen in FIG. 3E may be referred to that of the element as illustrated in FIG. 3A. The difference between the first and fifth types of semiconductor IC chips 100 is that the fifth type of semiconductor IC chip 100 may be provided with (1) an insulating bonding layer 52 at its active side and on the topmost one of the insulating dielectric layers 12 of its first interconnection scheme for a chip (FISC) 20 and (2) multiple metal pads 6a at its active side and in multiple openings 52a in its insulating bonding layer 52 and on the topmost one of the interconnection metal layers 6 of its first interconnection scheme for a chip (FISC) 20, instead of the second interconnection scheme for a chip (SISC) 29, the passivation layer 14 and micro-bumps, micro-pillars or micro-pads 34 as seen in FIG. 3A. For the fifth type of semiconductor IC chip 100, its insulating bonding layer 52 may include a silicon-oxide or silicon-oxynitride layer having a thickness between 0.1 and 2 micrometers. Each of its metal pads 6a may include (1) a copper layer 24 having a thickness of between 3 nm and 500 nm in one of the openings 52a in its insulating bonding layer 52, (2) an adhesion layer 18, such as titanium or titanium nitride having a thickness of between 1 nm and 50 nm, at a bottom and sidewall of the copper layer 24 of said each of its metal pads 6a and on the topmost one of the interconnection metal layers 6 of its first interconnection scheme for a chip (FISC) 20, and (3) a seed layer 22, such as copper, between the copper layer 24 and adhesion layer 18 of said each of its metal pads 6a, wherein said each of its metal pads 6a, i.e., the copper layer 24 thereof, may have a top surface substantially coplanar with a top surface of its insulating bonding layer 52, i.e., a top surface of the silicon-oxide or silicon-oxynitride layer thereof. The dimension, in a horizontal direction, of each of the metal pads 6a of the fifth type of semiconductor IC chip 100 may be smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6a of the fifth type of semiconductor IC chip 100 may be smaller than 10, 5, 2 or 1 micrometers, or between 0.2 and 10 micrometers, 0.2 and 5 micrometers, 0.2 and 2 micrometers, or 0.2 and 1 micrometers.

6. Sixth Type of Semiconductor IC Chip

Figure 3F:
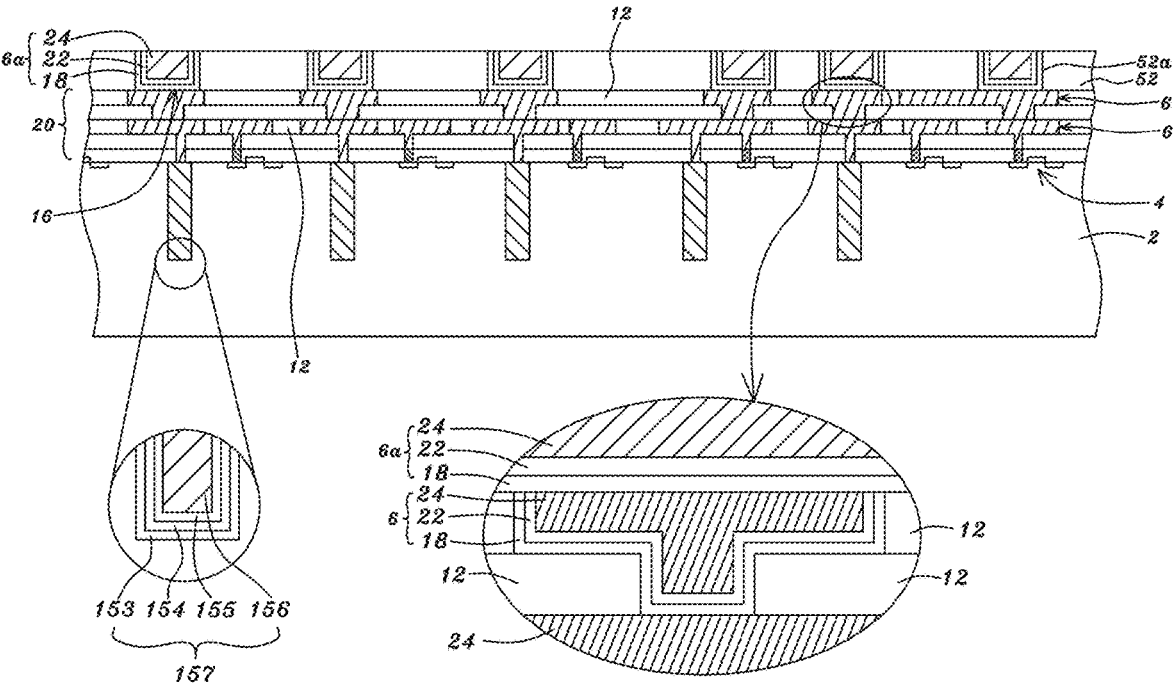

FIG. 3F is a schematically cross-sectional view showing a sixth type of semiconductor IC chip in accordance with an embodiment of the present application. Referring to FIG. 3F, the sixth type of semiconductor IC chip 100 may have a similar structure as illustrated in FIG. 3E. For an element indicated by the same reference number shown in FIGS. 3A, 3B, 3E and 3F, the specification of the element as seen in FIG. 3F may be referred to that of the element as illustrated in FIGS. 3A, 3B and 3E. The difference between the fifth and sixth types of semiconductor IC chips 100 is that the sixth type of semiconductor IC chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of its through silicon vias (TSVs) 157 may have a depth between 30 μm and 200 μm and a largest transverse dimension, such as diameter or width, between 2 μm and 20 μm or between 4 μm and 10 μm. Each of its through silicon vias (TSV) 157 may have the same specification as that of the through silicon vias (TSV) 157 of the second type of semiconductor IC chip 100 as illustrated in FIG. 3B.

Specification for Vertical-Through-Via (VTV) Connector

Figures 4A, 4B, 4C:
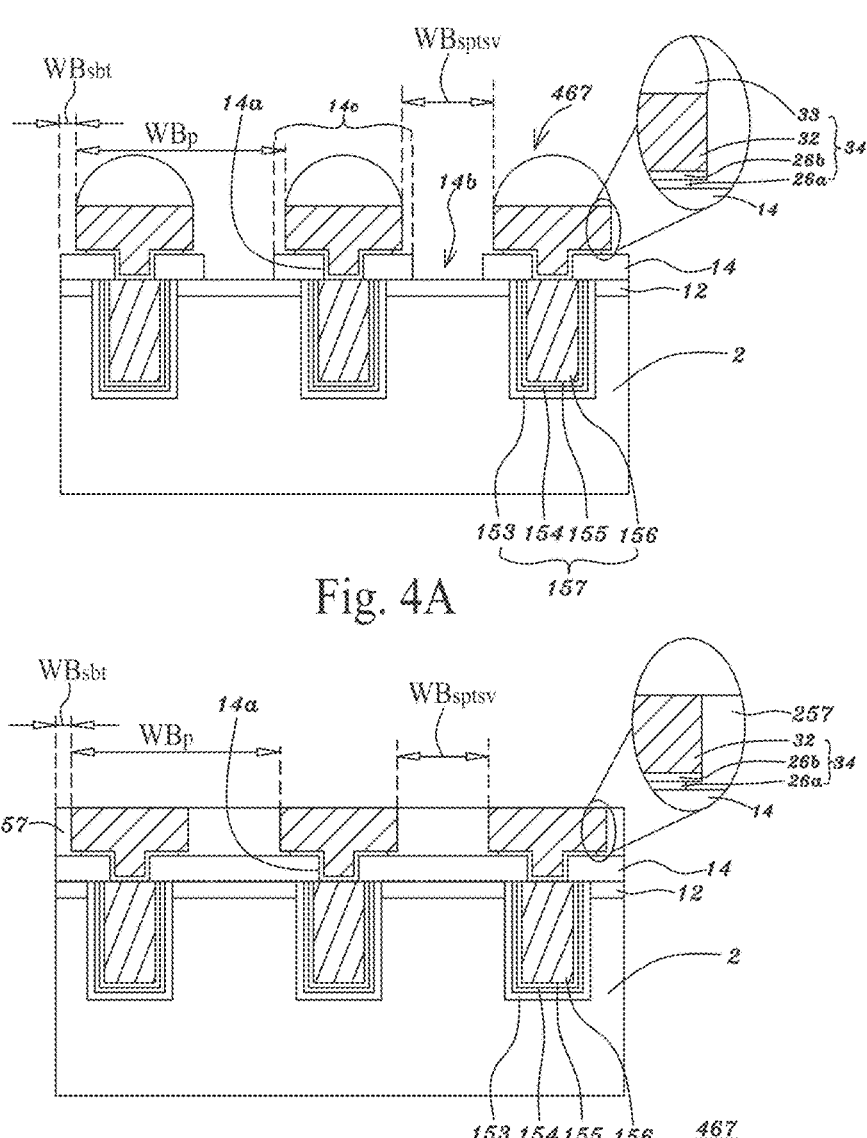
FIGS. 4A-4C are schematically cross-sectional views showing various types of vertical-through-via (VTV) connectors in accordance with an embodiment of the present application.

FIGS. 4A-4C are schematically cross-sectional views showing first, second and third types of vertical-through-via (VTV) connectors in accordance with an embodiment of the present application. Referring to FIGS. 4A-4C, each type of the first, second and third types of vertical-through-via (VTV) connectors 467 may be a passive device or component without any transistor but provided for vertical connection to transmit signals or deliver a power source or ground reference in a vertical direction.

First Type of Vertical-Through-Via (VTV) Connector

Referring to FIG. 4A, the first type of vertical-through-via (VTV) connector 467 may include (1) a semiconductor substrate 2, such as silicon substrate, wherein the semiconductor substrate 2 may be alternatively replaced with a glass substrate, (2) an insulating dielectric layer 12 on its semiconductor substrate 2, wherein its insulating dielectric layer 12 may include a silicon-oxide or silicon-oxynitride layer having a thickness between 0.1 and 2 μm, (3) multiple through silicon vias (TSVs) 157 vertically in its semiconductor substrate 2, wherein each of its through silicon vias (TSV) 157 may have the same specification as that of the through silicon vias (TSV) 157 of the second type of semiconductor IC chip 100 as illustrated in FIG. 3B, wherein each of its through silicon vias (TSVs) 157 extends vertically through its insulating dielectric layer 12 and has a top surface substantially coplanar with a top surface of its insulating dielectric layer 12, wherein each of its through silicon vias (TSVs) 157 may have a depth between 30 μm and 200 μm and a largest transverse dimension, such as diameter or width, between 2 μm and 20 μm or between 4 μm and 10 μm, (3) a passivation layer 14 may be formed on the top surface of its insulating dielectric layer 12, (4) a passivation layer 14 on the top surface of the insulating dielectric layer 12, wherein its passivation layer 14 may include a silicon-nitride layer having a thickness of greater than 0.3 micrometers and, optionally, a polymer layer, such as polyimide, having a thickness between 1 and 5 micrometers on the silicon-nitride layer, wherein the electroplated copper layer 156 of each of its through silicon vias (TSVs) 157 may have a contact point at a bottom of one of multiple opening 14a in its passivation layer 14, wherein each of the openings 14a may have a largest transverse dimension, from a top view, between 0.5 and 20 micrometers or between 20 and 200 micrometers, and (5) multiple micro-bumps, micro-pillars or micro-pads 34 each on the contact point of the electroplated copper layer 156 of its of the through silicon vias (TSVs) 157, wherein each of its micro-bumps, micro-pillars or micro-pads 34 may be of various types, i.e., first, second, third and fourth types, which may have the same specification as that of the first, second, third and fourth types of micro-bumps, micro-pillars or micro-pads 34 respectively as illustrated in FIG. 3A, and may have the adhesion layer 26a on the contact point of the electroplated copper layer 156 of one of its through silicon vias (TSVs) 157 and its passivation layer 14.

Referring to FIG. 4A, for the first type of vertical-through-via (VTV) connector 467, multiple trenches 14b may be formed in its passivation layer 14 to form multiple insulating-material islands 14c between neighboring two of the trenches 14b. A pitch $WB_p$ between each neighboring two of its micro-bumps, micro-pillars or micro-pads 34 may range from 20 to 150 micrometers or from 40 to 100 micrometers; and a space $WB_{sptsv}$ between each neighboring two of its micro-bumps, micro-pillars or micro-pads 34 may range from 20 to 150 micrometers or from 40 to 100 micrometers. A distance $WB_{sbt}$ between its edge and one of its micro-bumps, micro-pillars or micro-pads 34 may be smaller than the space $WB_{sptsv}$ between neighboring two of its micro-bumps, micro-pillars or micro-pads 34 and optionally its edge may be aligned with an edge of said one of its micro-bumps, micro-pillars or micro-pads 34; alternatively, the distance $WB_{sbt}$ between its edge and one of its micro-bumps, micro-pillars or micro-pads 34 may be smaller than 50, 40 or 30 micrometers.

2. Second Type of Vertical-Through-Via (VTV) Connector

Referring to FIG. 4B, the second type of vertical-through-via (VTV) connector 467 may have a similar structure to the second type of semiconductor IC chip 100 as illustrated in FIG. 3B. For an element indicated by the same reference number shown in FIGS. 3A, 3B and 4B, the specification of the element as seen in FIG. 4B may be referred to that of the element as illustrated in FIGS. 3A and 3B. The difference between the second type of vertical-through-via (VTV) connector 467 and the first type of semiconductor IC chip 100 is that the second type of vertical-through-via (VTV) connector 467 is a passive device or component without any transistor, first interconnection scheme for a chip (FISC) 20 and second interconnection scheme for a chip (SISC) 29 of the second type of semiconductor IC chip 100 as seen in FIG. 3B. For more elaboration, the second type of vertical-through-via (VTV) connectors 467 include (1) the semiconductor substrate 2, such as silicon substrate, wherein its semiconductor substrate 2 may be alternatively replaced with a glass substrate, (2) an insulating dielectric layer 12 on its semiconductor substrate 2, wherein its insulating dielectric layer 12 may include a silicon-oxide or silicon-oxynitride layer having a thickness between 0.1 and 2 μm, (3) multiple through silicon vias (TSVs) 157 vertically in its semiconductor substrate 2, wherein each of its through silicon vias (TSV) 157 may have the same specification as that of the through silicon vias (TSV) 157 of the second type of semiconductor IC chip 100 as illustrated in FIG. 3B, wherein each of its through silicon vias (TSVs) 157 extends vertically through the insulating dielectric layer 12 and has a top surface substantially coplanar with a top surface of the insulating dielectric layer 12, wherein each of the through silicon vias (TSVs) 157 may have a depth between 30 μm and 200 μm and a largest transverse dimension, such as diameter or width, between 2 μm and 20 μm or between 4 μm and 10 μm, (4) a passivation layer 14 on the top surface of its insulating dielectric layer 12, wherein its passivation layer 14 may include a silicon-nitride layer having a thickness of greater than 0.3 micrometers and, optionally, a polymer layer, such as polyimide, having a thickness between 1 and 5 micrometers on the silicon-nitride layer, wherein the electroplated copper layer 156 of each of its through silicon vias (TSVs) 157 may have a contact point at a bottom of one of multiple opening 14a in its passivation layer 14, wherein each of the openings 14a may have a largest transverse dimension, from a top view, between 0.5 and 20 micrometers or between 20 and 200 micrometers, (5) multiple micro-bumps, micro-pillars or micro-pads 34 each on the contact point of the electroplated copper layer 156 of one of its through silicon vias (TSVs) 157, wherein each of its micro-bumps, micro-pillars or micro-pads 34 may have the same specification as that of the first type of micro-bump, micro-pillar or micro-pad 34 as illustrated in FIG. 3A and may have the adhesion layer 26a on the contact point of the electroplated copper layer 156 of one of its through silicon vias (TSVs) 157 and its passivation layer 14, and (6) a polymer layer 257, i.e., insulating dielectric layer, at its top and on its passivation layer 14, wherein its polymer layer 257 may be horizontally around each of its micro-bumps, micro-pillars or micro-pads 34 and have a top surface coplanar with a top surface of each of its micro-bumps, micro-pillars or micro-pads 34, wherein its polymer layer 257 is not extending over the top surface of each of its micro-bumps, micro-pillars or micro-pads 34.

Referring to FIG. 4B, for the second type of vertical-through-via (VTV) connector 467, multiple trenches 14b may be formed in its passivation layer 14 to form multiple insulating-material islands 14c between neighboring two of the trenches 14b. A pitch $WB_p$ between each neighboring two of its micro-bumps, micro-pillars or micro-pads 34 may range from 20 to 150 micrometers or from 40 to 100 micrometers; and a space $WB_{sptsv}$ between each neighboring two of its micro-bumps, micro-pillars or micro-pads 34 may range from 20 to 150 micrometers or from 40 to 100 micrometers. A distance $WB_{sbt}$ between its edge and one of its micro-bumps, micro-pillars or micro-pads 34 may be smaller than the space $WB_{sptsv}$ between neighboring two of its micro-bumps, micro-pillars or micro-pads 34 and optionally its edge may be aligned with an edge of said one of its micro-bumps, micro-pillars or micro-pads 34; alternatively, the distance $WB_{sbt}$ between its edge and one of its micro-bumps, micro-pillars or micro-pads 34 may be smaller than 50, 40 or 30 micrometers.

3. Third Type of Vertical-Through-Via (VTV) Connector

Referring to FIG. 4C, the third type of vertical-through-via (VTV) connector 467 may have similar structure to the first type of vertical-through-via (VTV) connector 467 as illustrated in FIG. 4A. For an element indicated by the same reference number shown in FIGS. 4A and 4C, the specification of the element as seen in FIG. 4C may be referred to that of the element as illustrated in FIG. 4A. The difference between the first and third type of vertical-through-via (VTV) connectors 467 is that the third type of vertical-through-via (VTV) connector 467 may be formed without the passivation layer 14 and micro-bumps, micro-pillars or micro-pads 34 of the first type of vertical-through-via (VTV) connector 467 as seen in FIG. 4A. Further, the insulating dielectric layer 12 of the third type of vertical-through-via (VTV) connector 467 may be used as an insulating bonding layer 52 made of a silicon-oxide or silicon-oxynitride layer having a thickness between 0.1 and 2 micrometers. For the third type of vertical-through-via (VTV) connector 467, its insulating bonding layer 52 may have a top surface coplanar with a top surface of each of its through silicon vias (TSVs) 157.

Referring to FIG. 4C, for the third type of vertical-through-via (VTV) connector 467, a pitch $W_p$ between each neighboring two of its through silicon vias (TSVs) 157 may range from 20 to 150 micrometers or from 40 to 100 micrometers; and a space $W_{sptsv}$ between each neighboring two of its through silicon vias (TSVs) 157 may range from 20 to 150 micrometers or from 40 to 100 micrometers. A distance $W_{sbt}$ between its edge and one of its through silicon vias (TSVs) 157 may be smaller than 50, 40 or 30 micrometers.

Field Programmable Chip-On-Chip Module or Package

1. First Type of Field Programmable Chip-On-Chip Module or Package

Figures 5A, 5B:
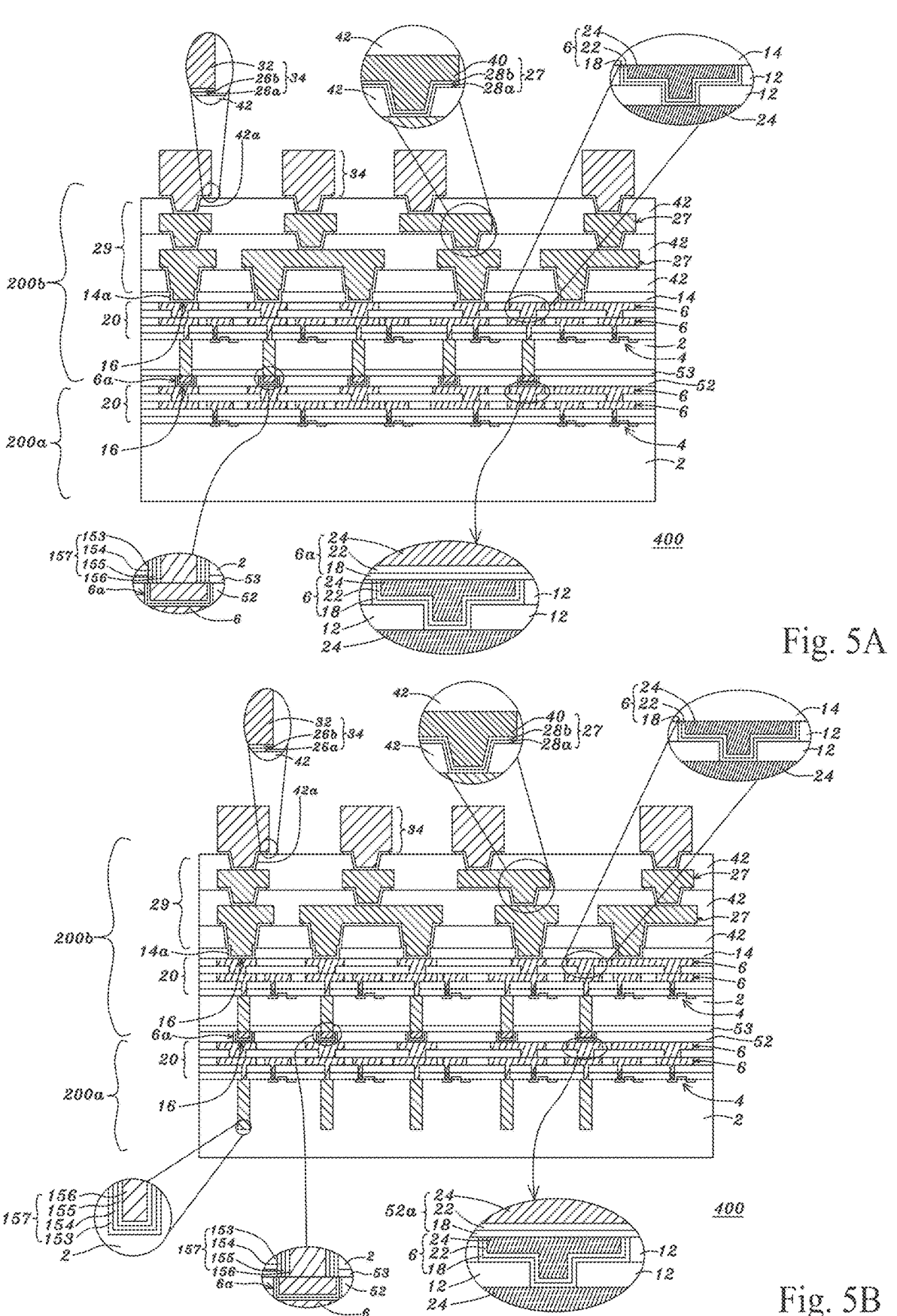
FIGS. 5A-5F are schematically cross-sectional views showing various types of field programmable chip-on-chip modules in accordance with an embodiment of the present application.

FIG. 5A is a schematically cross-sectional view showing a first type of field programmable chip-on-chip module in accordance with an embodiment of the present application. Referring to FIG. 5A, a first type of field programmable chip-on-chip module 400 may include (1) a first FPGA IC chip or chiplet 200a, which may have the specification for the fifth type of semiconductor IC chip 100 illustrated in FIG. 3E, and (2) a second FPGA IC chip or chiplet 200b, which may have the specification for the second type of semiconductor IC chip 100 illustrated in FIG. 3B, over its first FPGA IC chip or chiplet 200a. For the first type of field programmable chip-on-chip module 400, the semiconductor substrate 2 of its second FPGA IC chip or chiplet 200b may have a portion at a bottom side thereof removed by a chemical-mechanical-polishing (CMP) or mechanical grinding process and then its second FPGA IC chip or chiplet 200b may be formed with an insulating bonding layer 53, made of silicon oxide or silicon oxynitride for example, at a bottom of the semiconductor substrate 2 of its second FPGA IC chip or chiplet 200b, wherein the insulating bonding layer 53 of its second FPGA IC chip or chiplet 200b may have a bottom surface coplanar with a bottom surface of each of the through silicon vias (TSVs) 157 of its second FPGA IC chip or chiplet 200b, i.e., a bottom surface of the copper layer 156 of said each of the through silicon vias (TSVs) 157. Its second FPGA IC chip or chiplet 200b may be provided, for hybrid bonding, with (1) the insulating bonding layer 53, i.e., silicon oxide or oxynitride, having the bottom surface attached to and in contact with a top surface of the insulating bonding layer 52, i.e., silicon oxide or oxynitride, of its first FPGA IC chip or chiplet 200a, and (2) the through silicon vias (TSVs) 157 each having the copper layer 156 with the bottom surface bonded to and in contact with a top surface of one of the metal pads 6a, i.e., copper layer 24 thereof, of its first FPGA IC chip or chiplet 200a. The semiconductor substrate 2 of its second FPGA IC chip or chiplet 200b may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the second FPGA IC chip or chiplet 200b may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example.

Referring to FIG. 5A, for the first type of field programmable chip-on-chip module 400, each of its first and second FPGA IC chips or chiplets 200a and 200b may be arranged with any type of the first, second and third types of field programmable logic cells or elements (LCE) 2014 as seen in FIGS. 1A-1C and any type of the first and second types of field programmable switch cells 379 as seen in FIGS. 2A and 2B.

Referring to FIG. 5A, as a first example of the first type of field programmable chip-on-chip module 400, for achieving the first type of fined-grained field programmable logic cell or element (LCE) 2014 as illustrate in FIG. 1A, the memory cells 490 may be arranged in either of its first and second field programmable IC chips or chiplets 200a and 200b, and the selection circuit 211 may be arranged in the other of its first and second field programmable IC chips or chiplets 200a and 200b. Each of the memory cells 490 may couples to one of the selection circuits 211 through one of the metal pads 6a of its first field programmable IC chip or chiplet 200a and one of the through silicon vias (TSVs) 157 of its second field programmable IC chip or chiplet 200b.

Referring to FIG. 5A, as a second example of the first type of field programmable chip-on-chip module 400, for achieving the coarse-grained reconfigurable (CGR) units, a functional unit (FU) including multiple hard macros therein such as digital signal process DSP slices, graphic process GPU macros, DPU macros, microcontroller (MCU) macros, multiplexer macros, adder macros, multiplier macros, arithmetic logic unit (ALU) macros, shift circuit macros, comparison circuit macros, floating-point computing macros, register or flip-flops macros, and/or I/O interfacing macros may be arranged in either of its first and second semiconductor IC chips or chiplets 200a and 200b. A registering block having multiple registers or D-type flip-flop circuits each for registering or temporally storing data therein associated with a data output of the functional unit may be arranged in said either of its first and second semiconductor IC chips or chiplets 200a and 200b. A program counter (PC), i.e., instruction pointer, having multiple instruction address registers temporally storing multiple instruction addresses therein to point one or more of the arithmetic logic cells of the functional unit in a program sequence may be arranged in said either of its first and second semiconductor IC chips or chiplets 200a and 200b. An instruction memory block or section for temporally storing multiple instruction sets to be fetched by the the functional unit (FU) may be arranged in the other of its first and second semiconductor IC chips or chiplets 200a and 200b. Each of the functional unit (FU), registering block and program counter (PC) 2048 may couple to the instruction memory block or section through one of the metal pads 6a of its first field programmable IC chip or chiplet 200a and one of the through silicon vias (TSVs) 157 of its second field programmable IC chip or chiplet 200b.

Referring to FIG. 5A, as a third example of the first type of field programmable chip-on-chip module 400, for achieving a coarse-grained programmable logic cell or element (LCE), a memory section, i.e., memory array, local row and column decoders for reading data from the memory section used as a look-up table for performing a logic operation, and global row and column decoders for reading and writing data to and from the memory section may be arranged in either of its first and second field programmable IC chips or chiplets 200a and 200b, and a selection circuit for selecting data to be passed to the local row and column decoders and a block for registers or flip-flop circuits for storing data from the local column decoder may be arranged in the other of its first and second field programmable IC chips or chiplets 200a and 200b. Each of the memory sections, local row and column decoders and global row and column decoders may couple to either of the selection circuit and the block for registers or flip-flop circuits through one of the metal pads 6a of its first field programmable IC chip or chiplet 200a and one of the through silicon vias (TSVs) 157 of its second field programmable IC chip or chiplet 200b.

Referring to FIG. 5A, as any of the above first, second and third examples of the first type of field programmable chip-on-chip module 400, for achieving either type of the first and second types of field programmable switch cells 379 as illustrated in FIGS. 2A and 2B, the memory cells 362 may be arranged in either of its first and second field programmable IC chips or chiplets 200a and 200b, and the pass/no-pass switch 292 and/or selection circuits 211 may be arranged in the other of its first and second field programmable IC chips or chiplets 200a and 200b. Each of the memory cells 362 may couple to either of the pass/no-pass switch 292 and selection circuits 211 through one of the metal pads 6a of its first field programmable IC chip or chiplet 200a and one of the through silicon vias (TSVs) 157 of its second field programmable IC chip or chiplet 200b.

2. Second Type of Field Programmable Chip-On-Chip Module or Package

FIG. 5B is a schematically cross-sectional view showing a second type of field programmable chip-on-chip module in accordance with an embodiment of the present application. Referring to FIG. 5B, a second type of field programmable chip-on-chip module 400 may have a similar structure to the first type of field programmable chip-on-chip module 400 illustrated in FIG. 5A. For an element indicated by the same reference number shown in FIGS. 5A and 5B, the specification of the element as seen in FIG. 5B may be referred to that of the element as illustrated in FIG. 5A. The difference between the first and second types of field programmable chip-on-chip modules 400 is that the first FPGA IC chip or chiplet 200a of the second type of field programmable chip-on-chip module 400 may have the specification for the sixth type of semiconductor IC chip 100 illustrated in FIG. 3F.

3. Third Type of Field Programmable Chip-On-Chip Module or Package

Figures 5C, 5D:
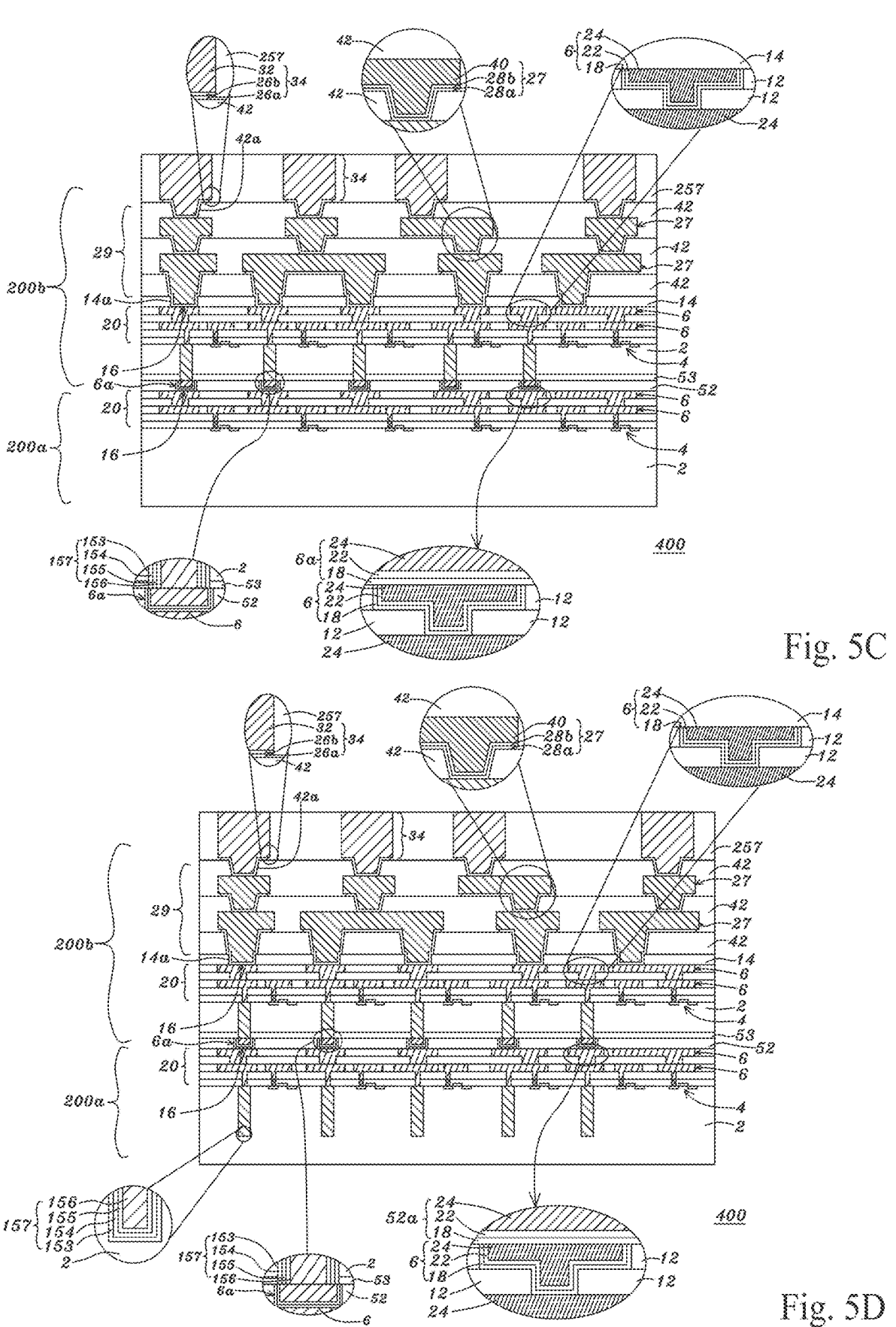

FIG. 5C is a schematically cross-sectional view showing a third type of field programmable chip-on-chip module in accordance with an embodiment of the present application. Referring to FIG. 5C, a third type of field programmable chip-on-chip module 400 may have a similar structure to the first type of field programmable chip-on-chip module 400 illustrated in FIG. 5A. For an element indicated by the same reference number shown in FIGS. 5A and 5C, the specification of the element as seen in FIG. 5C may be referred to that of the element as illustrated in FIG. 5A. The difference between the first and third types of field programmable chip-on-chip modules 400 is that the second FPGA IC chip or chiplet 200b of the third type of field programmable chip-on-chip module 400 may have the specification for the fourth type of semiconductor IC chip 100 illustrated in FIG. 3D.

4. Fourth Type of Field Programmable Chip-On-Chip Module or Package

FIG. 5D is a schematically cross-sectional view showing a fourth type of field programmable chip-on-chip module in accordance with an embodiment of the present application. Referring to FIG. 5D, a fourth type of field programmable chip-on-chip module 400 may have a similar structure to the third type of field programmable chip-on-chip module 400 illustrated in FIG. 5C. For an element indicated by the same reference number shown in FIGS. 5A, 5C and 5D, the specification of the element as seen in FIG. 5D may be referred to that of the element as illustrated in FIG. 5A or 5C. The difference between the third and fourth types of field programmable chip-on-chip modules 400 is that the first FPGA IC chip or chiplet 200a of the fourth type of field programmable chip-on-chip module 400 may have the specification for the sixth type of semiconductor IC chip 100 illustrated in FIG. 3F.

5. Fifth Type of Field Programmable Chip-On-Chip Module or Package

Figures 5E, 5F:
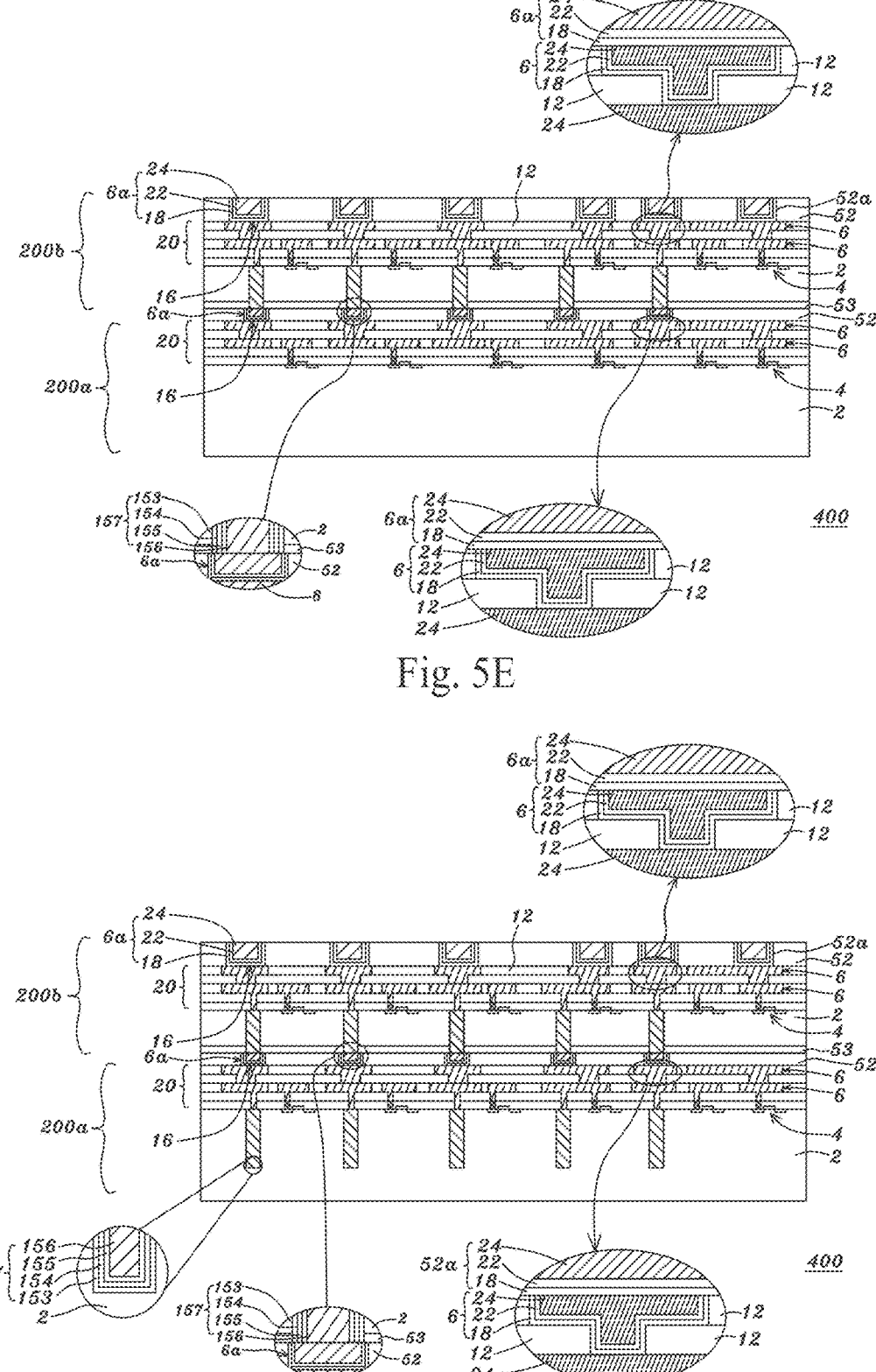

FIG. 5E is a schematically cross-sectional view showing a fifth type of field programmable chip-on-chip module in accordance with an embodiment of the present application. Referring to FIG. 5E, a fifth type of field programmable chip-on-chip module 400 may have a similar structure to the first type of field programmable chip-on-chip module 400 illustrated in FIG. 5A. For an element indicated by the same reference number shown in FIGS. 5A and 5E, the specification of the element as seen in FIG. 5E may be referred to that of the element as illustrated in FIG. 5A. The difference between the first and fifth types of field programmable chip-on-chip modules 400 is that the second FPGA IC chip or chiplet 200b of the fifth type of field programmable chip-on-chip module 400 may have the specification for the sixth type of semiconductor IC chip 100 illustrated in FIG. 3F.

6. Sixth Type of Field Programmable Chip-On-Chip Module or Package

FIG. 5F is a schematically cross-sectional view showing a sixth type of field programmable chip-on-chip module in accordance with an embodiment of the present application. Referring to FIG. 5F, a sixth type of field programmable chip-on-chip module 400 may have a similar structure to the fifth type of field programmable chip-on-chip module 400 illustrated in FIG. 5E. For an element indicated by the same reference number shown in FIGS. 5A, 5E and 5F, the specification of the element as seen in FIG. 5F may be referred to that of the element as illustrated in FIG. 5A or 5E. The difference between the fifth and sixth types of field programmable chip-on-chip modules 400 is that the first FPGA IC chip or chiplet 200a of the sixth type of field programmable chip-on-chip module 400 may have the specification for the sixth type of semiconductor IC chip 100 illustrated in FIG. 3F.

Embodiments for Various Chip Package

1. First Type of Chip Package

Figure 6:
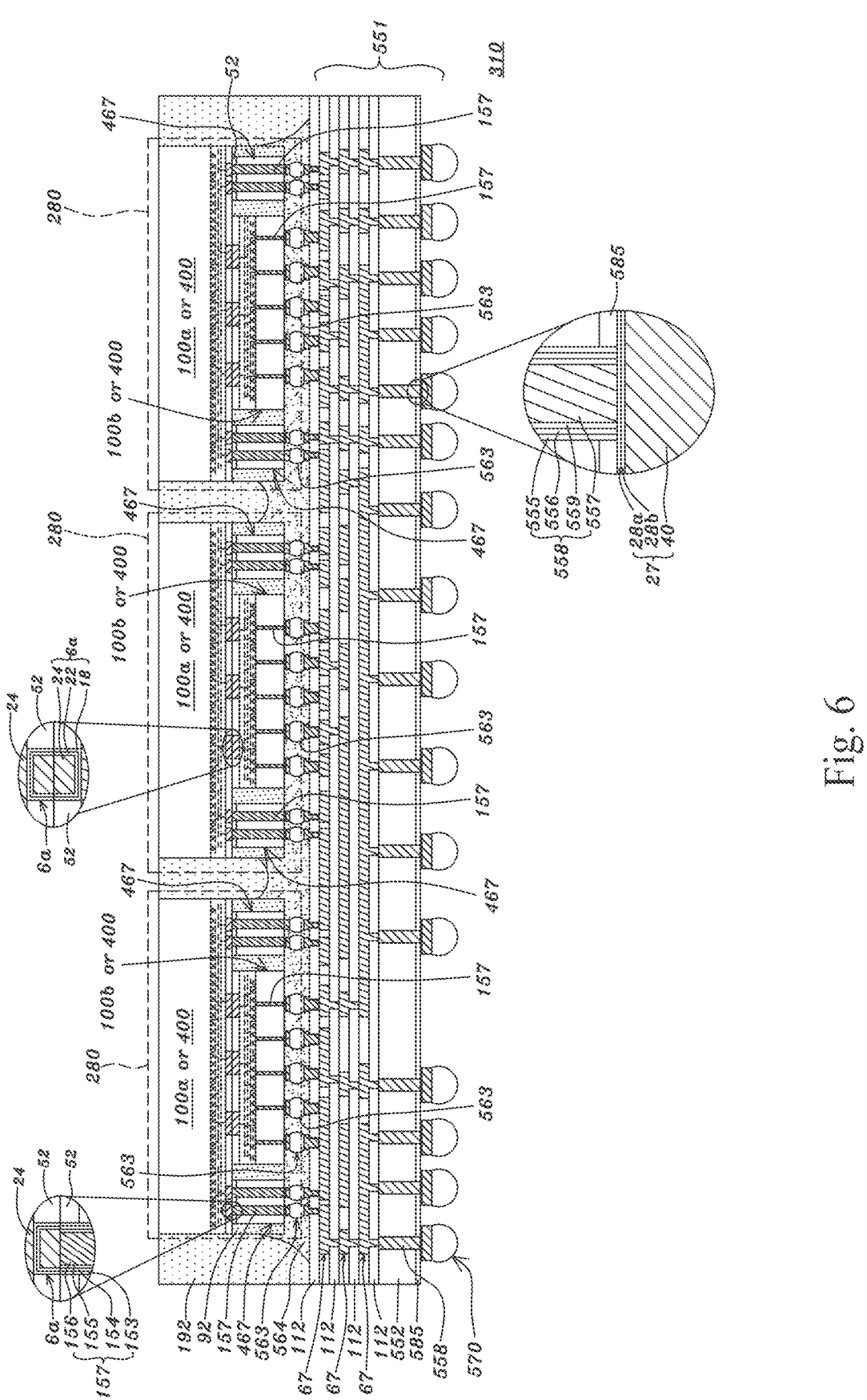
FIG. 6 is a schematically cross-sectional view showing a first type of chip package in accordance with an embodiment of the present application.

FIG. 6 is a schematically cross-sectional view showing a first type of chip package in accordance with an embodiment of the present application. Referring to FIG. 6, a first type of chip package 310 may include an interposer 551 and multiple subsystem units 280 bonded to a top surface of its interposer 551. For the first type of chip package 310, its interposer 551 may include (1) a silicon substrate 552, (2) multiple through silicon vias 558 extending vertically through its silicon substrate 552, (3) an interconnection scheme over the silicon substrate 552, having the specification as illustrated for the FISC 20, SISC 29 or combination of the FISC 20 and SISC 29 in FIG. 3A, over its silicon substrate 552, wherein its interconnection scheme may include multiple interconnection metal layers 67 over its silicon substrate 552, coupling to its through silicon vias 558 and each having the same specification as that of the interconnection metal layer 6 of the FISC 20 or that of the interconnection metal layer 27 of the SISC 27, and multiple insulating dielectric layers 112 each between neighboring two of the interconnection metal layers 67 of its interconnection scheme, under the bottommost one of the interconnection metal layers 67 of its interconnection scheme or over the topmost one of the interconnection metal layers 67 of its interconnection scheme and each having the same specification as that of the insulating dielectric layer 12 of the FISC 20 or that of the polymer layer 42 of the SISC 29, and (4) an insulating dielectric layer 585, i.e., silicon-oxide or silicon-nitride layer or polymer layer, on a bottom surface of its silicon substrate 552, wherein its insulating dielectric layer 585 may have a bottom surface substantially coplanar with a backside of each of its through silicon vias 558.

Referring to FIG. 6, each of the through silicon vias 558 of the interposer 551 of the first type of chip package 310 may include (1) a copper layer 557 extending vertically through the silicon substrate 552 of the interposer 551, (2) an insulating dielectric layer 555 around a sidewall of its copper layer 557 and in the silicon substrate 552 of the interposer 551, (3) an adhesion layer 556 around the sidewall of its copper layer 557 and between its copper layer 557 and insulating dielectric layer 555 and (4) a seed layer 559 around the sidewall of its copper layer 557 and between its copper layer 557 and adhesion layer 556. Each of the through silicon vias 558, i.e., the copper layer 557 thereof, may have a depth or thickness between 30 μm and 150 μm, or 50 μm and 100 μm, and a diameter or largest transverse size between 5 μm and 50 μm, or 5 μm and 15 μm. Its adhesion layer 556 may include a titanium (Ti) or titanium nitride (TiN) layer having a thickness between 1 nm to 50 nm. Its seed layer 559 may be a copper layer having a thickness of between 3 nm and 200 nm. Its insulating dielectric layer 555 may include a thermally grown silicon oxide ($SiO_2$) and/or a chemical-vapor-deposition (CVD) silicon nitride ($Si_3N_4$), for example.

Referring to FIG. 6, for the first type of chip package 310, each of its subsystem units 280 may include a top semiconductor IC chip 100a having the specification for the fifth type of semiconductor IC chip 100 illustrated in FIG. 3E to be turned upside down, which may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (AIU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip. Each of its subsystem units 280 may further include a bottom semiconductor IC chip 100b having the specification for the sixth type of semiconductor IC chip 100 illustrated in FIG. 3F, which may be used for (1) an application-specific integrated-circuit (ASIC) chip, (2) a logic IC chip, such as FPGA IC chip or chiplet 200, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (AIU) IC chip, machine-learning-unit (MLU) IC chip, application-specific-integrated-circuit (ASIC) chip or digital-signal-processing (DSP) IC chip, (3) a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip, or (4) an input/output (I/O) IC chip. Each of its subsystem units 280 may further include multiple vertical-through-via (VTV) connectors 467 each having the same specification as the third type of vertical-through-via (VTV) connector 467 illustrated in FIG. 4C. For example, in a first combination, the top semiconductor IC chip 100a of said each of its subsystem units 280 may be the logic IC chip, and the bottom semiconductor IC chip 100b of said each of its subsystem units 280 may be the memory IC chip; in a second combination, the bottom semiconductor IC chip 100b of said each of its subsystem units 280 may be the logic IC chip, and the top semiconductor IC chip 100a of said each of its subsystem units 280 may be the memory IC chip; in a third combination, the top semiconductor IC chip 100a of said each of its subsystem units 280 may be the logic IC chip, and the bottom semiconductor IC chip 100b of said each of its subsystem units 280 may be the input/output (I/O) IC chip. Alternatively, the top semiconductor IC chip 100a of any of its subsystem units 280 may be replaced with the fifth type of field programmable chip-on-chip module 400 as seen in FIG. 5E to be turned upside down. Alternatively, the bottom semiconductor IC chip 100b of any of its subsystem units 280 may be replaced with the sixth type of field programmable chip-on-chip module 400 as seen in FIG. 5E.

Referring to FIG. 6, for the first type of chip package 310, the bottom semiconductor IC chip 100b of each of its subsystem units 280, or the second FPGA IC chip or chiplet 200b of the fourth type of field programmable chip-on-chip module 400 of said each of its subsystem units 280 in case of replacing the bottom semiconductor IC chip 100b of said each of its subsystem units 280, may be provided, for hybrid bonding, with (1) the insulating bonding layer 52, i.e., silicon oxide or silicon oxynitride, having a top surface attached to and in contact with a bottom surface of the insulating bonding layer 52, i.e., silicon oxide or silicon oxynitride, of the top semiconductor IC chip 100a of said each of its subsystem units 280, or a bottom surface of the insulating bonding layer 52, i.e., silicon oxide or silicon oxynitride, of the second FPGA IC chip or chiplet 200b of the third type of field programmable chip-on-chip module 400 of said each of its subsystem units 280 in case of replacing the top semiconductor IC chip 100a of said each of its subsystem units 280, and (2) the metal pads 6a, i.e., copper layer 24 thereof, each having a top surface bonded to and in contact with a bottom surface of one of the metal pads 6a, i.e., copper layer 24 thereof, of the top semiconductor IC chip 100a of said each of its subsystem units 280, or a bottom surface of one of the metal pads 6a, i.e., copper layer 24 thereof, of the second FPGA IC chip or chiplet 200b of the third type of field programmable chip-on-chip module 400 of said each of its subsystem units 280 in case of replacing the top semiconductor IC chip 100a of said each of its subsystem units 280. Each of the vertical-through-via (VTV) connectors 467 of each of its subsystem units 280 may be provided with (1) the insulating bonding layer 52, i.e., silicon oxide or silicon oxynitride, having a top surface attached to and in contact with a bottom surface of the insulating bonding layer 52, i.e., silicon oxide or silicon oxynitride, of the top semiconductor IC chip 100a of said each of its subsystem units 280, or a bottom surface of the insulating bonding layer 52, i.e., silicon oxide or silicon oxynitride, of the second FPGA IC chip or chiplet 200b of the third type of field programmable chip-on-chip module 400 of said each of its subsystem units 280 in case of replacing the top semiconductor IC chip 100a of said each of its subsystem units 280, and (2) the through silicon vias (TSV) 157, i.e., copper layer 156 thereof, each having a top surface bonded to and in contact with a bottom surface of one of the metal pads 6a, i.e., copper layer 24 thereof, of the top semiconductor IC chip 100a of said each of its subsystem units 280, or a bottom surface of one of the metal pads 6a, i.e., copper layer 24 thereof, of the second FPGA IC chip or chiplet 200b of the third type of field programmable chip-on-chip module 400 of said each of its subsystem units 280 in case of replacing the top semiconductor IC chip 100a of said each of its subsystem units 280. Each of the metal pads 6a of each of the top and bottom semiconductor IC chips 100a and 100b of said each of its subsystem units 280, or each of the metal pads 6a of the second FPGA IC chip or chiplet 200b of each or either of the third and fourth type of field programmable chip-on-chip module(s) 400 of said each of its subsystem units 280 in case of replacing each or either of the top and bottom semiconductor IC chips 100a and 100b of said each of its subsystem units 280, may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6a of each of the top and bottom semiconductor IC chips 100a and 100b of said each of its subsystem units 280, or the pitch between neighboring two of the metal pads 6a of the second FPGA IC chip or chiplet 200b of each or either of the third and fourth type of field programmable chip-on-chip module(s) 400 of said each of its subsystem units 280 in case of replacing each or either of the top and bottom semiconductor IC chips 100a and 100b of said each of its subsystem units 280, may be smaller than 10, 5, 2 or 1 micrometers, or between 0.2 and 10 micrometers, 0.2 and 5 micrometers, 0.2 and 2 micrometers, or 0.2 and 1 micrometers. The bottom semiconductor IC chip 100b of said each of its subsystem units 280, or each of the first and second FPGA IC chips or chiplets 200a and 200b of the fourth type of field programmable chip-on-chip module 400 of said each of its subsystem units 280 in case of replacing the bottom semiconductor IC chip 100b of said each of its subsystem units 280, may be provided with the semiconductor devices 4, such as transistors, as illustrated in FIG. 3F or 5D at a top surface of the semiconductor substrate 2 thereof, and the top semiconductor IC chip 100a of each of its subsystem units 280, or each of the first and second FPGA IC chips or chiplets 200a and 200b of the third type of field program- mable chip-on-chip module 400 of said each of its subsys- tem units 280 in case of replacing the top semiconductor IC chip 100a of said each of its subsystem units 280, may be provided, as illustrated in FIG. 3E or 5C to be turned upside down, with the semiconductor devices 4, such as transistors, at a bottom surface of the semiconductor substrate 2 thereof facing the top surface of the semiconductor substrate 2 of the bottom semiconductor IC chip 100b of said each of its subsystem units 280, or the top surface of the semiconductor substrate 2 of each of the first and second FPGA IC chips or chiplets 200a and 200b of the fourth type of field program- mable chip-on-chip module 400 of said each of its subsys- tem units 280 in case of replacing the bottom semiconductor IC chip 100b of said each of its subsystem units 280.

Referring to FIG. 6, for the first type of chip package 310, each of its subsystem units 280 may further include a polymer layer 92, i.e., insulating dielectric layer, made of molding compound, epoxy-based material, polyimide or silicon oxide for example, in multiple gaps each between neighboring two of the bottom semiconductor IC chip 100b thereof and the vertical-through-via (VTV) connectors 467 thereof, or between neighboring two of the fourth type of field programmable chip-on-chip module 400 thereof, in case of replacing the bottom semiconductor IC chip 100b thereof, and the vertical-through-via (VTV) connectors 467 thereof, and under the top semiconductor IC chip 100a thereof, or the third type of field programmable chip-on-chip module 400 thereof in case of replacing the top semicon- ductor IC chip 100a thereof. For the first type of chip package 310, the polymer layer 92 of each of its subsystem units 280, the semiconductor substrate 2 of each of the bottom semiconductor IC chip 100b and vertical-through- via (VTV) connectors 467 of said each of its subsystem units 280, and the semiconductor substrate 2 of the first FPGA IC chip or chiplet 200a of the fourth type of field programmable chip-on-chip module 400 of said each of its subsystem units 280 in case of replacing the bottom semiconductor IC chip 100b of said each of its subsystem units 280, may have a portion at a backside thereof removed by a chemical- mechanical-polishing (CMP) or mechanical grinding pro- cess such that each of the through silicon vias (TSVs) 157 of said each of the bottom semiconductor IC chip 100b and vertical-through-via (VTV) connectors 467, and each of the through silicon vias (TSVs) 157 of the first FPGA IC chip or chiplet 200a of the fourth type of field programmable chip-on-chip module 400 of said each of its subsystem units 280 in case of replacing the bottom semiconductor IC chip 100b of said each of its subsystem units 280, that is, the electroplated copper layer 156 of said each of the through silicon vias (TSVs) 157, may have a backside substantially coplanar with the backside of the semiconductor substrate 2 of said each of the bottom semiconductor IC chip 100b and vertical-through-via (VTV) connectors 467, the backside of the semiconductor substrate 2 of the first FPGA IC chip or chiplet 200a of the fourth type of field programmable chip-on-chip module 400 of said each of its subsystem units 280 in case of replacing the bottom semiconductor IC chip 100b of said each of its subsystem units 280, and a bottom surface of the polymer layer 92 of said each of its subsystem units 280. Each of the through silicon vias (TSVs) 157 of each of the vertical-through-via (VTV) connectors 467 of each of its subsystem units 280 may couple to a voltage of power supply for delivering a power supply or a voltage of ground reference for delivering a ground reference or may pass signals or clocks for signal or clock transmission. The semiconductor substrate 2 of the bottom semiconductor IC chip 100b of each of its subsystem units 280, or the semiconductor substrate 2 of the first FPGA IC chip or chiplet 200a of the fourth type of field programmable chip-on-chip module 400 of said each of its subsystem units 280 in case of replacing the bottom semiconductor IC chip 100b of said each of its subsystem units 280, may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the bottom semiconductor IC chip 100b of said each of its subsystem units 280, or each of the through silicon vias (TSVs) 157 of the first FPGA IC chip or chiplet 200a of the fourth type of field programmable chip-on-chip module 400 of said each of its subsystem units 280 in case of replacing the bottom semiconductor IC chip 100b of said each of its subsystem units 280, may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example.

Referring to FIG. 6, for the first type of chip package 310, each of its subsystem units 280 may further include multiple metal bumps, pillars or pads in an array at a bottom thereof, each of which may be of one type of the first, second, third and fourth types having the same specification as that of the first, second, third and fourth types of micro-bumps, micropillars or micro-pads 34 respectively as illustrated in FIG. 3A to be turned upside down. Each of the first, second, third or fourth type of metal bumps, pillars or pads of said each of its subsystem units 280 may have the adhesion layer 26a on a bottom surface of one of the through silicon vias (TSVs) 157 of one of the bottom semiconductor IC chip 100b and vertical-through-via (VTV) connectors 467 of said each of its subsystem units 280, or a bottom surface of one of the through silicon vias (TSVs) 157 of the first FPGA IC chip or chiplet 200a of the fourth type of field programmable chip-on-chip module 400 of said each of its subsystem units 280 in case of replacing the bottom semiconductor IC chip 100b of said each of its subsystem units 280.

Referring to FIG. 6, for the first type of chip package 310, each of its subsystem units 280 may have the first, second, third or fourth type of metal bumps, pillars or pads bonded to its interposer 551 to form multiple metal contacts 563 each between one of the bottom semiconductor IC chip 100b and vertical-through-via (VTV) connectors 467 of said each of its subsystem units 280 and its interposer 551, or between the first FPGA IC chip or chiplet 200a of the fourth type of field programmable chip-on-chip module 400 of said each of its subsystem units 280, in case of replacing the bottom semiconductor IC chip 100b of said each of its first type of subsystem units 280, and its interposer 551, wherein said each of its metal contacts 563 may include (1) a copper layer having a thickness between 2 μm and 20 μm and a largest transverse dimension 1 μm and 15 μm between said one of the bottom semiconductor IC chip 100b and third type of vertical-through-via (VTV) connectors 467 and its interposer 551, or between the first FPGA IC chip or chiplet 200a of the fourth type of field programmable chip-on-chip module 400 of said each of its subsystem units 280, in case of replacing the bottom semiconductor IC chip 100b of said each of its subsystem units 280, and its interposer 551, and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The first type of chip package 310 may further include (1) an underfill 564, i.e., polymer layer, between said each of its subsystem units 280 and its interposer 551, covering a sidewall of each of its metal contacts 563 between said each of its subsystem units 280 and its interposer 551, (2) a polymer layer 192, i.e., insulating dielectric layer, made of molding compound, epoxy-based material, polyimide or silicon oxide for example, on its interposer 551 and underfill 564, wherein its polymer layer 192 has a top surface coplanar with a top surface of the top semiconductor IC chip 100a of said each of its subsystem units 280, or a top surface of the first FPGA IC chip or chiplet 200a of the third type of field programmable chip-on-chip module 400 of said each of its subsystem units 280 in case of replacing the top semiconductor IC chip 100a of said each of its subsystem units 280, and (3) multiple metal bumps, pillars or pads 570 in an array on a bottom surface of its interposer 551, wherein its metal bumps, pillars or pads 570 may act as external pins of the first type of chip package 310 to couple or bond to external circuits. Each of its metal bumps, pillars or pads 570 may be of various types. Its first type of metal bumps, pillars or pads 570 may formed each with (1) an adhesion layer 26a, such as titanium (Ti) or titanium nitride (TiN) layer having a thickness between 1 nm and 50 nm, on the backside of one of the through silicon vias 558 of its interposer 551, i.e., the backside of the copper layer 557 of said one of the through silicon vias 558, (2) a seed layer 26b, such as copper, on and under the adhesion layer 26a of said each of its first type of metal bumps, pillars or pads 570 and (3) a copper layer 32 having a thickness between 1 μm and 60 μm on and under the seed layer 26b of said each of its first type of metal bumps, pillars or pads 570. Alternatively, its second type of metal bumps, pillars or pads 570 may be formed each with the adhesion layer 26a, seed layer 26b and copper layer 32 as mentioned above for its first type of metal bumps, pillars or pads 570 and may further include a tin-containing solder cap 33, made of tin or a tin-silver alloy, having a thickness between 1 μm and 50 μm or between 20 μm and 100 μm on and under the copper layer 32 of said each of its second type of metal bumps, pillars or pads 570. Alternatively, its third type of metal bumps, pillars or pads 570 may be formed each with a gold layer having a thickness between 3 and 15 micrometers under the backside of one of the through silicon vias 558 of its interposer 551, i.e., a backside of the copper layer 557 of said one of the through silicon vias 558. The first type of chip package 310 in FIG. 6 is only shown with its second type of metal bumps, pillars or pads 570.

For the first type of chip package 310 as seen in FIG. 6, the bottom semiconductor IC chip 100b of each of its subsystem units 280 may have a first set of small I/O circuits coupling respectively to a second set of small I/O circuits of the top semiconductor IC chip 100a of said each of its subsystem units 280 through the bonding of a set of metal pads 6a of the bottom semiconductor IC chip 100b of said each of its subsystem units 280 to a set of metal pads 6a of the top semiconductor IC chip 100a of said each of its subsystem units 280 respectively. Alternatively, the top semiconductor IC chip 100a of any first one of its subsystem units 280 may be replaced with the fifth type of field programmable chip-on-chip module 400 as seen in FIG. 5E to be turned upside down, wherein the bottom semiconductor IC chip 100b of the first one of its subsystem units 280 may have the first set of small I/O circuits coupling respectively to a third set of small I/O circuits of the second FPGA IC chip or chiplet 200b of the third type of field programmable chip-on-chip module 400 of the first one of its subsystem units 280 through the bonding of a set of metal pads 6a of the bottom semiconductor IC chip 100b of the first one of its subsystem units 280 to a set of metal pads 6a of the second FPGA IC chip or chiplet 200b of the third type of field programmable chip-on-chip module 400 of the first one of its subsystem units 280 respectively. Alternatively, the bottom semiconductor IC chip 100b of any second one of its subsystem units 280 may be replaced with the sixth type of field programmable chip-on-chip module 400 as seen in FIG. 5F, wherein the top semiconductor IC chip 100*a* of the second one of its subsystem units 280 may have the second set of small I/O circuits coupling respectively to a fourth set of small I/O circuits of the second FPGA IC chip or chiplet 200*b* of the fourth type of field programmable chip-on-chip module 400 of the second one of its subsystem units 280 through the bonding of a set of metal pads 6*a* of the top semiconductor IC chip 100*a* of the second one of its subsystem units 280 to a set of metal pads 6*a* of the second FPGA IC chip or chiplet 200*b* of the fourth type of field programmable chip-on-chip module 400 of the second one of its subsystem units 280 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the first type of chip package 310, in the case that the number of its subsystem units 280 is three as seen in FIG. 6, the top semiconductor IC chip 100*a* of a middle one of its subsystem units 280 may be a central-processing-unit (CPU) IC chip, the top semiconductor IC chip 100*a* of a right one of its subsystem units 280 may be a graphic-processing unit (GPU) IC chip, i.e., data-processing-unit (DPU) IC chip, the top semiconductor IC chip 100*a* of a left one of its subsystem units 280 may be a FPGA IC chip, and the bottom semiconductor IC chip 100*b* of each of its subsystem units 280 may be the HBM IC chip, such as SRAM IC chip or DRAM IC chip. The bottom semiconductor IC chip 100*b* of each of its subsystem units 280 may couple to the top semiconductor IC chip 100*a* of said each of its subsystem units 280 for parallel data transmission with a data bit width of equal to or greater than 64, 128, 256, 512, 1024, 2048, 4096, 8K, or 16K. Alternatively, the FPGA IC chip for the top semiconductor IC chip 100*a* of the left one of its subsystem units 280 may be replaced with the fifth type of field programmable chip-on-chip module 400 as seen in FIG. 5E to be turned upside down, wherein the bottom semiconductor IC chip 100*b* of the left one of its subsystem units 280 may couple to the second FPGA IC chip or chiplet 200*b* of the third type of field programmable chip-on-chip module 400 of the left one of its subsystem units 280 for parallel data transmission with a data bit width of equal to or greater than 64, 128, 256, 512, 1024, 2048, 4096, 8K, or 16K.

Further, for the first type of chip package 310 as seen in FIG. 6, the top semiconductor IC chip 100*a* of each of its subsystem units 280, or each of the first and second FPGA IC chips or chiplets 200*a* and 200*b* of the third type of field programmable chip-on-chip module 400 of said each of its subsystem units 280 in case of replacing the top semiconductor IC chip 100*a* of said each of its subsystem units 280, may be fabricated or implemented in a technology node equal to or more advanced than 10 nm or 5 nm, for example, in 10 nm, 7 nm, 5 nm, 3 nm or 2 nm. A voltage (Vcc or Vdd) of power supply used in the top semiconductor IC chip 100*a* of each of its subsystem units 280, or each of the first and second FPGA IC chips or chiplets 200*a* and 200*b* of the third type of field programmable chip-on-chip module 400 of said each of its subsystem units 280 in case of replacing the top semiconductor IC chip 100*a* of said each of its subsystem units 280, may be between 0.1 and 0.5 volts, between 0.1 and 0.4 volts or between 0.1 and 0.3 volts, or may be smaller than or equal to 0.5, 0.4, 0.3 or 0.2 volts. For example, the top semiconductor IC chip 100*a* of said each of its subsystem units 280, or each of the first and second FPGA IC chips or chiplets 200*a* and 200*b* of the third type of field programmable chip-on-chip module 400 of said each of its subsystem units 280 in case of replacing the top semiconductor IC chip 100*a* of said each of its subsystem units 280, may be formed with fin field effective transistors (FINFETs) or gate-all-around field effective transistors (GAAFETs) with a threshold voltage between 0.1 and 0.4 volts, between 0.1 and 0.3 volts, between 0.1 and 0.2 volts, or smaller than or equal to 0.4, 0.3 or 0.2 volts, wherein the threshold voltage is defined when the drain current thereof is at 30 nano-amperes and the voltage (Vcc or Vdd) of power supply is between 0.1 and 0.5 volts, between 0.1 and 0.4 volts or between 0.1 and 0.3 volts or smaller than or equal to 0.5, 0.4, 0.3 or 0.2 volts.

Figure 5H:
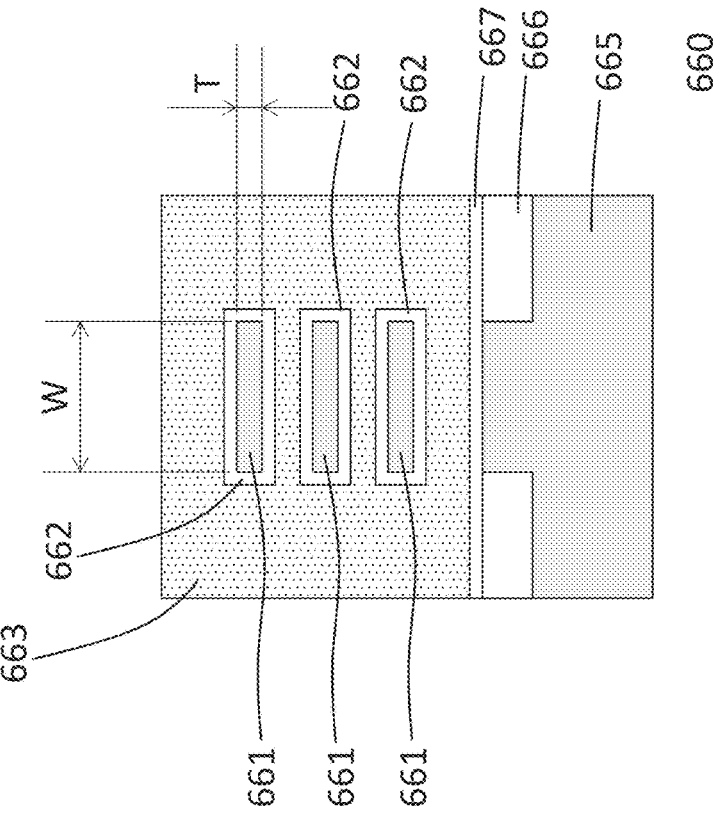
FIG. 5H is a schematically cross-sectional view of a gate-all-around field effective transistor (GAAFET) in accordance with an embodiment of the present application.
Figure 5G:
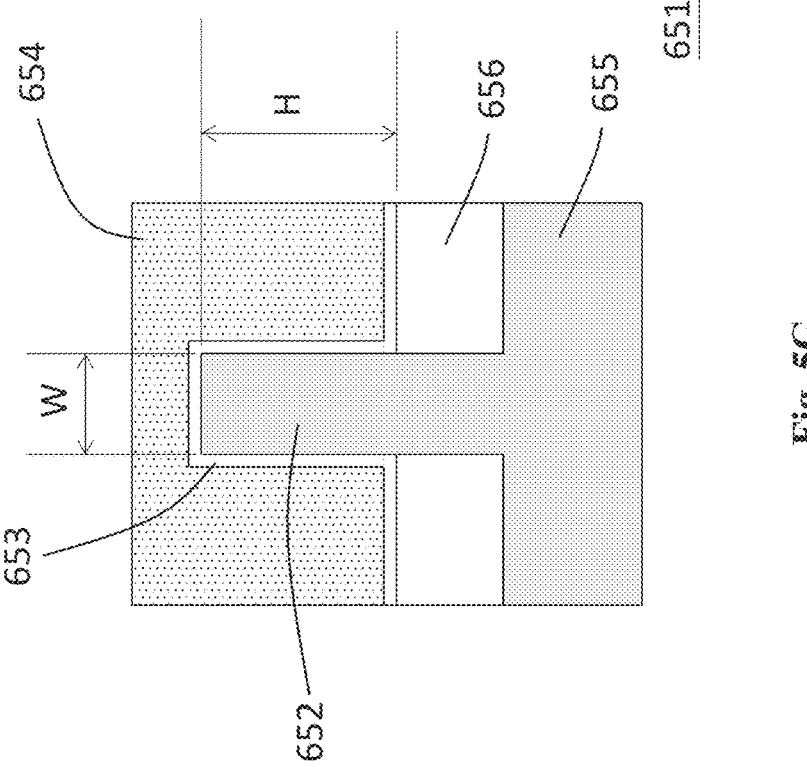
FIG. 5G is a schematically cross-sectional view of a fin field effective transistor (FINFET) in accordance with an embodiment of the present application.

FIG. 5G is a schematically cross-sectional view of a fin field effective transistor (FINFET) in accordance with an embodiment of the present application. FIG. 5H is a schematically cross-sectional view of a gate-all-around field effective transistor (GAAFET) in accordance with an embodiment of the present application. As mentioned above, the threshold voltage of the fin field effective transistor (FINFET) or gate-all-around field effective transistor (GAAFET) is low because the fin field effective transistor (FINFET) or gate-all-around field effective transistor (GAAFET) has a large effective channel width ($W_{eff}$) and a small sub-threshold leakage current. For a fin field effective transistor (FINFET) 651 as seen in FIG. 5G, its effective channel width ($W_{eff}$)=W+2H, wherein W is its physical channel width, i.e., a physical width of its silicon fin 652 protruding from a silicon substrate 655 and vertically extending through a field oxide layer 656 on the silicon substrate 655, and H is a physical height of its silicon fin 652 covered by its gate oxide layer 653 and gate material 654 over the field oxide layer 656. For a gate-all-around field effective transistor (GAAFET) 660 as seen in FIG. 5H, its effective channel width ($W_{eff}$)=2λ(W+T), wherein λ is the number of its channel layers 661 each surrounded by one of its gate oxide layers 662 and its gate material 663, W is the physical width of each of its channel layers 661 and T is the physical thickness of each of its channel layers 661, wherein its gate material 663 surrounds each of its gate oxide layers 662 and each of its channel layers 661 and its gate material 663. As an example, for a gate-all-around field effective transistor (GAAFET), if λ=3, $W_{eff}$=6 W+6T. Referring to FIG. 5H, each of its gate oxide layers 662 and each of its channel layers 661 may be formed over a silicon substrate 665 with a silicon portion protruding from a top surface of the silicon substrate 665 and extending vertically through a layer 666 of field oxide formed on the top surface of the silicon substrate 665, wherein each of its channel layers 661 may be arranged vertically over and aligned with the silicon portion of the silicon substrate 665. Further, a layer 667 of silicon oxide may be provided on a top surface of the silicon portion of the silicon substrate 665 and a top surface of the layer 666 of field oxide, and its gate material 663 may be formed on a top surface of the layer 667 of silicon oxide.

Second Type of Chip Package

Figure 7:
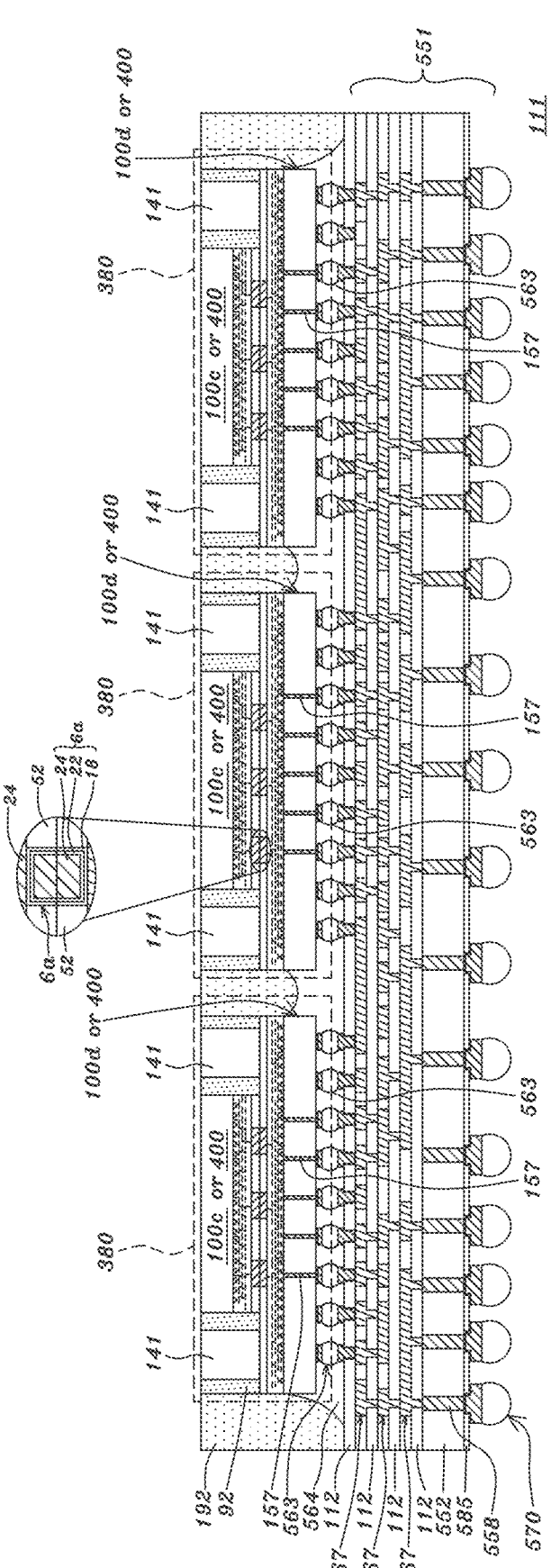
FIG. 7 is a schematically cross-sectional view showing a second type of chip package in accordance with an embodiment of the present application.

FIG. 7 is a schematically cross-sectional view showing a second type of chip package in accordance with an embodiment of the present application. Referring to FIG. 7, a second type of chip package 111 may include (1) an interposer 551 having the specification as illustrated in FIG. 6, and (2) multiple subsystem units 380 bonded to a top surface of its interposer 551. For the second type of chip package 111, each of its subsystem units 380 may include (1) a top semiconductor IC chip 100c having the specification for the fifth type of semiconductor IC chip 100 illustrated in FIG. 3E to be turned upside down, which may be used for (1) an application-specific integrated-circuit (ASIC) chip, (2) a logic IC chip, such as FPGA IC chip or chiplet 200, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (AIU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip. Each of its subsystem units 380 may further include a bottom semiconductor IC chip 100d having the specification for the sixth type of semiconductor IC chip 100 illustrated in FIG. 3F, which may be used for (1) an application-specific integrated-circuit (ASIC) chip, (2) a logic IC chip, such as FPGA IC chip or chiplet 200, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (AIU) IC chip, machine-learning-unit (MLU) IC chip, application-specific-integrated-circuit (ASIC) chip or digital-signal-processing (DSP) IC chip, (3) a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip, or (4) an input/output (I/O) IC chip. In a first combination, the top semiconductor IC chip 100c of said each of its subsystem units 380 may be the logic IC chip, and the bottom semiconductor IC chip 100d of said each of its subsystem units 380 may be the memory IC chip; in a second combination, the bottom semiconductor IC chip 100d of said each of its subsystem units 380 may be the logic IC chip, and the top semiconductor IC chip 100c of said each of its subsystem units 380 may be the memory IC chip; in a third combination, the top semiconductor IC chip 100c of said each of its subsystem units 380 may be the logic IC chip, and the bottom semiconductor IC chip 100d of said each of its subsystem units 380 may be the input/output (I/O) IC chip. Furthermore, said each of its subsystem units 380 may include multiple dummy chips 141, such as silicon chips, on the bottom semiconductor IC chip 100d of said each of its subsystem units 380. Alternatively, the top semiconductor IC chip 100c of any of its subsystem units 380 may be replaced with the fifth type of field programmable chip-on-chip module 400 as seen in FIG. 5E to be turned upside down. Alternatively, the bottom semiconductor IC chip 100d of any of its subsystem units 380 may be replaced with the sixth type of field programmable chip-on-chip module 400 as seen in FIG. 5F.

Referring to FIG. 7, for the second type of chip package 111, the bottom semiconductor IC chip 100d of each of its subsystem units 380, or the second FPGA IC chip or chiplet 200b of the fourth type of field programmable chip-on-chip module 400 of said each of its subsystem units 380 in case of replacing the bottom semiconductor IC chip 100d of said each of its subsystem units 380, may be provided, for hybrid bonding, with (1) the insulating bonding layer 52, i.e., silicon oxide or silicon oxynitride, having a top surface attached to and in contact with a bottom surface of the insulating bonding layer 52, i.e., silicon oxide or silicon oxynitride, of the top semiconductor IC chip 100c of said each of its subsystem units 380, or a bottom surface of the insulating bonding layer 52, i.e., silicon oxide or silicon oxynitride, of the second FPGA IC chip or chiplet 200b of the third type of field programmable chip-on-chip module 400 of said each of its subsystem units 380 in case of replacing the top semiconductor IC chip 100c of said each of its subsystem units 380, and attached to a bottom surface of each of the dummy chips 141 of said each of its subsystem units 380 via an adhesive glue, and (2) the metal pads 6a, i.e., copper layer 24 thereof, each having a top surface bonded to and in contact with a bottom surface of one of the metal pads 6a, i.e., copper layer 24 thereof, of the top semiconductor IC chip 100c of said each of its subsystem units 380, or a bottom surface of one of the metal pads 6a, i.e., copper layer 24 thereof, of the second FPGA IC chip or chiplet 200b of the third type of field programmable chip-on-chip module 400 of said each of its subsystem units 380 in case of replacing the top semiconductor IC chip 100c of said each of its subsystem units 380. Each of the metal pads 6a of each of the top and bottom semiconductor IC chips 100c and 100d of said each of its subsystem units 380, or each of the metal pads 6a of the second FPGA IC chip or chiplet 200b of each or either of the third and fourth type of field programmable chip-on-chip module(s) 400 of said each of its subsystem units 380 in case of replacing each or either of the top and bottom semiconductor IC chips 100c and 100d of said each of its subsystem units 380, may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6a of each of the top and bottom semiconductor IC chips 100c and 100d of said each of its subsystem units 380, or the pitch between neighboring two of the metal pads 6a of the second FPGA IC chip or chiplet 200b of each or either of the third and fourth type of field programmable chip-on-chip module(s) 400 of said each of its subsystem units 380 in case of replacing each or either of the top and bottom semiconductor IC chips 100c and 100d of said each of its subsystem units 380, may be smaller than 10, 5, 2 or 1 micrometers, or between 0.2 and 10 micrometers, 0.2 and 5 micrometers, 0.2 and 2 micrometers, or 0.2 and 1 micrometers. The bottom semiconductor IC chip 100d of said each of its subsystem units 380, or each of the first and second FPGA IC chips or chiplets 200a and 200b of the fourth type of field programmable chip-on-chip module 400 of said each of its subsystem units 380 in case of replacing the bottom semiconductor IC chip 100d of said each of its subsystem units 380, may be provided with the semiconductor devices 4, such as transistors, as illustrated in FIG. 3F or 5D at a top surface of the semiconductor substrate 2 thereof, and the top semiconductor IC chip 100c of said each of its subsystem units 380, or each of the first and second FPGA IC chips or chiplets 200a and 200b of the third type of field programmable chip-on-chip module 400 of said each of its subsystem units 380 in case of replacing the top semiconductor IC chip 100c of said each first one of its subsystem units 380, may be provided, as illustrated in FIG. 3E or 5C to be turned upside down, with the semiconductor devices 4, such as transistors, at a bottom surface of the semiconductor substrate 2 thereof facing the top surface of the semiconductor substrate 2 of the bottom semiconductor IC chip 100d of said each of its subsystem units 380, or the top surface of the semiconductor substrate 2 of each of the first and second FPGA IC chips or chiplets 200a and 200b of the fourth type of field programmable chip-on-chip module 400 of said each of its subsystem units 380 in case of replacing the bottom semiconductor IC chip 100d of said each of its subsystem units 380.

Referring to FIG. 7, for the second type of chip package 111, more than 80 percent of the through silicon vias (TSVs) 157 of the bottom semiconductor IC chip 100d of each of its subsystem units 380, or more than 80 percent of the through silicon vias (TSVs) 157 of each of the first and second FPGA IC chips or chiplets 200a and 200b of the fourth type of field programmable chip-on-chip module 400 of said each of its subsystem units 380 in case of replacing the bottom semiconductor IC chip 100d of said each of its subsystem units 380, may be arranged vertically under the top semiconductor IC chip 100c of said each of its subsystem units 380, or the third type of field programmable chip-on-chip module 400 of said each of its subsystem units 380 in case of replacing the top semiconductor IC chip 100c of said each of its subsystem units 380, while the top semiconductor IC chip 100c of said each of its subsystem units 380, or the third type of field programmable chip-on-chip module 400 of said each of its subsystem units 380 in case of replacing the top semiconductor IC chip 100c of said each of its subsystem units 380, covers less 60 percent of the total area of the top surface of the bottom semiconductor IC chip 100d of said each of its subsystem units 380, or less 60 percent of the total area of the top surface of the fourth type of field programmable chip-on-chip module 400 of said each of its subsystem units 380 in case of replacing the bottom semiconductor IC chip 100d of said each of its subsystem units 380.

Referring to FIG. 7, for the second type of chip package 111, each of its subsystem units 380 may further include a polymer layer 92, i.e., insulating dielectric layer, made of molding compound, epoxy-based material, polyimide or silicon oxide for example, in multiple gaps each between neighboring two of the top semiconductor IC chip 100c thereof and the dummy chips 141 thereof, or between neighboring two of the third type of field programmable chip-on-chip module 400 thereof, in case of replacing the top semiconductor IC chip 100c thereof, and the dummy chips 141 thereof, and over the bottom semiconductor IC chip 100d thereof, or the fourth type of field programmable chip-on-chip module 400 thereof in case of replacing the bottom semiconductor IC chip 100d thereof. For the second type of chip package 111, the semiconductor substrate 2 of the bottom semiconductor IC chip 100d of each of its subsystem units 380, or the semiconductor substrate 2 of the first FPGA IC chip or chiplet 200a of the fourth type of field programmable chip-on-chip module 400 of said each of its subsystem units 380 in case of replacing the bottom semiconductor IC chip 100d of said each of its subsystem units 380, may have a portion at a backside thereof removed by a chemical-mechanical-polishing (CMP) or mechanical grinding process, and then the bottom semiconductor IC chip 100d of each of its subsystem units 380, or the first FPGA IC chip or chiplet 200a of the fourth type of field programmable chip-on-chip module 400 of said each of its subsystem units 380 in case of replacing the bottom semiconductor IC chip 100d of said each of its subsystem units 380, may be further formed with an insulating dielectric layer 584, i.e., silicon-oxide or silicon-nitride layer or polymer layer, on a bottom surface of the semiconductor substrate 2 thereof, wherein the insulating dielectric layer 584 thereof may have a bottom surface substantially coplanar with a backside of each of the through silicon vias 558 thereof. The semiconductor substrate 2 of the bottom semiconductor IC chip 100d of said each of its subsystem units 380, or the semiconductor substrate 2 of the first FPGA IC chip or chiplet 200a of the fourth type of field programmable chip-on-chip module 400 of said each of its subsystem units 380 in case of replacing the bottom semiconductor IC chip 100d of said each of its subsystem units 380, may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the bottom semiconductor IC chip 100d of said each of its subsystem units 380, or each of the through silicon vias (TSVs) 157 of the first FPGA IC chip or chiplet 200a of the fourth type of field programmable chip-on-chip module 400 of said each of its subsystem units 380 in case of replacing the bottom semiconductor IC chip 100d of said each of its subsystem units 380, may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example.

Referring to FIG. 7, for the second type of chip package 111, each of its subsystem units 380 may further include multiple metal bumps, pillars or pads in an array at a bottom thereof, each of which may be one type of the first, second, third and fourth types having the same specification as that of the first, second, third and fourth types of micro-bumps, micro-pillars or micro-pads 34 respectively as illustrated in FIG. 3A to be turned upside down. Each of the first, second, third or fourth type of metal bumps, pillars or pads of said each of its subsystem units 380 may have the adhesion layer 26a on a bottom surface of one of the through silicon vias (TSVs) 157 of the bottom semiconductor IC chip 100d of said each of its subsystem units 380, or a bottom surface of one of the through silicon vias (TSVs) 157 of the first FPGA IC chip or chiplet 200a of the fourth type of field programmable chip-on-chip module 400 of said each of its subsystem units 380 in case of replacing the bottom semiconductor IC chip 100d of said each of its subsystem units 380.

Referring to FIG. 7, for the second type of chip package 111, each of its subsystem units 380 may have the first, second, third or fourth type of metal bumps, pillars or pads bonded to its interposer 551 to form multiple metal contacts 563 each between the bottom semiconductor IC chip 100d of said each of its subsystem units 380 and its interposer 551, or between the first FPGA IC chip or chiplet 200a of the fourth type of field programmable chip-on-chip module 400 of said each of its subsystem units 380, in case of replacing the bottom semiconductor IC chip 100d of said each of its subsystem units 380, and its interposer 551, wherein each of its metal contacts 563 may include (1) a copper layer having a thickness between 2 μm and 20 μm and a largest transverse dimension 1 μm and 15 μm between the bottom semiconductor IC chip 100d of said each of its subsystem units 380 and its interposer 551, or between the first FPGA IC chip or chiplet 200a of the fourth type of field programmable chip-on-chip module 400 of said each of its subsystem units 380, in case of replacing the bottom semiconductor IC chip 100d of said each of its subsystem units 380, and its interposer 551, and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The second type of chip package 111 may further include (1) an underfill 564, i.e., polymer layer, between said each of its subsystem units 380 and its interposer 551, covering a sidewall of each of its metal contacts 563 between said each of its subsystem units 380 and its interposer 551, (2) a polymer layer 192, i.e., insulating dielectric layer, made of molding compound, epoxy-based material, polyimide or silicon oxide for example, on its interposer 551 and underfill 564, wherein its polymer layer 192 has a top surface coplanar with a top surface of each of the top semiconductor IC chip 100c and dummy chips 141 of said each of its subsystem units 380 and a top surface of the first FPGA IC chip or chiplet 200a of the third type of field programmable chip-on-chip module 400 of said each of its subsystem units 380 in case of replacing the top semiconductor IC chip 100c of said each of its subsystem units 380, and (3) multiple metal bumps, pillars or pads 570 in an array on a bottom surface of its interposer 551, wherein its metal bumps, pillars or pads 570 may act as external pins of the second type of chip package 111 to couple or bond to external circuits. Each of its metal bumps, pillars or pads 570 may be one type of the first, second and third types having the same specification as that of the first, second or third type of metal bumps, pillars or pads 570 respectively as illustrated in FIG. 6. The second type of chip package 111 in FIG. 7 is only shown with its second type of metal bumps, pillars or pads 570.

For the second type of chip package 111 as seen in FIG. 7, the bottom semiconductor IC chip 100d of each of its subsystem units 380 may have a first set of small I/O circuits coupling respectively to a second set of small I/O circuits of the top semiconductor IC chip 100c of said each of its subsystem units 380 through the bonding of a set of metal pads 6a of the bottom semiconductor IC chip 100d of said each of its subsystem units 380 to a set of metal pads 6a of the top semiconductor IC chip 100c of said each of its subsystem units 380 respectively. Alternatively, the top semiconductor IC chip 100c of any first one of its subsystem units 380 may be replaced with the fifth type of field programmable chip-on-chip module 400 as seen in FIG. 5E to be turned upside down, wherein the bottom semiconductor IC chip 100d of the first one of its subsystem units 380 may have the first set of small I/O circuits coupling respectively to a third set of small I/O circuits of the second FPGA IC chip or chiplet 200b of the third type of field programmable chip-on-chip module 400 of the first one of its subsystem units 380 through the bonding of a set of metal pads 6a of the bottom semiconductor IC chip 100d of the first one of its subsystem units 380 to a set of metal pads 6a of the second FPGA IC chip or chiplet 200b of the third type of field programmable chip-on-chip module 400 of the first one of its subsystem units 380 respectively. Alternatively, the bottom semiconductor IC chip 100d of any second one of its subsystem units 380 may be replaced with the sixth type of field programmable chip-on-chip module 400 as seen in FIG. 5F, wherein the top semiconductor IC chip 100c of the second one of its subsystem units 380 may have the second set of small I/O circuits coupling respectively to a fourth set of small I/O circuits of the second FPGA IC chip or chiplet 200b of the fourth type of field programmable chip-on-chip module 400 of the second one of its subsystem units 380 through the bonding of a set of metal pads 6a of the top semiconductor IC chip 100c of the second one of its subsystem units 380 to a set of metal pads 6a of the second FPGA IC chip or chiplet 200b of the fourth type of field programmable chip-on-chip module 400 of the second one of its subsystem units 380 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the second type of chip package 111, in the case that the number of its subsystem units 380 is three as seen in FIG. 7, the bottom semiconductor IC chip 100d of a middle one of its subsystem units 380 may be a central-processing-unit (CPU) IC chip, the bottom semiconductor IC chip 100d of a right one of its subsystem units 380 may be a graphic-processing unit (GPU) IC chip, i.e., data-processing-unit (DPU) IC chip, the bottom semiconductor IC chip 100d of a left one of its subsystem units 380 may be a FPGA IC chip, and the top semiconductor IC chip 100c of each of its subsystem units 380 may be the HBM IC chip, such as SRAM IC chip or DRAM IC chip. The top semiconductor IC chip 100c of each of its subsystem units 380 may couple to the bottom semiconductor IC chip 100d of said each of its subsystem units 380 for parallel data transmission with a data bit width of equal to or greater than 64, 128, 256, 512, 1024, 2048, 4096, 8K, or 16K. Alternatively, the FPGA IC chip for the bottom semiconductor IC chip 100d of the left one of its subsystem units 380 may be replaced with the sixth type of field programmable chip-on-chip module 400 as seen in FIG. 5F, wherein the top semiconductor IC chip 100c of the left one of its subsystem units 380 may couple to the second FPGA IC chip or chiplet 200b of the fourth type of field programmable chip-on-chip module 400 of the left one of its subsystem units 380 for parallel data transmission with a data bit width of equal to or greater than 64, 128, 256, 512, 1024, 2048, 4096, 8K, or 16K.

Further, for the second type of chip package 111 as seen in FIG. 7, the bottom semiconductor IC chip 100d of each of its subsystem units 380, or each of the first and second FPGA IC chips or chiplets 200a and 200b of the fourth type of field programmable chip-on-chip module 400 of said each of its subsystem units 380 in case of replacing the bottom semiconductor IC chip 100d of said each of its subsystem units 380, may be fabricated or implemented in a technology node equal to or more advanced than 10 nm or 5 nm, for example, in 10 nm, 7 nm, 5 nm, 3 nm or 2 nm. A voltage (Vcc or Vdd) of power supply used in the bottom semiconductor IC chip 100d of each of its subsystem units 380, or each of the first and second FPGA IC chips or chiplets 200a and 200b of the fourth type of field programmable chip-on-chip module 400 of said each of its subsystem units 380 in case of replacing the bottom semiconductor IC chip 100d of said each of its subsystem units 380, may be between 0.1 and 0.5 volts, between 0.1 and 0.4 volts or between 0.1 and 0.3 volts, or may be smaller than or equal to 0.5, 0.4, 0.3 or 0.2 volts. For example, the bottom semiconductor IC chip 100d of said each of its subsystem units 380, or each of the first and second FPGA IC chips or chiplets 200a and 200b of the fourth type of field programmable chip-on-chip module 400 of said each of its subsystem units 380 in case of replacing the bottom semiconductor IC chip 100d of said each of its subsystem units 380, may be formed with fin field effective transistors (FINFETs) or gate-all-around field effective transistors (GAAFETs), each of which may be referred to those as illustrated in either of FIGS. 5G and 5H, with a threshold voltage between 0.1 and 0.4 volts, between 0.1 and 0.3 volts, between 0.1 and 0.2 volts, or smaller than or equal to 0.4, 0.3 or 0.2 volts, wherein the threshold voltage is defined when the drain current thereof is at 30 nano-amperes and the voltage (Vcc or Vdd) of power supply is between 0.1 and 0.5 volts, between 0.1 and 0.4 volts or between 0.1 and 0.3 volts or smaller than or equal to 0.5, 0.4, 0.3 or 0.2 volts.

Third Type of Chip Package

Figure 8:
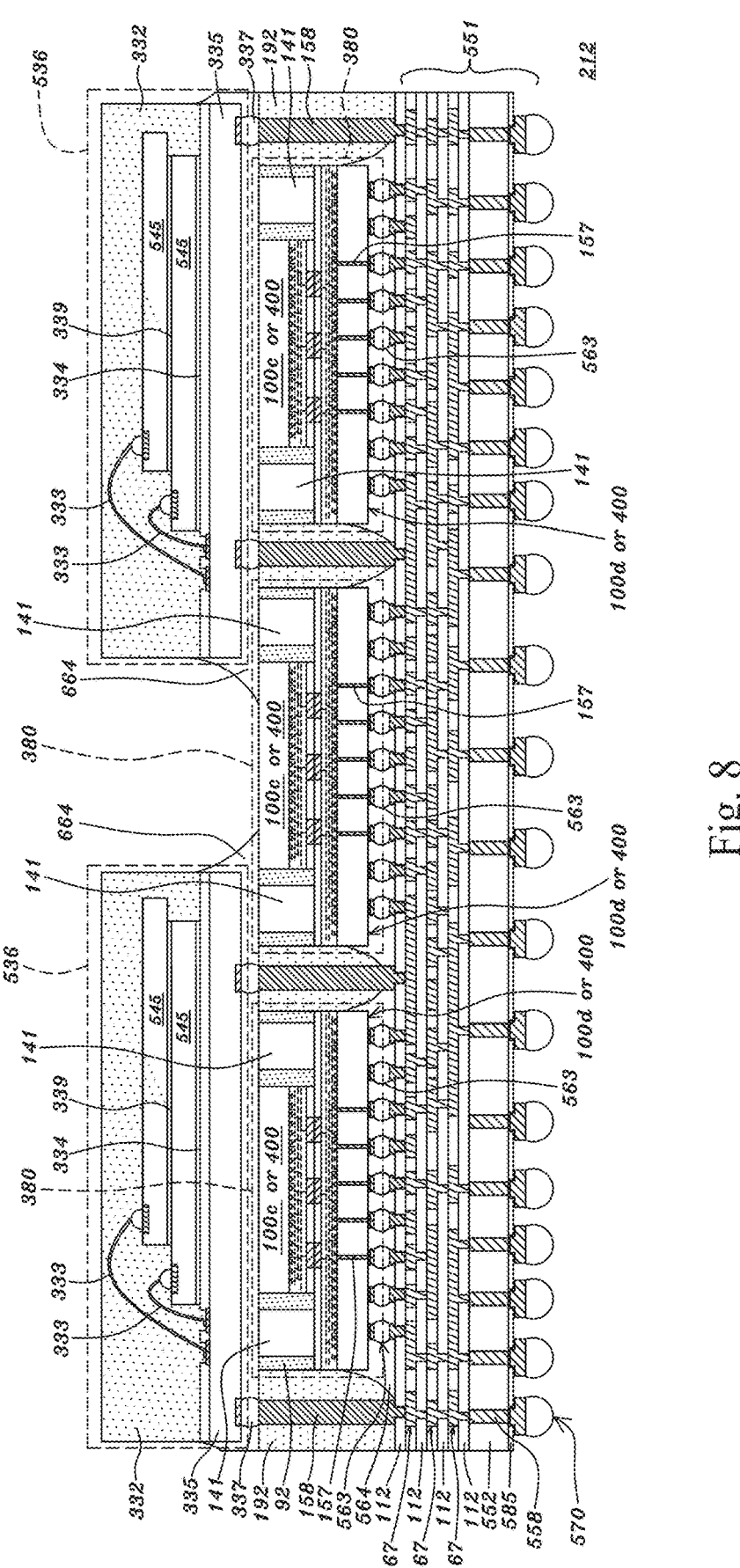
FIG. 8 is a schematically cross-sectional view showing a package-on-package (POP) assembly for a third type of chip package in accordance with an embodiment of the present application.

FIG. 8 is a schematically cross-sectional view showing a package-on-package (POP) assembly for a third type of chip package in accordance with an embodiment of the present application. A third type of chip package 212 as seen in FIG. 8 may have a similar structure to the second type of chip package 111 as seen in FIG. 7. For an element indicated by the same reference number shown in FIGS. 7 and 8, the specification of the element as seen in FIG. 8 may be referred to that of the element as illustrated in FIG. 7. The difference therebetween is that the third type of chip package 212 as seen in FIG. 8 may have multiple memory chip packages 536 mounted thereover, and the third type of chip package 212 may further include multiple through package vias (TPVs) 158 on the topmost one of interconnection metal layers 67 of its interposer 551 and in its polymer layer 192, wherein each of its through package vias (TPVs) 158 may extend vertically in its polymer layer 92 and couple one or more of the interconnection metal layers 67 of its interposer 551 to one of its memory chip packages 536. For the third type of chip package 212, some of its through package vias (TPVs) 158 may be arranged on a peripheral region of its interposer 551 surrounding a central region of its interposer 551, on which its subsystem units 380 are arranged, and some of its through package vias (TPVs) 158 may be arranged on the central region of its interposer 551 and between neighboring two of its subsystem units 380. Each of its through package vias (TPVs) 158 may have a top surface coplanar with a top surface of its polymer layer 192, the backside of the top semiconductor IC chip 100c of each of its subsystem units 380, a top surface of each of the dummy chips 141 of said each of its subsystem units 380, a top surface of the polymer layer 92 of said each of its subsystem units 380, and a top surface of the first FPGA IC chip or chiplet 200a of the third type of field programmable chip-on-chip module 400 of said each of its subsystem units 380 in case of replacing the top semiconductor IC chip 100c of said each of its subsystem units 380. Each of its through package vias (TPVs) 158 may be made of a copper layer having a thickness between 20 μm and 300 μm, 30 μm and 200 μm, 50 μm and 150 μm, 50 μm and 120 μm, 20 μm and 100 μm, 10 μm and 100 μm, 20 μm and 60 μm, 20 μm and 40 μm, or 20 μm and 30 μm, or greater than or equal to 100 μm, 50 μm, 30 μm or 20 μm. Its metal bumps, pillars or pads 570 may act as external pins of the third type of chip package 212 to couple or bond to external circuits.

For more elaboration, referring to FIG. 8, each of the memory chip packages 536 of the third type of chip package 212 may include two semiconductor IC chips 545 stacked with each other and mounted to each other via an adhesive layer 339 such as silver paste or a heat conductive paste, wherein an upper one of its semiconductor IC chips 545 may overhang from an edge of a lower one of its semiconductor IC chips 545, and its two semiconductor IC chips 545 may be (1) two respective non-volatile memory IC chips, such as two respective NAND flash memory chips, NOR flash memory chips, magnetoresistive random-access-memory (MRAM) IC chips, resistive random-access-memory (RRAM) IC chips or ferroelectric random-access-memory (FRAM) IC chips, or (2) two respective volatile memory (VM) IC chips, such as two respective DRAM IC chips or SRAM IC chips. Each of the memory chip packages 536 of the third type of chip package 212 may further include (1) a circuit board 335 under its semiconductor IC chips 545 to have the lower one of its semiconductor IC chips 545 to be attached to a top surface thereof via an adhesive layer 334 such as silver paste or a heat conductive paste, (2) multiple wirebonded wires 333 each coupling one of its semiconductor IC chips 545 to its circuit board 335, (3) a molded polymer 332 over its circuit board 335, encapsulating its semiconductor IC chips 545 and wirebonded wires 333 and (4) multiple solder balls 337 on a bottom surface of its circuit board 335 to be each bonded to the top surface of one of the through package vias (TPVs) 158 of the third type of chip package 212.

Referring to FIG. 8, the third type of chip package 212 may further include an underfill 664 between the circuit board 335 of each of its memory chip packages 536 and a planar top surface composed of the top surface of its polymer layer 192, the backside of the top semiconductor IC chip 100c of said each of its subsystem units 380, the top surface of each of the dummy chips 141 of said each of its subsystem units 380, the top surface of the polymer layer 92 of said each of its subsystem units 380 and the top surface of the first FPGA IC chip or chiplet 200a of the third type of field programmable chip-on-chip module 400 of said each of its subsystem units 380 in case of replacing the top semiconductor IC chip 100c of said each of its subsystem units 380, covering a sidewall of each of the solder balls 337 of each of its memory chip packages 536.

For the third type of chip package 212 as seen in FIG. 8, the bottom semiconductor IC chip 100d of each of its subsystem units 380 may have a first set of small I/O circuits coupling respectively to a second set of small I/O circuits of the top semiconductor IC chip 100c of said each of its subsystem units 380 through the bonding of a set of metal pads 6a of the bottom semiconductor IC chip 100d of said each of its subsystem units 380 to a set of metal pads 6a of the top semiconductor IC chip 100c of said each of its subsystem units 380 respectively. Alternatively, the top semiconductor IC chip 100c of any first one of its subsystem units 380 may be replaced with the fifth type of field programmable chip-on-chip module 400 as seen in FIG. 5E to be turned upside down, wherein the bottom semiconductor IC chip 100d of the first one of its subsystem units 380 may have the first set of small I/O circuits coupling respectively to a third set of small I/O circuits of the second FPGA IC chip or chiplet 200b of the third type of field programmable chip-on-chip module 400 of the first one of its subsystem units 380 through the bonding of a set of metal pads 6a of the bottom semiconductor IC chip 100d of the first one of its subsystem units 380 to a set of metal pads 6a of the second FPGA IC chip or chiplet 200b of the third type of field programmable chip-on-chip module 400 of the first one of its subsystem units 380 respectively. Alternatively, the bottom semiconductor IC chip 100d of any second one of its subsystem units 380 may be replaced with the sixth type of field programmable chip-on-chip module 400 as seen in FIG. 5F, wherein the top semiconductor IC chip 100c of the second one of its subsystem units 380 may have the second set of small I/O circuits coupling respectively to a fourth set of small I/O circuits of the second FPGA IC chip or chiplet 200b of the fourth type of field programmable chip-on-chip module 400 of the second one of its subsystem units 380 through the bonding of a set of metal pads 6a of the top semiconductor IC chip 100c of the second one of its subsystem units 380 to a set of metal pads 6a of the second FPGA IC chip or chiplet 200b of the fourth type of field programmable chip-on-chip module 400 of the second one of its subsystem units 380 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the third type of chip package 212, in the case that the number of its subsystem units 380 is three as seen in FIG. 8, the bottom semiconductor IC chip 100*d* of a middle one of its subsystem units 380 may be a central-processing-unit (CPU) IC chip, the bottom semiconductor IC chip 100*d* of a right one of its subsystem units 380 may be a graphic-processing unit (GPU) IC chip, i.e., data-processing-unit (DPU) IC chip, the bottom semiconductor IC chip 100*d* of a left one of its subsystem units 380 may be a FPGA IC chip, and the top semiconductor IC chip 100*c* of each of its subsystem units 380 may be the HBM IC chip, such as SRAM IC chip or DRAM IC chip. The top semiconductor IC chip 100*c* of each of its subsystem units 380 may couple to the bottom semiconductor IC chip 100*d* of said each of its subsystem units 380 for parallel data transmission with a data bit width of equal to or greater than 64, 128, 256, 512, 1024, 2048, 4096, 8K, or 16K. Alternatively, the FPGA IC chip for the bottom semiconductor IC chip 100*d* of the left one of its subsystem units 380 may be replaced with the sixth type of field programmable chip-on-chip module 400 as seen in FIG. 5F, wherein the top semiconductor IC chip 100*c* of the left one of its subsystem units 380 may couple to the second FPGA IC chip or chiplet 200*b* of the fourth type of field programmable chip-on-chip module 400 of the left one of its subsystem units 380 for parallel data transmission with a data bit width of equal to or greater than 64, 128, 256, 512, 1024, 2048, 4096, 8K, or 16K.

Further, referring to FIG. 8, for the specific example, the two semiconductor IC chips 545 of each of its memory chip packages 536 are two non-volatile memory (NVM) IC chips such as two respective NAND flash memory chips, NOR flash memory chips, magnetoresistive random access memory (MRAM) IC chips, resistive random access memory (RRAM) IC chips or ferroelectric random access memory (FRAM) IC chips. A first large I/O circuit of each of the NVM IC chips 545 of each of its memory chip packages 536 may have a large driver coupling to a large receiver of a second large I/O circuit of the bottom semiconductor IC chip 100*d* of the left one of its subsystem units 380, or a large receiver of a third large I/O circuit of either of the first and second FPGA IC chips or chiplets 200*a* and 200*b* of the fourth type of field programmable chip-on-chip module 400 of the left one of its subsystem units 380 in case of replacing the bottom semiconductor IC chip 100*d* of the left one of its subsystem units 380, through, in sequence, (1) one of the wirebonded wires 333 of said each of its memory chip packages 536, (2) the circuit board 335 of said each of its memory chip packages 536, (3) one of the solder balls 337 of said each of its memory chip packages 536, (4) one of its through package vias (TPVs) 158, (5) one or more of the interconnection metal layers 67 of its interposer 551, (6) one of its metal contacts 563 between its interposer 551 and the bottom semiconductor IC chip 100*d* of the left one of its subsystem units 380, or the first FPGA IC chip or chiplet 200*a* of the fourth type of field programmable chip-on-chip module 400 of the left one of its subsystem units 380 in case of replacing the bottom semiconductor IC chip 100*d* of the left one of its subsystem units 380, and (7) one of the through silicon vias (TSVs) 157 of the bottom semiconductor IC chip 100*d* of the left one of its subsystem units 380, or one of the through silicon vias (TSVs) 157 of the first FPGA IC chip or chiplet 200*a* of the fourth type of field programmable chip-on-chip module 400 of the left one of its subsystem units 380 in case of replacing the bottom semiconductor IC chip 100*d* of the left one of its subsystem units 380, for downloading CPM data, i.e., resulting values or programming codes, stored in multiple non-volatile memory cells of said each of the NVM IC chips 545 of said each of its memory chip packages 536 from the large driver of the first large I/O circuit to the large receiver of the second large I/O circuit to be passed to (1) the memory cells 490 of any type of the first, second and third types of field programmable logic cells or elements (LCEs) 2014 of the bottom semiconductor IC chip 100*d* of the left one of its subsystem units 380 as illustrated in FIGS. 1A-1C, or the memory cells 490 of any type of the first, second and third types of field programmable logic cells or elements (LCEs) 2014 of either of the first and second FPGA IC chips or chiplets 200*a* or 200*b* of the fourth type of field programmable chip-on-chip module 400 of the left one of its subsystem units 380 in case of replacing the bottom semiconductor IC chip 100*d* of the left one of its subsystem units 380, to be stored therein and/or (2) the memory cells 362 of any type of the first and second types of field programmable switch cells 379 of the bottom semiconductor IC chip 100*d* of the left one of its subsystem units 380 as illustrated in FIGS. 2A and 2B, or the memory cells 362 of any type of the first and second types of field programmable switch cells 379 of either of the first and second FPGA IC chips or chiplets 200*a* and 200*b* of the fourth type of field programmable chip-on-chip module 400 of the left one of its subsystem units 380 in case of replacing the bottom semiconductor IC chip 100*d* of the left one of its subsystem units 380, to be stored therein. It is noted that each of the first and second large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF.

Further, for the third type of chip package 212 as seen in FIG. 8, the bottom semiconductor IC chip 100*d* of each of its subsystem units 380, or each of the first and second FPGA IC chips or chiplets 200*a* and 200*b* of the fourth type of field programmable chip-on-chip module 400 of said each of its subsystem units 380 in case of replacing the bottom semiconductor IC chip 100*d* of said each of its subsystem units 380, may be fabricated or implemented in a technology node equal to or more advanced than 10 nm or 5 nm, for example, in 10 nm, 7 nm, 5 nm, 3 nm or 2 nm. A voltage (Vcc or Vdd) of power supply used in the bottom semiconductor IC chip 100*d* of each of its subsystem units 380, or each of the first and second FPGA IC chips or chiplets 200*a* and 200*b* of the fourth type of field programmable chip-on-chip module 400 of said each of its subsystem units 380 in case of replacing the bottom semiconductor IC chip 100*d* of said each of its subsystem units 380, may be between 0.1 and 0.5 volts, between 0.1 and 0.4 volts or between 0.1 and 0.3 volts, or may be smaller than or equal to 0.5, 0.4, 0.3 or 0.2 volts. For example, the bottom semiconductor IC chip 100*d* of said each of its subsystem units 380, or each of the first and second FPGA IC chips or chiplets 200*a* and 200*b* of the fourth type of field programmable chip-on-chip module 400 of said each of its subsystem units 380 in case of replacing the bottom semiconductor IC chip 100*d* of said each of its subsystem units 380, may be formed with fin field effective transistors (FINFETs) or gate-all-around field effective transistors (GAAFETs), each of which may be referred to those as illustrated in either of FIGS. 5G and 5H, with a threshold voltage between 0.1 and 0.4 volts, between 0.1 and 0.3 volts, between 0.1 and 0.2 volts, or smaller than or equal to 0.4, 0.3 or 0.2 volts, wherein the threshold voltage is defined when the drain current thereof is at 30 nano-amperes and the voltage (Vcc or Vdd) of power supply is between 0.1 and 0.5 volts, between 0.1 and 0.4 volts or between 0.1 and 0.3 volts or smaller than or equal to 0.5, 0.4, 0.3 or 0.2 volts.

Fourth Type of Chip Package

Figure 9A:
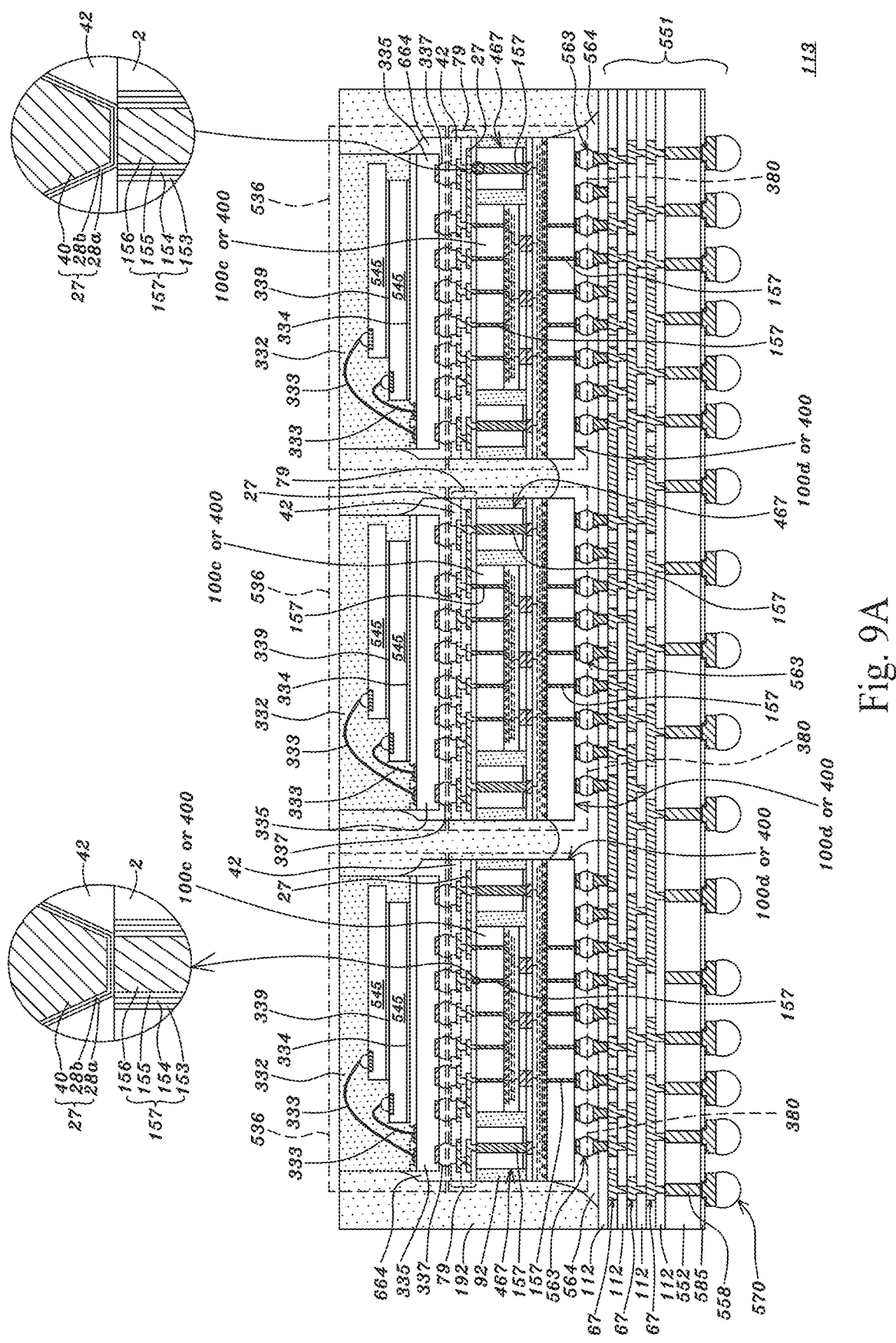
FIGS. 9A and 9B are schematically cross-sectional views showing various package-on-package (POP) assemblies for a fourth type of chip package for a first alternative in accordance with an embodiment of the present application.
Figure 9B:
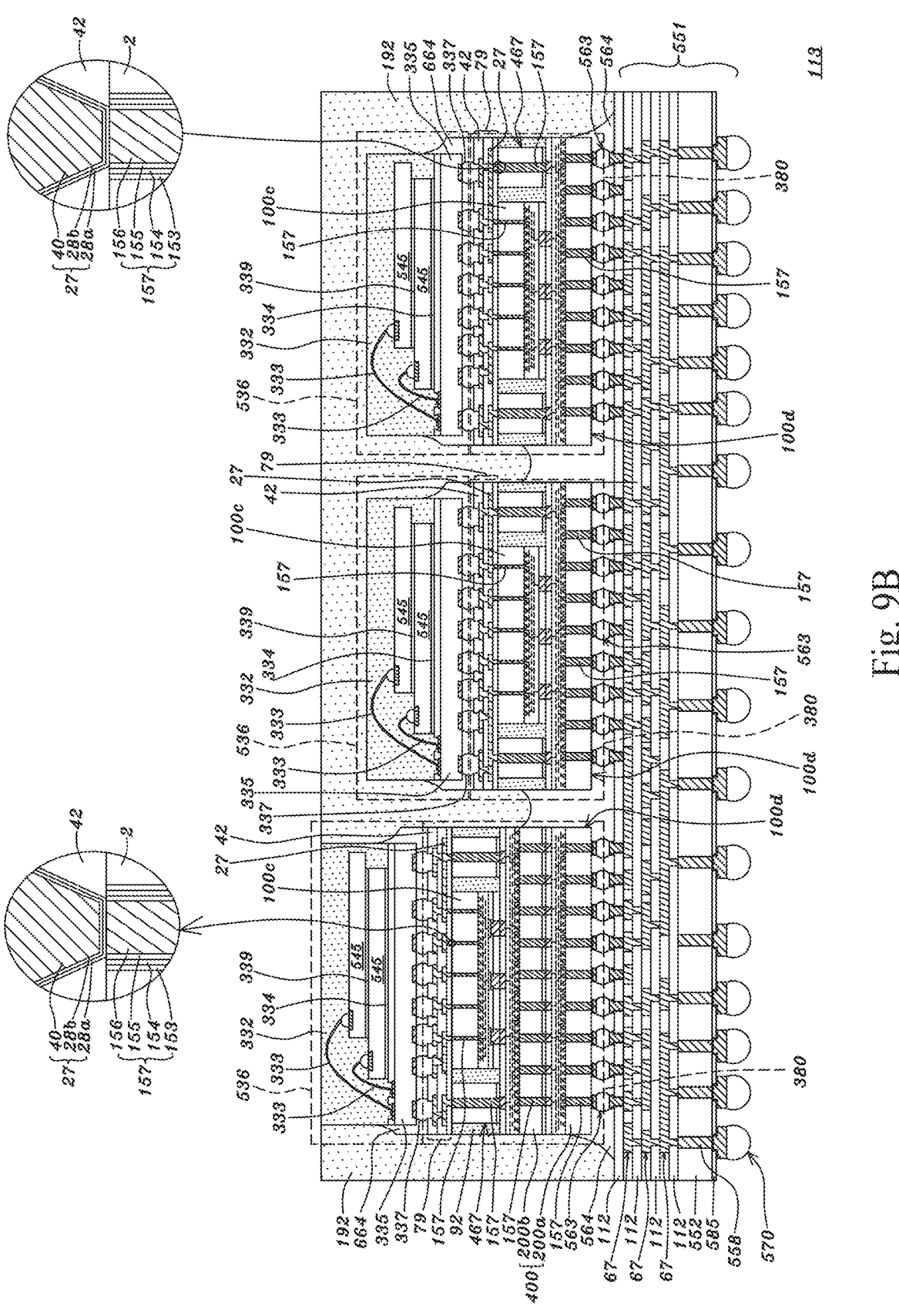

FIGS. 9A and 9B are schematically cross-sectional views showing various package-on-package (POP) assemblies for a fourth type of chip package for a first alternative in accordance with an embodiment of the present application. A fourth type of chip package 113 for the first alternative as seen in FIGS. 9A and 9B may have a similar structure to the second type of chip package 111 as seen in FIG. 7. For an element indicated by the same reference number shown in FIGS. 7, 9A and 9B, the specification of the element as seen in FIGS. 9A and 9B may be referred to that of the element as illustrated in FIG. 7. The difference therebetween is that the top semiconductor IC chip 100*c* of each of the subsystem units 380 of the second type of chip package 111 may alternatively have the specification for the fourth type of semiconductor IC chip 100 illustrated in FIG. 3F to be turned upside down for the fourth type of chip package 113 for the first alternative. Referring to FIG. 9A, for the fourth type of chip package 113 for the first alternative, the top semiconductor IC chip 100*c* of each of its subsystem units 380 may be used for (1) an application-specific integrated-circuit (ASIC) chip, (2) a logic IC chip, such as FPGA IC chip or chiplet 200, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip. The bottom semiconductor IC chip 100*d* of each of its subsystem units 380 may be used for (1) an application-specific integrated-circuit (ASIC) chip, (2) a logic IC chip, such as FPGA IC chip or chiplet 200, graphic-processing-unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, (3) a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip, or (4) an input/output (I/O) IC chip. In a first combination, the top semiconductor IC chip 100*c* of said each of its subsystem units 380 may be the logic IC chip, and the bottom semiconductor IC chip 100*d* of said each of its subsystem units 380 may be the memory IC chip; in a second combination, the bottom semiconductor IC chip 100*d* of said each of its subsystem units 380 may be the logic IC chip, and the top semiconductor IC chip 100*c* of said each of its subsystem units 380 may be the memory IC chip; in a third combination, the top semiconductor IC chip 100*c* of said each of its subsystem units 380 may be the logic IC chip, and the bottom semiconductor IC chip 100*d* of said each of its subsystem units 380 may be the input/output (I/O) IC chip. Alternatively, the top semiconductor IC chip 100*c* of any of its subsystem units 380 may be replaced with the sixth type of field programmable chip-on-chip module 400 as seen in FIG. 5F to be turned upside down. Alternatively, the bottom semiconductor IC chip 100*d* of any of its subsystem units 380 (only one is shown at a left side in FIG. 9B) may be replaced with the sixth type of field programmable chip-on-chip module 400 as seen in FIG. 5F. Its metal bumps, pillars or pads 570 may act as external pins of the fourth type of chip package 113 to couple or bond to external circuits.

Further, each of the dummy chips 141 of each of the subsystem units 380 of the second type of chip package 111 as seen in FIG. 7 may be replaced with a vertical-through-via (VTV) connector 467 for the fourth type of chip package 113 for the first alternative as seen in FIGS. 9A and 9B, which may have the specification for the third type of vertical-through-via (VTV) connector 467 as illustrated in FIG. 4C to be turned upside down. Referring to FIGS. 9A and 9B, for the fourth type of chip package 113 for the first alternative, the bottom semiconductor IC chip 100*d* of each of its subsystem units 380, or the second FPGA IC chip or chiplet 200*b* of the fourth type of field programmable chip-on-chip module 400 of said each of its subsystem units 380 in case of replacing the bottom semiconductor IC chip 100*d* of said each of its subsystem units 380, may be provided with (1) the insulating bonding layer 52, i.e., silicon oxide or silicon oxynitride, having a top surface attached to and in contact with a bottom surface of the insulating bonding layer 52, i.e., silicon oxide or silicon oxynitride, of the top semiconductor IC chip 100*c* of said each of its subsystem units 380, or a bottom surface of the insulating bonding layer 52, i.e., silicon oxide or silicon oxynitride, of the second FPGA IC chip or chiplet 200*b* of the fourth type of field programmable chip-on-chip module 400 of said each of its subsystem units 380 in case of replacing the top semiconductor IC chip 100*c* of said each of its subsystem units 380, and a bottom surface of the insulating bonding layer 52, i.e., silicon oxide or silicon oxynitride, of each of the vertical-through-via (VTV) connectors 467 of said each of its subsystem units 380, and (2) the metal pads 6*a*, i.e., copper layer 24 thereof, each having a top surface bonded to and in contact with a bottom surface of one of the metal pads 6*a*, i.e., copper layer 24 thereof, of one of the top semiconductor IC chip 100*c* of said each of its subsystem units 380, or a bottom surface of one of the metal pads 6*a*, i.e., copper layer 24 thereof, of the second FPGA IC chip or chiplet 200*b* of the fourth type of field programmable chip-on-chip module 400 of said each of its subsystem units 380 in case of replacing the top semiconductor IC chip 100*c* of said each of its subsystem units 380, or a bottom surface of one of the through silicon vias (TSVs) 157, i.e., copper layer 156 thereof, of one of the vertical-through-via (VTV) connectors 467 of said each of its subsystem units 380. Each of the metal pads 6*a* of each of the top and bottom semiconductor IC chips 100*c* and 100*d* of said each of its subsystem units 380, or each of the metal pads 6*a* of the second FPGA IC chip or chiplet 200*b* of each or either of the fourth type of field programmable chip-onchip module(s) 400 of said each of its subsystem units 380 in case of replacing each or either of the top and/or bottom semiconductor IC chips 100*c* and/or 100*d* of said each of its subsystem units 380, may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6*a* of each of the top and bottom semiconductor IC chips 100*c* and 100*d* of said each of its subsystem units 380, or the pitch between neighboring two of the metal pads 6*a* of the second FPGA IC chip or chiplet 200*b* of each or either of the fourth type of field programmable chip-on-chip module(s) 400 of said each of its subsystem units 380 in case of replacing each or either of the top and/or bottom semiconductor IC chips 100*c* and/or 100*d* of said each of its subsystem units 380, may be smaller than 10, 5, 2 or 1 micrometers, or between 0.2 and 10 micrometers, 0.2 and 5 micrometers, 0.2 and 2 micrometers, or 0.2 and 1 micrometers. The bottom semiconductor IC chip 100*d* of said each of its subsystem units 380, or each of the first and second FPGA IC chips or chiplets 200*a* and 200*b* of the fourth type of field programmable chip-on-chip module 400 of said each of its subsystem units 380 in case of replacing the bottom semiconductor IC chip 100*d* of said each of its subsystem units 380, may be provided with the semiconductor devices 4, such as transistors, as illustrated in FIG. 3F or 5D at a top surface of the semiconductor substrate 2 thereof, and the top semiconductor IC chip 100*c* of said each of its subsystem units 380, or each of the first and second FPGA IC chips or chiplets 200*a* and 200*b* of the fourth type of field programmable chip-on-chip module 400 of said each of its subsystem units 380 in case of replacing the top semiconductor IC chip 100*c* of said each of its subsystem units 380, may be provided, as illustrated in FIG. 3F or 5D to be turned upside down, with the semiconductor devices 4, such as transistors, at a bottom surface of the semiconductor substrate 2 thereof facing the top surface of the semiconductor substrate 2 of the bottom semiconductor IC chip 100*d* of said each of its subsystem units 380, or the top surface of the semiconductor substrate 2 of each of the first and second FPGA IC chips or chiplets 200*a* and 200*b* of the fourth type of field programmable chip-on-chip module 400 of said each of its subsystem units 380 in case of replacing the bottom semiconductor IC chip 100*d* of said each of its subsystem units 380.

Referring to FIGS. 9A and 9B, for the fourth type of chip package 113 for the first alternative, each of its subsystem units 380 may further include a polymer layer 92, i.e., insulating dielectric layer, made of molding compound, epoxy-based material, polyimide or silicon oxide for example, in multiple gaps each between neighboring two of the top semiconductor IC chip 100*c* and vertical-through-via (VTV) connectors 467 thereof, or between neighboring two of the fourth type of field programmable chip-on-chip module 400 thereof, in case of replacing the top semiconductor IC chip 100*c* thereof, and the vertical-through-via (VTV) connectors 467 thereof, and over the bottom semiconductor IC chip 100*d* thereof, or the fourth type of field programmable chip-on-chip module 400 thereof in case of replacing the bottom semiconductor IC chip 100*d* thereof. For the fourth type of chip package 113 for the first alternative, the semiconductor substrate 2 of each of the top semiconductor IC chip 100*c* and vertical-through-via (VTV) connectors 467 of each of its subsystem units 380, the semiconductor substrate 2 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, and the polymer layer 92 of said each of its subsystem units 380 may have a portion at a top side thereof removed by a chemical-mechanical-polishing (CMP) or mechanical grinding process such that each of the through silicon vias (TSVs) 157 of said each of the top semiconductor IC chip 100*c* and vertical-through-via (VTV) connectors 467 of said each of its subsystem units 380, and each of the through silicon vias (TSVs) 157 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, that is, the electroplated copper layer 156 of said each of the through silicon vias (TSVs) 157, may have a backside substantially coplanar with the backside of the semiconductor substrate 2 of said each of the top semiconductor IC chip 100*c* and vertical-through-via (VTV) connectors 467 of said each of its subsystem units 380, the backside of the semiconductor substrate 2 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, and a top surface of the polymer layer 92 of said each of its subsystem units 380. Each of the through silicon vias (TSVs) 157 of each of the vertical-through-via (VTV) connectors 467 of each of its subsystem units 380 may couple to a voltage of power supply for delivering a power supply or a voltage of ground reference for delivering a ground reference or may pass signals or clocks for signal or clock transmission. The semiconductor substrate 2 of the top semiconductor IC chip 100*c* of said each of its subsystem units 380, or the semiconductor substrate 2 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the top semiconductor IC chip 100*c* of said each of its subsystem units 380, or each of the through silicon vias (TSVs) 157 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example.

Referring to FIGS. 9A and 9B, for the fourth type of chip package 113 for the first alternative, each of its subsystem units 380 may further include a first backside interconnection scheme for a logic drive or device (BISD) 79 over the top semiconductor IC chip 100*c*, vertical-through-via (VTV) connectors 467 and polymer layer 92 thereof and the fourth type of field programmable chip-on-chip module 400 thereof in case of replacing the top semiconductor IC chip 100*c* thereof. The first BISD 79 of said each of its subsystem units 380 may be provided with (1) one or more interconnection metal layers 27 coupling to each of the through silicon vias (TSVs) 157 of each of the top semiconductor IC chip 100*c* and vertical-through-via (VTV) connectors 467 of said each of its subsystem units 380 and each of the through silicon vias (TSVs) 157 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, and (2) one or more polymer layers 42, i.e., insulating dielectric layer, each between neighboring two of the interconnection metal layers 27 thereof, under the bottommost one of the interconnection metal layers 27 thereof or over the topmost one of the interconnection metal layers 27 thereof, wherein an upper one of the interconnection metal layers 27 thereof may couple to a lower one of the interconnection metal layers 27 thereof through an opening in one of the polymer layers 42 thereof between the upper and lower ones of the interconnection metal layers 27 thereof. The bottommost one of the polymer layers 42 of the first BISD 79 of said each of its subsystem units 380 may be between the bottommost one of the interconnection metal layers 27 of the first BISD 79 of said each of its subsystem units 380 and a top planar surface composed of the backside of the semiconductor substrate 2 of each of the top semiconductor IC chip 100*c* and vertical-through-via (VTV) connectors 467 of said each of its subsystem units 380, the backside of the semiconductor substrate 2 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380, and the top surface of the polymer layer 92 of said each of its subsystem units 380, wherein each opening in the bottommost one of the polymer layers 42 of the first BISD 79 of said each of its subsystem units 380 may be vertically over one of the through silicon vias (TSVs) 157 of one of the top semiconductor IC chip 100*c* and vertical-through-via (VTV) connectors 467 of said each of its subsystem units 380, or one of the through silicon vias (TSVs) 157 of the first FPGA IC chip or chiplet 200*a* of the fourth type of field programmable chip-on-chip module 400 of said each of its subsystem units 380 in case of replacing the top semiconductor IC chip 100*c* of said each of its subsystem units 380. Each of the interconnection metal layers 27 of the first BISD 79 of said each of its subsystem units 380 may extend across an edge of each of the top semiconductor IC chip 100*c* and vertical-through-via (VTV) connectors 467 of said each of its subsystem units 380 and an edge of the fourth type of field programmable chip-on-chip module 400 of said each of its subsystem units 380 in case of replacing the top semiconductor IC chip 100*c* of said each of its subsystem units 380. The topmost one of the interconnection metal layers 27 of the first BISD 79 of said each of its subsystem units 380 may be defined with multiple metal pads under multiple openings in the topmost one of the polymer layers 42 of the first BISD 79 of said each of its subsystem units 380 respectively. The specification and process for the interconnection metal layers 27 and polymer layers 42 for the first BISD 79 of said each of its subsystem units 380 may be referred to those for the SISC 29 as illustrated in FIG. 3A. For example, each of the interconnection metal layers 27 of the first BISD 79 of said each of its subsystem units 380 may have a thickness in a vertical direction between 0.2 and 5 micrometers, wherein said each of the interconnection metal layers 27 may have the copper layer 40 with a thickness in a vertical direction between 0.2 and 5 micrometers.

Referring to FIGS. 9A and 9B, the fourth type of chip package 113 for the first alternative may further include multiple memory chip packages 536, each of which may have the same specification as one illustrated in FIG. 8, over its subsystem units 380 respectively. For an element of the memory chip package 536 indicated by the same reference number shown in FIGS. 8, 9A and 9B, the specification of the element as seen in FIGS. 9A and 9B may be referred to that of the element as illustrated in FIG. 8. For the fourth type of chip package 113 for the first alternative, each of its memory chip packages 536 may include the solder balls 337 at the bottom thereof each bonded to one of the metal pads of the topmost one of the interconnection metal layers 27 of the first BISD 79 of one of its subsystem units 380. The fourth type of chip package 113 for the first alternative may further include an underfill 664, i.e., polymer layer, between each of its memory chip packages 536 and one of its subsystem units 380, covering a sidewall of each of the solder balls 337 of said each of its memory chip packages 536. The fourth type of chip package 113 for the first alternative may further include a polymer layer 192, i.e., insulating dielectric layer, made of molding compound, epoxy-based material, polyimide or silicon oxide for example, on its interposer 551 and underfills 564 and 664, covering a sidewall of each of its subsystem units 380 and memory chip packages 536, wherein its polymer layer 192 may have a top surface coplanar with a top surface of each of one or more of its memory chip packages 536, or may cover a top surface of each of one or more of its memory chip packages 536.

For the fourth type of chip package 113 for the first alternative as seen in FIG. 9A, the bottom semiconductor IC chip 100*d* of each of its subsystem units 380 may have a first set of small I/O circuits coupling respectively to a second set of small I/O circuits of the top semiconductor IC chip 100*c* of said each of its subsystem units 380 through the bonding of a set of metal pads 6*a* of the bottom semiconductor IC chip 100*d* of said each of its subsystem units 380 to a set of metal pads 6*a* of the top semiconductor IC chip 100*c* of said each of its subsystem units 380 respectively. Alternatively, the top semiconductor IC chip 100*c* of any first one of its subsystem units 380 may be replaced with the sixth type of field programmable chip-on-chip module 400 as seen in FIG. 5F to be turned upside down, wherein the bottom semiconductor IC chip 100*d* of the first one of its subsystem units 380 may have the first set of small I/O circuits coupling respectively to a third set of small I/O circuits of the second FPGA IC chip or chiplet 200*b* of the fourth type of field programmable chip-on-chip module 400 of the first one of its subsystem units 380 through the bonding of a set of metal pads 6*a* of the bottom semiconductor IC chip 100*d* of the first one of its subsystem units 380 to a set of metal pads 6*a* of the second FPGA IC chip or chiplet 200*b* of the fourth type of field programmable chip-on-chip module 400 of the first one of its subsystem units 380 respectively. Alternatively, as seen in FIG. 9B, the bottom semiconductor IC chip 100*d* of any second one of its subsystem units 380 may be replaced with the sixth type of field programmable chip-on-chip module 400 as seen in FIG. 5F, wherein the top semiconductor IC chip 100*c* of the second one of its subsystem units 380 may have the second set of small I/O circuits coupling respectively to a fourth set of small I/O circuits of the second FPGA IC chip or chiplet 200*b* of the fourth type of field programmable chip-on-chip module 400 of the second one of its subsystem units 380 through the bonding of a set of metal pads 6*a* of the top semiconductor IC chip 100*c* of the second one of its subsystem units 380 to a set of metal pads 6*a* of the second FPGA IC chip or chiplet 200*b* of the fourth type of field programmable chip-on-chip module 400 of the second one of its subsystem units 380 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the fourth type of chip package 113 for the first alternative, in the case that the number of its subsystem units 380 is three as seen in FIG. 9A, the bottom semiconductor IC chip 100*d* of a middle one of its subsystem units 380 may be a central-processing-unit (CPU) IC chip, the bottom semiconductor IC chip 100*d* of a right one of its subsystem units 380 may be a graphic-processing unit (GPU) IC chip, i.e., data-processing-unit (DPU) IC chip, the bottom semiconductor IC chip 100*d* of a left one of its subsystem units 380 may be a FPGA IC chip, and the top semiconductor IC chip 100*c* of each of its subsystem units 380 may be the HBM IC chip, such as SRAM IC chip or DRAM IC chip. The top semiconductor IC chip 100*c* of each of its subsystem units 380 may couple to the bottom semiconductor IC chip 100*d* of said each of its subsystem units 380 for parallel data transmission with a data bit width of equal to or greater than 64, 128, 256, 512, 1024, 2048, 4096, 8K, or 16K. Alternatively, as seen in FIG. 9B, the FPGA IC chip for the bottom semiconductor IC chip 100*d* of the left one of its subsystem units 380 may be replaced with the sixth type of field programmable chip-on-chip module 400 as seen in FIG. 5F, wherein the top semiconductor IC chip 100*c* of the left one of its subsystem units 380 may couple to the second FPGA IC chip or chiplet 200*b* of the fourth type of field programmable chip-on-chip module 400 of the left one of its subsystem units 380 for parallel data transmission with a data bit width of equal to or greater than 64, 128, 256, 512, 1024, 2048, 4096, 8K, or 16K.

Further, referring to FIG. 9A, for the specific example, the two semiconductor IC chips 545 of the left one of its memory chip packages 536 are two non-volatile memory (NVM) IC chips such as two respective NAND flash memory chips, NOR flash memory chips, magnetoresistive random access memory (MRAM) IC chips, resistive random access memory (RRAM) IC chips or ferroelectric random access memory (FRAM) IC chips. A first large I/O circuit of each of the NVM IC chips 545 of the left one of its memory chip packages 536 may have a large driver coupling to a large receiver of a second large I/O circuit of the bottom semiconductor IC chip 100*d* of the left one of its subsystem units 380, or a large receiver of a third large I/O circuit of either of the first and second FPGA IC chips or chiplets 200*a* and 200*b* of the fourth type of field programmable chip-on-chip module 400 of the left one of its subsystem units 380 as seen in FIG. 9B in case of replacing the bottom semiconductor IC chip 100*d* of the left one of its subsystem units 380, through, in sequence, (1) one of the wirebonded wires 333 of the left one of its memory chip packages 536, (2) the circuit board 335 of the left one of its memory chip packages 536, (3) one of the solder balls 337 of the left one of its memory chip packages 536, (4) each of the interconnection metal layers 27 of the first BISD 79 of the left one of its subsystem units 380, and (5) one of the through silicon vias (TSVs) 157 of one of the vertical-through-via (VTV) connectors 467 of the left one of its subsystem units 380, for downloading CPM data, i.e., resulting values or programming codes, stored in multiple non-volatile memory cells of said each of the NVM IC chips 545 of the left one of its memory chip packages 536 from the large driver of the first large I/O circuit to the large receiver of the second large I/O circuit to be passed to (1) the memory cells 490 of any type of the first, second and third types of field programmable logic cells or elements (LCEs) 2014 of the bottom semiconductor IC chip 100*d* of the left one of its subsystem units 380 as illustrated in FIGS. 1A-1C, or the memory cells 490 of any type of the first, second and third types of field programmable logic cells or elements (LCEs) 2014 of either of the first and second FPGA IC chips or chiplets 200*a* or 200*b* of the fourth type of field programmable chip-on-chip module 400 of the left one of its subsystem units 380 in case of replacing the bottom semiconductor IC chip 100*d* of the left one of its subsystem units 380, to be stored therein and/or (2) the memory cells 362 of any type of the first and second types of field programmable switch cells 379 of the bottom semiconductor IC chip 100*d* of the left one of its subsystem units 380 as illustrated in FIGS. 2A and 2B, or the memory cells 362 of any type of the first and second types of field programmable switch cells 379 of either of the first and second FPGA IC chips or chiplets 200*a* and 200*b* of the fourth type of field programmable chip-on-chip module 400 of the left one of its subsystem units 380 in case of replacing the bottom semiconductor IC chip 100*d* of the left one of its subsystem units 380, to be stored therein. It is noted that each of the first and second large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF.

Further, for the fourth type of chip package 113 for the first alternative as seen in FIG. 9A, the bottom semiconductor IC chip 100*d* of each of its subsystem units 380, or each of the first and second FPGA IC chips or chiplets 200*a* and 200*b* of the fourth type of field programmable chip-on-chip module 400 of said each of its subsystem units 380 as seen in the left side of FIG. 9B in case of replacing the bottom semiconductor IC chip 100*d* of said each of its subsystem units 380, may be fabricated or implemented in a technology node equal to or more advanced than 10 nm or 5 nm, for example, in 10 nm, 7 nm, 5 nm, 3 nm or 2 nm. A voltage (Vcc or Vdd) of power supply used in the bottom semiconductor IC chip 100*d* of each of its subsystem units 380, or each of the first and second FPGA IC chips or chiplets 200*a* and 200*b* of the fourth type of field programmable chip-on-chip module 400 of said each of its subsystem units 380 as seen in the left side of FIG. 9B in case of replacing the bottom semiconductor IC chip 100*d* of said each of its subsystem units 380, may be between 0.1 and 0.5 volts, between 0.1 and 0.4 volts or between 0.1 and 0.3 volts, or may be smaller than or equal to 0.5, 0.4, 0.3 or 0.2 volts. For example, the bottom semiconductor IC chip 100*d* of said each of its subsystem units 380, or each of the first and second FPGA IC chips or chiplets 200*a* and 200*b* of the fourth type of field programmable chip-on-chip module 400 of said each of its subsystem units 380 as seen in the left side of FIG. 9B in case of replacing the bottom semiconductor IC chip 100*d* of said each of its subsystem units 380, may be formed with fin field effective transistors (FINFETs) or gate-all-around field effective transistors (GAAFETs), each of which may be referred to those as illustrated in either of FIGS. 5G and 5H, with a threshold voltage between 0.1 and 0.4 volts, between 0.1 and 0.3 volts, between 0.1 and 0.2 volts, or smaller than or equal to 0.4, 0.3 or 0.2 volts, wherein the threshold voltage is defined when the drain current thereof is at 30 nano-amperes and the voltage (Vcc or Vdd) of power supply is between 0.1 and 0.5 volts, between 0.1 and 0.4 volts or between 0.1 and 0.3 volts or smaller than or equal to 0.5, 0.4, 0.3 or 0.2 volts.

Figure 9C:
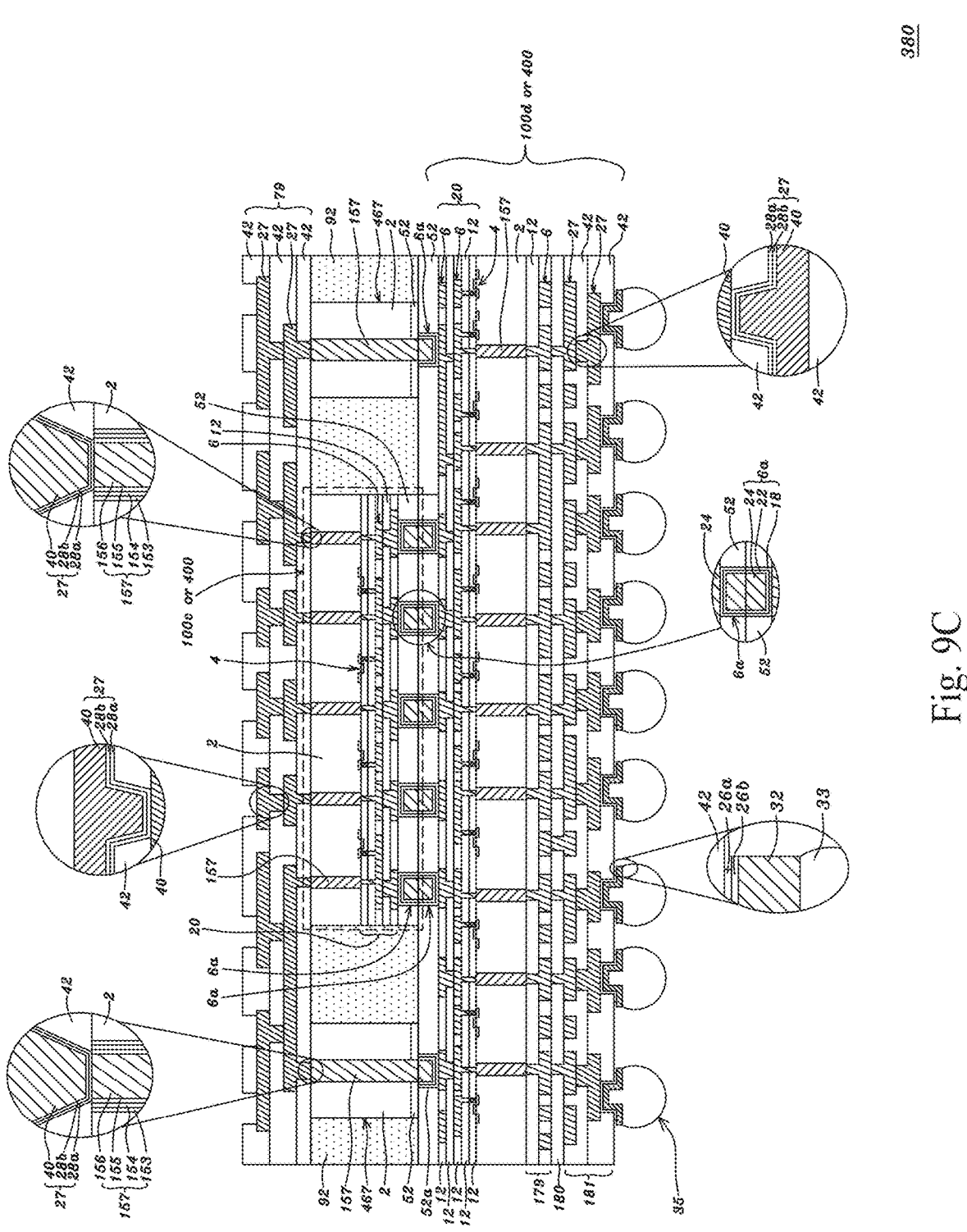
FIG. 9C is a schematically cross-sectional view showing another subsystem unit of a fourth type of chip package for a second alternative in accordance with an embodiment of the present application.

Alternatively, FIG. 9C is a schematically cross-sectional view showing another subsystem unit of a fourth type of chip package for a second alternative in accordance with an embodiment of the present application. The fourth type of chip package 113 for the second alternative may have a similar structure to the fourth type of chip package 113 for the first alternative as seen in FIGS. 9A and 9B. For an element indicated by the same reference number shown in FIGS. 9A, 9B and 9C, the specification of the element as seen in FIG. 9C may be referred to that of the element as illustrated in FIGS. 9A and 9B. The difference therebetween is mentioned as below: The insulating dielectric layer 584 formed for the fourth type of chip package 113 for the first alternative as seen in FIGS. 9A and 9B may not be formed for the fourth type of chip package 113 for the second alternative as seen in FIG. 9C. For the bottom semiconductor IC chip 100d of each of the subsystem units 380 of the fourth type of chip package 113 for the second alternative, or the first FPGA IC chip or chiplet 200a of the fourth type of field programmable chip-on-chip module 400 of said each of its subsystem units 380 in case of replacing the bottom semiconductor IC chip 100d of said each of the subsystem units 380, its semiconductor substrate 2 may have a portion at a backside thereof removed by a chemical-mechanical-polishing (CMP) or mechanical grinding process such that each of its through silicon vias (TSVs) 157, that is, the electroplated copper layer 156 thereof, may have a backside substantially coplanar with the backside of its semiconductor substrate 2. Its semiconductor substrate 2 may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of its through silicon vias (TSVs) 157 may have a width, diameter or maximum transverse dimension smaller than 20, 10, 5, 1 or 0.1 micrometers. For example, each of its through silicon vias (TSVs) 157 may include the copper layer 156, i.e., copper via, having a width in a horizontal direction between 0.05 and 0.5 micrometers and a thickness in a vertical direction between 0.3 and 10 micrometers.

Referring to FIGS. 9A, 9B and 9C, the bottom semiconductor IC chip 100d of each of the subsystem units 380 of the fourth type of chip package 113 for the second alternative, or the first FPGA IC chip or chiplet 200a of the fourth type of field programmable chip-on-chip module 400 of said each of its subsystem units 380 in case of replacing the bottom semiconductor IC chip 100d of said each of the subsystem units 380, may be further provided with a third interconnection scheme for a chip 179 on a bottom surface of the semiconductor substrate 2 of the bottom semiconductor IC chip 100d of said each of the subsystem units 380, or a bottom surface of the semiconductor substrate 2 of the first FPGA IC chip or chiplet 200a of the fourth type of field programmable chip-on-chip module 400 of said each of its subsystem units 380.

Referring to FIGS. 9A, 9B and 9C, for the bottom semiconductor IC chip 100d of each of the subsystem units 380 of the fourth type of chip package 113 for the second alternative, its third interconnection scheme for a chip 179 may include (1) one or more insulating dielectric layers 12 each having the same specification as one of the insulating dielectric layers 12 of its first interconnection scheme for a chip (FISC) 20 as illustrated in FIG. 3A to be turned upside down and (2) one or more interconnection metal layers 6 each in one of the insulating dielectric layers 12 of its third interconnection scheme for a chip 179, wherein each of the interconnection metal layers 6 of its third interconnection scheme for a chip 179 may have the same specification as that of the first interconnection scheme for a chip (FISC) 20 as illustrated in FIG. 3A to be turned upside down, wherein each of the insulating dielectric layers 12 of its third interconnection scheme for a chip 179 may be provided between neighboring two of the interconnection metal layers 6 of its third interconnection scheme for a chip 179 or between the bottom surface of its semiconductor substrate 2 and the topmost one of the interconnection metal layers 6 of its third interconnection scheme for a chip 179, wherein a bottom one of the interconnection metal layers 6 of its third interconnection scheme for a chip 179 may couple to an upper one of the interconnection metal layers 6 of its third interconnection scheme for a chip 179 through an opening in one of the insulating dielectric layers 12 of its third interconnection scheme for a chip 179 between the upper and lower ones of the interconnection metal layers 6 of its third interconnection scheme for a chip 179. For example, each of the interconnection metal layers 6 of its third interconnection scheme for a chip 179 may have a thickness in a vertical direction between 0.05 and 1 micrometers and a trace width for each connection, in a horizontal direction, between 0.05 and 1 micrometers, wherein said each of the interconnection metal layers 6 may have the copper layer 24 with a thickness in a vertical direction between 0.05 and 1 micrometers. Each of its through silicon vias (TSVs) 157 vertically extending in its semiconductor substrate 2 may couple one of the interconnection metal layers 6 of its third interconnection scheme for a chip 179 under its semiconductor substrate 2 to one of the interconnection metal layers 6 of its first interconnection scheme for a chip (FISC) 20 over its semiconductor substrate 2 for power or ground (voltage) delivery, or signal or clock transmission.

Referring to FIGS. 9A, 9B and 9C, for the fourth type of field programmable chip-on-chip module 400 of said each of the subsystem units 380 of the fourth type of chip package 113 for the second alternative in case of replacing the bottom semiconductor IC chip 100d of said each of the subsystem units 380, its third interconnection scheme for a chip 179 may include (1) one or more insulating dielectric layers 12 each having the same specification as one of the insulating dielectric layers 12 of its first interconnection scheme for a chip (FISC) 20 as illustrated in FIG. 3A to be turned upside down and (2) one or more interconnection metal layers 6 each in one of the insulating dielectric layers 12 of its third interconnection scheme for a chip 179, wherein each of the interconnection metal layers 6 of its third interconnection scheme for a chip 179 may have the same specification as that of the first interconnection scheme for a chip (FISC) 20 as illustrated in FIG. 3A to be turned upside down, wherein each of the insulating dielectric layers 12 of its third interconnection scheme for a chip 179 may be provided between each neighboring two of the interconnection metal layers 6 of its third interconnection scheme for a chip 179 or between the bottom surface of the semiconductor substrate 2 of its first FPGA IC chip or chiplet 200a and the topmost one of the interconnection metal layers 6 of its third interconnection scheme for a chip 179, wherein a bottom one of the interconnection metal layers 6 of its third interconnection scheme for a chip 179 may couple to an upper one of the interconnection metal layers 6 of its third interconnection scheme for a chip 179 through an opening in one of the insulating dielectric layers 12 of its third interconnection scheme for a chip 179 between the upper and lower ones of the interconnection metal layers 6 of its third interconnection scheme for a chip 179. For example, each of the interconnection metal layers 6 of its third interconnection scheme for a chip 179 may have a thickness in a vertical direction between 0.05 and 1 micrometers and a trace width for each connection, in a horizontal direction, between 0.05 and 1 micrometers, wherein said each of the interconnection metal layers 6 may have the copper layer 24 with a thickness in a vertical direction between 0.05 and 1 micrometers. Each of the through silicon vias (TSVs) 157 of its first FPGA IC chip or chiplet 200a vertically extending in the semiconductor substrate 2 of its first FPGA IC chip or chiplet 200a may couple one of the interconnection metal layers 6 of its third interconnection scheme for a chip 179 under the semiconductor substrate 2 of its first FPGA IC chip or chiplet 200a to one of the interconnection metal layers 6 of the first interconnection scheme for a chip (FISC) 20 of its first FPGA IC chip or chiplet 200a over the semiconductor substrate 2 of its first FPGA IC chip or chiplet 200a for power or ground (voltage) delivery, or signal or clock transmission.

Referring to FIG. 9C, the bottom semiconductor IC chip 100d of each of the subsystem units 380 of the fourth type of chip package 113 for the second alternative may be further provided with a passivation layer 180, i.e., insulating dielectric layer, under its third interconnection scheme for a chip 179, wherein its passivation layer 180 may have the same specification as the passivation layer 14 as illustrated in FIG. 3A to be turned upside down. For the bottom semiconductor IC chip 100d of said each of the subsystem units 380, each opening in its passivation layer 180 may be provided under one of multiple metal contacts of the bottommost one of the interconnection metal layers 6 of its third interconnection scheme for a chip 179. Alternatively, for the fourth type of chip package 113 for the second alternative, the bottom semiconductor IC chip 100d of said each of its subsystem units 380 may be replaced with the sixth type of field programmable chip-on-chip module 400 as seen in FIG. 5F, the fourth type of field programmable chip-on-chip module 400 of said each of its subsystem units 380 may be further provided with a passivation layer 180, i.e., insulating dielectric layer, under the third interconnection scheme for a chip 179 of the fourth type of field programmable chip-on-chip module 400 of said each of its subsystem units 380, wherein the passivation layer 180 of the fourth type of field programmable chip-on-chip module 400 of said each of its subsystem units 380 may have the same specification as the passivation layer 14 as illustrated in FIG. 3A to be turned upside down, and wherein each opening in the passivation layer 180 of the fourth type of field programmable chip-on-chip module 400 of said each of its subsystem units 380 may be provided under one of multiple metal contacts of the bottommost one of the interconnection metal layers 6 of the third interconnection scheme for a chip 179 of the fourth type of field programmable chip-on-chip module 400 of said each of its subsystem units 380.

Referring to FIG. 9C, the bottom semiconductor IC chip 100d of each of the subsystem units 380 of the fourth type of chip package 113 for the second alternative, or the fourth type of field programmable chip-on-chip module 400 of said each of the subsystem units 380 of the fourth type of chip package 113 for the second alternative in case of replacing the bottom semiconductor IC chip 100d of said each of the subsystem units 380 of the fourth type of chip package 113 for the second alternative, may be further provided with a fourth interconnection scheme for a chip 181 on a bottom surface of its passivation layer 180. For the bottom semiconductor IC chip 100d of each of the subsystem units 380 of the fourth type of chip package 113 for the second alternative, or the fourth type of field programmable chip-on-chip module 400 of said each of the subsystem units 380 of the fourth type of chip package 113 for the second alternative in case of replacing the bottom semiconductor IC chip 100d of said each of the subsystem units 380 of the fourth type of chip package 113 for the second alternative, its fourth interconnection scheme for a chip 181 may include (1) one or more interconnection metal layers 27 under its passivation layer 180 and coupling to each of the metal contacts of the bottommost one of the interconnection metal layers 6 of its third interconnection scheme for a chip 179 through one of the openings in its passivation layer 180, and (2) one or more polymer layers 42, i.e., insulating dielectric layer, each between neighboring two of the interconnection metal layers 27 thereof, under the bottommost one of the interconnection metal layers 27 thereof or between the topmost one of the interconnection metal layers 27 thereof and its passivation layer 180, wherein a lower one of the interconnection metal layers 27 thereof may couple to an upper one of the interconnection metal layers 27 thereof through an opening in one of the polymer layers 42 thereof between the upper and lower ones of the interconnection metal layers 27 thereof, wherein each opening in the topmost one of the polymer layers 42 thereof may be vertically aligned with one of the openings in its passivation layer 180, and thus the topmost one of the interconnection metal layers 27 thereof may couple to one of the metal contacts of the bottommost one of the interconnection metal layers 6 of its third interconnection scheme for a chip 179 through one of the openings in the topmost one of the polymer layers 42 thereof and one of the openings in its passivation layer 180, and wherein each opening in the bottommost one of the polymer layers 42 thereof may be under one of multiple metal contacts of the bottommost one of the interconnection metal layers 27 thereof. For the bottom semiconductor IC chip 100d of each of the subsystem units 380 of the fourth type of chip package 113 for the second alternative, or the fourth type of field programmable chip-on-chip module 400 of said each of the subsystem units 380 of the fourth type of chip package 113 for the second alternative in case of replacing the bottom semiconductor IC chip 100d of said each of the subsystem units 380 of the fourth type of chip package 113 for the second alternative, the specification and process for the interconnection metal layers 27 and polymer layers 42 of its fourth interconnection scheme for a chip 181 may be referred to those for the SISC 29 as illustrated in FIG. 3A to be turned upside down. For example, each of the interconnection metal layers 27 of its fourth interconnection scheme for a chip 181 may have a thickness in a vertical direction between 0.2 and 5 micrometers, wherein said each of the interconnection metal layers 27 may have the copper layer 40 with a thickness in a vertical direction between 0.2 and 5 micrometers.

Referring to FIG. 9C, for the fourth type of chip package 113 for the second alternative, each of its subsystem units 380 may have multiple metal bumps, pillars or pads 35 in an array at a bottom thereof, each of which may be of one type of the first, second, third and fourth types having the same specification as that of the first, second, third and fourth types of micro-bumps, micro-pillars or micro-pads 34 respectively as illustrated in FIG. 3A to be turned upside down. Each of the first, second, third or fourth type of metal bumps, pillars or pads 35 of each of its subsystem units 380 may have the adhesion layer 26*a* on one of the metal contacts of the bottommost one of the interconnection metal layers 27 of the fourth interconnection scheme for a chip 181 of the bottom semiconductor IC chip 100*d* of said each of its subsystem units 380, or one of the metal contacts of the bottommost one of the interconnection metal layers 27 of the fourth interconnection scheme for a chip 181 of the fourth type of field programmable chip-on-chip module 400 of said each of its subsystem units 380 in case of replacing the bottom semiconductor IC chip 100*d* of said each of its subsystem units 380.

Referring to FIG. 9C, for the fourth type of chip package 113 for the second alternative, the first, second, third or fourth type of metal bumps, pillars or pads 35 of each of its subsystem units 380 may be bonded to its interposer 551 as seen in FIGS. 9A and 9B to form multiple metal contacts 563 each between the fourth interconnection scheme for a chip 181 of the bottom semiconductor IC chip 100*d* of said each of its subsystem units 380 and its interposer 551, or between the fourth interconnection scheme for a chip 181 of the fourth type of field programmable chip-on-chip module 400 of said each of its subsystem units 380, in case of replacing the bottom semiconductor IC chip 100*d* of said each of its subsystem units 380, and its interposer 551, wherein each of its metal contacts 563 may include (1) a copper layer having a thickness between 2 μm and 20 μm and a largest transverse dimension 1 μm and 15 μm between the fourth interconnection scheme for a chip 181 of the bottom semiconductor IC chip 100*d* of said each of its subsystem units 380 and its interposer 551, or between the fourth interconnection scheme for a chip 181 of the fourth type of field programmable chip-on-chip module 400 of said each of its second type of subsystem units 380, in case of replacing the bottom semiconductor IC chip 100*d* of said each of its subsystem units 380, and its interposer 551, and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551.

Referring to FIGS. 9A, 9B and 9C, for the fourth type of chip package 113 for the second alternative, each of its metal contacts 563 may be used for power or ground (voltage) delivery or signal or clock transmission to couple to (1) one of the semiconductor devices 4, i.e., transistors, of the bottom semiconductor IC chip 100*d* of one of its subsystem units 380 through, in sequence, each of the interconnection metal layers 27 of the fourth interconnection scheme for a chip 181 of the bottom semiconductor IC chip 100*d* of said one of its subsystem units 380, each of the interconnection metal layers 6 of the third interconnection scheme for a chip 179 of the bottom semiconductor IC chip 100*d* of said one of its subsystem units 380, one of the through silicon vias (TSVs) 157 of the bottom semiconductor IC chip 100*d* of said one of its subsystem units 380, and one of the interconnection metal layers 6 of the first interconnection scheme for a chip 20 of the bottom semiconductor IC chip 100*d* of said one of its subsystem units 380, (2) one of the semiconductor devices 4, i.e., transistors, of the top semiconductor IC chip 100*c* of said one of its subsystem units 380 through, in sequence, each of the interconnection metal layers 27 of the fourth interconnection scheme for a chip 181 of the bottom semiconductor IC chip 100*d* of said one of its subsystem units 380, each of the interconnection metal layers 6 of the third interconnection scheme for a chip 179 of the bottom semiconductor IC chip 100*d* of said one of its subsystem units 380, one of the through silicon vias (TSVs) 157 of the bottom semiconductor IC chip 100*d* of said one of its subsystem units 380, each of the interconnection metal layers 6 of the first interconnection scheme for a chip 20 of the bottom semiconductor IC chip 100*d* of said one of its subsystem units 380, one of the metal pads 6*a* of the bottom semiconductor IC chip 100*d* of said one of its subsystem units 380, one of the metal pads 6*a* of the top semiconductor IC chip 100*c* of said one of its subsystem units 380, and each of the interconnection metal layers 6 of the first interconnection scheme for a chip 20 of the top semiconductor IC chip 100*c* of said one of its subsystem units 380, (3) one or more of the metal pads of the first backside interconnection scheme for a logic drive or device (BISD) 79 of said one of its subsystem units 380 through, in sequence, each of the interconnection metal layers 27 of the fourth interconnection scheme for a chip 181 of the bottom semiconductor IC chip 100*d* of said one of its subsystem units 380, each of the interconnection metal layers 6 of the third interconnection scheme for a chip 179 of the bottom semiconductor IC chip 100*d* of said one of its subsystem units 380, one of the through silicon vias (TSVs) 157 of the bottom semiconductor IC chip 100*d* of said one of its subsystem units 380, each of the interconnection metal layers 6 of the first interconnection scheme for a chip 20 of the bottom semiconductor IC chip 100*d* of said one of its subsystem units 380, one of the metal pads 6*a* of the bottom semiconductor IC chip 100*d* of said one of its subsystem units 380, one of the metal pads 6*a* of the top semiconductor IC chip 100*c* of said one of its subsystem units 380, each of the interconnection metal layers 6 of the first interconnection scheme for a chip 20 of the top semiconductor IC chip 100*c* of said one of its subsystem units 380, one of the through silicon vias (TSVs) 157 of the top semiconductor IC chip 100*c* of said one of its subsystem units 380, and each of the interconnection metal layers 27 of the first backside interconnection scheme for a logic drive or device (BISD) 79 of said one of its subsystem units 380, or (4) one or more of the metal pads of the first backside interconnection scheme for a logic drive or device (BISD) 79 of said one of its second type of subsystem units 380 through, in sequence, each of the interconnection metal layers 27 of the fourth interconnection scheme for a chip 181 of the bottom semiconductor IC chip 100*d* of said one of its subsystem units 380, each of the interconnection metal layers 6 of the third interconnection scheme for a chip 179 of the bottom semiconductor IC chip 100*d* of said one of its subsystem units 380, one of the through silicon vias (TSVs) 157 of the bottom semiconductor IC chip 100*d* of said one of its subsystem units 380, each of the interconnection metal layers 6 of the first interconnection scheme for a chip 20 of the bottom semiconductor IC chip 100*d* of said one of its subsystem units 380, one of the metal pads 6*a* of the bottom semiconductor IC chip 100*d* of said one of its subsystem units 380, one of the through silicon vias (TSVs) 157 of one of the vertical-through-via (VTV) connectors 467 of said one of its subsystem units 380, and each of the interconnection metal layers 27 of the first backside interconnection scheme for a logic drive or device (BISD) 79 of said one of its subsystem units 380.

Fifth Type of Chip Package

Figure 10:
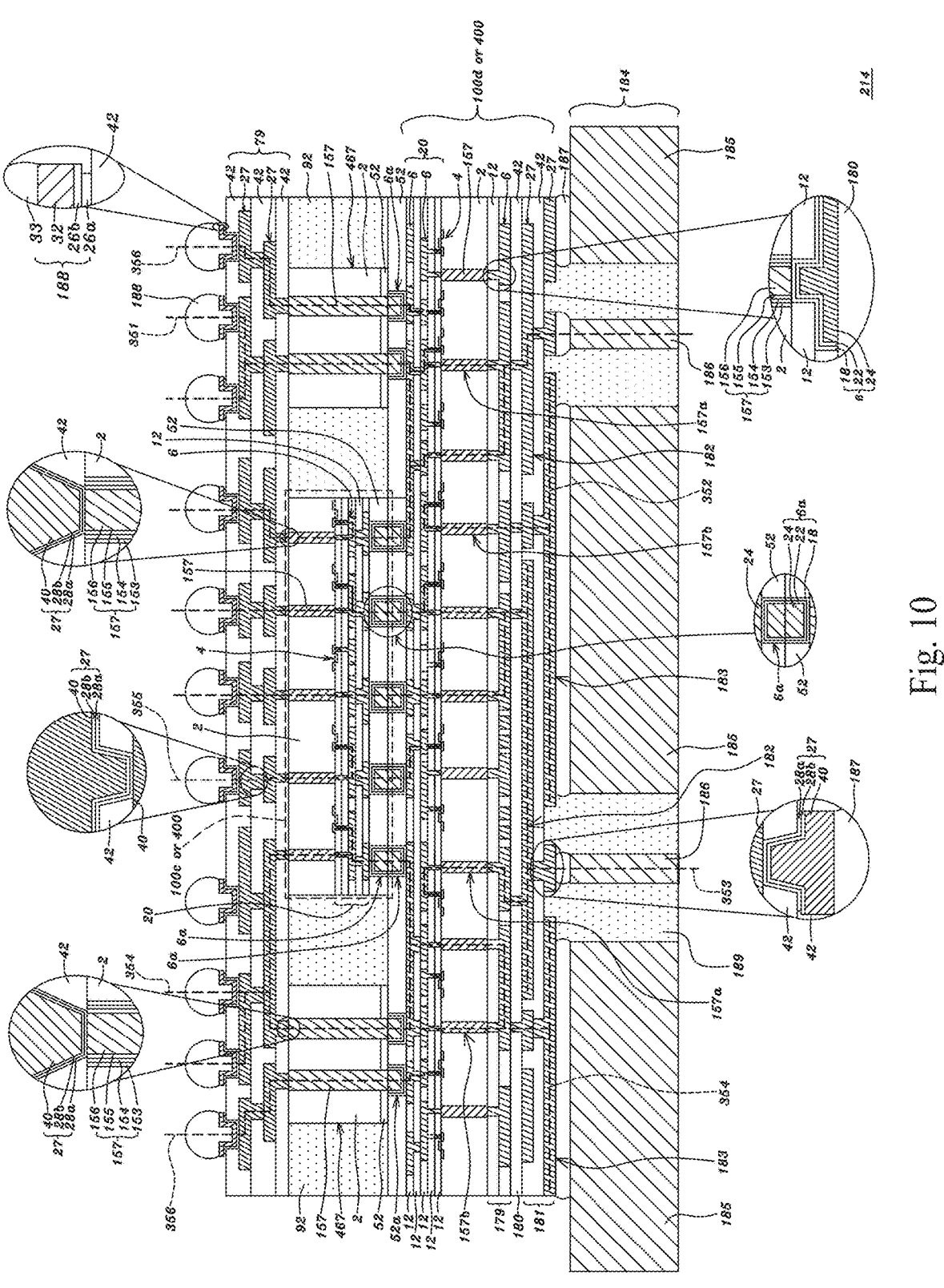
FIG. 10 is a schematically cross-sectional view showing a fifth type of chip package in accordance with an embodiment of the present application.

FIG. 10 is a schematically cross-sectional view showing a fifth type of chip package in accordance with an embodiment of the present application. Referring to FIG. 10, a fifth type of chip package 214 may have a similar structure to the subsystem unit 380 as seen in FIG. 9C packaged in the fourth type of chip package 113 for the second alternative.

For an element indicated by the same reference number shown in FIGS. 9C and 10, the specification of the element as seen in FIG. 10 may be referred to that of the element as illustrated in FIG. 9C. The difference therebetween is that the bottommost one of the interconnection metal layers 27 of the fourth interconnection scheme for a chip 181 of the bottom semiconductor IC chip 100*d* of the fifth type of chip package 214 as seen in FIG. 10, or the bottommost one of the interconnection metal layers 27 of the fourth interconnection scheme for a chip 181 of the fourth type of field programmable chip-on-chip module 400 of the fifth type of chip package 214 in case of replacing the bottom semiconductor IC chip 100*d* of the fourteenth type of chip package 214, may include a ground plane, buses or interconnection scheme 183; one of the interconnection metal layers 27 of the fourth interconnection scheme for a chip 181 of the bottom semiconductor IC chip 100*d* of the fourteenth type of chip package 214, or one of the interconnection metal layers 27 of the fourth interconnection scheme for a chip 181 of the fourth type of field programmable chip-on-chip module 400 of the fourteenth type of chip package 214 in case of replacing the bottom semiconductor IC chip 100*d* of the fourteenth type of chip package 214, neighboring to the ground plane, buses or interconnection scheme 183, may include a power plane, buses or interconnection scheme 182 aligned with the ground plane, buses or interconnection scheme 183; the fourth interconnection scheme for a chip 181 of the bottom semiconductor IC chip 100*d* of the fourteenth type of chip package 214, or the fourth interconnection scheme for a chip 181 of the fourth type of field programmable chip-on-chip module 400 of the fourteenth type of chip package 214 in case of replacing the bottom semiconductor IC chip 100*d* of the fourteenth type of chip package 214, may include a high dielectric-constant layer (not shown), i.e., insulating dielectric layer, between the power and ground planes, buses or interconnection schemes 182 and 183, wherein the high dielectric-constant layer may have a dielectric constant equal to or greater than 3, 5, 10, 30, 50 or 100, for example, and may be made of silicon oxide, silicon nitride, oxynitride, hafnium silicate, zirconium silicate, hafnium dioxide or zirconium dioxide. In this case, for the fifth type of chip package 214, its bottom semiconductor IC chip 100*d*, or its fourth type of field programmable chip-on-chip module 400 in case of replacing its bottom semiconductor IC chip 100*d*, may be formed with a decoupling capacitor therein provided by the power and ground planes, buses or interconnection schemes 182 and 183 and high dielectric-constant layer of the fourth interconnection scheme for a chip 181 thereof.

Further, the bottommost one of the polymer layers 42 of the fourth interconnection scheme for a chip 181 of its bottom semiconductor IC chip 100*d* of the subsystem unit 380 as seen in FIG. 9C, or the bottommost one of the polymer layers 42 of the fourth interconnection scheme for a chip 181 of its fourth type of field programmable chip-on-chip module 400 in case of replacing its bottom semiconductor IC chip 100*d* of the subsystem unit 380 as seen in FIG. 9C, may be omitted for the fifth type of chip package 214 as seen in FIG. 10 to expose all bottom surface of the bottommost one of the interconnection metal layers 27 of the fourth interconnection scheme for a chip 181 of the bottom semiconductor IC chip 100*d* of the fifth type of chip package 214, or all bottom surface of the bottommost one of the interconnection metal layers 27 of the fourth interconnection scheme for a chip 181 of the fourth type of field programmable chip-on-chip module 400 of the fifth type of chip package 214 in case of replacing the bottom semiconductor IC chip 100*d* of the fourteenth type of chip package 214. The fifth type of chip package 214 may further include a heat sink or spreader 184, such as a layer of copper or aluminum, including a ground portion 185 and multiple power portions 186 each arranged in an opening in the ground portion 185 of its heat sink or spreader 184 and surrounded by the ground portion 185 of its heat sink or spreader 184, wherein each of the ground and power portions 185 and 186 of its heat sink or spreader 184 may have a top surface mounted to a bottom surface of the bottommost one of the interconnection metal layers 27 of the fourth interconnection scheme for a chip 181 of its bottom semiconductor IC chip 100*d*, or a bottom surface of the bottommost one of the interconnection metal layers 27 of the fourth interconnection scheme for a chip 181 of its fourth type of field programmable chip-on-chip module 400 in case of replacing its bottom semiconductor IC chip 100*d*, via a tin-containing solder 187, or an electrically and thermally conductive adhesive. The ground and power portions 185 and 186 of its heat sink or spreader 184 may act as external pins of the fifth type of chip package 214 to couple or bond to external circuits for ground and power deliveries respectively.

Thereby, for the fifth type of chip package 214, each of the power portions 186 of its heat sink or spreader 184 may couple to the power plane, buses or interconnection scheme 182 of its bottom semiconductor IC chip 100*d*, or the power plane, buses or interconnection scheme 182 of its fourth type of field programmable chip-on-chip module 400 in case of replacing its bottom semiconductor IC chip 100*d*, and the ground portion 185 of its heat sink or spreader 184 may couple to the ground plane, buses or interconnection scheme 183 of its bottom semiconductor IC chip 100*d*, or the ground plane, buses or interconnection scheme 183 of its fourth type of field programmable chip-on-chip module 400 in case of replacing its bottom semiconductor IC chip 100*d*. The through silicon vias (TSVs) 157 of its bottom semiconductor IC chip 100*d*, or the through silicon vias (TSVs) 157 of either of the first or second FPGA IC chip or chiplet 200*a* or 200*b* of its fourth type of field programmable chip-on-chip module 400 in case of replacing its bottom semiconductor IC chip 100*d*, may include (1) multiple power vias 157*a* for delivering a voltage (Vcc) of power supply each coupling to the power plane, buses or interconnection scheme 182 of its bottom semiconductor IC chip 100*d*, or the power plane, buses or interconnection scheme 182 of its fourth type of field programmable chip-on-chip module 400 in case of replacing its bottom semiconductor IC chip 100*d*, through each of the interconnection metal layers 6 of the third interconnection scheme for a chip 179 of its bottom semiconductor IC chip 100*d*, or each of the interconnection metal layers 6 of the third interconnection scheme for a chip 179 of its fourth type of field programmable chip-on-chip module 400 in case of replacing its bottom semiconductor IC chip 100*d*, and (2) multiple ground vias 157*b* for delivering a voltage (Vss) of ground reference each coupling to the ground plane, buses or interconnection scheme 183 of its bottom semiconductor IC chip 100*d*, or the ground plane, buses or interconnection scheme 183 of its fourth type of field programmable chip-on-chip module 400 in case of replacing its bottom semiconductor IC chip 100*d*, through each of the interconnection metal layers 6 of the third interconnection scheme for a chip 179 of its bottom semiconductor IC chip 100*d* and one or more of the interconnection metal layers 27 of the fourth interconnection scheme for a chip 181 of its bottom semiconductor IC chip 100*d*, or each of the interconnection metal layers 6 of the third interconnection scheme for a chip 179 of its fourth type of field programmable chip-on-chip module 400 in case of replacing its bottom semiconductor IC chip 100*d* and one or more of the interconnection metal layers 27 of the fourth interconnection scheme for a chip 181 of its fourth type of field programmable chip-on-chip module 400.

Referring to FIG. 10, the fifth type of chip package 214 may further include a polymer layer 189 in each of the openings in the ground portion 185 of its heat sink or spreader 184, wherein its polymer layer 189 covers a side-wall of each of the power portions 186 of its heat sink or spreader 184, and its polymer layer 189 may have a bottom surface coplanar with a bottom surface of the ground portion 185 of its heat sink or spreader 184 and a bottom surface of each of the power portions 186 of its heat sink or spreader 184. The fifth type of chip package 214 may further include multiple metal bumps, pillars or pads 188 in an array at a top thereof acting as external pins of the fifth type of chip package 214 to couple or bond to external circuits for signal transmission, each of which may be one type of the first, second, third and fourth types having the same specification as that of the first, second, third and fourth types of micro-bumps, micro-pillars or micro-pads 34 respectively as illustrated in FIG. 3A. For the fifth type of chip package 214, each of its metal bumps, pillars or pads 188 may have the adhesion layer 26*a* on one of the metal pads of the topmost one of the interconnection metal layers 27 of its first backside interconnection scheme for a logic drive or device (BISD) 79.

Referring to FIG. 10, for the fifth type of chip package 214, the power plane, buses or interconnection scheme 182 of its bottom semiconductor IC chip 100*d* may couple, for power (voltage) delivery, to (1) one of the semiconductor devices 4, i.e., transistors, of its bottom semiconductor IC chip 100*d* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, and one of the interconnection metal layers 6 of the first interconnection scheme for a chip 20 of its bottom semi-conductor IC chip 100*d*, shown as either metal interconnect 351 or 353 in FIG. 10, (2) one of the semiconductor devices 4, i.e., i.e., transistors, of its top semiconductor IC chip 100*c* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semicon-ductor IC chip 100*c*, and each of the interconnection metal layers 6 of the first interconnection scheme for a chip 20 of its top semiconductor IC chip 100*c*, shown as the metal interconnect 351 in FIG. 10, (3) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semicon-ductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semiconductor IC chip 100*c*, each of the interconnection metal layers 6 of the first intercon-nection scheme for a chip 20 of its top semiconductor IC chip 100*c*, one of the through silicon vias (TSVs) 157 of its top semiconductor IC chip 100*c*, and each of the interconnection metal layers 27 of its first backside interconnection scheme for a logic drive or device (BISD) 79, shown as either the metal interconnect 351 or 353 in FIG. 10, and/or (4) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its vertical-through-via (VTV) connectors 467, and each of the interconnection metal layers 27 of its first backside interconnection scheme for a logic drive or device (BISD) 79, shown as the metal interconnect 351 in FIG. 10. Accordingly, a voltage (Vcc) of power supply may be delivered from each of the power portions 186 of its heat sink or spreader 184 to one or more of the semiconductor devices 4, i.e., transistors, of either or both of its top and bottom semiconductor IC chips 100*c* and 100*d* and/or one or more of its metal bumps, pillars or pads 188.

Referring to FIG. 10, for the fifth type of chip package 214, the ground plane, buses or interconnection scheme 183 of its bottom semiconductor IC chip 100*d* may couple, for ground (voltage) delivery, to (1) one of the semiconductor devices 4, i.e., transistors, of its bottom semiconductor IC chip 100*d* through, in sequence, one or more of the inter-connection metal layers 27 of the fourth interconnection scheme for a chip 181 of its bottom semiconductor IC chip 100*d*, each of the interconnection metal layers 6 of the third interconnection scheme for a chip 179 of its bottom semi-conductor IC chip 100*d*, one of the ground vias 157*b* of its bottom semiconductor IC chip 100*d*, and one of the inter-connection metal layers 6 of the first interconnection scheme for a chip 20 of its bottom semiconductor IC chip 100*d*, shown as a metal interconnect 352 in FIG. 10, (2) one of the semiconductor devices 4, i.e., i.e., transistors, of its top semiconductor IC chip 100*c* through, in sequence, one or more of the interconnection metal layers 27 of the fourth interconnection scheme for a chip 181 of its bottom semi-conductor IC chip 100*d*, each of the interconnection metal layers 6 of the third interconnection scheme for a chip 179 of its bottom semiconductor IC chip 100*d*, one of the ground vias 157*b* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semicon-ductor IC chip 100*c*, and each of the interconnection metal layers 6 of the first interconnection scheme for a chip 20 of its top semiconductor IC chip 100*c*, shown as a metal interconnect 354 in FIG. 10, (3) one or more of its metal bumps, pillars or pads 188 through, in sequence, one or more of the interconnection metal layers 27 of the fourth inter-connection scheme for a chip 181 of its bottom semicon-ductor IC chip 100*d*, each of the interconnection metal layers 6 of the third interconnection scheme for a chip 179 of its bottom semiconductor IC chip 100*d*, one of the ground vias 157*b* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semicon-ductor IC chip 100*c*, each of the interconnection metal layers 6 of the first interconnection scheme for a chip 20 of its top semiconductor IC chip 100*c*, one of the through silicon vias (TSVs) 157 of its top semiconductor IC chip 100c, and each of the interconnection metal layers 27 of its first backside interconnection scheme for a logic drive or device (BISD) 79, shown as the metal interconnect 354 in FIG. 10, and/or (4) one or more of its metal bumps, pillars or pads 188 through, in sequence, one or more of the interconnection metal layers 27 of the fourth interconnection scheme for a chip 181 of its bottom semiconductor IC chip 100d, each of the interconnection metal layers 6 of the third interconnection scheme for a chip 179 of its bottom semiconductor IC chip 100d, one of the ground vias 157b of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the through silicon vias (TSVs) 157 of one of its vertical-through-via (VTV) connectors 467, and each of the interconnection metal layers 27 of its first backside interconnection scheme for a logic drive or device (BISD) 79, shown as the metal interconnect 354 in FIG. 10. Accordingly, a voltage (Vss) of ground reference may be delivered from the ground portion 185 of its heat sink or spreader 184 to one or more of the semiconductor devices 4, i.e., transistors, of either or both of its top and bottom semiconductor IC chips 100c and 100d and/or one or more of its metal bumps, pillars or pads 188.

Referring to FIG. 10, for the fifth type of chip package 214, one of its metal bumps, pillars or pads 188 may couple, for signal or clock transmission or power or ground (voltage) delivery to (1) one of the semiconductor devices 4, i.e., transistors, of its bottom semiconductor IC chip 100d through, in sequence, each of the interconnection metal layers 27 of its first backside interconnection scheme for a logic drive or device (BISD) 79, one of the through silicon vias (TSVs) 157 of its top semiconductor IC chip 100c, each of the interconnection metal layers 6 of the first interconnection scheme for a chip 20 of its top semiconductor IC chip 100c, one of the metal pads 6a of its top semiconductor IC chip 100c, one of the metal pads 6a of its bottom semiconductor IC chip 100d, and each of the interconnection metal layers 6 of the first interconnection scheme for a chip 20 of its bottom semiconductor IC chip 100d, shown as a metal interconnect 355 in FIG. 10, (2) one of the semiconductor devices 4, i.e., transistors, of its bottom semiconductor IC chip 100d through, in sequence, each of the interconnection metal layers 27 of its first backside interconnection scheme for a logic drive or device (BISD) 79, one of the through silicon vias (TSVs) 157 of one of its vertical-through-via (VTV) connectors 467, one of the metal pads 6a of its bottom semiconductor IC chip 100d, and each of the interconnection metal layers 6 of the first interconnection scheme for a chip 20 of its bottom semiconductor IC chip 100d, shown as a metal interconnect 356 in FIG. 10, and/or (3) one of the semiconductor devices 4, i.e., transistors, of its top semiconductor IC chip 100c through, in sequence, each of the interconnection metal layers 27 of its first backside interconnection scheme for a logic drive or device (BISD) 79, one of the through silicon vias (TSVs) 157 of its top semiconductor IC chip 100c, and one of the interconnection metal layers 6 of the first interconnection scheme for a chip 20 of its top semiconductor IC chip 100c, shown as the metal interconnect 355 in FIG. 10.

Alternatively, for the fifth type of chip package 214 as seen in FIG. 10, its heat sink or spreader 184 may not be used for electrical connection and none of the openings for accommodating the power portions 186 of its heat sink or spreader 184 may formed in its heat sink or spreader 184.

For the fifth type of chip package 214 as seen in FIG. 10, its bottom semiconductor IC chip 100d may have a first set of small I/O circuits coupling respectively to a second set of small I/O circuits of its top semiconductor IC chip 100c through the bonding of a set of metal pads 6a of its bottom semiconductor IC chip 100d to a set of metal pads 6a of its top semiconductor IC chip 100c. Alternatively, its top semiconductor IC chip 100c may be replaced with the sixth type of field programmable chip-on-chip module 400 as seen in FIG. 5F to be turned upside down, wherein its bottom semiconductor IC chip 100d may have the first set of small I/O circuits coupling respectively to a third set of small I/O circuits of the second FPGA IC chip or chiplet 200b of its fourth type of field programmable chip-on-chip module 400 through the bonding of a set of metal pads 6a of its bottom semiconductor IC chip 100d to a set of metal pads 6a of the second FPGA IC chip or chiplet 200b of its fourth type of field programmable chip-on-chip module 400 respectively. Alternatively, its bottom semiconductor IC chip 100d may be replaced with the sixth type of field programmable chip-on-chip module 400 as seen in FIG. 5F, wherein its top semiconductor IC chip 100c may have the second set of small I/O circuits coupling respectively to a fourth set of small I/O circuits of the second FPGA IC chip or chiplet 200b of its fourth type of field programmable chip-on-chip module 400 through the bonding of a set of metal pads 6a of its top semiconductor IC chip 100c to a set of metal pads 6a of the second FPGA IC chip or chiplet 200b of its fourth type of field programmable chip-on-chip module 400 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Sixth Type of Chip Package

Figure 11:
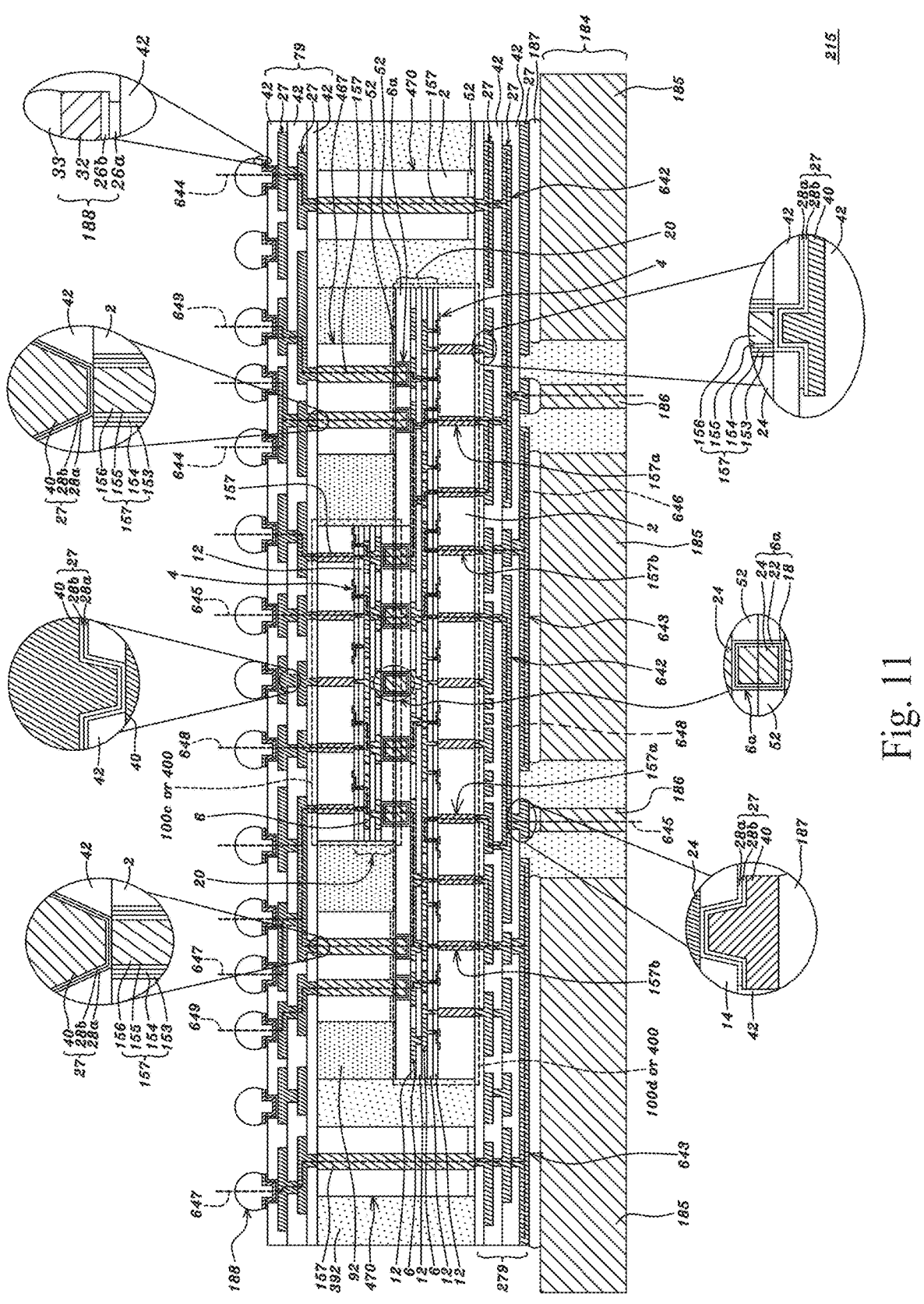
FIG. 11 is a schematically cross-sectional view showing a sixth type of chip package in accordance with an embodiment of the present application.

FIG. 11 is a schematically cross-sectional view showing a sixth type of chip package in accordance with an embodiment of the present application. The sixth type of chip package 215 as seen in FIG. 11 may have a similar structure to the fifth type of chip package 214 as seen in FIG. 10. For an element indicated by the same reference number shown in FIGS. 10 and 11, the specification of the element as seen in FIG. 11 may be referred to that of the element as illustrated in FIG. 10. The difference therebetween is that the third interconnection scheme for a chip 179, passivation layer 180 and fourth interconnection scheme for a chip 181 of the bottom semiconductor IC chip 100d of the fifth type of chip package 214 as seen in FIG. 10 may be omitted for the bottom semiconductor IC chip 100d of the sixth type of chip package 215 as seen in FIG. 11. The bottom semiconductor IC chip 100d of the sixth type of chip package 215 may have the specification for the sixth type of semiconductor IC chip 100 illustrated in FIG. 3F. Alternatively, the bottom semiconductor IC chip 100d of the sixth type of chip package 215 may be replaced with the sixth type of field programmable chip-on-chip module 400 as seen in FIG. 5F.

Referring to FIG. 11, the sixth type of chip package 215 may further include (1) multiple through-package-via connectors 470, each of which may have the specification for the third type of vertical-through-via (VTV) connector 467 as illustrated in FIG. 4C to be turned upside down, in a space extending from a sidewall of its bottom semiconductor IC chip 100*d*, or a sidewall of its fourth type of field programmable chip-on-chip module 400 in case of replacing its bottom semiconductor IC chip 100*d*, and a sidewall of its polymer layer 92, and (2) a polymer layer 392, i.e., insulating dielectric layer, made of molding compound, epoxy-based material, polyimide or silicon oxide for example, in the space, covering a sidewall of each of its through-package-via connectors 470, the sidewall of its bottom semiconductor IC chip 100*d*, or the sidewall of its fourth type of field programmable chip-on-chip module 400 in case of replacing its bottom semiconductor IC chip 100*d*, and the sidewall of its polymer layer 92, wherein its polymer layer 392 may have a top surface coplanar with a top surface of each of its through-package-via connectors 470, a top surface of its top semiconductor IC chip 100*c*, or a top surface of the first FPGA IC chip or chiplet 200*a* of its fourth type of field programmable chip-on-chip module 400 in case of replacing its top semiconductor IC chip 100*c*, a top surface of each of its vertical-through-via (VTV) connectors 467 and a top surface of its polymer layer 92, and its polymer layer 392 may have a bottom surface coplanar with a bottom surface of each of its through-package-via connectors 470 and a bottom surface of its bottom semiconductor IC chip 100*d*, or a bottom surface of the first FPGA IC chip or chiplet 200*a* of its fourth type of field programmable chip-on-chip module 400 in case of replacing its bottom semiconductor IC chip 100*d*. For the sixth type of chip package 215, each of the through silicon vias (TSVs) 157 of each of its through-package-via connectors 470 may vertically extend in the semiconductor substrate 2 of said each of its through-package-via connectors 470 with a depth greater than that of each of the through silicon vias (TSVs) 157 of each of its vertical-through-via (VTV) connectors 467 vertically extending in the semiconductor substrate 2 of said each of its vertical-through-via (VTV) connectors 467.

Referring to FIG. 11, for the sixth type of chip package 215, its first backside interconnection scheme for a logic drive or device (BISD) 79 may further extend over its polymer layer 392 and through-package-via connectors 470 and across an outer edge of its polymer layer 92, an edge of its bottom semiconductor IC chip 100*d* and an edge of its fourth type of field programmable chip-on-chip module 400 in case of replacing its bottom semiconductor IC chip 100*d*. Its first backside interconnection scheme for a logic drive or device (BISD) 79 may be provided with (1) one or more interconnection metal layers 27 coupling to each of the through silicon vias (TSVs) 157 of each of its top semiconductor IC chip 100*c*, vertical-through-via (VTV) connectors 467 and through-package-via connectors 470 and each of the through silicon vias (TSVs) 157 of the first FPGA IC chip or chiplet 200*a* of its fourth type of field programmable chip-on-chip module 400 in case of replacing its top semiconductor IC chip 100*c*, and (2) one or more polymer layers 42 each between neighboring two of the interconnection metal layers 27 thereof, under the bottommost one of the interconnection metal layers 27 thereof or over the topmost one of the interconnection metal layers 27 thereof, wherein an upper one of the interconnection metal layers 27 thereof may couple to a lower one of the interconnection metal layers 27 thereof through an opening in one of the polymer layers 42 thereof between the upper and lower ones of the interconnection metal layers 27 thereof. The bottommost one of the polymer layers 42 of its first backside interconnection scheme for a logic drive or device (BISD) 79 may be between the bottommost one of the interconnection metal layers 27 of its first backside interconnection scheme for a logic drive or device (BISD) 79 and a top planar surface composed of the backside of the semiconductor substrate 2 of each of its top semiconductor IC chip 100*c*, vertical-through-via (VTV) connectors 467 and through-package-via connectors 470, the backside of the semiconductor substrate 2 of the first FPGA IC chip or chiplet 200*a* of its fourth type of field programmable chip-on-chip module 400 in case of replacing its top semiconductor IC chip 100*c*, the top surface of its polymer layer 92 and the top surface of its polymer layer 392, wherein each opening in the bottommost one of the polymer layers 42 of its first backside interconnection scheme for a logic drive or device (BISD) 79 may be vertically over one of the through silicon vias (TSVs) 157 of one of its top semiconductor IC chip 100*c*, vertical-through-via (VTV) connectors 467 and through-package-via connectors 470 and one of the through silicon vias (TSVs) 157 of the first FPGA IC chip or chiplet 200*a* of its fourth type of field programmable chip-on-chip module 400 in case of replacing its top semiconductor IC chip 100*c*. The specification and process for the interconnection metal layers 27 and polymer layers 42 for its first backside interconnection scheme for a logic drive or device (BISD) 79 may be referred to those for the SISC 29 as illustrated in FIG. 3A.

Referring to FIG. 11, the sixth type of chip package 215 may further include a second backside interconnection scheme for a logic drive or device (BISD) 279 under its bottom semiconductor IC chip 100*d*, through-package-via connectors 470 and polymer layer 392 and its fourth type of field programmable chip-on-chip module 400 in case of replacing its bottom semiconductor IC chip 100*d*. Its second backside interconnection scheme for a logic drive or device (BISD) 279 may be provided with (1) one or more interconnection metal layers 27 coupling to each of the through silicon vias (TSVs) 157 of each of its bottom semiconductor IC chip 100*d* and through-package-via connectors 470 and each of the through silicon vias (TSVs) 157 of the first FPGA IC chip or chiplet 200*a* of its fourth type of field programmable chip-on-chip module 400 in case of replacing its bottom semiconductor IC chip 100*d*, and (2) one or more polymer layers 42 each between neighboring two of the interconnection metal layers 27 thereof or over the topmost one of the interconnection metal layers 27 thereof, wherein a lower one of the interconnection metal layers 27 thereof may couple to an upper one of the interconnection metal layers 27 thereof through an opening in one of the polymer layers 42 thereof between the upper and lower ones of the interconnection metal layers 27 thereof. The topmost one of the polymer layers 42 of its second backside interconnection scheme for a logic drive or device (BISD) 279 may be between the topmost one of the interconnection metal layers 27 of its second backside interconnection scheme for a logic drive or device (BISD) 279 and a bottom planar surface composed of the backside of the semiconductor substrate 2 of its bottom semiconductor IC chip 100*d*, the backside of the semiconductor substrate 2 of the first FPGA IC chip or chiplet 200*a* of its fourth type of field programmable chip-on-chip module 400 in case of replacing its bottom semiconductor IC chip 100*d*, a bottom surface of the insulating bonding layer 52 of each of its through-package-via connectors 470 and a bottom surface of its polymer layer 392, wherein each opening in the topmost one of the polymer layers 42 of its second backside interconnection scheme for a logic drive or device (BISD) 279 may be vertically under one of the through silicon vias (TSVs) 157 of one of its bottom semiconductor IC chip 100*d* and through-package-via connectors 470 and one of the through silicon vias (TSVs) 157 of the first FPGA IC chip or chiplet 200*a* of its fourth type of field programmable chip-on-chip module 400 in case of replacing its bottom semiconductor IC chip 100*d*. Each of the interconnection metal layers 27 of its second backside interconnection scheme for a logic drive or device (BISD) 279 may extend across an edge of each of its bottom semiconductor IC chip 100*d* and through-package-via connectors 470 and an edge of its fourth type of field programmable chip-on-chip module 400 in case of replacing its bottom semiconductor IC chip 100*d*. The specification and process for the interconnection metal layers 27 and polymer layers 42 for its second backside interconnection scheme for a logic drive or device (BISD) 279 may be referred to those for the SISC 29 as illustrated in FIG. 3A to be turned upside down. For example, each of the interconnection metal layers 27 of its second backside interconnection scheme for a logic drive or device (BISD) 279 may have a thickness in a vertical direction between 0.2 and 5 micrometers, wherein said each of the interconnection metal layers 27 may have the copper layer 40 with a thickness in a vertical direction between 0.2 and 5 micrometers.

Referring to FIG. 11, for the sixth type of chip package 215, a bottommost one of the interconnection metal layers 27 of its second backside interconnection scheme for a logic drive or device (BISD) 279 may include a ground plane, buses or interconnection scheme 643, and one of the interconnection metal layers 27 of its second backside interconnection scheme for a logic drive or device (BISD) 279, neighboring to the ground plane, buses or interconnection scheme 643, may include a power plane, buses or interconnection scheme 642 aligned with the ground plane, buses or interconnection scheme 643. For the sixth type of chip package 215, its second backside interconnection scheme for a logic drive or device (BISD) 279 may be formed with a high dielectric-constant layer (not shown), i.e., insulating dielectric layer, between the power and ground planes, buses or interconnection schemes 642 and 643, wherein the high dielectric-constant layer may have a dielectric constant equal to or greater than 3, 5, 10, 30, 50 or 100, for example, and may be made of silicon oxide, silicon nitride, oxynitride, hafnium silicate, zirconium silicate, hafnium dioxide or zirconium dioxide. Its second backside interconnection scheme for a logic drive or device (BISD) 279 may be formed with a decoupling capacitor therein provided by the power and ground planes, buses or interconnection schemes 642 and 643 and high dielectric-constant layer of its second backside interconnection scheme for a logic drive or device (BISD) 279.

Referring to FIG. 11, the sixth type of chip package 215 may further include a heat sink or spreader 184 having the same specification as that of the heat sink or spreader 184 as illustrated in FIG. 10. For the sixth type of chip package 215, each of the ground and power portions 185 and 186 of its heat sink or spreader 184 may have a top surface mounted to a bottom surface of the bottommost one of the interconnection metal layers 27 of its second backside interconnection scheme for a logic drive or device (BISD) 279 via a tin-containing solder 187, or an electrically and thermally conductive adhesive. For the sixth type of chip package 215, the ground and power portions 185 and 186 of its heat sink or spreader 184 may act as external pins of the sixth type of chip package 215 to couple or bond to external circuits for ground and power deliveries respectively, and its metal bumps, pillars or pads 188 may act as external pins of the sixth type of chip package 215 to couple or bond to external circuits for signal transmission.

For the sixth type of chip package 215, each of the power portions 186 of its heat sink or spreader 184 may couple to the power plane, buses or interconnection scheme 642 of its second backside interconnection scheme for a logic drive or device (BISD) 279, and the ground portion 185 of its heat sink or spreader 184 may couple to the ground plane, buses or interconnection scheme 643 of its second backside interconnection scheme for a logic drive or device (BISD) 279. Each of the power vias 157*a* of its bottom semiconductor IC chip 100*d*, or each of the power vias 157*a* of either of the first and second FPGA IC chips or chiplets 200*a* and 200*b* of its fourth type of field programmable chip-on-chip module 400 in case of replacing its bottom semiconductor IC chip 100*d*, for delivering a voltage (Vcc) of power supply may couple to the power plane, buses or interconnection scheme 642 of its second backside interconnection scheme for a logic drive or device (BISD) 279 through one or more of the interconnection metal layers 27 of its second backside interconnection scheme for a logic drive or device (BISD) 279. Each of the ground vias 157*b* of its bottom semiconductor IC chip 100*d*, or each of the ground vias 157*b* of either of the first and second FPGA IC chips or chiplets 200*a* and 200*b* of its fourth type of field programmable chip-on-chip module 400 in case of replacing its bottom semiconductor IC chip 100*d*, for delivering a voltage (Vss) of ground reference may couple to the ground plane, buses or interconnection scheme 183 of its second backside interconnection scheme for a logic drive or device (BISD) 279 through one or more of the interconnection metal layers 27 of its second backside interconnection scheme for a logic drive or device (BISD) 279.

Referring to FIG. 11, for the sixth type of chip package 215, the power plane, buses or interconnection scheme 642 of its second backside interconnection scheme for a logic drive or device (BISD) 279 may couple, for power (voltage) delivery, to (1) one of the semiconductor devices 4, i.e., transistors, of its bottom semiconductor IC chip 100*d* through, in sequence, one or more of the interconnection metal layers 27 of its second backside interconnection scheme for a logic drive or device (BISD) 279, one of the power vias 157*a* of its bottom semiconductor IC chip 100*d*, and one of the interconnection metal layers 6 of the first interconnection scheme for a chip 20 of its bottom semiconductor IC chip 100*d*, shown as either metal interconnect 644 or 645 in FIG. 11, (2) one of the semiconductor devices 4, i.e., i.e., transistors, of its top semiconductor IC chip 100*c* through, in sequence, one or more of the interconnection metal layers 27 of its second backside interconnection scheme for a logic drive or device (BISD) 279, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semiconductor IC chip 100*c*, and each of the interconnection metal layers 6 of the first interconnection scheme for a chip 20 of its top semiconductor IC chip 100*c*, shown as the metal interconnect 644 in FIG. 11, (3) one or more of its metal bumps, pillars or pads 188 through, in sequence, one or more of the interconnection metal layers 27 of its second backside interconnection scheme for a logic drive or device (BISD) 279, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semiconductor IC chip 100*c*, each of the interconnection metal layers 6 of the first interconnection scheme for a chip 20 of its top semiconductor IC chip 100*c*, one of the through silicon vias (TSVs) 157 of its top semiconductor IC chip 100*c*, and each of the interconnection metal layers 27 of its first backside interconnection scheme for a logic drive or device (BISD) 79, shown as the metal interconnect 644 in FIG. 11, (4) one or more of its metal bumps, pillars or pads 188 through, in sequence, one or more of the interconnection metal layers 27 of its second backside interconnection scheme for a logic drive or device (BISD) 279, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its vertical-through-via (VTV) connectors 467, and each of the interconnection metal layers 27 of its first backside interconnection scheme for a logic drive or device (BISD) 79, shown as the metal interconnect 644 in FIG. 11, and/or (5) one or more of its metal bumps, pillars or pads 188 through, in sequence, one or more of the interconnection metal layers 27 of its second backside interconnection scheme for a logic drive or device (BISD) 279, one of the through silicon vias (TSVs) 157 of one of its through-package-via connectors 470 and each of the interconnection metal layers 27 of its first backside interconnection scheme for a logic drive or device (BISD) 79, shown as the metal interconnect 644 in FIG. 11. Accordingly, a voltage (Vcc) of power supply may be delivered from each of the power portions 186 of its heat sink or spreader 184 to one or more of the semiconductor devices 4, i.e., transistors, of either or both of its top and bottom semiconductor IC chips 100*c* and 100*d* and/or one or more of its metal bumps, pillars or pads 188.

Referring to FIG. 11, for the sixth type of chip package 215, the ground plane, buses or interconnection scheme 643 of its second backside interconnection scheme for a logic drive or device (BISD) 279 may couple, for ground (voltage) delivery, to (1) one of the semiconductor devices 4, i.e., transistors, of its bottom semiconductor IC chip 100*d* through, in sequence, one or more of the interconnection metal layers 27 of its second backside interconnection scheme for a logic drive or device (BISD) 279, one of the ground vias 157*b* of its bottom semiconductor IC chip 100*d*, and one of the interconnection metal layers 6 of the first interconnection scheme for a chip 20 of its bottom semiconductor IC chip 100*d*, shown as a metal interconnect 646 in FIG. 11, (2) one of the semiconductor devices 4, i.e., i.e., transistors, of its top semiconductor IC chip 100*c* through, in sequence, one or more of the interconnection metal layers 27 of its second backside interconnection scheme for a logic drive or device (BISD) 279, one of the ground vias 157*b* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semiconductor IC chip 100*c*, and each of the interconnection metal layers 6 of the first interconnection scheme for a chip 20 of its top semiconductor IC chip 100*c*, shown as a metal interconnect 647 in FIG. 11, (3) one or more of its metal bumps, pillars or pads 188 through, in sequence, one or more of the interconnection metal layers 27 of its second backside interconnection scheme for a logic drive or device (BISD) 279, one of the ground vias 157*b* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its top semiconductor IC chip 100*c*, each of the interconnection metal layers 6 of the first interconnection scheme for a chip 20 of its top semiconductor IC chip 100*c*, one of the through silicon vias (TSVs) 157 of its top semiconductor IC chip 100*c*, and each of the interconnection metal layers 27 of its first backside interconnection scheme for a logic drive or device (BISD) 79, shown as the metal interconnect 647 in FIG. 11, (4) one or more of its metal bumps, pillars or pads 188 through, in sequence, one or more of the interconnection metal layers 27 of its second backside interconnection scheme for a logic drive or device (BISD) 279, one of the ground vias 157*b* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its vertical-through-via (VTV) connectors 467, and each of the interconnection metal layers 27 of its first backside interconnection scheme for a logic drive or device (BISD) 79, shown as the metal interconnect 647 in FIG. 11, and/or (5) one or more of its metal bumps, pillars or pads 188 through, in sequence, one or more of the interconnection metal layers 27 of its second backside interconnection scheme for a logic drive or device (BISD) 279, one of the through silicon vias (TSVs) 157 of one of its through-package-via connectors 470 and each of the interconnection metal layers 27 of its first backside interconnection scheme for a logic drive or device (BISD) 79, shown as the metal interconnect 647 in FIG. 11. Accordingly, a voltage (Vss) of ground reference may be delivered from the ground portion 185 of its heat sink or spreader 184 to one or more of the semiconductor devices 4, i.e., transistors, of either or both of its top and bottom semiconductor IC chips 100*c* and 100*d* and/or one or more of its metal bumps, pillars or pads 188.

Referring to FIG. 11, for the sixth type of chip package 215, one of its metal bumps, pillars or pads 188 may couple, for signal or clock transmission or power or ground (voltage) delivery, to (1) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of its top semiconductor IC chip 100*c*, each of the interconnection metal layers 6 of the first interconnection scheme for a chip 20 of its top semiconductor IC chip 100*c*, one of the metal pads 6*a* of its top semiconductor IC chip 100*c*, one of the metal pads 6*a* of its bottom semiconductor IC chip 100*d*, and each of the interconnection metal layers 6 of the first interconnection scheme for a chip 20 of its bottom semiconductor IC chip 100*d*, shown as a metal interconnect 648 in FIG. 11, (2) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of one of its vertical-through-via (VTV) connectors 467, one of the metal pads 6*a* of its bottom semiconductor IC chip 100*d*, and each of the interconnection metal layers 6 of the first interconnection scheme for a chip 20 of its bottom semiconductor IC chip 100*d*, shown as a metal interconnect 649 in FIG. 11, and/or (3) one of the semiconductor devices 4, i.e., transistors, of its top semiconductor IC chip 100*c* through, in sequence, each of the interconnection metal layers 27 of its first backside interconnection scheme for a logic drive or device (BISD) 79, one of the through silicon vias (TSVs)

157 of its top semiconductor IC chip 100c, and one of the interconnection metal layers 6 of the first interconnection scheme for a chip 20 of its top semiconductor IC chip 100c, shown as the metal interconnect 648 in FIG. 11.

Alternatively, for the sixth type of chip package 215 as seen in FIG. 11, its heat sink or spreader 184 may not be used for electrical connection and none of the openings for accommodating the power portions 186 of its heat sink or spreader 184 may formed in its heat sink or spreader 184.

For the sixth type of chip package 215 as seen in FIG. 11, its bottom semiconductor IC chip 100d may have a first set of small I/O circuits coupling respectively to a second set of small I/O circuits of its top semiconductor IC chip 100c through the bonding of a set of metal pads 6a of its bottom semiconductor IC chip 100d to a set of metal pads 6a of its top semiconductor IC chip 100c. Alternatively, its top semiconductor IC chip 100c may be replaced with the sixth type of field programmable chip-on-chip module 400 as seen in FIG. 5F to be turned upside down, wherein its bottom semiconductor IC chip 100d may have the first set of small I/O circuits coupling respectively to a third set of small I/O circuits of the second FPGA IC chip or chiplet 200b of its fourth type of field programmable chip-on-chip module 400 through the bonding of a set of metal pads 6a of its bottom semiconductor IC chip 100d to a set of metal pads 6a of the second FPGA IC chip or chiplet 200b of its fourth type of field programmable chip-on-chip module 400 respectively. Alternatively, its bottom semiconductor IC chip 100d may be replaced with the sixth type of field programmable chip-on-chip module 400 as seen in FIG. 5F, wherein its top semiconductor IC chip 100c may have the second set of small I/O circuits coupling respectively to a fourth set of small I/O circuits of the second FPGA IC chip or chiplet 200b of its fourth type of field programmable chip-on-chip module 400 through the bonding of a set of metal pads 6a of its top semiconductor IC chip 100c to a set of metal pads 6a of the second FPGA IC chip or chiplet 200b of its fourth type of field programmable chip-on-chip module 400 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Seventh Type of Chip Package

Figure 12:
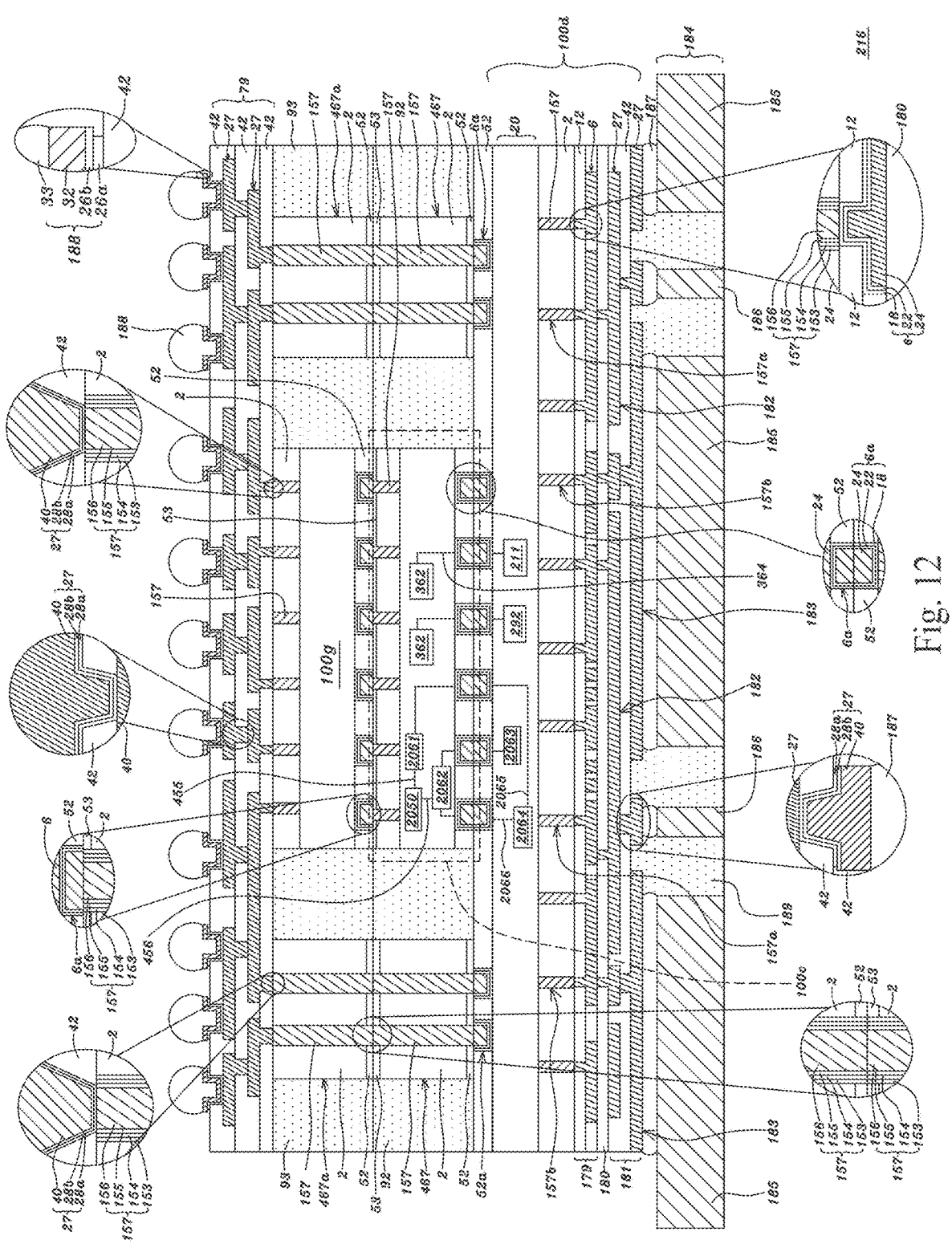
FIG. 12 is a schematically cross-sectional view showing a seventh type of chip package for a first alternative in accordance with an embodiment of the present application.

FIG. 12 is a schematically cross-sectional view showing a seventh type of chip package for a first alternative in accordance with an embodiment of the present application. A seventh type of chip package 216 for the first alternative as seen in FIG. 12 may have a similar structure to the fifth type of chip package 214 as seen in FIG. 10. For an element indicated by the same reference number shown in FIGS. 10 and 12, the specification of the element as seen in FIG. 12 may be referred to that of the element as illustrated in FIG. 10. The difference therebetween is that the top semiconductor IC chip 100c of the fifth type of chip package 214 is renamed as a middle semiconductor IC chip for the seventh type of chip package 216 for the first alternative, and each of the vertical-through-via (VTV) connectors 467 of the fifth type of chip package 214 is renamed as a bottom vertical-through-via (VTV) connector for the seventh type of chip package 216 for the first alternative.

Referring to FIG. 12, the seventh type of chip package 216 for the first alternative may further include a top semiconductor IC chip 100g bonded onto its middle semiconductor IC chip 100c, wherein its top semiconductor IC chip 100g may have the same specification as the sixth type of semiconductor IC chip 100 illustrated in FIG. 3F to be turned upside down. For the seventh type of chip package 216 for the first alternative, its middle semiconductor IC chip 100c may be formed with another insulating bonding layer 53, made of silicon oxide or silicon oxynitride, at a top of the semiconductor substrate 2 thereof, wherein the insulating bonding layer 53 thereof may have a top surface coplanar with a top surface of each of the through silicon vias (TSVs) 157 thereof, i.e., a top surface of the copper layer 156 of said each of the through silicon vias (TSVs) 157. Its middle semiconductor IC chip 100c may be provided, for hybrid bonding, with (1) the insulating bonding layer 53, i.e., silicon oxide or silicon oxynitride, having the top surface attached to and in contact with a bottom surface of the insulating bonding layer 52, i.e., silicon oxide or silicon oxynitride, of its top semiconductor IC chip 100g, and (2) the through silicon vias (TSVs) 157 each having the copper layer 156 with the top surface bonded to and in contact with a bottom surface of one of the metal pads 6a, i.e., copper layer 24 thereof, of its top semiconductor IC chip 100g. Each of the metal pads 6a of its top semiconductor IC chip 100g may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6a of its top semiconductor IC chip 100g may be smaller than 10, 5, 2 or 1 micrometers, or between 0.2 and 10 micrometers, 0.2 and 5 micrometers, 0.2 and 2 micrometers, or 0.2 and 1 micrometers. Its top semiconductor IC chip 100g may be provided with the semiconductor devices 4, such as transistors, as illustrated in FIG. 3F to be turned upside down at a bottom surface of the semiconductor substrate 2 thereof facing the top surface of the semiconductor substrate 2 of its bottom semiconductor IC chip 100d and facing the top surface of the insulating bonding layer 53 of its middle semiconductor IC chip 100c. Its top semiconductor IC chip 100g may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip. Its top semiconductor IC chip 100g may have a sidewall coplanar, in a vertical direction, with that of its middle semiconductor IC chip 100c. The seventh type of chip package 216 for the first alternative may further include multiple top vertical-through-via (VTV) connectors 467a bonded onto its bottom vertical-through-via (VTV) connectors 467 respectively, wherein each of its top vertical-through-via (VTV) connectors 467a may have the same specification as that of the third type of verticalthrough-via (VTV) connector 467 as illustrated in FIG. 4C to be turned upside down. Each of its bottom vertical-through-via (VTV) connectors 467 may be formed with another insulating bonding layer 53, made of silicon oxide or silicon oxynitride, at a top of the semiconductor substrate 2 thereof, wherein the insulating bonding layer 53 thereof may have a top surface coplanar with a top surface of each of the through silicon vias (TSVs) 157 thereof, i.e., a top surface of the copper layer 156 thereof. Each of its bottom vertical-through-via (VTV) connectors 467 may be provided with (1) the insulating bonding layer 53, i.e., silicon oxide or silicon oxynitride, having the top surface attached to and in contact with a bottom surface of the insulating bonding layer 52, i.e., silicon oxide or silicon oxynitride, of one of its top vertical-through-via (VTV) connectors 467a, and (2) the through silicon vias (TSVs) 157, i.e., copper layer 156 thereof, each having a top surface bonded to and in contact with a bottom surface of one of the through silicon vias (TSVs) 157, i.e., copper layer 156 thereof, of one of its top vertical-through-via (VTV) connectors 467a. Each of its top vertical-through-via (VTV) connectors 467a may have a sidewall coplanar, in a vertical direction, with that of one of its bottom vertical-through-via (VTV) connectors 467.

Referring to FIG. 12, the seventh type of chip package 216 for the first alternative may further include a polymer layer 93, i.e., insulating dielectric layer, made of molding compound, epoxy-based material, polyimide or silicon oxide for example, in multiple gaps each between neighboring two of its top semiconductor IC chip 100g and top vertical-through-via (VTV) connectors 467a and on a top surface of its polymer layer 92. For the seventh type of chip package 216 for the first alternative, the semiconductor substrate 2 of each of its top semiconductor IC chip 100g and top vertical-through-via (VTV) connectors 467a and its polymer layer 93 may have a portion at a top side thereof removed by a chemical-mechanical-polishing (CMP) or mechanical grinding process such that each of the through silicon vias (TSVs) 157 of said each of its top semiconductor IC chip 100g and top vertical-through-via (VTV) connectors 467a, that is, the electroplated copper layer 156 of said each of the through silicon vias (TSVs) 157, may have a backside substantially coplanar with the backside of the semiconductor substrate 2 of said each of its top semiconductor IC chip 100g and top vertical-through-via (VTV) connectors 467a and a top surface of its polymer layer 93. The semiconductor substrate 2 of its top semiconductor IC chip 100g may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of its top semiconductor IC chip 100g may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example. Each connection path provided by a stack of one of the through silicon vias (TSVs) 157 of one of its bottom vertical-through-via (VTV) connectors 467 and one of the through silicon vias (TSVs) 157 of one of its top vertical-through-via (VTV) connectors 467a, stacked from bottom to top, may couple its bottom semiconductor IC chip 100d to a voltage of power supply for delivering a power supply or to a voltage of ground reference for delivering a ground reference. Alternatively, each connection path provided by a stack of one of the through silicon vias (TSVs) 157 of one of its bottom vertical-through-via (VTV) connectors 467 and one of the through silicon vias (TSVs) 157 of one of its top vertical-through-via (VTV) connectors 467a, stacked from bottom to top, may couple to its bottom semiconductor IC chip 100d for signal or clock transmission.

Referring to FIG. 12, for the seventh type of chip package 216 for the first alternative, its first backside interconnection scheme for a logic drive or device (BISD) 79 may be formed over its top semiconductor IC chip 100g, top vertical-through-via (VTV) connectors 467a and polymer layer 93. Its first backside interconnection scheme for a logic drive or device (BISD) 79 may be provided with (1) one or more interconnection metal layers 27 coupling to each of the through silicon vias (TSVs) 157 of each of its top semiconductor IC chip 100g and vertical-top through-via (VTV) connectors 467a, and (2) one or more polymer layers 42 each between neighboring two of the interconnection metal layers 27 thereof, under the bottommost one of the interconnection metal layers 27 thereof or over the topmost one of the interconnection metal layers 27 thereof, wherein an upper one of the interconnection metal layers 27 thereof may couple to a lower one of the interconnection metal layers 27 thereof through an opening in one of the polymer layers 42 thereof between the upper and lower ones of the interconnection metal layers 27 thereof. The bottommost one of the polymer layers 42 of its first backside interconnection scheme for a logic drive or device (BISD) 79 may be between the bottommost one of the interconnection metal layers 27 of its first backside interconnection scheme for a logic drive or device (BISD) 79 and a top planar surface composed of the backside of the semiconductor substrate 2 of each of its top semiconductor IC chip 100g and top vertical-through-via (VTV) connectors 467a and the top surface of its polymer layer 93, wherein each opening in the bottommost one of the polymer layers 42 of its first backside interconnection scheme for a logic drive or device (BISD) 79 may be vertically over one of the through silicon vias (TSVs) 157 of one of its top semiconductor IC chip 100g and top vertical-through-via (VTV) connectors 467a. Each of the interconnection metal layers 27 of its first backside interconnection scheme for a logic drive or device (BISD) 79 may extend across an edge of each of its top semiconductor IC chip 100c and top vertical-through-via (VTV) connectors 467a. The specification and process for the interconnection metal layers 27 and polymer layers 42 for its first backside interconnection scheme for a logic drive or device (BISD) 79 may be referred to those for the SISC 29 as illustrated in FIG. 3A.

Referring to FIG. 12, for the seventh type of chip package 216 for the first alternative, its middle and bottom semiconductor IC chips 100c and 100d may be combined as a system for a FPGA function. For example, its middle semiconductor IC chip 100c may be provided therein with (1) multiple memory sections 2050 arranged in a first array, each of which may include multiple SRAM cells arranged in a second array, multiple local word lines 455 each coupling to the SRAM cells in the same row of the second array and multiple local bit lines 456 each coupling to the SRAM cells in the same column of the second array, (2) a local row decoder 2061 coupling to the local word lines 455 of said each of the memory sections 2050, and (3) a local column decoder 2062 coupling to the local bit lines 456 of said each of the memory sections 2050. Its bottom semiconductor IC chip 100d may be provided therein with (1) a block 2063 for registers or flip-flop circuits coupling to one or more output points of the local column decoder 2062 through the bonding of a first set of metal pads 6a of its middle semiconductor IC chip 100c to a first set of metal pads 6a of its bottom semiconductor IC chip 100d respectively for storing data outputs from the output points of the local column decoder 2062 therein, and (2) a switch box 2064 coupling to the local row and column decoders 2061 and 2062 through the bonding of a second set of metal pads 6a of its middle semiconductor IC chip 100c to a second set of metal pads 6a of its bottom semiconductor IC chip 100d respectively for controlling the local row and column decoders 2061 and 2062. The local row decoder 2061 is configured for selecting, in accordance with its input data set associated with a first output data sets of the switch box 2064, one from the local word lines 455 to read data stored in the SRAM cells in one row of the second array to be passed to the local bit lines 456. The local column decoder 2062 is configured for selecting, in accordance with its input data set associated with a second output data sets of the switch box 2064, one or more from the local bit lines 456 to pass data as one or more data outputs of the local column decoder 2062 to be stored in the block 2063 for registers or flip-flop circuits.

Referring to FIG. 12, for the seventh type of chip package 216 for the first alternative, its middle semiconductor IC chip 100c may further include the memory cells 362 of either type of the first and second types of field programmable switch cells 279 as illustrated in FIGS. 2A and 2B. Its bottom semiconductor IC chip 100d may be provided therein with (1) the pass/no-pass switches 292 of either type of the first and second types of field programmable switch cells 279 as illustrated in FIGS. 2A and 2B each coupling to one or more of the memory cells 362 through the bonding of a third set of metal pads 6a of its middle semiconductor IC chip 100c to a third set of metal pads 6a of its bottom semiconductor IC chip 100d respectively, and (2) the selection circuits 211, such as multiplexers, of the second type of field programmable switch cells 279 as illustrated in FIG. 2A each coupling to one or more of the memory cells 362 through the bonding of a fourth set of metal pads 6a of its middle semiconductor IC chip 100c to a fourth set of metal pads 6a of its bottom semiconductor IC chip 100d respectively.

Figure 13:
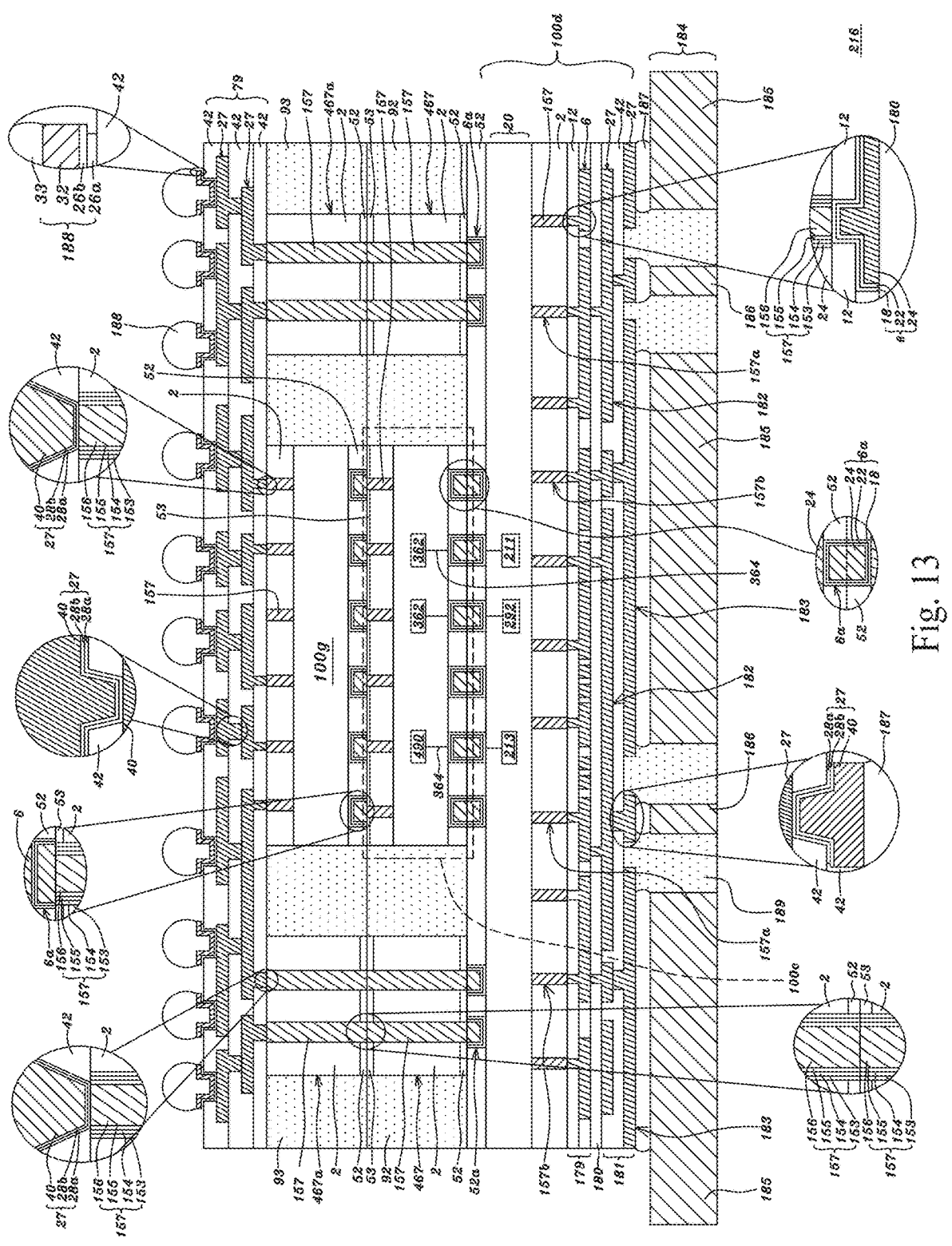
FIG. 13 is a schematically cross-sectional view showing a seventh type of chip package for a second alternative in accordance with an embodiment of the present application.

Alternatively, FIG. 13 is a schematically cross-sectional view showing a seventh type of chip package for a second alternative with an embodiment of the present application. The seventh type of chip package 216 for the second alternative as seen in FIG. 13 may have a similar structure to the seventh type of chip package 216 for the first alternative as seen in FIG. 12. For an element indicated by the same reference number shown in FIGS. 12 and 13, the specification of the element as seen in FIG. 13 may be referred to that of the element as illustrated in FIG. 12. The difference therebetween is that any type of the first, second and third types of field programmable logic cells or elements 2014 as seen in FIGS. 1A-1C may be further arranged in the middle and bottom semiconductor IC chips 100c and 100d for the seventh type of chip package 216 for the second alternative as seen in FIG. 13.

Referring to FIG. 13, for the seventh type of chip package 216 for the second alternative, its middle semiconductor IC chip 100c may be provided therein with the memory cells 490 of any type of the first, second and third types of field programmable logic cells or elements 2014 as illustrated in FIGS. 1A-1C. Its bottom semiconductor IC chip 100d may be provided therein with (1) the selection circuit 211 of the first type of fined-grained programmable logic cells or elements 2014 as illustrated in FIG. 1A coupling to one or more of the memory cells 490 through the bonding of a fifth set of metal pads 6a of its middle semiconductor IC chip 100c to a fifth set of metal pads 6a of its bottom semiconductor IC chip 100d respectively, (2) the two logic gate or circuits 2031, fixed-wired adding unit 2016, multiplexers 2032, 2033 and 2036 and D-type flip-flop circuit 2034 of the second type of field programmable logic cells or elements 2014 as illustrated in FIG. 1B coupling to one or more of the memory cells through the bonding of a sixth set of metal pads 6a of its middle semiconductor IC chip 100c to a sixth set of metal pads 6a of its bottom semiconductor IC chip 100d respectively, and/or (3) the logic operator or circuit 2037, cascade circuit 2038, D-type flip-flop circuit 2039, set-reset control circuit 2041, clock control circuit 2042 and multiplexer 2043 of the third type of fined-grained programmable logic cells or elements 2014 as illustrated in FIG. 1C coupling to one or more of the memory cells 490 through the bonding of a sixth set of metal pads 6a of its middle semiconductor IC chip 100c to a sixth set of metal pads 6a of its bottom semiconductor IC chip 100d respectively.

Alternatively, referring to FIG. 13, for the seventh type of chip package 216 for a third alternative, for achieving the coarse-grained reconfigurable (CGR) units, a functional unit (FU) including multiple hard macros therein such as digital signal process DSP slices, graphic process GPU macros, DPU macros, microcontroller (MCU) macros, multiplexer macros, adder macros, multiplier macros, arithmetic logic unit (ALU) macros, shift circuit macros, comparison circuit macros, floating-point computing macros, register or flip-flops macros, and/or I/O interfacing macros may be arranged in its bottom semiconductor IC chip 100d. A registering block having multiple registers or D-type flip-flop circuits each for registering or temporally storing data therein associated with a data output of the functional unit may be arranged in its bottom semiconductor IC chip 100d. A program counter (PC), i.e., instruction pointer, having multiple instruction address registers temporally storing multiple instruction addresses therein to point one or more of the arithmetic logic cells of the functional unit in a program sequence may be arranged in its bottom semiconductor IC chip 100d. An instruction memory block or section for temporally storing multiple instruction sets to be fetched by the the functional unit (FU) may be arranged in its middle semiconductor IC chip 100c.

Referring to FIGS. 12 and 13, for the seventh type of chip package 216 for each of the first and second alternatives, the power plane, buses or interconnection scheme 182 of its bottom semiconductor IC chip 100d may couple, for power (voltage) delivery, to (1) one of the semiconductor devices 4, i.e., transistors, of its bottom semiconductor IC chip 100d through, in sequence, each of the interconnection metal layers 6 of the third interconnection scheme for a chip 179 of its bottom semiconductor IC chip 100d, one of the power vias 157a of its bottom semiconductor IC chip 100d, and one of the interconnection metal layers 6 of the first interconnection scheme for a chip 20 of its bottom semiconductor IC chip 100d, (2) one of the semiconductor devices 4, i.e., i.e., transistors, of its middle semiconductor IC chip 100c through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the metal pads 6a of its middle semiconductor IC chip 100c, and each of the interconnection metal layers 6 of the first interconnection scheme for a chip 20 of its middle semiconductor IC chip 100*c*, (3) one of the semiconductor devices 4, i.e., i.e., transistors, of its top semiconductor IC chip 100*g* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semiconductor IC chip 100*c* and one of the through silicon vias (TSVs) 157 of its middle semiconductor IC chip 100*c*, one of the metal pads 6*a* of its top semiconductor IC chip 100*g*, and each of the interconnection metal layers 6 of the first interconnection scheme for a chip 20 of its top semiconductor IC chip 100*g*, (4) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semiconductor IC chip 100*c*, one of the through silicon vias (TSVs) 157 of its middle semiconductor IC chip 100*c*, one of the metal pads 6*a* of its top semiconductor IC chip 100*g*, each of the interconnection metal layers 6 of the first interconnection scheme for a chip 20 of its top semiconductor IC chip 100*g*, one of the through silicon vias (TSVs) 157 of its top semiconductor IC chip 100*g*, and each of the interconnection metal layers 27 of its first backside interconnection scheme for a logic drive or device (BISD) 79, and/or (5) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its bottom vertical-through-via (VTV) connectors 467, one of the through silicon vias (TSVs) 157 of one of its top vertical-through-via (VTV) connectors 467*a*, and each of the interconnection metal layers 27 of its first backside interconnection scheme for a logic drive or device (BISD) 79.

Referring to FIGS. 12 and 13, for the seventh type of chip package 216 for each of the first and second alternatives, the ground plane, buses or interconnection scheme 183 of its bottom semiconductor IC chip 100*d* may couple, for ground (voltage) delivery, to (1) one of the semiconductor devices 4, i.e., transistors, of its bottom semiconductor IC chip 100*d* through, in sequence, one or more of the interconnection metal layers 27 of the fourth interconnection scheme for a chip 181 of its bottom semiconductor IC chip 100*d*, each of the interconnection metal layers 6 of the third interconnection scheme for a chip 179 of its bottom semiconductor IC chip 100*d*, one of the ground vias 157*b* of its bottom semiconductor IC chip 100*d*, and one of the interconnection metal layers 6 of the first interconnection scheme for a chip 20 of its bottom semiconductor IC chip 100*d*, (2) one of the semiconductor devices 4, i.e., i.e., transistors, of its middle semiconductor IC chip 100*c* through, in sequence, one or more of the interconnection metal layers 27 of the fourth interconnection scheme for a chip 181 of its bottom semiconductor IC chip 100*d*, each of the interconnection metal layers 6 of the third interconnection scheme for a chip 179 of its bottom semiconductor IC chip 100*d*, one of the ground vias 157*b* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*c*, and each of the interconnection metal layers 6 of the first interconnection scheme for a chip 20 of its middle semiconductor IC chip 100*c*, (3) one of the semiconductor devices 4, i.e., i.e., transistors, of its top semiconductor IC chip 100*g* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semiconductor IC chip 100*c* and one of the through silicon vias (TSVs) 157 of its middle semiconductor IC chip 100*c*, one of the metal pads 6*a* of its top semiconductor IC chip 100*g*, and each of the interconnection metal layers 6 of the first interconnection scheme for a chip 20 of its top semiconductor IC chip 100*g*, (4) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semiconductor IC chip 100*c*, one of the through silicon vias (TSVs) 157 of its middle semiconductor IC chip 100*c*, one of the metal pads 6*a* of its top semiconductor IC chip 100*g*, each of the interconnection metal layers 6 of the first interconnection scheme for a chip 20 of its top semiconductor IC chip 100*g*, one of the through silicon vias (TSVs) 157 of its top semiconductor IC chip 100*g*, and each of the interconnection metal layers 27 of its first backside interconnection scheme for a logic drive or device (BISD) 79, and/or (5) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its bottom vertical-through-via (VTV) connectors 467, one of the through silicon vias (TSVs) 157 of one of its top vertical-through-via (VTV) connectors 467*a*, and each of the interconnection metal layers 27 of its first backside interconnection scheme for a logic drive or device (BISD) 79.

Referring to FIGS. 12 and 13, for the seventh type of chip package 216 for each of the first and second alternatives, one of its metal bumps, pillars or pads 188 may couple, for signal or clock transmission or power or ground (voltage) delivery, to (1) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first interconnection scheme for a chip 20 of its top semiconductor IC chip 100*g*, one of the metal pads 6*a* of its top semiconductor IC chip 100*g*, one of the through silicon vias (TSVs) 157 of its middle semiconductor IC chip 100*c*, each of the interconnection metal layers 6 of the first interconnection scheme for a chip 20 of its middle semiconductor IC chip 100*c*, one of the metal pads 6*a* of its middle semiconductor IC chip 100*c*, one of the metal pads 6*a* of its bottom semiconductor IC chip 100*d*, and each of the interconnection metal layers 6 of the first interconnection scheme for a chip 20 of its bottom semiconductor IC chip 100*d*, (2) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of one of its top vertical-through-via (VTV) connectors 467*a*, one of the through silicon vias (TSVs) 157 of one of its bottom vertical-through-via (VTV) connectors 467, one of the metal pads 6*a* of its bottom semiconductor IC chip 100*d*, and each of the interconnection metal layers 6 of the first interconnection scheme for a chip 20 of its bottom semiconductor IC chip 100*d*, (3) one of the semiconductor devices 4, i.e., transistors, of its middle semiconductor IC chip 100*c* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first interconnection scheme for a chip 20 of its top semiconductor IC chip 100*g*, one of the metal pads 6*a* of its top semiconductor IC chip 100*g*, one of the through silicon vias (TSVs) 157 of its middle semiconductor IC chip 100*c*, and one or more of the interconnection metal layers 6 of the first interconnection scheme for a chip 20 of its middle semiconductor IC chip 100*c*, and/or (4) one of the semiconductor devices 4, i.e., transistors, of its top semiconductor IC chip 100*g* through, in sequence, each of the interconnection metal layers 27 of its first backside interconnection scheme for a logic drive or device (BISD) 79, one of the through silicon vias (TSVs) 157 of its top semiconductor IC chip 100*g* and one or more of the interconnection metal layers 6 of the first interconnection scheme for a chip 20 of its top semiconductor IC chip 100*g*.

Alternatively, for the seventh type of chip package 216 for each of the first and second alternatives as seen in FIGS. 12 and 13, its heat sink or spreader 184 may not be used for electrical connection and none of the openings for accommodating the power portions 186 of its heat sink or spreader 184 may formed in its heat sink or spreader 184.

Referring to FIGS. 12 and 13, for the seventh type of chip package 216 for each of the first and second alternatives, its bottom semiconductor IC chip 100*d* may have a first set of small I/O circuits coupling respectively to a second set of small I/O circuits of its middle semiconductor IC chip 100*c* through the bonding of a set of metal pads 6*a* of its bottom semiconductor IC chip 100*d* to a set of metal pads 6*a* of its middle semiconductor IC chip 100*c*. Its middle semiconductor IC chip 100*c* may have a third set of small I/O circuits coupling respectively to a fourth set of small I/O circuits of its top semiconductor IC chip 100*g* through the bonding of a set of through silicon vias (TSV) 157 of its middle semiconductor IC chip 100*c* to a set of metal pads 6*a* of its top semiconductor IC chip 100*g*. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the seventh type of chip package 216 for each of the first and second alternatives as seen in FIGS. 12 and 13, in case that its top semiconductor IC chip 100*g* is the HBM IC chip, such as SRAM IC chip or DRAM IC chip, its top semiconductor IC chip 100*g* may couple to either of its middle and bottom semiconductor IC chips 100*c* and 100*d* for parallel data transmission with a data bit width of equal to or greater than 64, 128, 256, 512, 1024, 2048, 4096, 8K, or 16K.

Eighth Type of Chip Package

Figure 14:
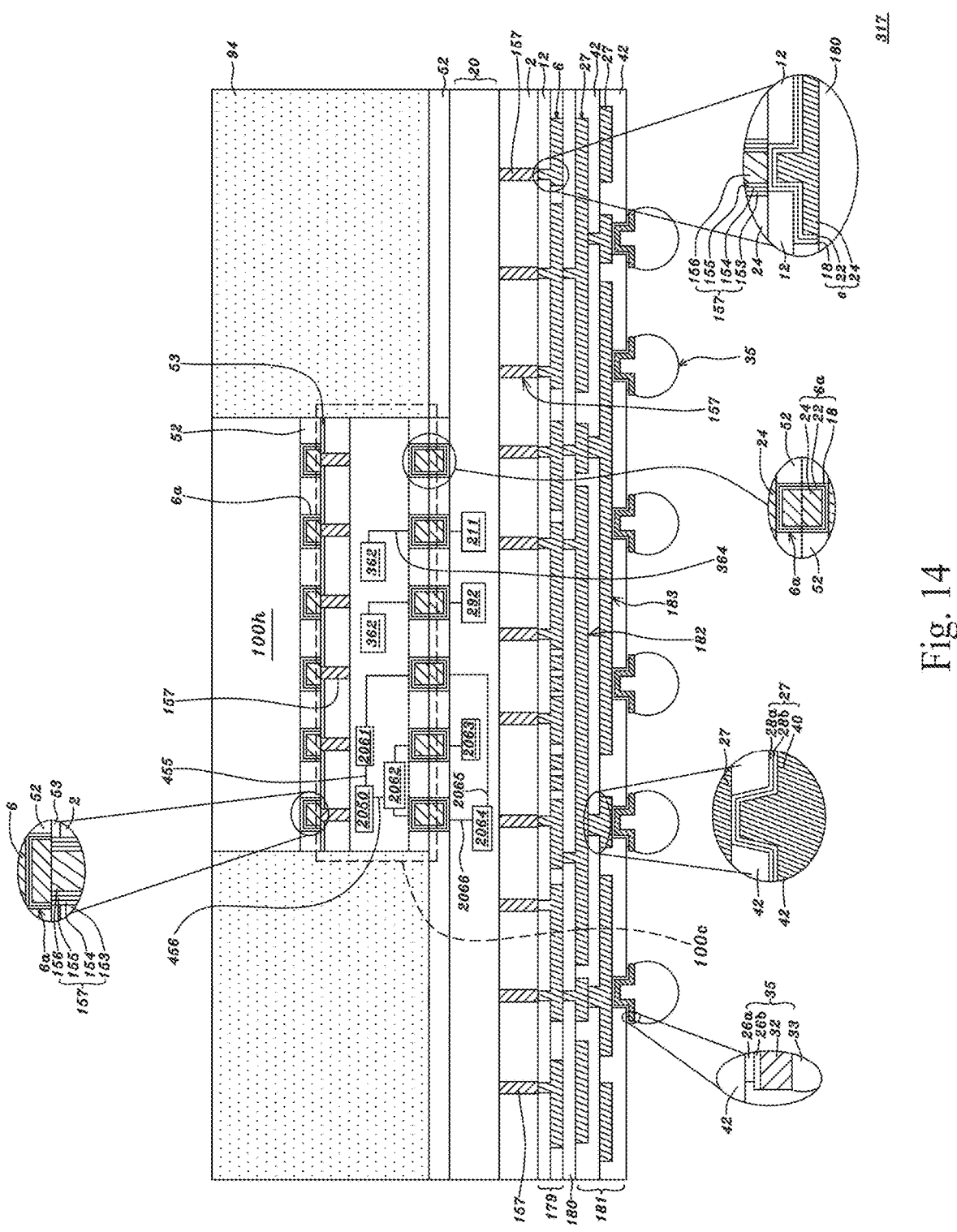
FIG. 14 is a schematically cross-sectional view showing an eighth type of chip package in accordance with an embodiment of the present application.

FIG. 14 is a schematically cross-sectional view showing an eighth type of chip package in accordance with an embodiment of the present application. An eighth type of chip package 317 as seen in FIG. 14 may have a similar structure to the seventh type of chip package 216 for the first alternative as seen in FIG. 12. For an element indicated by the same reference number shown in FIGS. 12 and 14, the specification of the element as seen in FIG. 14 may be referred to that of the element as illustrated in FIG. 12. The difference therebetween is that the heat sink or spreader 184, bottom and top vertical-through-via (VTV) connectors 467 and 467*a* and first backside interconnection scheme for a logic drive or device (BISD) 79 of the seventh type of chip package 216 for the first alternative may be saved for the eighth type of chip package 317. Further, the top semiconductor IC chip 100*g* of the seventh type of chip package 216 for the first alternative may be replaced with a top semiconductor IC chip 100*h* for the eighth type of chip package 317 to be bonded onto the middle semiconductor IC chip 100*c* of the eighth type of chip package 317. For the eighth type of chip package 317, its top semiconductor IC chip 100*h* may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip. Its top semiconductor IC chip 100*h* may have the same specification as the third type of semiconductor IC chip 100 illustrated in FIG. 3E to be turned upside down. Its middle semiconductor IC chip 100*c* may be provided, for hybrid bonding, with (1) the insulating bonding layer 53, i.e., silicon oxide, having the top surface attached to and in contact with a bottom surface of the insulating bonding layer 52, i.e., silicon oxide, of its top semiconductor IC chip 100*h*, and (2) the through silicon vias (TSVs) 157 each having the copper layer 156 with the top surface bonded to and in contact with a bottom surface of one of the metal pads 6*a*, i.e., copper layer 24 thereof, of its top semiconductor IC chip 100*h*. Each of the metal pads 6*a* of its top semiconductor IC chip 100*h* may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6*a* of its top semiconductor IC chip 100*h* may be smaller than 10, 5, 2 or 1 micrometers, or between 0.2 and 10 micrometers, 0.2 and 5 micrometers, 0.2 and 2 micrometers, or 0.2 and 1 micrometers. Its top semiconductor IC chip 100*h* may be provided with the semiconductor devices 4, such as transistors, as illustrated in FIG. 3E to be turned upside down at a bottom surface of the semiconductor substrate 2 thereof facing the top surface of the semiconductor substrate 2 of its bottom semiconductor IC chip 100*d* and facing the top surface of the insulating bonding layer 53 of its middle semiconductor IC chip 100*c*. Its top semiconductor IC chip 100*h* may have a sidewall coplanar, in a vertical direction, with that of its middle semiconductor IC chip 100*c*.

Referring to FIG. 14, instead of the polymer layers 92 and 93 for the seventh type of chip package 216 for the first alternative as seen in FIG. 12, the eighth type of chip package 317 may further include a polymer layer 94, i.e., insulating dielectric layer, made of molding compound, epoxy-based material, polyimide or silicon oxide for example, on its bottom semiconductor IC chip 100*d* and extending from a sidewall of each of its top and middle semiconductor IC chips 100*h* and 100*c*. For the eighth type of chip package 317, the semiconductor substrate 2 of its top semiconductor IC chip 100*h* and its polymer layer 94 may have a portion at a top side thereof removed by a chemical-mechanical-polishing (CMP) or mechanical grinding process such that the backside of the semiconductor substrate 2 of its top semiconductor IC chip 100*h* may be coplanar with a top surface of its polymer layer 94.

Referring to FIG. 14, for the eighth type of chip package 317, the fourth interconnection scheme for a chip 181 of its bottom semiconductor IC chip 100*d* may further include another polymer layer 42, i.e., a bottommost one of the polymer layers 42 thereof, on and under the bottommost one of the interconnection metal layers 27 thereof, wherein each opening in the bottommost one of the polymer layers 42 thereof may be under one of multiple metal contacts of the bottommost one of the interconnection metal layers 27 thereof. The specification and process for the interconnection metal layers 27 and polymer layers 42 of the fourth interconnection scheme for a chip 181 of its bottom semiconductor IC chip 100*d* may be referred to those for the SISC 29 as illustrated in FIG. 3A to be turned upside down.

Referring to FIG. 14, the eighth type of chip package 317 may have multiple metal bumps, pillars or pads 35 in an array at a bottom thereof, each of which may be of one type of the first, second, third and fourth types having the same specification as that of the first, second, third and fourth types of micro-bumps, micro-pillars or micro-pads 34 respectively as illustrated in FIG. 3A to be turned upside down. Its metal bumps, pillars or pads 35 may act as external pins of the eighth type of chip package 317 to couple or bond to external circuits. Each of its first, second, third or fourth type of metal bumps, pillars or pads 35 may have the adhesion layer 26*a* on one of the metal contacts of the bottommost one of the interconnection metal layers 27 of the fourth interconnection scheme for a chip 181 of its bottom semiconductor IC chip 100*d*.

Referring to FIG. 14, for the eighth type of chip package 317, each of its metal bumps, pillars or pads 35 may couple, for power or ground (voltage) delivery or signal or clock transmission, to (1) one of the semiconductor devices 4, i.e., transistors, of its bottom semiconductor IC chip 100*d* through, in sequence, each of the interconnection metal layers 27 of the fourth interconnection scheme for a chip 181 of its bottom semiconductor IC chip 100*d*, each of the interconnection metal layers 6 of the third interconnection scheme for a chip 179 of its bottom semiconductor IC chip 100*d*, one of the through silicon vias (TSVs) 157 of its bottom semiconductor IC chip 100*d*, and one of the interconnection metal layers 6 of the first interconnection scheme for a chip 20 of its bottom semiconductor IC chip 100*d*, (2) one of the semiconductor devices 4, i.e., transistors, of its middle semiconductor IC chip 100*c* through, in sequence, each of the interconnection metal layers 27 of the fourth interconnection scheme for a chip 181 of its bottom semiconductor IC chip 100*d*, each of the interconnection metal layers 6 of the third interconnection scheme for a chip 179 of its bottom semiconductor IC chip 100*d*, one of the through silicon vias (TSVs) 157 of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, and each of the interconnection metal layers 6 of the first interconnection scheme for a chip 20 of its middle semiconductor IC chip 100*c*, and/or (3) one of the semiconductor devices 4, i.e., transistors, of its top semiconductor IC chip 100*h* through, in sequence, each of the interconnection metal layers 27 of the fourth interconnection scheme for a chip 181 of its bottom semiconductor IC chip 100*d*, each of the interconnection metal layers 6 of the third interconnection scheme for a chip 179 of its bottom semiconductor IC chip 100*d*, one of the through silicon vias (TSVs) 157 of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semiconductor IC chip 100*c*, one of the through silicon vias (TSVs) 157 of its middle semiconductor IC chip 100*h*, one of the metal pads 6*a* of its top semiconductor IC chip 100*h*, and each of the interconnection metal layers 6 of the first interconnection scheme for a chip 20 of its top semiconductor IC chip 100*h*.

Referring to FIG. 14, for the eighth type of chip package 217, its bottom semiconductor IC chip 100*d* may have a first set of small I/O circuits coupling respectively to a second set of small I/O circuits of its middle semiconductor IC chip 100*c* through the bonding of a set of metal pads 6*a* of its bottom semiconductor IC chip 100*d* to a set of metal pads 6*a* of its middle semiconductor IC chip 100*c*. Its middle semiconductor IC chip 100*c* may have a third set of small I/O circuits coupling respectively to a fourth set of small I/O circuits of its top semiconductor IC chip 100h through the bonding of a set of through silicon vias (TSV) 157 of its middle semiconductor IC chip 100c to a set of metal pads 6a of its top semiconductor IC chip 100h. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the eighth type of chip package 217 as seen in FIG. 14, in case that its top semiconductor IC chip 100h is the HBM IC chip, such as SRAM IC chip or DRAM IC chip, its top semiconductor IC chip 100h may couple to either of its middle and bottom semiconductor IC chips 100c and 100d for parallel data transmission with a data bit width of equal to or greater than 64, 128, 256, 512, 1024, 2048, 4096, 8K, or 16K.

Ninth Type of Chip Package

Figure 15:
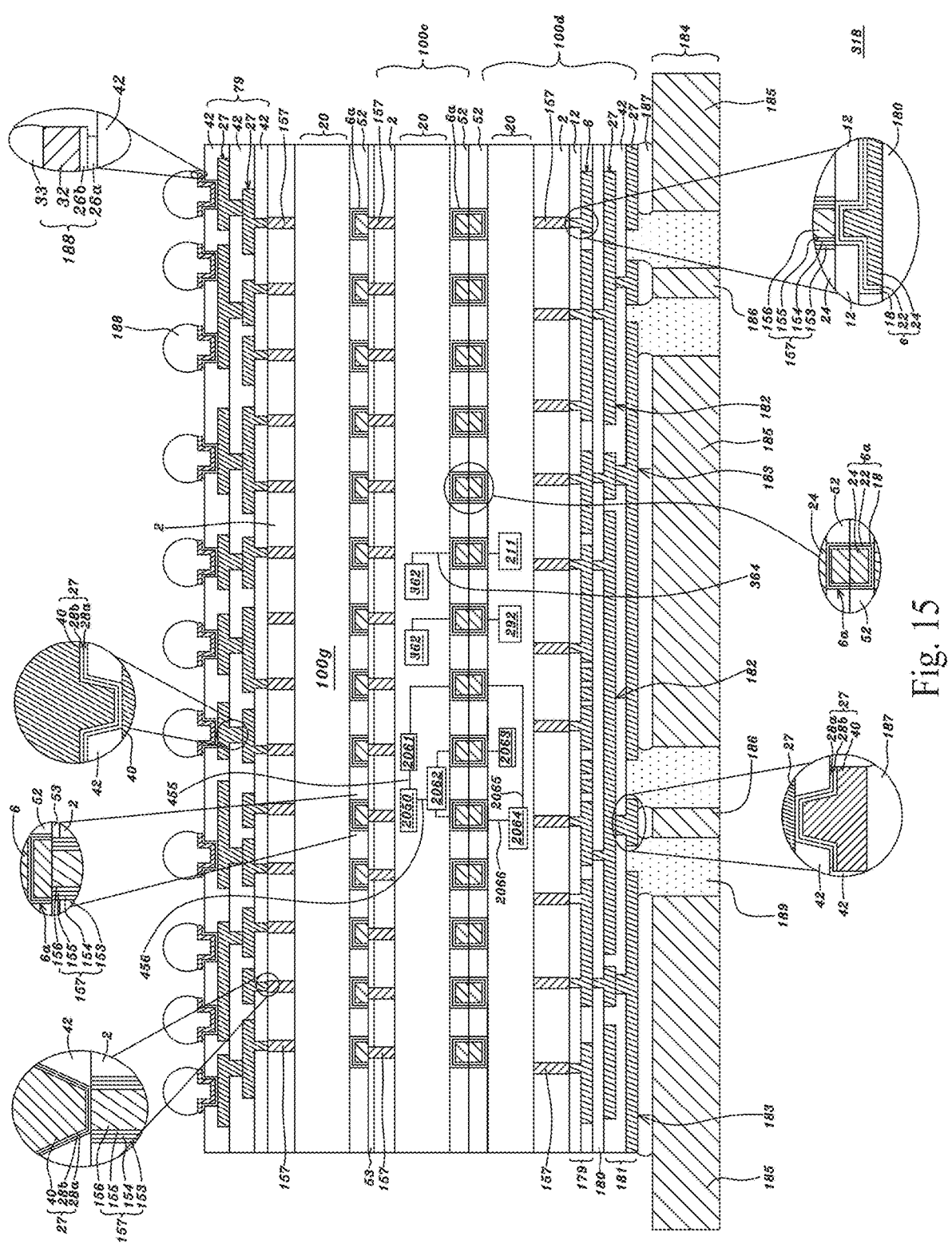
FIG. 15 is a schematically cross-sectional view showing a ninth type of chip package in accordance with an embodiment of the present application.

FIG. 15 is a schematically cross-sectional view showing a ninth type of chip package in accordance with an embodiment of the present application. A ninth type of chip package 318 as seen in FIG. 15 may have a similar structure to the seventh type of chip package 216 for the first alternative as seen in FIG. 12. For an element indicated by the same reference number shown in FIGS. 12 and 15, the specification of the element as seen in FIG. 15 may be referred to that of the element as illustrated in FIG. 12. The difference therebetween is that the bottom and top vertical-through-via (VTV) connectors 467 and 467a and polymer layers 92 and 93 of the sixteenth type of chip package 216 for the first alternative as seen in FIG. 12 may be saved for the ninth type of chip package 318 as seen in FIG. 15. Referring to FIG. 15, for the ninth type of chip package 318, its bottom, middle and top semiconductor IC chips 100d, 100c and 100g may be bonded together in a wafer-level process and later singulated such that each sidewall of its top semiconductor IC chip 100g may be aligned or coplanar, in a vertical direction, with a sidewall of its middle semiconductor IC chip 100c and a sidewall of its bottom semiconductor IC chip 100d. For the ninth type of chip package 318, the ground and power portions 185 and 186 of its heat sink or spreader 184 may act as external pins of the ninth type of chip package 318 to couple or bond to external circuits for ground and power deliveries respectively, and its metal bumps, pillars or pads 188 may act as external pins of the ninth type of chip package 318 to couple or bond to external circuits for signal transmission.

Referring to FIG. 15, for the ninth type of chip package 318, the power plane, buses or interconnection scheme 182 of its bottom semiconductor IC chip 100d may couple, for power (voltage) delivery, to (1) one of the semiconductor devices 4, i.e., transistors, of its bottom semiconductor IC chip 100d through, in sequence, each of the interconnection metal layers 6 of the third interconnection scheme for a chip 179 of its bottom semiconductor IC chip 100d, one of the power vias 157a of its bottom semiconductor IC chip 100d, and one of the interconnection metal layers 6 of the first interconnection scheme for a chip 20 of its bottom semiconductor IC chip 100d, (2) one of the semiconductor devices 4, i.e., i.e., transistors, of its middle semiconductor IC chip 100c through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the metal pads 6a of its middle semiconductor IC chip 100c, and each of the interconnection metal layers 6 of the first interconnection scheme for a chip 20 of its middle semiconductor IC chip 100c, (3) one of the semiconductor devices 4, i.e., i.e., transistors, of its top semiconductor IC chip 100g through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the metal pads 6a of its middle semiconductor IC chip 100c, each of the interconnection metal layers 6 of the first interconnection scheme for a chip 20 of its middle semiconductor IC chip 100c and one of the through silicon vias (TSVs) 157 of its middle semiconductor IC chip 100c, one of the metal pads 6a of its top semiconductor IC chip 100g, and each of the interconnection metal layers 6 of the first interconnection scheme for a chip 20 of its top semiconductor IC chip 100g, (4) one or more of its metal bumps, pillars or pads 188 through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the metal pads 6a of its middle semiconductor IC chip 100c, each of the interconnection metal layers 6 of the first interconnection scheme for a chip 20 of its middle semiconductor IC chip 100c, one of the through silicon vias (TSVs) 157 of its middle semiconductor IC chip 100c, one of the metal pads 6a of its top semiconductor IC chip 100g, each of the interconnection metal layers 6 of the first interconnection scheme for a chip 20 of its top semiconductor IC chip 100g, one of the through silicon vias (TSVs) 157 of its top semiconductor IC chip 100g, and each of the interconnection metal layers 27 of its first backside interconnection scheme for a logic drive or device (BISD) 79, and/or (5) one or more of its metal bumps, pillars or pads 188 through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the through silicon vias (TSVs) 157 of one of its bottom vertical-through-via (VTV) connectors 467, one of the through silicon vias (TSVs) 157 of one of its top vertical-through-via (VTV) connectors 467a, and each of the interconnection metal layers 27 of its first backside interconnection scheme for a logic drive or device (BISD) 79.

Referring to FIG. 15, for the ninth type of chip package 318, the ground plane, buses or interconnection scheme 183 of its bottom semiconductor IC chip 100d may couple, for ground (voltage) delivery, to (1) one of the semiconductor devices 4, i.e., transistors, of its bottom semiconductor IC chip 100*d* through, in sequence, one or more of the inter-connection metal layers 27 of the fourth interconnection scheme for a chip 181 of its bottom semiconductor IC chip 100*d*, each of the interconnection metal layers 6 of the third interconnection scheme for a chip 179 of its bottom semi-conductor IC chip 100*d*, one of the ground vias 157*b* of its bottom semiconductor IC chip 100*d*, and one of the inter-connection metal layers 6 of the first interconnection scheme for a chip 20 of its bottom semiconductor IC chip 100*d*, (2) one of the semiconductor devices 4, i.e., i.e., transistors, of its middle semiconductor IC chip 100*c* through, in sequence, one or more of the interconnection metal layers 27 of the fourth interconnection scheme for a chip 181 of its bottom semiconductor IC chip 100*d*, each of the interconnection metal layers 6 of the third interconnection scheme for a chip 179 of its bottom semiconductor IC chip 100*d*, one of the ground vias 157*b* of its bottom semiconductor IC chip 100*d*, each of the interconnection metal layers 6 of the first interconnection scheme for a chip 20 of its bottom semi-conductor IC chip 100*d*, one of the metal pads 6*a* of its bottom semiconductor IC chip 100*d*, one of the metal pads 6*a* of its middle semiconductor IC chip 100*c*, and each of the interconnection metal layers 6 of the first interconnection scheme for a chip 20 of its middle semiconductor IC chip 100*c*, (3) one of the semiconductor devices 4, i.e., i.e., transistors, of its top semiconductor IC chip 100*g* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the inter-connection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semiconductor IC chip 100*c* and one of the through silicon vias (TSVs) 157 of its middle semiconductor IC chip 100*c*, one of the metal pads 6*a* of its top semiconductor IC chip 100*g*, and each of the interconnection metal layers 6 of the first interconnection scheme for a chip 20 of its top semi-conductor IC chip 100*g*, (4) one or more of its metal bumps, pillars or pads 188 through, in sequence, each of the inter-connection metal layers 6 of the third interconnection scheme for a chip 179 of its bottom semiconductor IC chip 100*d*, one of the power vias 157*a* of its bottom semicon-ductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its middle semiconductor IC chip 100*c*, each of the interconnection metal layers 6 of the first interconnection scheme for a chip 20 of its middle semi-conductor IC chip 100*c*, one of the through silicon vias (TSVs) 157 of its middle semiconductor IC chip 100*c*, one of the metal pads 6*a* of its top semiconductor IC chip 100*g*, each of the interconnection metal layers 6 of the first interconnection scheme for a chip 20 of its top semiconduc-tor IC chip 100*g*, one of the through silicon vias (TSVs) 157 of its top semiconductor IC chip 100*g*, and each of the interconnection metal layers 27 of its first backside inter-connection scheme for a logic drive or device (BISD) 79, and/or (5) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its bottom vertical-through-via (VTV) connectors 467, one of the through silicon vias (TSVs) 157 of one of its top vertical-through-via (VTV) connectors 467*a*, and each of the interconnection metal layers 27 of its first backside interconnection scheme for a logic drive or device (BISD) 79.

Referring to FIG. 15, for the ninth type of chip package 318, one of its metal bumps, pillars or pads 188 may couple, for signal or clock transmission or power or ground (volt-age) delivery, to (1) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first intercon-nection scheme for a chip 20 of its top semiconductor IC chip 100*g*, one of the metal pads 6*a* of its top semiconductor IC chip 100*g*, one of the through silicon vias (TSVs) 157 of its middle semiconductor IC chip 100*c*, each of the inter-connection metal layers 6 of the first interconnection scheme for a chip 20 of its middle semiconductor IC chip 100*c*, one of the metal pads 6*a* of its middle semiconductor IC chip 100*c*, one of the metal pads 6*a* of its bottom semiconductor IC chip 100*d*, and each of the interconnection metal layers 6 of the first interconnection scheme for a chip 20 of its bottom semiconductor IC chip 100*d*, (2) one of the semi-conductor devices 4, i.e., transistors, of its bottom semicon-ductor IC chip 100*d* through, in sequence, each of the interconnection metal layers 27 of its first backside inter-connection scheme for a logic drive or device (BISD) 79, one of the through silicon vias (TSVs) 157 of one of its top vertical-through-via (VTV) connectors 467*a*, one of the through silicon vias (TSVs) 157 of one of its bottom vertical-through-via (VTV) connectors 467, one of the metal pads 6*a* of its bottom semiconductor IC chip 100*d*, and each of the interconnection metal layers 6 of the first intercon-nection scheme for a chip 20 of its bottom semiconductor IC chip 100*d*, (3) one of the semiconductor devices 4, i.e., transistors, of its middle semiconductor IC chip 100*c* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first intercon-nection scheme for a chip 20 of its top semiconductor IC chip 100*g*, one of the metal pads 6*a* of its top semiconductor IC chip 100*g*, one of the through silicon vias (TSVs) 157 of its middle semiconductor IC chip 100*c*, and one or more of the interconnection metal layers 6 of the first interconnection scheme for a chip 20 of its middle semiconductor IC chip 100*c*, and/or (4) one of the semiconductor devices 4, i.e., transistors, of its top semiconductor IC chip 100*g* through, in sequence, each of the interconnection metal layers 27 of its first backside interconnection scheme for a logic drive or device (BISD) 79, one of the through silicon vias (TSVs) 157 of its top semiconductor IC chip 100*g* and one or more of the interconnection metal layers 6 of the first intercon-nection scheme for a chip 20 of its top semiconductor IC chip 100*g*.

Alternatively, for the ninth type of chip package 318 as seen in FIG. 15, its heat sink or spreader 184 may not be used for electrical connection and none of the openings for accommodating the power portions 186 of its heat sink or spreader 184 may formed in its heat sink or spreader 184.

Referring to FIG. 15, for the ninth type of chip package 318, its bottom semiconductor IC chip 100*d* may have a first set of small I/O circuits coupling respectively to a second set of small I/O circuits of its middle semiconductor IC chip 100*c* through the bonding of a set of metal pads 6*a* of its bottom semiconductor IC chip 100*d* to a set of metal pads 6*a* of its middle semiconductor IC chip 100*c*. Its middle semiconductor IC chip 100*c* may have a third set of small I/O circuits coupling respectively to a fourth set of small I/O circuits of its top semiconductor IC chip 100*g* through the bonding of a set of through silicon vias (TSV) 157 of its middle semiconductor IC chip 100*c* to a set of metal pads 6*a* of its top semiconductor IC chip 100*g*. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the ninth type of chip package 318 as seen in FIG. 15, in case that its top semiconductor IC chip 100*g* is the HBM IC chip, such as SRAM IC chip or DRAM IC chip, its top semiconductor IC chip 100*g* may couple to either of its middle and bottom semiconductor IC chips 100*c* and 100*d* for parallel data transmission with a data bit width of equal to or greater than 64, 128, 256, 512, 1024, 2048, 4096, 8K, or 16K.

Tenth Type of Chip Package

Figure 16:
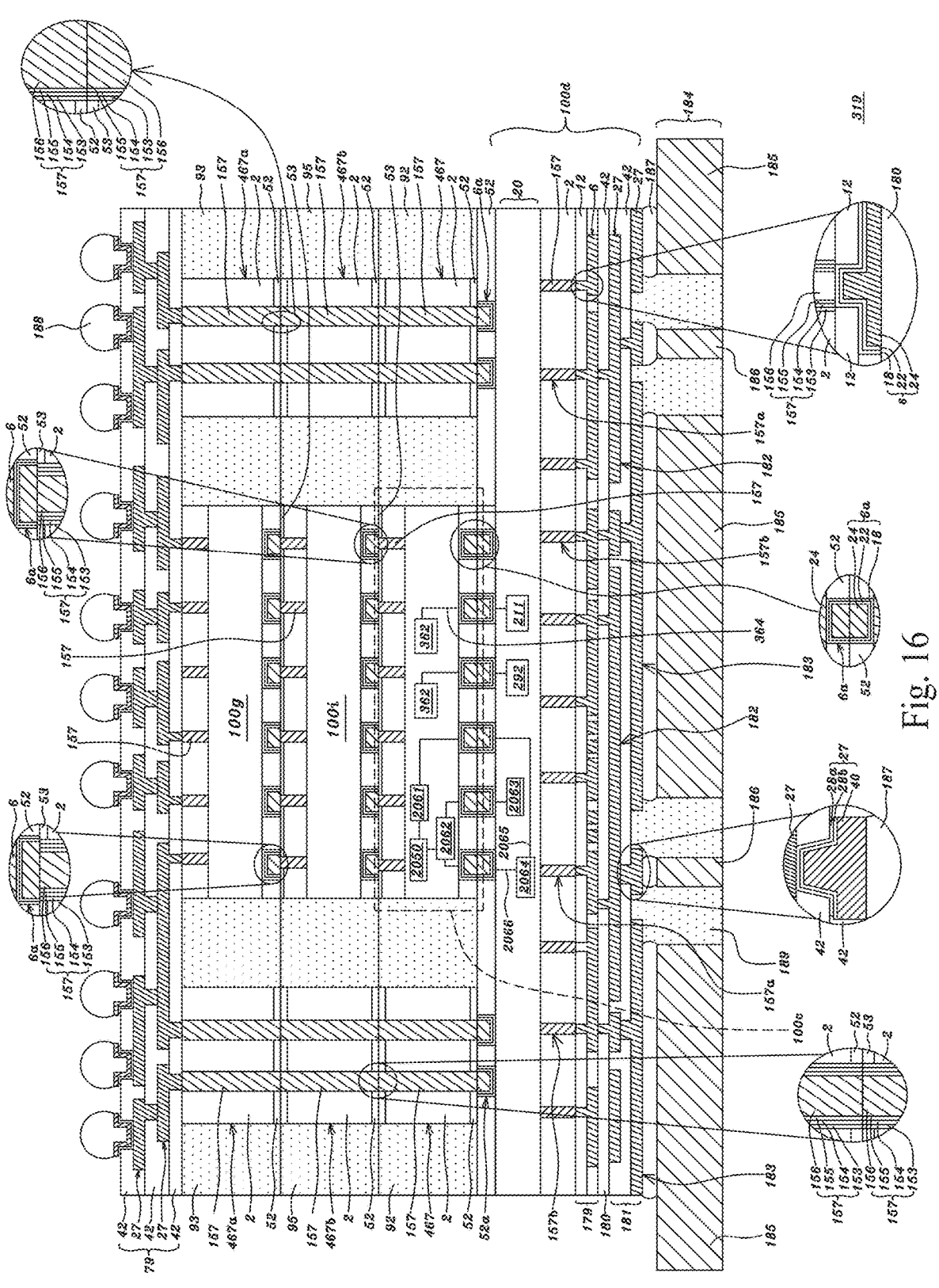
FIG. 16 is a schematically cross-sectional view showing a tenth type of chip package in accordance with an embodiment of the present application.

FIG. 16 is a schematically cross-sectional view showing a tenth type of chip package in accordance with an embodiment of the present application. The tenth type of chip package 319 as seen in FIG. 16 may have a similar structure to the seventh type of chip package 216 for the first alternative as seen in FIG. 12. For an element indicated by the same reference number shown in FIGS. 12 and 16, the specification of the element as seen in FIG. 16 may be referred to that of the element as illustrated in FIG. 12. The difference therebetween is that the middle semiconductor IC chip 100*c* of the seventh type of chip package 216 for the first alternative is renamed as a first middle semiconductor IC chip for the tenth type of chip package 319, and the tenth type of chip package 319 may further include a second middle semiconductor IC chip 100*i* between its first middle semiconductor IC chip 100*c* and top semiconductor IC chip 100*g*. For the nineteenth type of chip package 319, its second middle semiconductor IC chip 100*i* may have the specification for the sixth type of semiconductor IC chip 100 illustrated in FIG. 3F to be turned upside down. For the tenth type of chip package 319, its first middle semiconductor IC chip 100*c* may be provided, for hybrid bonding, with (1) the insulating bonding layer 53, i.e., silicon oxide or silicon oxynitride, having the top surface attached to and in contact with a bottom surface of the insulating bonding layer 52, i.e., silicon oxide or silicon oxynitride, of its second middle semiconductor IC chip 100*i*, and (2) the through silicon vias (TSVs) 157 each having the copper layer 156 with the top surface bonded to and in contact with a bottom surface of one of the metal pads 6*a*, i.e., copper layer 24 thereof, of its second middle semiconductor IC chip 100*i*. Each of the metal pads 6*a* of its second middle semiconductor IC chip 100*i* may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6*a* of its second middle semiconductor IC chip 100*i* may be smaller than 10, 5, 2 or 1 micrometers, or between 0.2 and 10 micrometers, 0.2 and 5 micrometers, 0.2 and 2 micrometers, or 0.2 and 1 micrometers. Its second middle semiconductor IC chip 100*i* may be provided with the semiconductor devices 4, such as transistors, as illustrated in FIG. 3F to be turned upside down at a bottom surface of the semiconductor substrate 2 thereof facing the top surface of the semiconductor substrate 2 of its bottom semiconductor IC chip 100*d* and facing the top surface of the insulating bonding layer 53 of its first middle semiconductor IC chip 100*c*. Its second middle semiconductor IC chip 100*i* may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip. Besides, the tenth type of chip package 319 may further include multiple middle vertical-through-via (VTV) connectors 467*b* each between one of its bottom vertical-through-via (VTV) connectors 467 and one of its top vertical-through-via (VTV) connectors 467*a*, wherein each of its middle vertical-through-via (VTV) connectors 467*b* may have the specification for the third type of vertical-through-via (VTV) connector 467 as illustrated in FIG. 4C to be turned upside down. Each of its bottom vertical-through-via (VTV) connectors 467 may be provided with (1) the insulating bonding layer 53, i.e., silicon oxide or silicon oxynitride, having the top surface attached to and in contact with a bottom surface of the insulating bonding layer 52, i.e., silicon oxide or silicon oxynitride, of one of its middle vertical-through-via (VTV) connectors 467*b*, and (2) the through silicon vias (TSVs) 157, i.e., copper layer 156 thereof, each having a top surface bonded to and in contact with a bottom surface of one of the through silicon vias (TSVs) 157, i.e., copper layer 156 thereof, of one of its middle vertical-through-via (VTV) connectors 467*b*.

Referring to FIG. 16, the tenth type of chip package 319 may further include a polymer layer 95, i.e., insulating dielectric layer, made of molding compound, epoxy-based material, polyimide or silicon oxide for example, in multiple gaps each between neighboring two of its second middle semiconductor IC chip 100*i* and middle vertical-through-via (VTV) connectors 467*b* and on a top surface of its polymer layer 92. For the tenth type of chip package 319, the semiconductor substrate 2 of each of its second middle semiconductor IC chip 100*i* and middle vertical-through-via (VTV) connectors 467*b* and its polymer layer 95 may have a portion at a top side thereof removed by a chemical-mechanical-polishing (CMP) or mechanical grinding process, and then each of its second middle semiconductor IC chip 100*i* and middle vertical-through-via (VTV) connectors 467*b* may be formed with another insulating bonding layer 53, made of silicon oxide or silicon oxynitride, at a top of the semiconductor substrate 2 thereof, wherein the insulating bonding layer 53 thereof may have a top surface coplanar with a top surface of each of the through silicon vias (TSVs) 157 thereof, i.e., a top surface of the copper layer 156 thereof, and a top surface of its polymer layer 95. The semiconductor substrate 2 of each of its second middle semiconductor IC chip 100i and middle vertical-through-via (VTV) connectors 467b may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of each of its second middle semiconductor IC chip 100i and middle vertical-through-via (VTV) connectors 467b may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example.

Referring to FIG. 16, for the tenth type of chip package 319, its second middle semiconductor IC chip 100i may be formed with another insulating bonding layer 53, made of silicon oxide or silicon oxynitride, at a top of the semiconductor substrate 2 thereof, wherein the insulating bonding layer 53 thereof may have a top surface coplanar with a top surface of each of the through silicon vias (TSVs) 157 thereof, i.e., a top surface of the copper layer 156 thereof, and a top surface of its polymer layer 95. Its second middle semiconductor IC chip 100i may be provided, for hybrid bonding, with (1) the insulating bonding layer 53, i.e., silicon oxide, having the top surface attached to and in contact with a bottom surface of the insulating bonding layer 52, i.e., silicon oxide, of its top semiconductor IC chip 100g, and (2) the through silicon vias (TSVs) 157 each having the copper layer 156 with the top surface bonded to and in contact with a bottom surface of one of the metal pads 6a, i.e., copper layer 24 thereof, of its top semiconductor IC chip 100g. Its top semiconductor IC chip 100g may have a sidewall aligned or coplanar, in a vertical direction, with that of its second middle semiconductor IC chip 100i and that of its first middle semiconductor IC chip 100c. Further, each of its middle vertical-through-via (VTV) connectors 467b may be formed with another insulating bonding layer 53, made of silicon oxide for example, at a top of the semiconductor substrate 2 thereof, wherein the insulating bonding layer 53 thereof may have a top surface coplanar with a top surface of each of the through silicon vias (TSVs) 157 thereof, i.e., a top surface of the copper layer 156 thereof, and the top surface of its polymer layer 95. Each of its middle vertical-through-via (VTV) connectors 467b may be provided with (1) the insulating bonding layer 53, i.e., silicon oxide, having the top surface attached to and in contact with a bottom surface of the insulating bonding layer 52, i.e., silicon oxide, of one of its top vertical-through-via (VTV) connectors 467a, and (2) the through silicon vias (TSVs) 157, i.e., copper layer 156 thereof, each having a top surface bonded to and in contact with a bottom surface of one of the through silicon vias (TSVs) 157, i.e., copper layer 156 thereof, of one of its top vertical-through-via (VTV) connectors 467a. Each of its top vertical-through-via (VTV) connectors 467a may have a sidewall aligned or coplanar, in a vertical direction, with that of one of its middle vertical-through-via (VTV) connectors 467b and that of one of its bottom vertical-through-via (VTV) connectors 467. Further, its polymer layer 93 is formed on the top surface of its polymer layer 95. Each connection path provided by a stack of one of the through silicon vias (TSVs) 157 of one of its bottom vertical-through-via (VTV) connectors 467, one of the through silicon vias (TSVs) 157 of one of its middle vertical-through-via (VTV) connectors 467b and one of the through silicon vias (TSVs) 157 of one of its top vertical-through-via (VTV) connectors 467a, stacked from bottom to top, may couple its bottom semiconductor IC chip 100d to a voltage of power supply for delivering a power supply or to a voltage of ground reference for delivering a ground reference. Alternatively, each connection path provided by a stack of one of the through silicon vias (TSVs) 157 of one of its bottom vertical-through-via (VTV) connectors 467, one of the through silicon vias (TSVs) 157 of one of its middle vertical-through-via (VTV) connectors 467b and one of the through silicon vias (TSVs) 157 of one of its top vertical-through-via (VTV) connectors 467a, stacked from bottom to top, may couple to its bottom semiconductor IC chip 100d to pass signals or clocks to its bottom semiconductor IC chip 100d for signal or clock transmission.

Referring to FIG. 16, for the tenth type of chip package 319, the power plane, buses or interconnection scheme 182 of its bottom semiconductor IC chip 100d may couple, for power (voltage) delivery, to (1) one of the semiconductor devices 4, i.e., transistors, of its bottom semiconductor IC chip 100d through, in sequence, each of the interconnection metal layers 6 of the third interconnection scheme for a chip 179 of its bottom semiconductor IC chip 100d, one of the power vias 157a of its bottom semiconductor IC chip 100d, and one of the interconnection metal layers 6 of the first interconnection scheme for a chip 20 of its bottom semiconductor IC chip 100d, (2) one of the semiconductor devices 4, i.e., i.e., transistors, of its first middle semiconductor IC chip 100c through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the metal pads 6a of its first middle semiconductor IC chip 100c, and each of the interconnection metal layers 6 of the first interconnection scheme for a chip 20 of its first middle semiconductor IC chip 100c, (3) one of the semiconductor devices 4, i.e., i.e., transistors, of its second middle semiconductor IC chip 100i through, in sequence, each of the interconnection metal layers 6 of the third interconnection scheme for a chip 179 of its bottom semiconductor IC chip 100d, one of the power vias 157a of its bottom semiconductor IC chip 100d, each of the interconnection metal layers 6 of the first interconnection scheme for a chip 20 of its bottom semiconductor IC chip 100d, one of the metal pads 6a of its bottom semiconductor IC chip 100d, one of the metal pads 6a of its first middle semiconductor IC chip 100c, each of the interconnection metal layers 6 of the first interconnection scheme for a chip 20 of its first middle semiconductor IC chip 100c and one of the through silicon vias (TSVs) 157 of its first middle semiconductor IC chip 100c, one of the metal pads 6a of its second middle semiconductor IC chip 100i, and each of the interconnection metal layers 6 of the first interconnection scheme for a chip 20 of its second middle semiconductor IC chip 100i, (4) one of the semiconductor devices 4, i.e., i.e., transistors, of its top semiconductor IC chip 100g through, in sequence, each of the interconnection metal layers 6 of the third intercon nection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its first middle semiconductor IC chip 100*c*, each of the interconnection metal layers 6 of the first interconnection scheme for a chip 20 of its first middle semiconductor IC chip 100*c* and one of the through silicon vias (TSVs) 157 of its first middle semiconductor IC chip 100*c*, one of the metal pads 6*a* of its second middle semiconductor IC chip 100*i*, each of the interconnection metal layers 6 of the first interconnection scheme for a chip 20 of its second middle semiconductor IC chip 100*i* and one of the through silicon vias (TSVs) 157 of its second middle semiconductor IC chip 100*i*, one of the metal pads 6*a* of its top semiconductor IC chip 100*g*, and each of the interconnection metal layers 6 of the first interconnection scheme for a chip 20 of its top semiconductor IC chip 100*g*, (5) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its first middle semiconductor IC chip 100*c*, each of the interconnection metal layers 6 of the first interconnection scheme for a chip 20 of its first middle semiconductor IC chip 100*c*, one of the through silicon vias (TSVs) 157 of its first middle semiconductor IC chip 100*c*, one of the metal pads 6*a* of its second middle semiconductor IC chip 100*i*, each of the interconnection metal layers 6 of the first interconnection scheme for a chip 20 of its second middle semiconductor IC chip 100*i* and one of the through silicon vias (TSVs) 157 of its second middle semiconductor IC chip 100*i*, one of the metal pads 6*a* of its top semiconductor IC chip 100*g*, each of the interconnection metal layers 6 of the first interconnection scheme for a chip 20 of its top semiconductor IC chip 100*g*, one of the through silicon vias (TSVs) 157 of its top semiconductor IC chip 100*g*, and each of the interconnection metal layers 27 of its first backside interconnection scheme for a logic drive or device (BISD) 79, and/or (6) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its bottom vertical-through-via (VTV) connectors 467, one of the through silicon vias (TSVs) 157 of one of its middle vertical-through-via (VTV) connectors 467*b*, one of the through silicon vias (TSVs) 157 of one of its top vertical-through-via (VTV) connectors 467*a*, and each of the interconnection metal layers 27 of its first backside interconnection scheme for a logic drive or device (BISD) 79.

Referring to FIG. 16, for the tenth type of chip package 319, the ground plane, buses or interconnection scheme 183 of its bottom semiconductor IC chip 100*d* may couple, for ground (voltage) delivery, to (1) one of the semiconductor devices 4, i.e., transistors, of its bottom semiconductor IC chip 100*d* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, and one of the interconnection metal layers 6 of the first interconnection scheme for a chip 20 of its bottom semiconductor IC chip 100*d*, shown as either the metal interconnect 351 or 353 in FIG. 10, (2) one of the semiconductor devices 4, i.e., i.e., transistors, of its first middle semiconductor IC chip 100*c* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its first middle semiconductor IC chip 100*c*, and each of the interconnection metal layers 6 of the first interconnection scheme for a chip 20 of its first middle semiconductor IC chip 100*c*, shown as the metal interconnect 351 in FIG. 10, (3) one of the semiconductor devices 4, i.e., i.e., transistors, of its second middle semiconductor IC chip 100*i* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its first middle semiconductor IC chip 100*c*, each of the interconnection metal layers 6 of the first interconnection scheme for a chip 20 of its first middle semiconductor IC chip 100*c* and one of the through silicon vias (TSVs) 157 of its first middle semiconductor IC chip 100*c*, one of the metal pads 6*a* of its second middle semiconductor IC chip 100*i*, and each of the interconnection metal layers 6 of the first interconnection scheme for a chip 20 of its second middle semiconductor IC chip 100*i*, (4) one of the semiconductor devices 4, i.e., i.e., transistors, of its top semiconductor IC chip 100*g* through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its first middle semiconductor IC chip 100*c*, each of the interconnection metal layers 6 of the first interconnection scheme for a chip 20 of its first middle semiconductor IC chip 100*c* and one of the through silicon vias (TSVs) 157 of its first middle semiconductor IC chip 100*c*, one of the metal pads 6*a* of its second middle semiconductor IC chip 100*i*, each of the interconnection metal layers 6 of the first interconnection scheme for a chip 20 of its second middle semiconductor IC chip 100*i* and one of the through silicon vias (TSVs) 157 of its second middle semiconductor IC chip 100*i*, one of the metal pads 6*a* of its top semiconductor IC chip 100*g*, and each of the interconnection metal layers 6 of the first interconnection scheme for a chip 20 of its top semiconductor IC chip 100*g*, (5) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the metal pads 6*a* of its first middle semiconductor IC chip 100*c*, each of the interconnection metal layers 6 of the first interconnection scheme for a chip 20 of its first middle semiconductor IC chip 100*c*, one of the through silicon vias (TSVs) 157 of its first middle semiconductor IC chip 100*c*, one of the metal pads 6*a* of its second middle semiconductor IC chip 100*i*, each of the interconnection metal layers 6 of the first interconnection scheme for a chip 20 of its second middle semiconductor IC chip 100*i* and one of the through silicon vias (TSVs) 157 of its second middle semiconductor IC chip 100*i*, one of the metal pads 6*a* of its top semiconductor IC chip 100*g*, each of the interconnection metal layers 6 of the first interconnection scheme for a chip 20 of its top semiconductor IC chip 100*g*, one of the through silicon vias (TSVs) 157 of its top semiconductor IC chip 100*g*, and each of the interconnection metal layers 27 of its first backside interconnection scheme for a logic drive or device (BISD) 79, and/or (6) one or more of its metal bumps, pillars or pads 188 through, in sequence, each of the interconnection metal layers 6 of the third interconnection scheme for a chip 179 of its bottom semiconductor IC chip 100*d*, one of the power vias 157*a* of its bottom semiconductor IC chip 100*d*, each of the interconnection metal layers 6 of the first interconnection scheme for a chip 20 of its bottom semiconductor IC chip 100*d*, one of the metal pads 6*a* of its bottom semiconductor IC chip 100*d*, one of the through silicon vias (TSVs) 157 of one of its bottom vertical-through-via (VTV) connectors 467, one of the through silicon vias (TSVs) 157 of one of its middle vertical-through-via (VTV) connectors 467*b*, one of the through silicon vias (TSVs) 157 of one of its top vertical-through-via (VTV) connectors 467*a*, and each of the interconnection metal layers 27 of its first backside interconnection scheme for a logic drive or device (BISD) 79.

Referring to FIG. 16, for the tenth type of chip package 319, one of its metal bumps, pillars or pads 188 may couple, for signal or clock transmission or power or ground (voltage) delivery, to (1) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first interconnection scheme for a chip 20 of its top semiconductor IC chip 100*g*, one of the metal pads 6*a* of its top semiconductor IC chip 100*g*, one of the through silicon vias (TSVs) 157 of its second middle semiconductor IC chip 100*i*, each of the interconnection metal layers 6 of the first interconnection scheme for a chip 20 of its second middle semiconductor IC chip 100*i*, one of the metal pads 6*a* of its second middle semiconductor IC chip 100*i*, one of the through silicon vias (TSVs) 157 of its first middle semiconductor IC chip 100*c*, each of the interconnection metal layers 6 of the first interconnection scheme for a chip 20 of its first middle semiconductor IC chip 100*c*, one of the metal pads 6*a* of its first middle semiconductor IC chip 100*c*, one of the metal pads 6*a* of its bottom semiconductor IC chip 100*d*, and each of the interconnection metal layers 6 of the first interconnection scheme for a chip 20 of its bottom semiconductor IC chip 100*d*, (2) one of the semiconductor devices 4, i.e., transistors, of its bottom semiconductor IC chip 100*d* through, in sequence, each of the interconnection metal layers 27 of its first backside interconnection scheme for a logic drive or device (BISD) 79, one of the through silicon vias (TSVs) 157 of one of its top vertical-through-via (VTV) connectors 467*a*, one of the through silicon vias (TSVs) 157 of one of its middle vertical-through-via (VTV) connectors 467*b*, one of the through silicon vias (TSVs) 157 of one of its bottom vertical-through-via (VTV) connectors 467, one of the metal pads 6*a* of its bottom semiconductor IC chip 100*d*, and each of the interconnection metal layers 6 of the first interconnection scheme for a chip 20 of its bottom semiconductor IC chip 100*d*, (3) one of the semiconductor devices 4, i.e., transistors, of its first middle semiconductor IC chip 100*c* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first interconnection scheme for a chip 20 of its top semiconductor IC chip 100*g*, one of the metal pads 6*a* of its top semiconductor IC chip 100*g*, one of the through silicon vias (TSVs) 157 of its second middle semiconductor IC chip 100*i*, each of the interconnection metal layers 6 of the first interconnection scheme for a chip 20 of its second middle semiconductor IC chip 100*i*, one of the metal pads 6*a* of its second middle semiconductor IC chip 100*i*, one of the through silicon vias (TSVs) 157 of its first middle semiconductor IC chip 100*c*, and one or more of the interconnection metal layers 6 of the first interconnection scheme for a chip 20 of its first middle semiconductor IC chip 100*c*, (4) one of the semiconductor devices 4, i.e., transistors, of its second middle semiconductor IC chip 100*i* through, in sequence, each of the interconnection metal layers 27 of its first backside interconnection scheme for a logic drive or device (BISD) 79, one of the through silicon vias (TSVs) 157 of its top semiconductor IC chip 100*g*, each of the interconnection metal layers 6 of the first interconnection scheme for a chip 20 of its top semiconductor IC chip 100*g*, one of the metal pads 6*a* of its top semiconductor IC chip 100*g*, one of the through silicon vias (TSVs) 157 of its second middle semiconductor IC chip 100*i*, and one or more of the interconnection metal layers 6 of the first interconnection scheme for a chip 20 of its second middle semiconductor IC chip 100*i*, and/or (5) one of the semiconductor devices 4, i.e., transistors, of its top semiconductor IC chip 100*g* through, in sequence, each of the interconnection metal layers 27 of its first backside interconnection scheme for a logic drive or device (BISD) 79, one of the through silicon vias (TSVs) 157 of its top semiconductor IC chip 100*g* and one or more of the interconnection metal layers 6 of the first interconnection scheme for a chip 20 of its top semiconductor IC chip 100*g*.

Alternatively, for the tenth type of chip package 319 as seen in FIG. 16, its heat sink or spreader 184 may not be used for electrical connection and none of the openings for accommodating the power portions 186 of its heat sink or spreader 184 may formed in its heat sink or spreader 184.

Referring to FIG. 16, for the tenth type of chip package 319, its bottom semiconductor IC chip 100*d* may have a first set of small I/O circuits coupling respectively to a second set of small I/O circuits of its first middle semiconductor IC chip 100*c* through the bonding of a set of metal pads 6*a* of its bottom semiconductor IC chip 100*d* to a set of metal pads 6*a* of its middle semiconductor IC chip 100*c*. Its first middle semiconductor IC chip 100*c* may have a third set of small I/O circuits coupling respectively to a fourth set of small I/O circuits of its second middle semiconductor IC chip 100*i* through the bonding of a set of through silicon vias (TSV)

157 of its first middle semiconductor IC chip 100*c* to a set of metal pads 6*a* of its second semiconductor IC chip 100*i*. Its second middle semiconductor IC chip 100*i* may have a fifth set of small I/O circuits coupling respectively to a sixth set of small I/O circuits of its top semiconductor IC chip 100*g* through the bonding of a set of through silicon vias (TSV) 157 of its second middle semiconductor IC chip 100*i* to a set of metal pads 6*a* of its top semiconductor IC chip 100*g*. It is noted that each of the first, second, third, fourth, fifth and sixth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the tenth type of chip package 319 as seen in FIG. 16, in case that its second middle semiconductor IC chip 100*i* is the HBM IC chip, such as SRAM IC chip or DRAM IC chip, its second middle semiconductor IC chip 100*i* may couple to either of its first middle and bottom semiconductor IC chips 100*c* and 100*d* for parallel data transmission with a data bit width of equal to or greater than 64, 128, 256, 512, 1024, 2048, 4096, 8K, or 16K.

Further, referring to FIG. 16, for the specific example, in the case that its top semiconductor IC chip 100*g* is a non-volatile memory (NVM) IC chip, such as NAND flash memory chip, NOR flash memory chip, magnetoresistive random access memory (MRAM) IC chip, resistive random access memory (RRAM) IC chip or ferroelectric random access memory (FRAM) IC chip and its first middle and bottom semiconductor IC chips 100*c* and 100*d* are combined as the system for a FPGA function as illustrated in either of FIGS. 12 and 13, A seventh set of small I/O circuits of its top semiconductor IC chip 100*g* may have a set of small drivers coupling to a set of small receiver of an eighth set of small I/O circuits of its first middle semiconductor IC chip 100*c* through, in sequence, (1) each of the interconnection metal layers 6 of the first interconnection scheme for a chip (FISC) 20 of its top semiconductor IC chip 100*g*, (2) one of the metal pads 6*a* of its top semiconductor IC chip 100*g*, (3) one of the through silicon vias (TSVs) 157 of its second middle semiconductor IC chip 100*i*, (4) each of the interconnection metal layers 6 of the first interconnection scheme for a chip 20 of its second middle semiconductor IC chip 100*i*, (5) one of the metal pads 6*a* of its second middle semiconductor IC chip 100*i*, (6) one of the through silicon vias (TSVs) 157 of its first middle semiconductor IC chip 100*c*, and (7) one or more of the interconnection metal layers 6 of the first interconnection scheme for a chip 20 of its first middle semiconductor IC chip 100*c*, for downloading CPM data, i.e., resulting values or programming codes, stored in multiple non-volatile memory cells of its top semiconductor IC chip 100*g* from the set of small drivers of the seventh set of small I/O circuits to the set of small receivers of the eighth set of small I/O circuits to be passed to (1) the SRAM cells of the memory sections 2050 of its first middle semiconductor IC chip 100*c*, which may have the specification for the middle semiconductor IC chip 100*c* of the seventh type of chip package 216 for the first alternative illustrated in FIG. 12, to be stored therein, (2) the memory cells 490 of any type of the first, second and third types of field programmable logic cells or elements (LCEs) 2014 of its first middle semiconductor IC chip 100*c*, which may have the specification for the middle semiconductor IC chip 100*c* of the seventh type of chip package 216 for the second alternative illustrated in FIG. 13, and/or (3) the memory cells 362 of any type of the first and second types of field programmable switch cells 379 of its first middle semiconductor IC chip 100*c*, which may have the specification for the middle semiconductor IC chip 100*c* of the seventh type of chip package 216 for either of the first and second alternatives illustrated in FIGS. 12 and 13, to be stored therein. It is noted that each of the seventh and eighth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Referring to FIG. 16, for the tenth type of chip package 319, the ground and power portions 185 and 186 of its heat sink or spreader 184 may act as external pins of the tenth type of chip package 319 to couple or bond to external circuits for ground and power deliveries respectively, and its metal bumps, pillars or pads 188 may act as external pins of the tenth type of chip package 319 to couple or bond to external circuits for signal transmission.

Eleventh Type of Chip Package

Figure 17A:
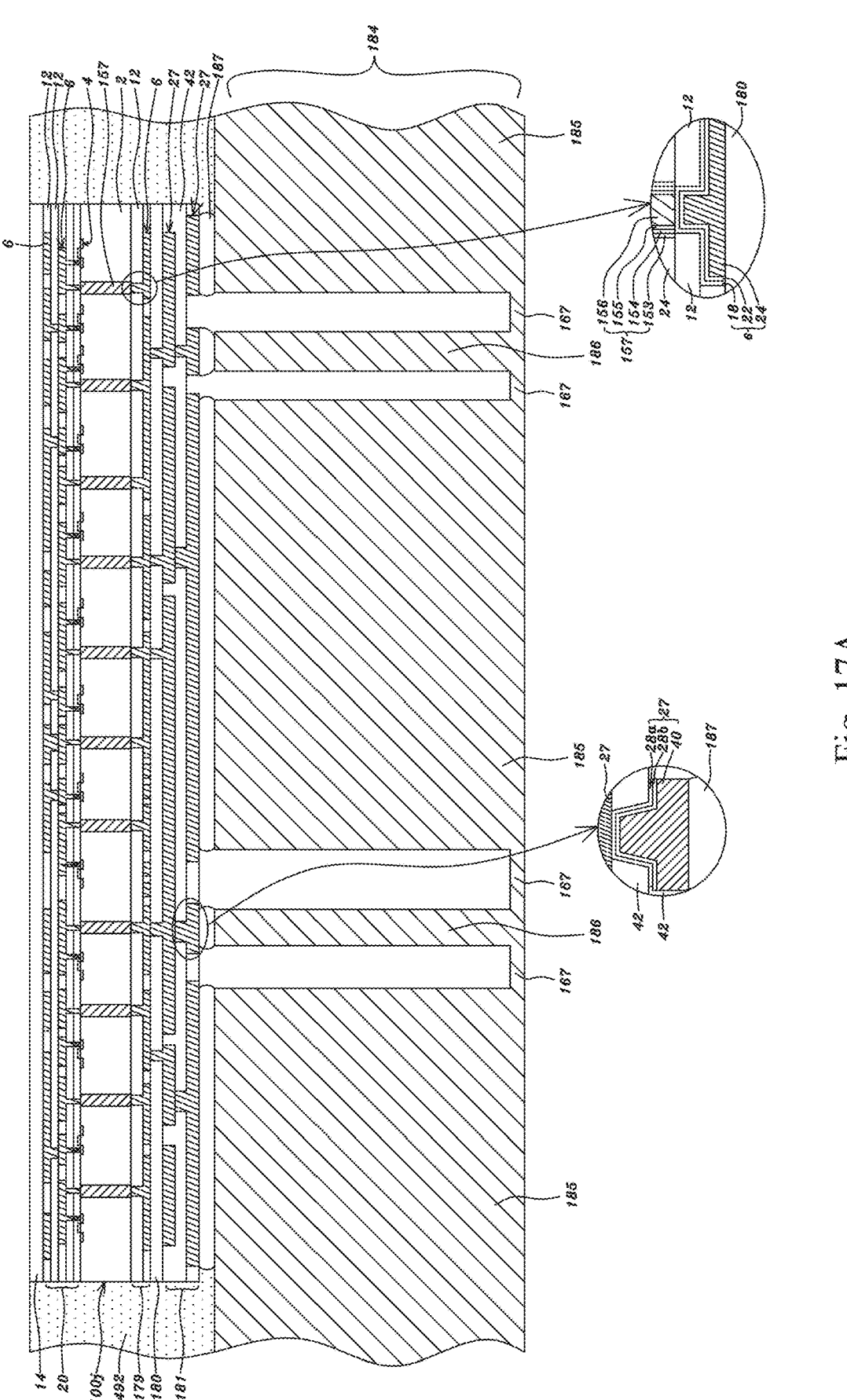
FIGS. 17A-17C are schematically cross-sectional views showing a process for fabricating an eleventh type of chip package in accordance with an embodiment of the present application.
Figure 17B:
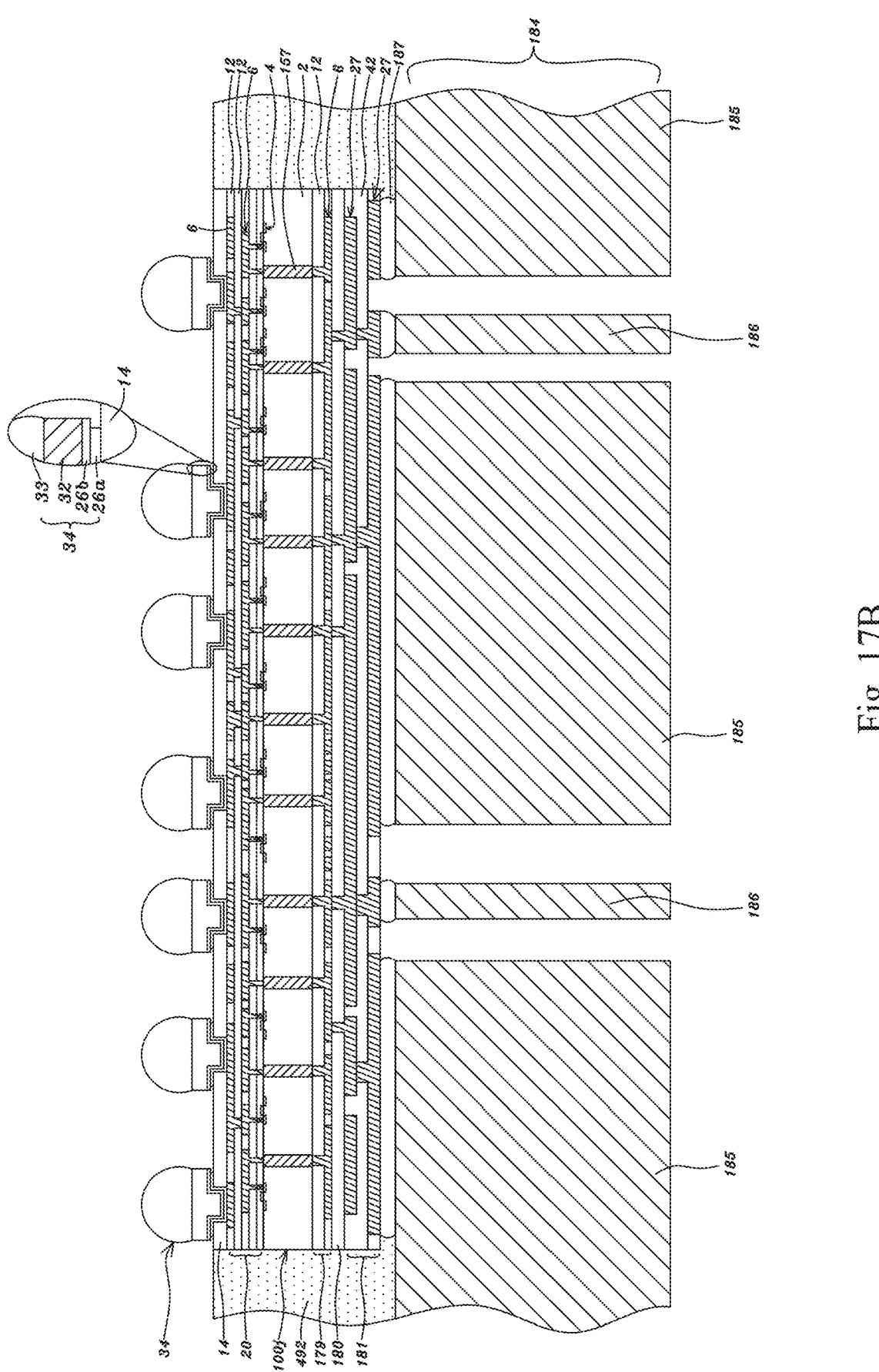
Figure 17C:
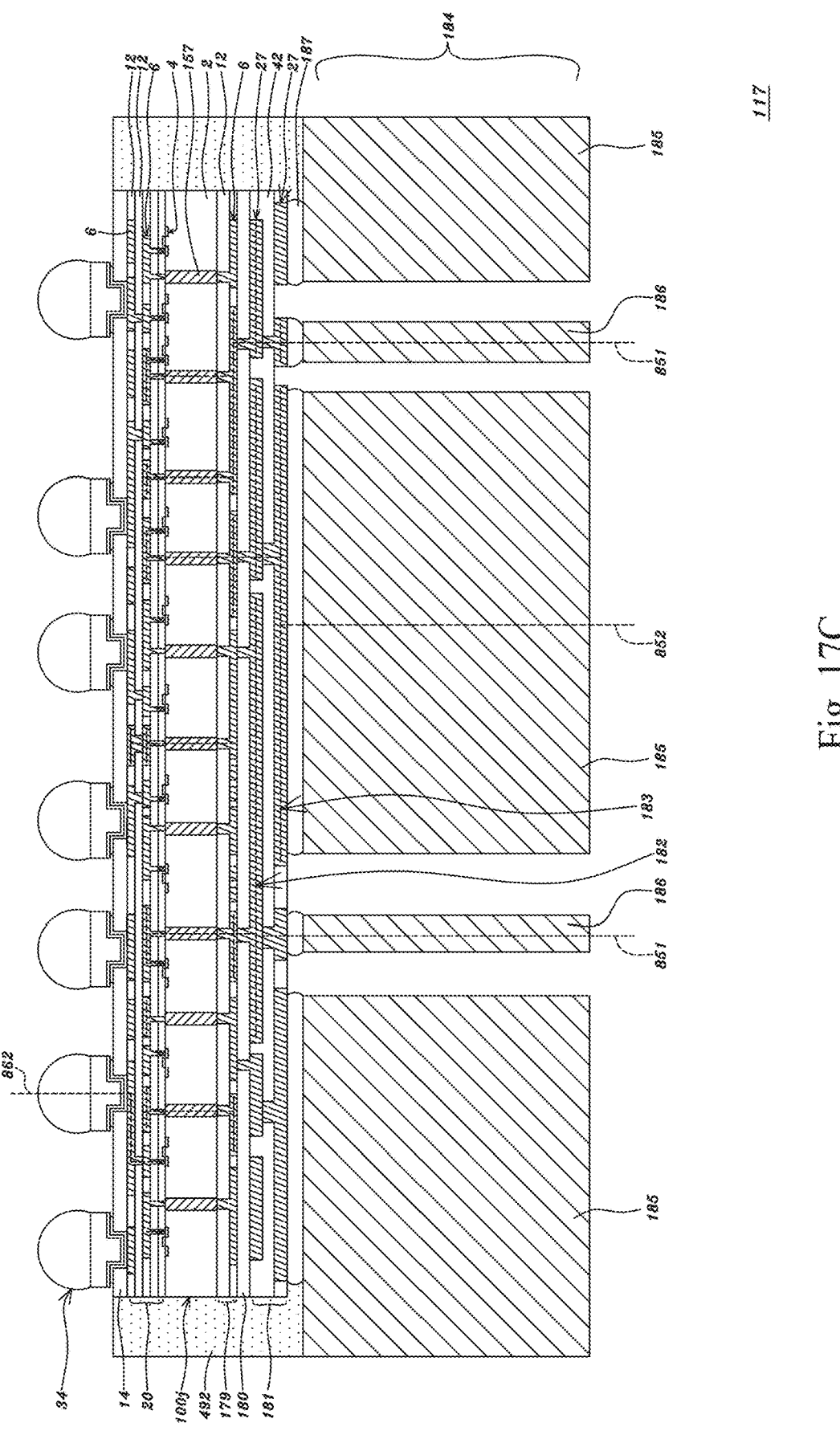

FIGS. 17A-17C are schematically cross-sectional views showing a process for fabricating an eleventh type of chip package in accordance with an embodiment of the present application. Referring to FIG. 17A, multiple semiconductor IC chips 100*j* (only one is shown) are provided each with the specification for the second type of semiconductor IC chip 100 as illustrated in FIG. 3B. The difference therebetween is mentioned as below: The semiconductor substrate 2 of the second type of semiconductor IC chips 100 may have a portion at a backside thereof to be removed by a chemical-mechanical-polishing (CMP) or mechanical grinding process for the semiconductor IC chip 100*j*. The semiconductor substrate 2 of the semiconductor IC chip 100*j* may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the semiconductor IC chip 100*j* may have a width, diameter or maximum transverse dimension smaller than 20, 10, 5, 1 or 0.1 micrometers. For example, each of the through silicon vias (TSVs) 157 of the semiconductor IC chip 100*j* may include the copper layer 156, i.e., copper via, having a width in a horizontal direction between 0.05 and 0.5 micrometers and a thickness in a vertical direction between 0.3 and 10 micrometers. The semiconductor IC chip 100*j* may further include a third interconnection scheme for a chip 179 on a bottom surface of its semiconductor substrate 2, a passivation layer 180 on a bottom surface of its third interconnection scheme for a chip 179 and a fourth interconnection scheme for a chip 181 on a bottom surface of its passivation layer 180. The specification and process for the interconnection metal layers 6 and insulating dielectric layers 12 of its third interconnection scheme for a chip 179 may be referred to those of the FISC 20 as illustrated in FIG. 3A to be turned upside down and those of the third interconnection scheme for a chip 179 of the bottom semiconductor IC chip 100*d* of each of the subsystem units 380 of the fourth type of chip package 113 for the second alternative as illustrated in FIG. 9C. For example, each of the interconnection metal layers 6 of its third interconnection scheme for a chip 179 may have a thickness in a vertical direction between 0.05 and 1 micrometers and a trace width for each connection, in a horizontal direction, between 0.05 and 1 micrometers, wherein said each of the interconnection metal layers 6 may have the copper layer 24 with a thickness in a vertical direction between 0.05 and 1 micrometers. The specification and process for its passivation layer 180 may be referred to those of the passivation layer 14 as illustrated in FIG. 3A to be turned upside down and those of the passivation layer 180 of the bottom semiconductor IC chip 100d of each of the subsystem units 380 of the fourth type of chip package 113 for the second alternative as illustrated in FIG. 9C. The specification and process for the interconnection metal layers 27 and polymer layers 42 of its fourth interconnection scheme for a chip 181 may be referred to those of the SISC 29 as illustrated in FIG. 3A to be turned upside down and those of the fourth interconnection scheme for a chip 181 of the bottom semiconductor IC chip 100d of each of the subsystem units 380 of the fourth type of chip package 113 for the second alternative as illustrated in FIG. 9C. For example, each of the interconnection metal layers 27 of its fourth interconnection scheme for a chip 181 may have a thickness in a vertical direction between 0.2 and 5 micrometers, wherein said each of the interconnection metal layers 27 may have the copper layer 40 with a thickness in a vertical direction between 0.2 and 5 micrometers. Further, at an initial stage, the micro-bumps, micro-pillars or micro-pads 34 and second interconnection scheme for a chip (SISC) 29 provided for the second type of semiconductor IC chip 100 as illustrated in FIG. 3B may not be formed for the semiconductor IC chip 100j as seen in FIG. 17A, but the topmost one of the interconnection metal layers 6 of its first interconnection scheme for a chip (FISC) 20 may have the entire top surface covered with its passivation layer 14.

Referring to FIG. 17A, a heat sink or spreader 184 may be provided with (1) a ground portion 185, (2) multiple power portions 186 each arranged in an opening 166 in the ground portion 185 of the heat sink or spreader 184 and surrounded by the ground portion 185 of the heat sink or spreader 184 and (3) multiple metal sheets 167 each at a bottom of one of the openings 166 and connecting the ground portion 185 and one of the power portions 186 in said one of the openings 166, wherein each of the metal sheets 167 may have a thickness between 10 and 100 micrometers.

First, referring to FIG. 17A, a tin-containing solder 187, or an electrically and thermally conductive adhesive, may be formed on a bottom surface of the bottommost one of the interconnection metal layers 27 of the fourth interconnection scheme for a chip 181 of the semiconductor IC chip 100j. Next, each of the semiconductor IC chips 100j may be picked up by a thermal compression head to be bonded to a top surface of the heat sink or spreader 184 via the tin-containing solder 187. Next, an insulating sealing layer 492, i.e., insulating dielectric layer, made of polymer, molding compound, epoxy-based material, polyimide or silicon oxide for example, may be formed on the top surface of the heat sink or spreader 184 and in a space extending from a sidewall of each of the semiconductor IC chips 100j, wherein the insulating sealing layer 492 may have a top surface substantially coplanar with a top surface of the passivation layer 14 of each of the semiconductor IC chips 100j.

Next, referring to FIG. 17B, the heat sink or spreader 184 may have a portion at a bottom side thereof removed by a chemical-mechanical-polishing (CMP) or mechanical grinding process such that the metal sheets 167 of the heat sink or spreader 184 may be removed to separate each of the power portions 186 of the heat sink or spreader 184 from the ground portion 185 of the heat sink or spreader 184. Next, multiple openings 14a may be formed in the passivation layer 14 of each of the semiconductor IC chips 100j and over multiple respective contact points of the topmost one of the interconnection metal layers 6 of the first interconnection scheme for a chip (FISC) 20 of each of the semiconductor IC chips 100j. Next, multiple micro-bumps, micro-pillars or micro-pads 34 may be each formed on one of the contact points, wherein the micro-bumps, micro-pillars or micro-pads 34 may be of one type of the first, second, third and fourth types having the same specification as that of the first, second, third and fourth types of micro-bumps, micro-pillars or micro-pads 34 respectively as illustrated in FIG. 3A. Each of the first, second, third or fourth type of metal bumps, pillars or pads 34 may have the adhesion layer 26a on one of the contact points. Next, the insulating sealing layer 492 and heat sink or spreader 184 may be cut or diced to be singulated into an eleventh type of chip package 117 as seen in FIG. 17C. For the eleventh type of chip package 117, the ground and power portions 185 and 186 of its heat sink or spreader 184 may act as its external pins to couple or bond to external circuits for ground and power deliveries respectively.

Referring to FIG. 17C, for the eleventh type of chip package 117, the bottommost one of the interconnection metal layers 27 of the fourth interconnection scheme for a chip 181 of its semiconductor IC chip 100j may include a ground plane, buses or interconnection scheme 183; one of the interconnection metal layers 27 of the fourth interconnection scheme for a chip 181 of its semiconductor IC chip 100j neighboring to the ground plane, buses or interconnection scheme 183 of its semiconductor IC chip 100j may include a power plane, buses or interconnection scheme 182 aligned with the ground plane, buses or interconnection scheme 183 of its semiconductor IC chip 100j. The fourth interconnection scheme for a chip 181 of its semiconductor IC chip 100j may include a high dielectric-constant layer (not shown), i.e., insulating dielectric layer, between the power and ground planes, buses or interconnection schemes 182 and 183 of its semiconductor IC chip 100j, wherein the high dielectric-constant layer of its semiconductor IC chip 100j may have a dielectric constant equal to or greater than 3, 5, 10, 30, 50 or 100, for example, and may be made of silicon oxide, silicon nitride, oxynitride, hafnium silicate, zirconium silicate, hafnium dioxide or zirconium dioxide. In this case, its semiconductor IC chip 100j may be formed with a decoupling capacitor therein provided by the power and ground planes, buses or interconnection schemes 182 and 183 and high dielectric-constant layer of the fourth interconnection scheme for a chip 181 of its semiconductor IC chip 100j.

Referring to FIG. 17C, for the eleventh type of chip package 117, each of the power portions 186 of its heat sink or spreader 184 may couple to the power plane, buses or interconnection scheme 182 of its semiconductor IC chip 100j, and the ground portion 185 of its heat sink or spreader 184 may couple to the ground plane, buses or interconnection scheme 183 of its semiconductor IC chip 100j. The through silicon vias (TSVs) 157 of its semiconductor IC chip 100j may include (1) multiple power vias 157a for delivering a voltage (Vcc) of power supply each coupling to the power plane, buses or interconnection scheme 182 of its semiconductor IC chip 100j through each of the interconnection metal layers 6 of the third interconnection scheme for a chip 179 of its semiconductor IC chip 100j, and (2)

multiple ground vias 157*b* for delivering a voltage (Vss) of ground reference each coupling to the ground plane, buses or interconnection scheme 183 of its semiconductor IC chip 100*j* through each of the interconnection metal layers 6 of the third interconnection scheme for a chip 179 of its semiconductor IC chip 100*j* and one or more of the interconnection metal layers 27 of the fourth interconnection scheme for a chip 181 of its semiconductor IC chip 100*j*. Its heat sink or spreader 184 may be made of a copper or aluminum film having a thickness between 50 micrometers and 3 millimeters.

Referring to FIG. 17C, for the eleventh type of chip package 117, the power plane, buses or interconnection scheme 182 of its semiconductor IC chip 100*j* may couple, for power (voltage) delivery, to (1) one of the semiconductor devices 4, i.e., transistors, of its semiconductor IC chip 100*j* through, in sequence, each of the interconnection metal layers 6 of the third interconnection scheme for a chip 179 of its semiconductor IC chip 100*j*, one of the power vias 157*a* of its semiconductor IC chip 100*j*, and one of the interconnection metal layers 6 of the first interconnection scheme for a chip 20 of its semiconductor IC chip 100*j*, shown as a metal interconnect 851 in FIG. 17C, and/or (2) one or more of the micro-bumps, micro-pillars or micro-pads 34 of its semiconductor IC chip 100*j* through, in sequence, each of the interconnection metal layers 6 of the third interconnection scheme for a chip 179 of its semiconductor IC chip 100*j*, one of the power vias 157*a* of its semiconductor IC chip 100*j* and each of the interconnection metal layers 6 of the first interconnection scheme for a chip 20 of its semiconductor IC chip 100*j*. Accordingly, a voltage (Vcc) of power supply may be delivered from each of the power portions 186 of its heat sink or spreader 184 to one or more of the semiconductor devices 4, i.e., transistors, of its semiconductor IC chip 100*j* and/or one or more of the micro-bumps, micro-pillars or micro-pads 34 of its semiconductor IC chip 100*j*.

Referring to FIG. 17C, for the eleventh type of chip package 117, the ground plane, buses or interconnection scheme 183 of its semiconductor IC chip 100*j* may couple, for ground (voltage) delivery, to (1) one of the semiconductor devices 4, i.e., transistors, of its semiconductor IC chip 100*j* through, in sequence, one or more of the interconnection metal layers 27 of the fourth interconnection scheme for a chip 181 of its semiconductor IC chip 100*j*, each of the interconnection metal layers 6 of the third interconnection scheme for a chip 179 of its semiconductor IC chip 100*j*, one of the ground vias 157*b* of its semiconductor IC chip 100*j*, and one of the interconnection metal layers 6 of the first interconnection scheme for a chip 20 of its semiconductor IC chip 100*j*, shown as a metal interconnect 852 in FIG. 17C, and/or (2) one or more of the micro-bumps, micro-pillars or micro-pads 34 of its semiconductor IC chip 100*j* through, in sequence, one or more of the interconnection metal layers 27 of the fourth interconnection scheme for a chip 181 of its semiconductor IC chip 100*j*, each of the interconnection metal layers 6 of the third interconnection scheme for a chip 179 of its semiconductor IC chip 100*j*, one of the ground vias 157*b* of its semiconductor IC chip 100*j* and each of the interconnection metal layers 6 of the first interconnection scheme for a chip 20 of its semiconductor IC chip 100*j*. Accordingly, a voltage (Vss) of ground reference may be delivered from the ground portion 185 of its heat sink or spreader 184 to one or more of the semiconductor devices 4, i.e., transistors, of its semiconductor IC chip 100*j* and/or one or more of the micro-bumps, micro-pillars or micro-pads 34 of its semiconductor IC chip 100*j*.

Referring to FIG. 17C, for the eleventh type of chip package 117, one of the micro-bumps, micro-pillars or micro-pads 34 of its semiconductor IC chip 100*j* may couple, for signal or clock transmission or power or ground (voltage) delivery to one of the semiconductor devices 4, i.e., transistors, of its bottom semiconductor IC chip 100*d* through each of the interconnection metal layers 6 of the first interconnection scheme for a chip 20 of its semiconductor IC chip 100*j*, shown as a metal interconnect 862 in FIG. 17C, wherein the metal interconnect 862 has two ends joining said one of the micro-bumps, micro-pillars or micro-pads 34 and said one of the semiconductor device 4 respectively, extending only over the semiconductor substrate 2 of its semiconductor IC chip 100*j*.

For the eleventh type of chip package 117 as seen in FIG. 17C, its heat sink or spreader 184 may not be used for electrical connection and none of the openings for accommodating the power portions 186 of its heat sink or spreader 184 may formed in its heat sink or spreader 184. Further, its semiconductor IC chip 100*j* may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip.

Twelfth Type of Chip Package

Figures 18A, 18B:
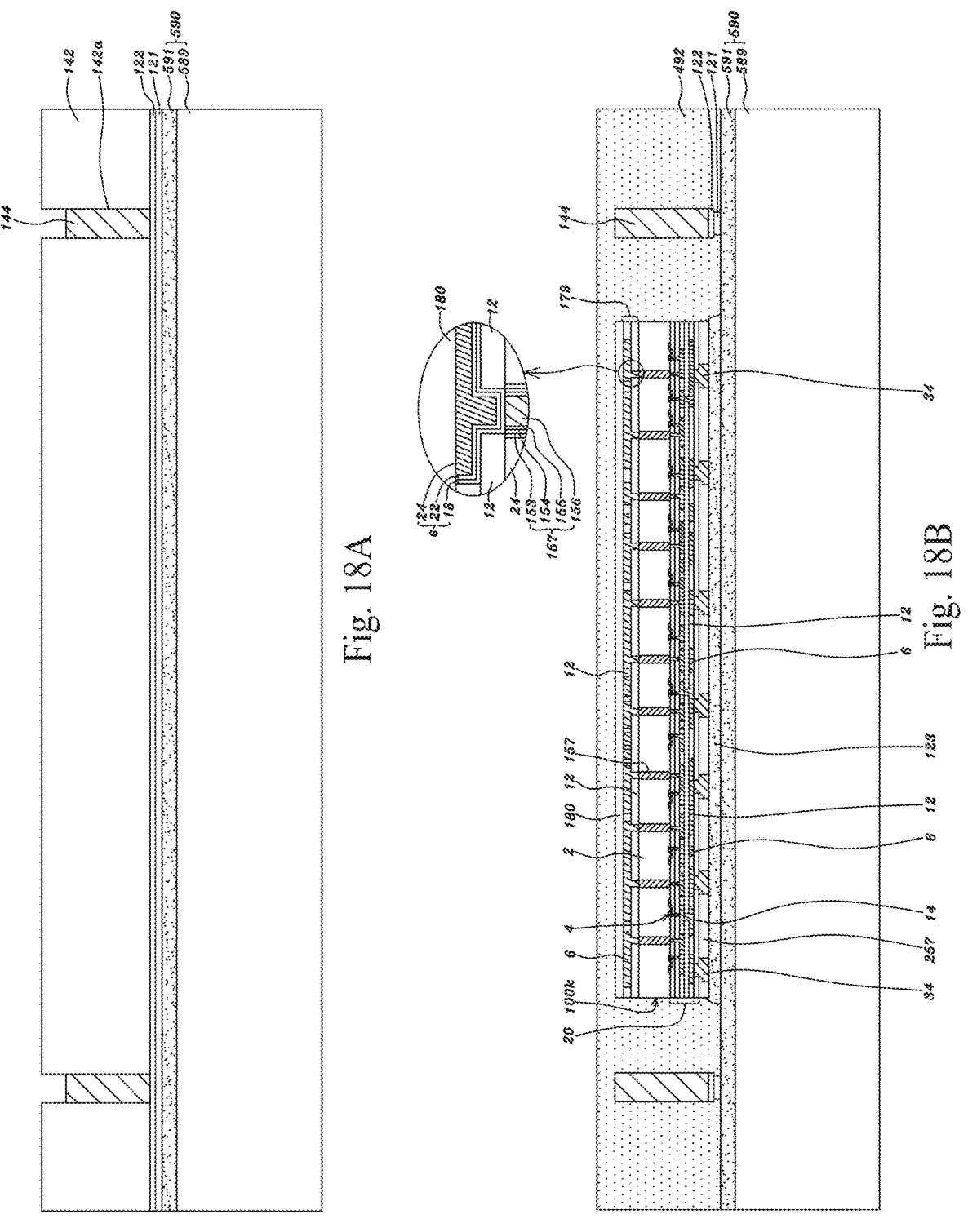
FIGS. 18A-18G are schematically cross-sectional views showing a process for fabricating a twelfth type of chip package in accordance with an embodiment of the present application.

FIGS. 18A-18G are schematically cross-sectional views showing a process for fabricating a twelfth type of chip package in accordance with an embodiment of the present application. Referring to FIG. 18A, a temporary substrate 590 may be provided with a glass or silicon substrate 589 and a sacrificial bonding layer 591 formed on a top surface of the glass or silicon substrate 589. The sacrificial bonding layer 591 may have the glass or silicon substrate 589 to be easily debonded or released from a structure subsequently formed on the sacrificial bonding layer 591. For example, the sacrificial bonding layer 591 may be a material of light-to-heat conversion (LTHC) that may be deposited on the glass or silicon substrate 589 by printing or spin-on coating and then cured or dried with a thickness of about 1 micrometer or between 0.5 and 2 micrometers. The LTHC material may be a liquid ink containing carbon black and binder in a mixture of solvents. Next, an adhesion layer 121 of titanium, a titanium-tungsten alloy, titanium nitride, chromium, titanium-tungsten-alloy layer of tantalum nitride having a thickness of between 0.001 and 0.7 metermeters may be formed on a top surface of the sacrificial bonding layer 591 of the temporary substrate 590. The adhesion layer 121 may be formed by a sputtering process, an atomic-layer-deposition (ALD) process, chemical vapor deposition (CVD) process or evaporation process. Next, a seed layer 122 of copper having a thickness between 0.001 and 1 micrometers, between 0.03 and 2 micrometers or between 0.05 and 0.5 micrometers may be formed on a top surface of the adhesion layer 121. The seed layer 122 may be formed by a sputtering process, atomic-layer-deposition (ALD) process, chemical-vapor-deposition (CVD) process, vapor deposition method, electroless plating method or physical-vapor-deposition (PVD) method. Next, a photoresist layer 142 having a thickness between 5 and 500 micrometers may be formed on a top surface of the seed layer 122 and patterned with multiple openings 142a therein to expose the top surface of the seed layer 122 using processes of exposure and development. Next, a copper layer 144, i.e., copper posts, may be electroplated in the openings 142a and on the top surface of the seed layer 122 exposed by the openings 142a. Next, the photoresist layer 142 may be removed from the top surface of the seed layer 122, as seen in FIG. 18B. Next, the seed layer 122 and adhesion layer 121 not under the copper layer 144 may be etched to expose the top surface of the sacrificial bonding layer 591 of the temporary substrate 590, as seen in FIG. 18B.

Next, referring to FIG. 18B, multiple semiconductor IC chips 100k (only one is shown) are provided each with the specification for the fourth type of semiconductor IC chip 100 as illustrated in FIG. 3D to be turned upside down. The difference therebetween is mentioned as below: The semiconductor substrate 2 of the second type of semiconductor IC chips 100 may have a portion at a backside thereof to be removed by a chemical-mechanical-polishing (CMP) or mechanical grinding process for the semiconductor IC chip 100k such that each of the through silicon vias (TSVs) 157 of the semiconductor IC chip 100k may have a backside substantially coplanar with a backside of the semiconductor substrate 2 of the semiconductor IC chip 100k. The semiconductor substrate 2 of the semiconductor IC chip 100k may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the semiconductor IC chip 100k may have a width, diameter or maximum transverse dimension smaller than 20, 10, 5, 1 or 0.1 micrometers. For example, each of the through silicon vias (TSVs) 157 of the semiconductor IC chip 100k may include the copper layer 156, i.e., copper via, having a width in a horizontal direction between 0.05 and 0.5 micrometers and a thickness in a vertical direction between 0.3 and 10 micrometers. The semiconductor IC chip 100k may further include a third interconnection scheme for a chip 179 on a top surface of its semiconductor substrate 2 and a passivation layer 180 on a top surface of its third interconnection scheme for a chip 179. The specification and process for the interconnection metal layers 6 and insulating dielectric layers 12 of its third interconnection scheme for a chip 179 may be referred to those of the FISC 20 as illustrated in FIG. 3A. For example, each of the interconnection metal layers 6 of its third interconnection scheme for a chip 179 may have a thickness in a vertical direction between 0.05 and 1 micrometers and a trace width for each connection, in a horizontal direction, between 0.05 and 1 micrometers, wherein said each of the interconnection metal layers 6 may have the copper layer 24 with a thickness in a vertical direction between 0.05 and 1 micrometers. The specification and process for its passivation layer 180 may be referred to those of the passivation layer 14 as illustrated in FIG. 3A. Alternatively, the second interconnection scheme for a chip (SISC) 29 provided for the fourth type of semiconductor IC chip 100 as illustrated in FIG. 3D may not be formed for the semiconductor IC chip 100k as seen in FIG. 18B, and the micro-bumps, micro-pillars or micro-pads 34 of each of the semiconductor IC chips 100k may be formed on a bottom surface of the bottommost one of the interconnection metal layers 6 of the first interconnection scheme for a chip (FISC) 20 of said each of the semiconductor IC chips 100k, and the polymer layer 257 of said each of the semiconductor IC chips 100k may be formed on a bottom surface of the passivation layer 14 of said each of the semiconductor IC chips 100k. Next, each of the semiconductor IC chips 100k may have a frontside with the micro-bumps, micro-pillars or micro-pads 34 and polymer layer 257 thereof to be mounted to the top surface of the sacrificial bonding layer 591 of the temporary substrate 590 via a glue layer 123, i.e., adhesive material. Next, an insulating sealing layer 492, i.e., insulating dielectric layer, made of polymer, molding compound, epoxy-based material, polyimide or silicon oxide for example, may be formed on the top surface of the sacrificial bonding layer 591 of the temporary substrate 590, in a space extending from a sidewall of each of the semiconductor IC chips 100k, between neighboring two of the copper posts 144 and semiconductor IC chips 100k and covering the passivation layer 180 of each of the semiconductor IC chips 100k and a top of each of the copper posts 144.

Figures 18C, 18D:
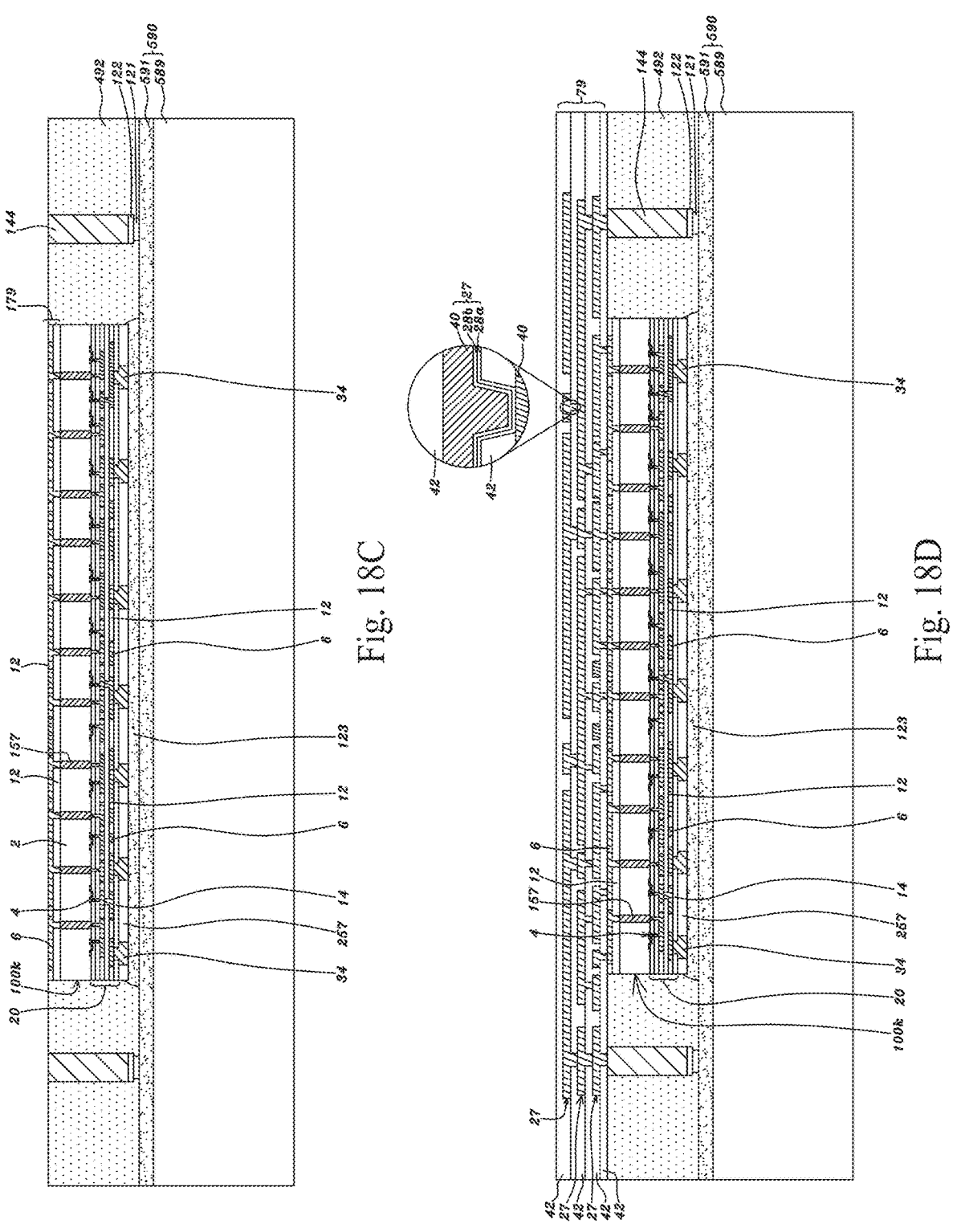

Next, a chemical-mechanical-polishing (CMP) or mechanical grinding process may be performed as seen in FIG. 18C to remove a top portion of the insulating sealing layer 492 and the passivation layer 180 of each of the semiconductor IC chips 100k such that the insulating sealing layer 492 may have a top surface substantially coplanar with a top surface of each of the copper posts 144, a top surface of the topmost one of the interconnection metal layers 6 of the third interconnection scheme for a chip 179 of each of the semiconductor IC chips 100k and a top surface of the topmost one of the insulating dielectric layers 12 of the third interconnection scheme for a chip 179 of each of the semiconductor IC chips 100k.

Next, referring to FIG. 18D, a backside interconnection scheme for a logic drive or device (BISD) 79 may be formed on each of the semiconductor IC chips 100k, the top surface of each of the copper posts 144 and the top surface of the insulating sealing layer 492. The backside interconnection scheme for a logic drive or device (BISD) 79 may be provided with (1) one or more interconnection metal layers 27 coupling to each of the copper posts 144 and the topmost one of the interconnection metal layers 6 of the third interconnection scheme for a chip 179 of each of the semiconductor IC chips 100k, and (2) one or more polymer layers 42, i.e., insulating dielectric layer, each between neighboring two of the interconnection metal layers 27 thereof, under the bottommost one of the interconnection metal layers 27 thereof or over the topmost one of the interconnection metal layers 27 thereof, wherein an upper one of the interconnection metal layers 27 thereof may couple to a lower one of the interconnection metal layers 27 thereof through an opening in one of the polymer layers 42 thereof between the upper and lower ones of the interconnection metal layers 27 thereof. The bottommost one of the polymer layers 42 of the backside interconnection scheme for a logic drive or device (BISD) 79 may be between the bottommost one of the interconnection metal layers 27 of the backside interconnection scheme for a logic drive or device (BISD) 79 and a top planar surface composed of the top surface of the insulating sealing layer 492, the top surface of each of the copper posts 144, the top surface of the topmost one of the interconnection metal layers 6 of the third interconnection scheme for a chip 179 of each of the semiconductor IC chips 100k and the top surface of the topmost one of the insulating dielectric layers 12 of the third interconnection scheme for a chip 179 of each of the semiconductor IC chips 100k, wherein each opening in the bottommost one of the polymer layers 42 of the backside interconnection scheme for a logic drive or device (BISD) 79 may be vertically over the top surface of one of the copper posts 144 or the top surface of the topmost one of the interconnection metal layers 6 of the third interconnection scheme for a chip 179 of one of the semiconductor IC chips 100k. Each of the interconnection metal layers 27 of the backside interconnection scheme for a logic drive or device (BISD) 79 may extend across an edge of each of the semiconductor IC chip 100k. The specification and process for the interconnection metal layers 27 and polymer layers 42 for the backside interconnection scheme for a logic drive or device (BISD) 79 may be referred to those for the SISC 29 as illustrated in FIG. 3A. For example, each of the interconnection metal layers 27 of the backside interconnection scheme for a logic drive or device (BISD) 79 may have a thickness in a vertical direction between 0.2 and 5 micrometers, wherein said each of the interconnection metal layers 27 may have the copper layer 40 with a thickness in a vertical direction between 0.2 and 5 micrometers.

Figures 18E, 18F:
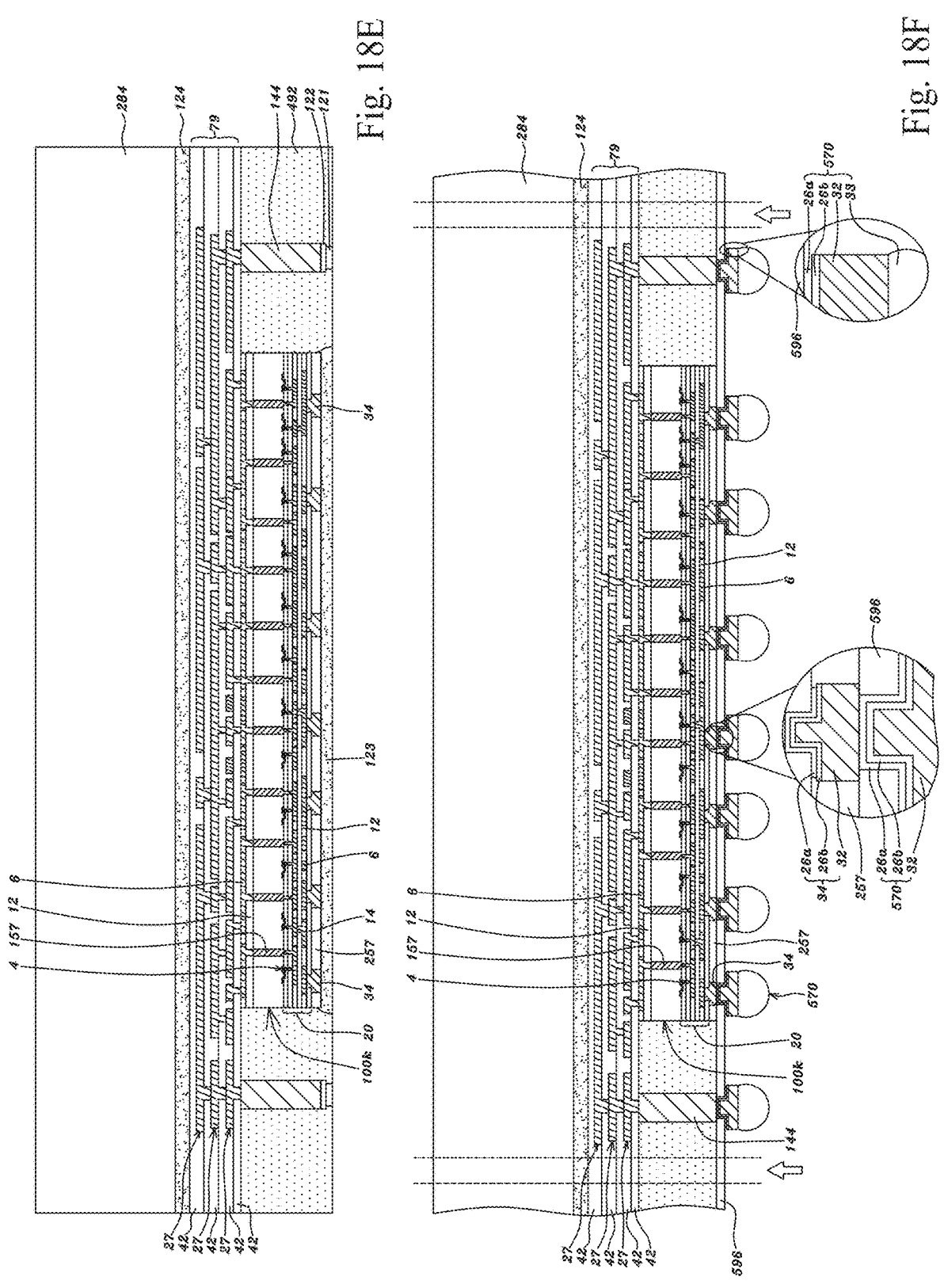

Next, referring to FIG. 18E, a heat sink or spreader 284, made of a layer of copper, aluminum or silicon, may be provided with a bottom surface attached to a top surface of the topmost one of the polymer layers 42 of the backside interconnection scheme for a logic drive or device (BISD) 79 via a glue layer 124, i.e., adhesive material. Next, the glass or silicon substrate 589 and sacrificial bonding layer 591 of the temporary substrate 590 as seen in FIG. 18D may be released from the glue layer 123, insulating sealing layer 492 and adhesion layer 121. Next, a chemical-mechanical-polishing (CMP) or mechanical grinding process may be performed as seen in FIG. 18F to remove the glue layer 123, adhesion layer 121 and seed layer 122 and a bottom portion of the insulating sealing layer 492 such that the insulating sealing layer 492 may have a bottom surface substantially coplanar with a bottom surface of each of the copper posts 144, a bottom surface of each of the micro-bumps, micro-pillars or micro-pads 34 of each of the semiconductor IC chips 100k and a bottom surface of the polymer layer 257 of each of the semiconductor IC chips 100k.

Figure 18G:
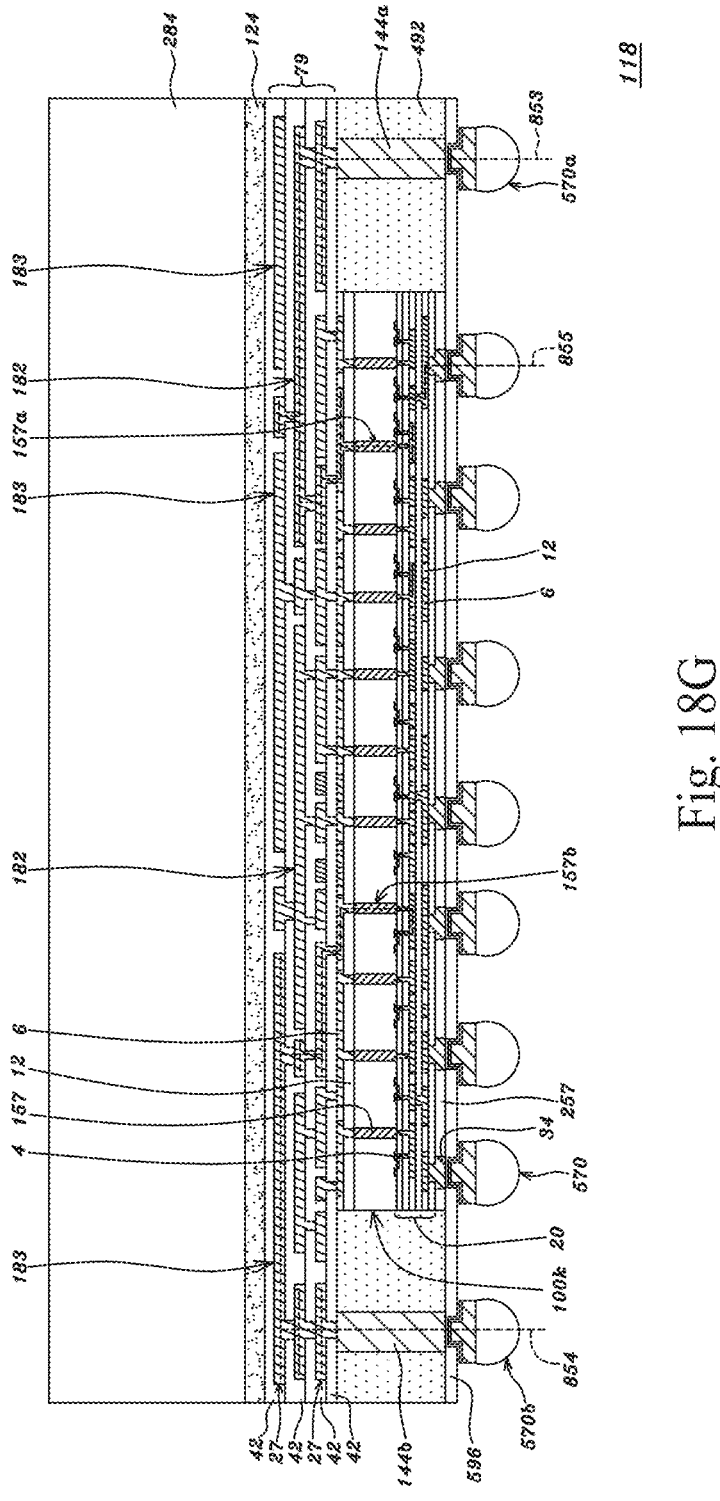

Next, referring to FIG. 18F, an insulating dielectric layer 596 of polymer, silicon oxide or silicon oxynitride may be formed with a thickness between 0.2 and 5 micrometers on the bottom surface of the insulating sealing layer 492, the bottom surface of each of the copper posts 144, the bottom surface of each of the micro-bumps, micro-pillars or micro-pads 34 of each of the semiconductor IC chips 100k and the bottom surface of the polymer layer 257 of each of the semiconductor IC chips 100k. The insulating dielectric layer 596 may be patterned with multiple openings each vertically under the bottom surface of one of the copper posts 144 or the bottom surface of one of the micro-bumps, micro-pillars or micro-pads 34 of one of the semiconductor IC chips 100k. Next, multiple metal bumps, pillars or pads 570 may be each formed on the bottom surface of one of the micro-bumps, micro-pillars or micro-pads 34 of one of the semiconductor IC chips 100k, wherein the metal bumps, pillars or pads 570 may be of one type of the first, second and third types having the same specification as that of the first, second and third types of metal bumps, pillars or pads 570 respectively as illustrated in FIG. 6. Next, the heat sink or spreader 284, backside interconnection scheme for a logic drive or device (BISD) 79, insulating sealing layer 492 and insulating dielectric layer 596 may be cut or diced to be singulated into a twelfth type of chip package 118 as seen in FIG. 18G. For the twelfth type of chip package 118, its metal bumps, pillars or pads 570 may act as external pins of the twelfth type of chip package 118 to couple or bond to external circuits for power or ground delivery and signal transmission. Each of its copper posts 144 may extend vertically in its insulating sealing layer 492 and have a width in a horizontal direction between 0.5 and 10 micrometers and a height in a vertical direction between 0.3 and 10 micrometers.

Referring to FIG. 18G, for the twelfth type of chip package 118, the topmost one of the interconnection metal layers 27 of its backside interconnection scheme for a logic drive or device (BISD) 79 may include a ground plane, buses or interconnection scheme 183; one of the interconnection metal layers 27 of its backside interconnection scheme for a logic drive or device (BISD) 79 neighboring to the ground plane, buses or interconnection scheme 183 of its backside interconnection scheme for a logic drive or device (BISD) 79 may include a power plane, buses or interconnection scheme 182 aligned with the ground plane, buses or interconnection scheme 183 of its backside interconnection scheme for a logic drive or device (BISD) 79. Its backside interconnection scheme for a logic drive or device (BISD) 79 may include a high dielectric-constant layer (not shown), i.e., insulating dielectric layer, between the power and ground planes, buses or interconnection schemes 182 and 183 of its backside interconnection scheme for a logic drive or device (BISD) 79, wherein the high dielectric-constant layer of its backside interconnection scheme for a logic drive or device (BISD) 79 may have a dielectric constant equal to or greater than 3, 5, 10, 30, 50 or 100, for example, and may be made of silicon oxide, silicon nitride, oxynitride, hafnium silicate, zirconium silicate, hafnium dioxide or zirconium dioxide. In this case, its backside interconnection scheme for a logic drive or device (BISD) 79 may be formed with a decoupling capacitor therein provided by the power and ground planes, buses or interconnection schemes 182 and 183 and high dielectric-constant layer of its backside interconnection scheme for a logic drive or device (BISD) 79.

Referring to FIG. 18G, for the twelfth type of chip package 118, the through silicon vias (TSVs) 157 of its semiconductor IC chip 100k may include (1) multiple power vias 157a for delivering a voltage (Vcc) of power supply each coupling to the power plane, buses or interconnection scheme 182 of its backside interconnection scheme for a logic drive or device (BISD) 79 through one or more of the interconnection metal layers 27 of its backside interconnection scheme for a logic drive or device (BISD) 79, and (2) multiple ground vias 157b for delivering a voltage (Vss) of ground reference each coupling to the ground plane, buses or interconnection scheme 183 of its backside interconnection scheme for a logic drive or device (BISD) 79 through one or more of the interconnection metal layers 27 of its backside interconnection scheme for a logic drive or device (BISD) 79. The copper posts 144 may include (1) multiple power posts 144a for delivering a voltage (Vcc) of power supply each coupling to the power plane, buses or interconnection scheme 182 of its backside interconnection scheme for a logic drive or device (BISD) 79 through one or more of the interconnection metal layers 27 of its backside interconnection scheme for a logic drive or device (BISD) 79, and (2) multiple ground posts 144b for delivering a voltage (Vss) of ground reference each coupling to the ground plane, buses or interconnection scheme 183 of its backside interconnection scheme for a logic drive or device (BISD) 79 through one or more of the interconnection metal layers 27 of its backside interconnection scheme for a logic drive or device (BISD) 79. Its metal bumps, pillars or pads 570 may include (1) multiple power bumps, pillars or pads 570a for delivering a voltage (Vcc) of power supply each coupling to the power plane, buses or interconnection scheme 182 of its backside interconnection scheme for a logic drive or device (BISD) 79 through, in sequence, one of its power posts 144*a* and one or more of the interconnection metal layers 27 of its backside interconnection scheme for a logic drive or device (BISD) 79, and (2) multiple ground bumps, pillars or pads 570*b* for delivering a voltage (Vss) of ground reference each coupling to the ground plane, buses or interconnection scheme 183 of its backside interconnection scheme for a logic drive or device (BISD) 79 through, in sequence, one of its ground posts 144*b* and one or more of the interconnection metal layers 27 of its backside interconnection scheme for a logic drive or device (BISD) 79. Its heat sink or spreader 284 may be made of a copper, aluminum or silicon film having a thickness between 50 micrometers and 3 millimeters.

Referring to FIG. 18G, for the twelfth type of chip package 118, each of its power bumps, pillars or pads 570*a* may couple, for power (voltage) delivery, to one of the semiconductor devices 4, i.e., transistors, of its semiconductor IC chip 100*k* through, in sequence, one of its power posts 144*a*, the power plane, buses or interconnection scheme 182 of its backside interconnection scheme for a logic drive or device (BISD) 79, one of its power vias 157*a* and one of the interconnection metal layers 6 of the first interconnection scheme for a chip (FISC) 20 of its semiconductor IC chip 100*k*, shown as a metal interconnect 853 in FIG. 18G. Each of its ground bumps, pillars or pads 570*b* may couple, for ground (voltage) delivery, to one of the semiconductor devices 4, i.e., transistors, of its semiconductor IC chip 100*k* through, in sequence, one of its ground posts 144*b*, the ground plane, buses or interconnection scheme 183 of its backside interconnection scheme for a logic drive or device (BISD) 79, one of its ground vias 157*b* and one of the interconnection metal layers 6 of the first interconnection scheme for a chip (FISC) 20 of its semiconductor IC chip 100*k*, shown as a metal interconnect 854 in FIG. 18G. A metal bump, pillar or pad 570 of its metal bumps, pillars or pads 570 may couple, for signal or clock transmission or power or ground (voltage) delivery, to a semiconductor device of the semiconductor devices 4, i.e., transistors, of its semiconductor IC chip 100*k* through each of the interconnection metal layers 6 of the first interconnection scheme for a chip (FISC) 20 of its semiconductor IC chip 100*k*, shown as a metal interconnect 855 in FIG. 18G, wherein the metal interconnect 855 has two ends joining the metal bump, pillar or pad 570 and semiconductor device 4 respectively, extending only under the semiconductor substrate 2 of its semiconductor IC chip 100*k*.

Referring to FIG. 18G, for the twelfth type of chip package 118, its semiconductor IC chip 100*k* may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, highbandwidth-memory (HBM) IC chip, static-random-access-memory (SRAM) IC chip or dynamic-random-access-memory (DRAM) IC chip.

Thirteenth Type of Chip Package

FIGS. 19A-19G are schematically cross-sectional views showing a process for fabricating a thirteenth type of chip package in accordance with an embodiment of the present application. First, referring to FIG. 19A, multiple of the semiconductor IC chips 100*k* (only one is shown), each of which may have the same specification as one illustrated in FIG. 18A, may have a frontside with the micro-bumps, micro-pillars or micro-pads 34 and polymer layer 257 thereof to be mounted to a top surface of a sacrificial bonding layer 591 of a temporary substrate 590, which may have the same specification as one illustrated in FIG. 18A, via a glue layer 123, i.e., adhesive material. For an element indicated by the same reference number shown in FIGS. 18A-18G and 19A-19G, the specification of the element as seen in FIGS. 19A-19G may be referred to that of the element as illustrated in FIGS. 18A-18G. Next, an insulating sealing layer 492, i.e., insulating dielectric layer, made of polymer, molding compound, epoxy-based material, polyimide or silicon oxide for example, may be formed on the top surface of the sacrificial bonding layer 591 of the temporary substrate 590, in a space extending from a sidewall of each of the semiconductor IC chips 100*k* and covering the passivation layer 180 of each of the semiconductor IC chips 100*k*. Next, the insulating sealing layer 492 may be patterned with multiple openings 492*a* therein to expose the top surface of the sacrificial bonding layer 591 of the temporary substrate 590.

Figures 19A, 19B:
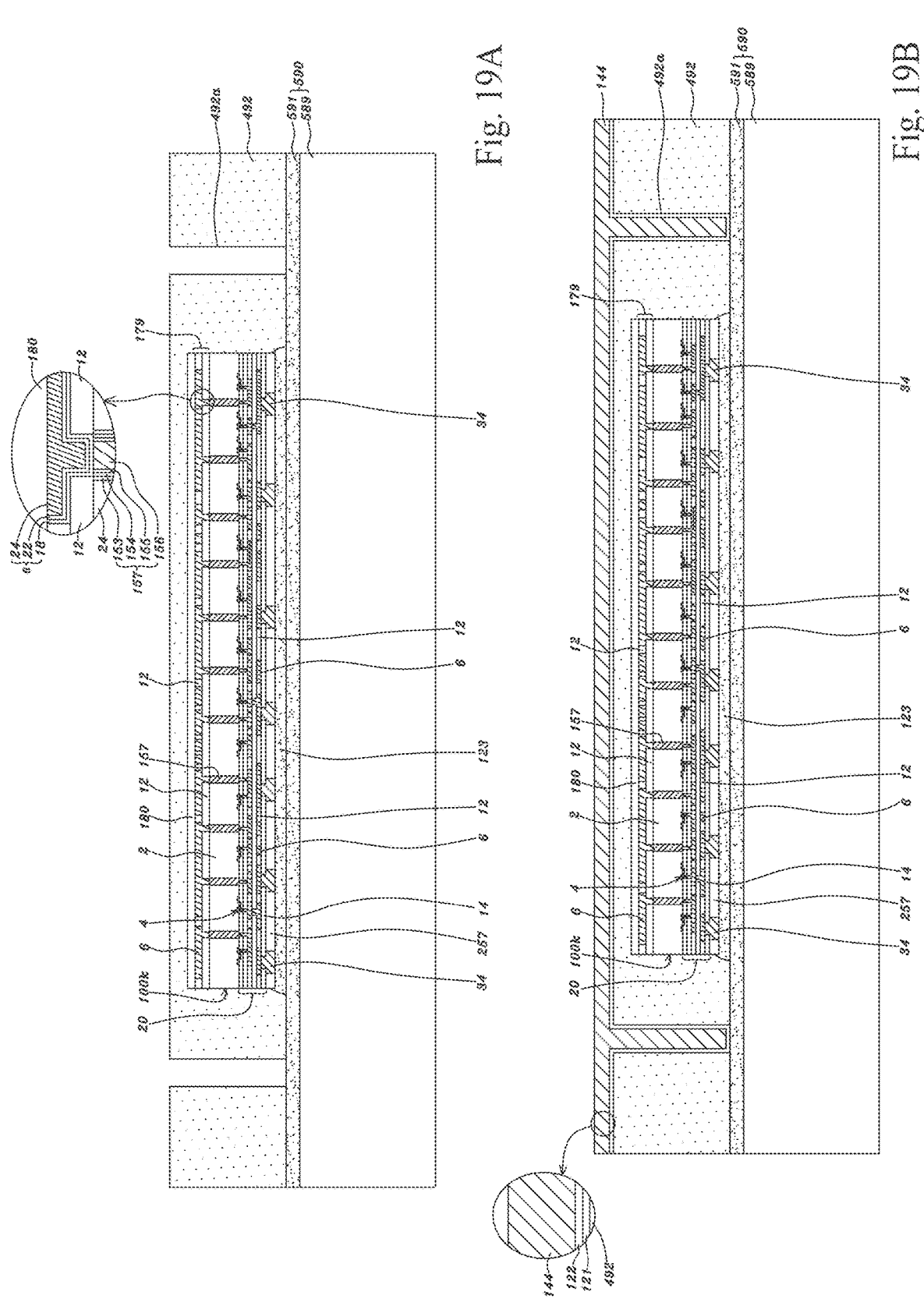
FIGS. 19A-19G are schematically cross-sectional views showing a process for fabricating a thirteenth type of chip package in accordance with an embodiment of the present application.

Next, referring to FIG. 19B, an adhesion layer 121 of titanium, a titanium-tungsten alloy, titanium nitride, chromium, titanium-tungsten-alloy layer of tantalum nitride having a thickness of between 0.001 and 0.7 metermeters may be formed on a top surface of the insulating sealing layer 492, in each of the openings 492*a* in the insulating sealing layer 492, on a sidewall and bottom of each of the openings 492*a* in the insulating sealing layer 492 and on the top surface of the sacrificial bonding layer 591 of the temporary substrate 590 under each of the openings 492*a* in the insulating sealing layer 492. The adhesion layer 121 may be formed by a sputtering process, an atomic-layer-deposition (ALD) process, chemical vapor deposition (CVD) process or evaporation process. Next, a seed layer 122 of copper having a thickness between 0.001 and 1 micrometers, between 0.03 and 2 micrometers or between 0.05 and 0.5 micrometers may be formed on the adhesion layer 121 and in each of the openings 492*a* in the insulating sealing layer 492. The seed layer 122 may be formed by a sputtering process, atomic-layer-deposition (ALD) process, chemical-vapor-deposition (CVD) process, vapor deposition method, electroless plating method or physical-vapor-deposition (PVD) method. Next, a copper layer 144, i.e., copper vias, may be electroplated on the seed layer 122 and in each of the openings 492*a* in the insulating sealing layer 492.

Figures 19C, 19D:
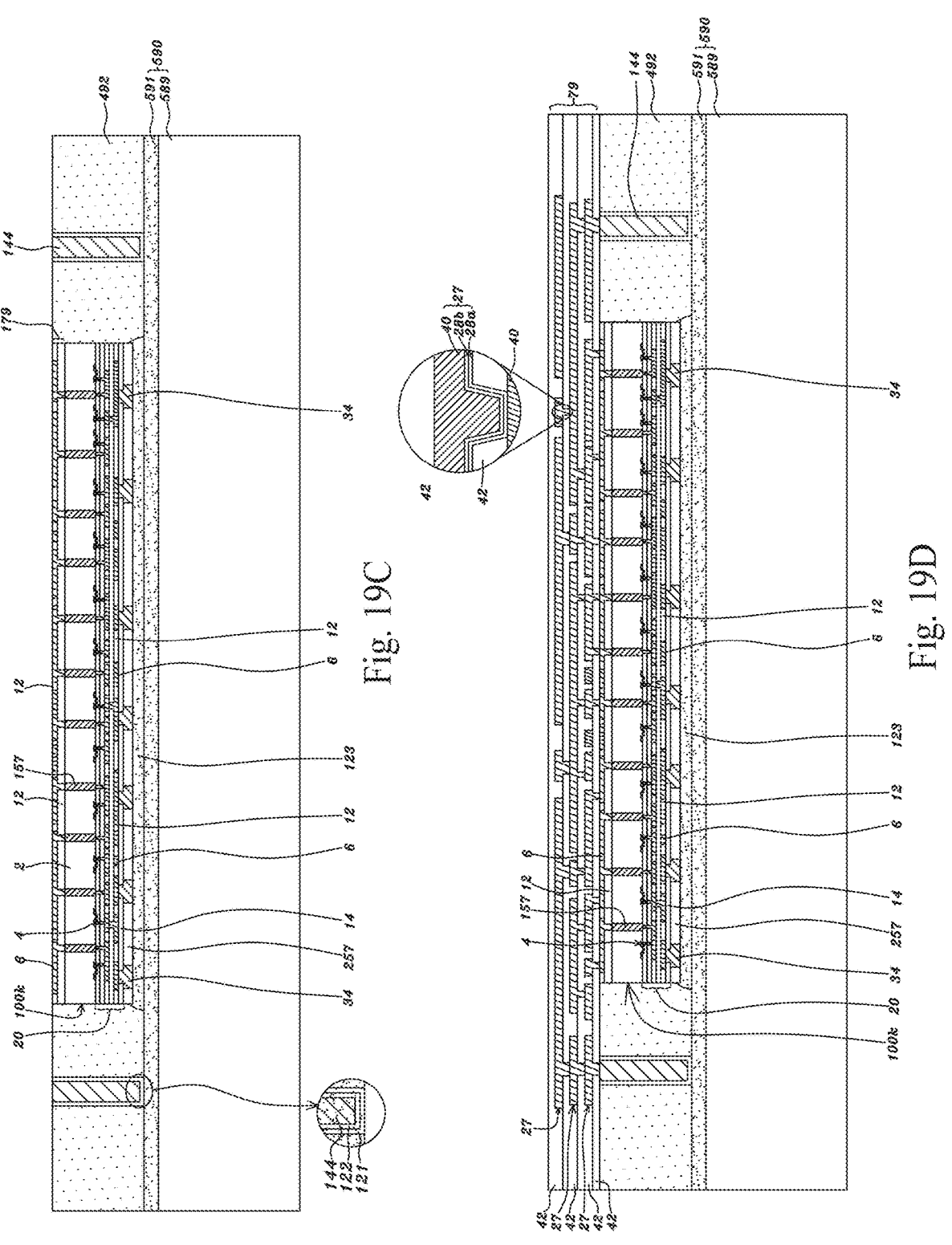

Next, a chemical-mechanical-polishing (CMP) or mechanical grinding process may be performed as seen in FIG. 19C to remove the adhesion layer 121, seed layer 122 and copper layer 144 outside the openings 492*a* in the insulating sealing layer 492, a top portion of the insulating sealing layer 492 and the passivation layer 180 of each of the semiconductor IC chips 100*k* such that the insulating sealing layer 492 may have a top surface substantially coplanar with a top surface of each of the copper vias 144, a top surface of the topmost one of the interconnection metal layers 6 of the third interconnection scheme for a chip 179 of each of the semiconductor IC chips 100*k* and a top surface of the topmost one of the insulating dielectric layers 12 of the third interconnection scheme for a chip 179 of each of the semiconductor IC chips 100*k*.

Next, referring to FIG. 19D, a backside interconnection scheme for a logic drive or device (BISD) 79 may be formed on each of the semiconductor IC chips 100*k*, the top surface of each of the copper vias 144 and the top surface of the insulating sealing layer 492. The backside interconnection scheme for a logic drive or device (BISD) 79 may be provided with (1) one or more interconnection metal layers 27 coupling to each of the copper vias 144 and the topmost one of the interconnection metal layers 6 of the third interconnection scheme for a chip 179 of each of the semiconductor IC chips 100*k*, and (2) one or more polymer layers 42, i.e., insulating dielectric layer, each between neighboring two of the interconnection metal layers 27 thereof, under the bottommost one of the interconnection metal layers 27 thereof or over the topmost one of the interconnection metal layers 27 thereof, wherein an upper one of the interconnection metal layers 27 thereof may couple to a lower one of the interconnection metal layers 27 thereof through an opening in one of the polymer layers 42 thereof between the upper and lower ones of the interconnection metal layers 27 thereof. The bottommost one of the polymer layers 42 of the backside interconnection scheme for a logic drive or device (BISD) 79 may be between the bottommost one of the interconnection metal layers 27 of the backside interconnection scheme for a logic drive or device (BISD) 79 and a top planar surface composed of the top surface of the insulating sealing layer 492, the top surface of each of the copper vias 144, the top surface of the topmost one of the interconnection metal layers 6 of the third interconnection scheme for a chip 179 of each of the semiconductor IC chips 100*k* and the top surface of the topmost one of the insulating dielectric layers 12 of the third interconnection scheme for a chip 179 of each of the semiconductor IC chips 100*k*, wherein each opening in the bottommost one of the polymer layers 42 of the backside interconnection scheme for a logic drive or device (BISD) 79 may be vertically over the top surface of one of the copper vias 144 or the top surface of the topmost one of the interconnection metal layers 6 of the third interconnection scheme for a chip 179 of one of the semiconductor IC chips 100*k*. Each of the interconnection metal layers 27 of the backside interconnection scheme for a logic drive or device (BISD) 79 may extend across an edge of each of the semiconductor IC chip 100*k*. The specification and process for the interconnection metal layers 27 and polymer layers 42 for the backside interconnection scheme for a logic drive or device (BISD) 79 may be referred to those for the SISC 29 as illustrated in FIG. 3A. For example, each of the interconnection metal layers 27 of the backside interconnection scheme for a logic drive or device (BISD) 79 may have a thickness in a vertical direction between 0.2 and 5 micrometers, wherein said each of the interconnection metal layers 27 may have the copper layer 40 with a thickness in a vertical direction between 0.2 and 5 micrometers.

Figures 19E, 19F:
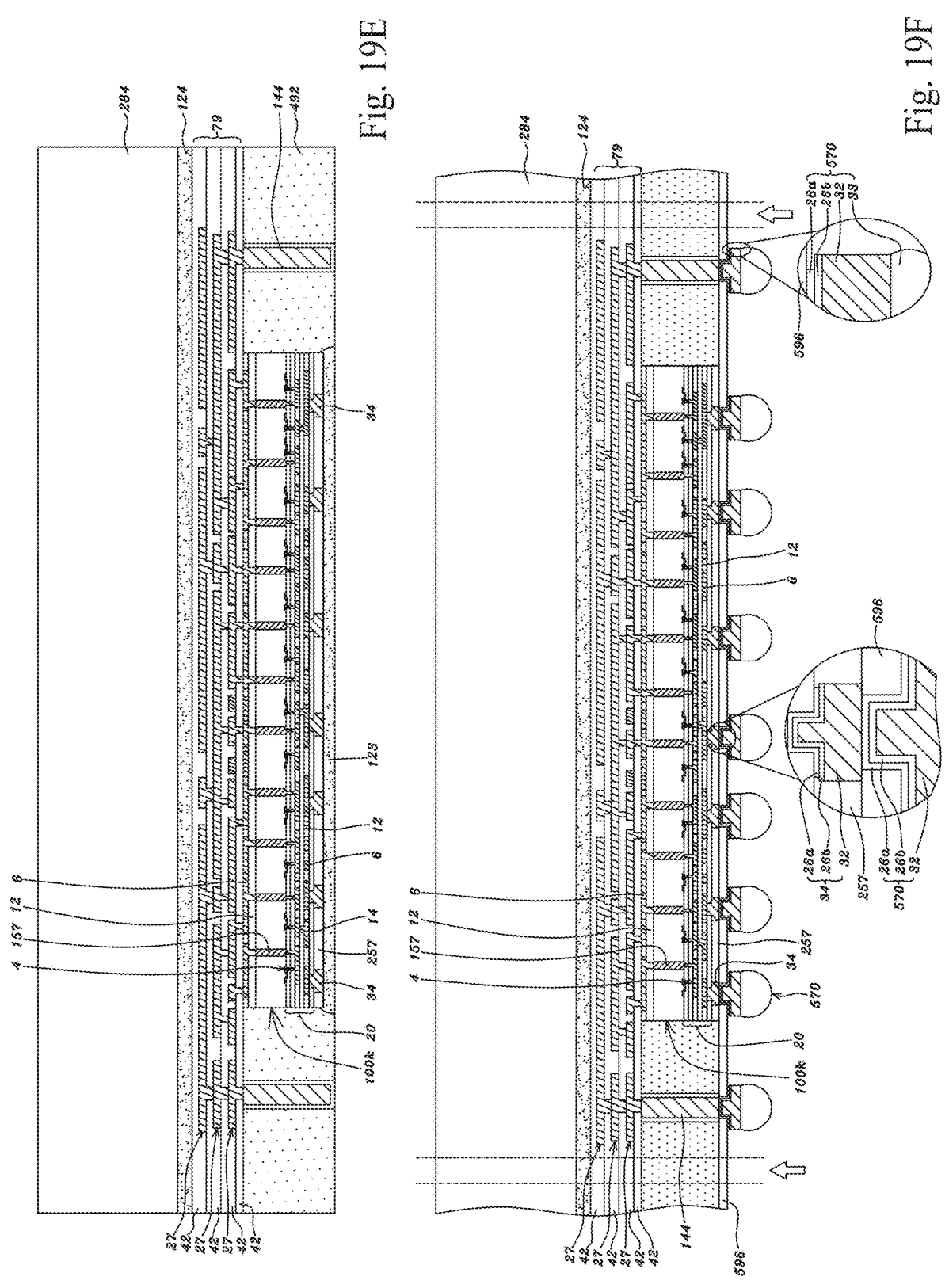

Next, referring to FIG. 19E, a heat sink or spreader 284, made of a layer of copper, aluminum or silicon, may be provided with a bottom surface attached to a top surface of the topmost one of the polymer layers 42 of the backside interconnection scheme for a logic drive or device (BISD) 79 via a glue layer 124, i.e., adhesive material. Next, the glass or silicon substrate 589 and sacrificial bonding layer 591 of the temporary substrate 590 as seen in FIG. 19D may be released from the glue layer 123, insulating sealing layer 492 and adhesion layer 121. Next, a chemical-mechanical-polishing (CMP) or mechanical grinding process may be performed as seen in FIG. 19F to remove the glue layer 123, the adhesion layer 121 and seed layer 122 at a bottom of each of the copper vias 144, a bottom portion of the insulating sealing layer 492 such that the insulating sealing layer 492 may have a bottom surface substantially coplanar with a bottom surface of each of the copper vias 144, a bottom surface of each of the micro-bumps, micro-pillars or micro-pads 34 of each of the semiconductor IC chips 100*k* and a bottom surface of the polymer layer 257 of each of the semiconductor IC chips 100*k*, as seen in FIG. 19F.

Figure 19G:
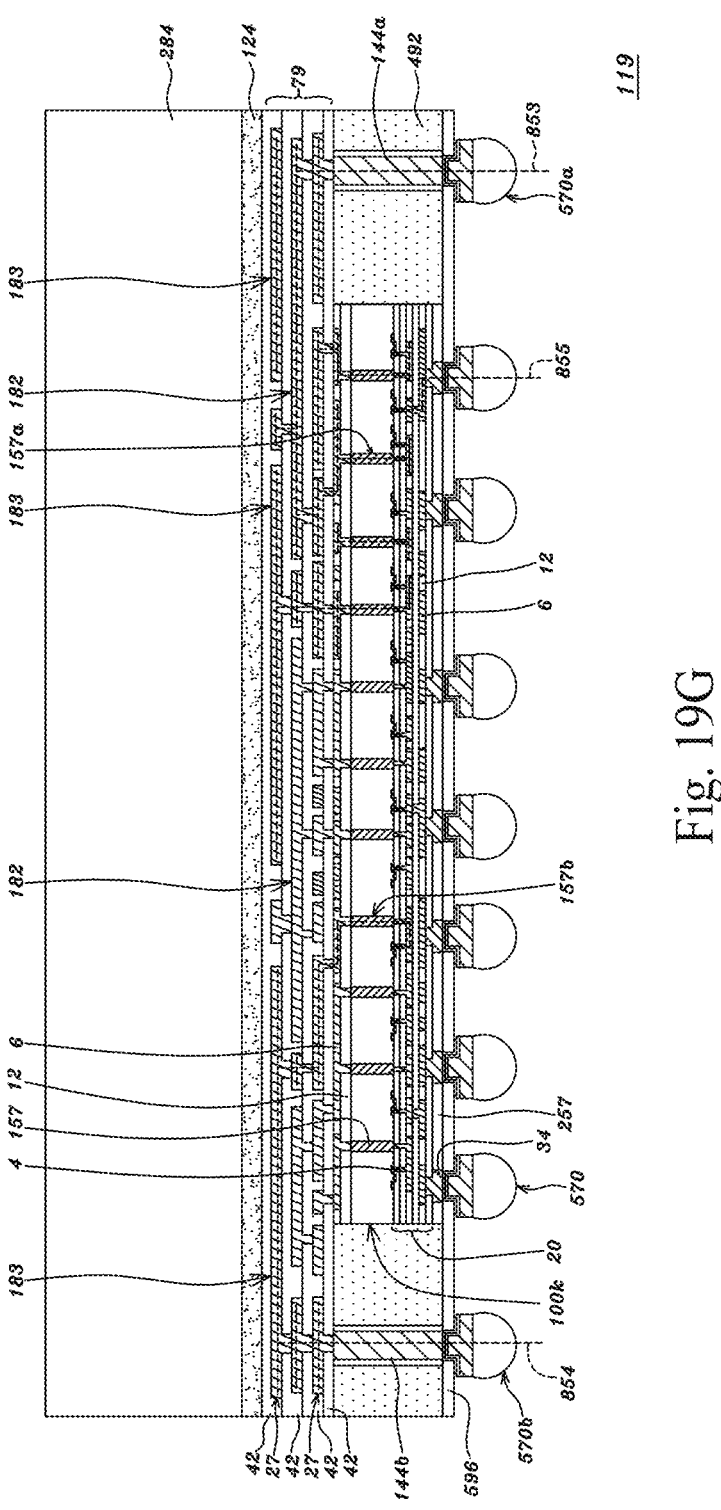

Next, referring to FIG. 19F, an insulating dielectric layer 596 of polymer, silicon oxide or silicon oxynitride may be formed with a thickness between 0.2 and 5 micrometers on the bottom surface of the insulating sealing layer 492, the bottom surface of each of the copper vias 144, the bottom surface of each of the micro-bumps, micro-pillars or micro-pads 34 of each of the semiconductor IC chips 100*k* and the bottom surface of the polymer layer 257 of each of the semiconductor IC chips 100*k*. The insulating dielectric layer 596 may be patterned with multiple openings each vertically under the bottom surface of one of the copper vias 144 or the bottom surface of one of the micro-bumps, micro-pillars or micro-pads 34 of one of the semiconductor IC chips 100*k*. Next, multiple metal bumps, pillars or pads 570 may be each formed on the bottom surface of one of the micro-bumps, micro-pillars or micro-pads 34 of one of the semiconductor IC chips 100*k*, wherein the metal bumps, pillars or pads 570 may be of one type of the first, second and third types having the same specification as that of the first, second and third types of metal bumps, pillars or pads 570 respectively as illustrated in FIG. 6. Next, the heat sink or spreader 284, backside interconnection scheme for a logic drive or device (BISD) 79, insulating sealing layer 492 and insulating dielectric layer 596 may be cut or diced to be singulated into a thirteenth type of chip package 119 as seen in FIG. 19G. For the thirteenth type of chip package 119, its metal bumps, pillars or pads 570 may act as external pins of the thirteenth type of chip package 119 to couple or bond to external circuits for power or ground delivery and signal transmission. Each of its copper vias 144*a* may have a width in a horizontal direction between 0.5 and 10 micrometers and a height in a vertical direction between 0.3 and 10 micrometers with its adhesion layer 121 being at a sidewall of each of its copper vias 144*a*.

Referring to FIG. 19G, for the thirteenth type of chip package 119, the topmost one of the interconnection metal layers 27 of its backside interconnection scheme for a logic drive or device (BISD) 79 may include a ground plane, buses or interconnection scheme 183; one of the interconnection metal layers 27 of its backside interconnection scheme for a logic drive or device (BISD) 79 neighboring to the ground plane, buses or interconnection scheme 183 of its backside interconnection scheme for a logic drive or device (BISD) 79 may include a power plane, buses or interconnection scheme 182 aligned with the ground plane, buses or interconnection scheme 183 of its backside interconnection scheme for a logic drive or device (BISD) 79. Its backside interconnection scheme for a logic drive or device (BISD) 79 may include a high dielectric-constant layer (not shown), i.e., insulating dielectric layer, between the power and ground planes, buses or interconnection schemes 182 and 183 of its backside interconnection scheme for a logic drive or device (BISD) 79, wherein the high dielectric-constant layer of its backside interconnection scheme for a logic drive or device (BISD) 79 may have a dielectric constant equal to or greater than 3, 5, 10, 30, 50 or 100, for example, and may be made of silicon oxide, silicon nitride, oxynitride, hafnium silicate, zirconium silicate, hafnium dioxide or zirconium dioxide. In this case, its backside interconnection scheme for a logic drive or device (BISD) 79 may be formed with a decoupling capacitor therein provided by the power and ground planes, buses or interconnection schemes 182 and 183 and high dielectric-constant layer of its backside interconnection scheme for a logic drive or device (BISD) 79.

Referring to FIG. 19G, for the thirteenth type of chip package 119, the through silicon vias (TSVs) 157 of its semiconductor IC chip 100k may include (1) multiple power vias 157a for delivering a voltage (Vcc) of power supply each coupling to the power plane, buses or interconnection scheme 182 of its backside interconnection scheme for a logic drive or device (BISD) 79 through one or more of the interconnection metal layers 27 of its backside interconnection scheme for a logic drive or device (BISD) 79, and (2) multiple ground vias 157b for delivering a voltage (Vss) of ground reference each coupling to the ground plane, buses or interconnection scheme 183 of its backside interconnection scheme for a logic drive or device (BISD) 79 through one or more of the interconnection metal layers 27 of its backside interconnection scheme for a logic drive or device (BISD) 79. The copper vias 144 may include (1) multiple power vias 144a for delivering a voltage (Vcc) of power supply each coupling to the power plane, buses or interconnection scheme 182 of its backside interconnection scheme for a logic drive or device (BISD) 79 through one or more of the interconnection metal layers 27 of its backside interconnection scheme for a logic drive or device (BISD) 79, and (2) multiple ground vias 144b for delivering a voltage (Vss) of ground reference each coupling to the ground plane, buses or interconnection scheme 183 of its backside interconnection scheme for a logic drive or device (BISD) 79 through one or more of the interconnection metal layers 27 of its backside interconnection scheme for a logic drive or device (BISD) 79. Its metal bumps, pillars or pads 570 may include (1) multiple power bumps, pillars or pads 570a for delivering a voltage (Vcc) of power supply each coupling to the power plane, buses or interconnection scheme 182 of its backside interconnection scheme for a logic drive or device (BISD) 79 through, in sequence, one of its power vias 144a and one or more of the interconnection metal layers 27 of its backside interconnection scheme for a logic drive or device (BISD) 79, and (2) multiple ground bumps, pillars or pads 570b for delivering a voltage (Vss) of ground reference each coupling to the ground plane, buses or interconnection scheme 183 of its backside interconnection scheme for a logic drive or device (BISD) 79 through one of its ground vias 144b and one or more of the interconnection metal layers 27 of its backside interconnection scheme for a logic drive or device (BISD) 79. Its heat sink or spreader 284 may be made of a copper, aluminum or silicon film having a thickness between 50 micrometers and 3 millimeters.

Referring to FIG. 19G, for the thirteenth type of chip package 119, each of its power bumps, pillars or pads 570a may couple, for power (voltage) delivery, to one of the semiconductor devices 4, i.e., transistors, of its semiconductor IC chip 100k through, in sequence, one of its power vias 144a, the power plane, buses or interconnection scheme 182 of its backside interconnection scheme for a logic drive or device (BISD) 79, one of the power vias 157a of its semiconductor IC chip 100k and one or more of the interconnection metal layers 6 of the first interconnection scheme for a chip (FISC) 20 of its semiconductor IC chip 100k, shown as a metal interconnect 856 in FIG. 19G. Each of its ground bumps, pillars or pads 570b may couple, for ground (voltage) delivery, to one of the semiconductor devices 4, i.e., transistors, of its semiconductor IC chip 100k through, in sequence, one of its ground vias 144b, the ground plane, buses or interconnection scheme 183 of its backside interconnection scheme for a logic drive or device (BISD) 79, one of the ground vias 157b of its semiconductor IC chip 100k and one or more of the interconnection metal layers 6 of the first interconnection scheme for a chip (FISC) 20 of its semiconductor IC chip 100k, shown as a metal interconnect 857 in FIG. 19G. A metal bump, pillar or pad of its metal bumps, pillars or pads 570 may couple, for signal or clock transmission or power or ground (voltage) delivery, to a semiconductor device of the semiconductor devices 4, i.e., transistors, of its semiconductor IC chip 100k through each of the interconnection metal layers 6 of the first interconnection scheme for a chip (FISC) 20 of its semiconductor IC chip 100k, shown as a metal interconnect 858 in FIG. 19G, wherein the metal interconnect 858 has two ends joining the metal bump, pillar or pad and semiconductor device respectively, extending only under the semiconductor substrate 2 of its semiconductor IC chip 100k.

Referring to FIG. 19G, for the thirteenth type of chip package 119, its semiconductor IC chip 100k may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip.

Fourteenth Type of Chip Package

Figure 20:
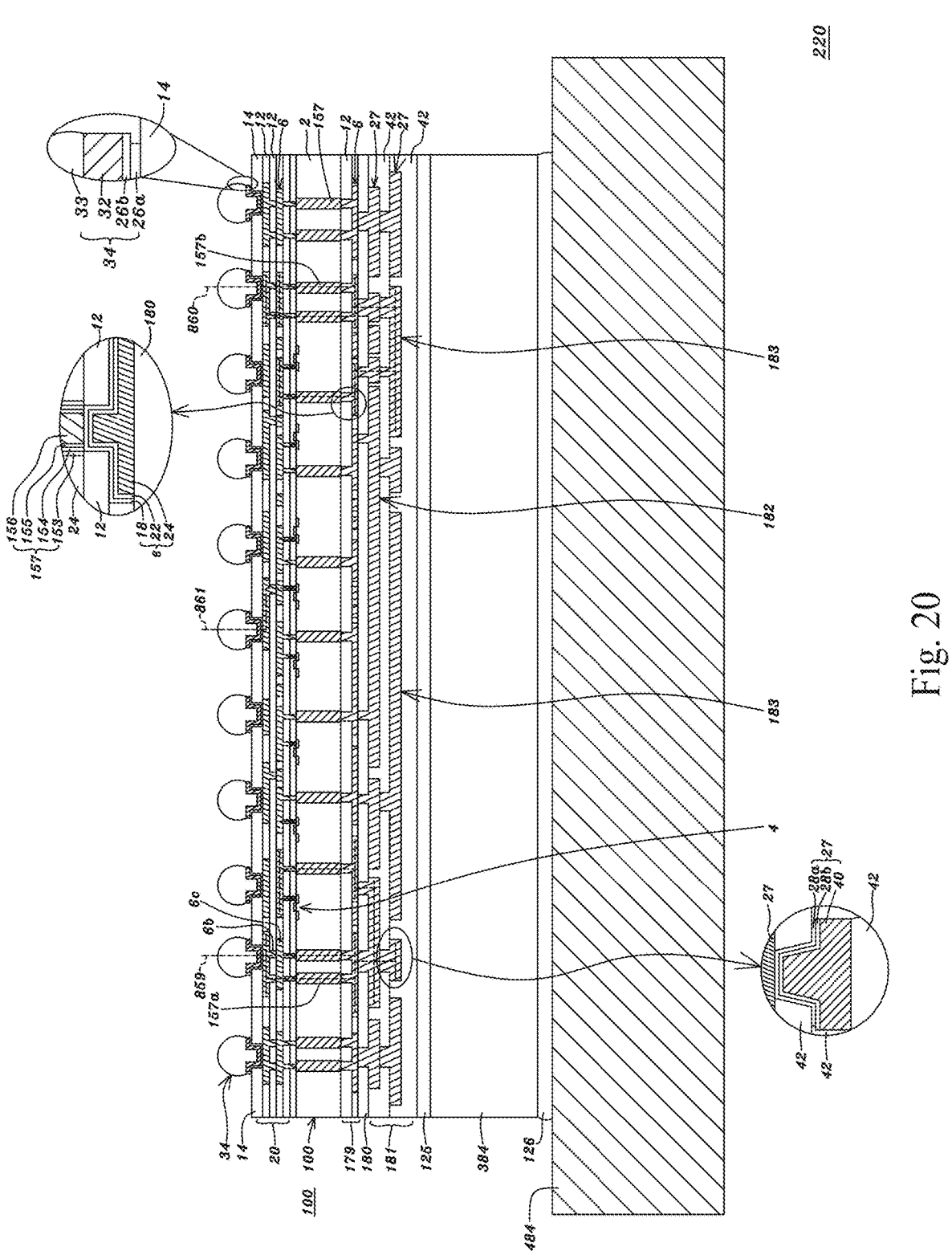
FIG. 20 is a schematically cross-sectional view showing a fourteenth type of chip package in accordance with an embodiment of the present application.

FIG. 20 is a schematically cross-sectional view showing a fourteenth type of chip package in accordance with an embodiment of the present application. Referring to FIG. 20, a fourteenth type of chip package 220 may include a semiconductor IC chip 100 having the specification for the second type of semiconductor IC chip 100 illustrated in FIG. 3B. For an element indicated by the same reference number shown in FIGS. 20 and 3B, the specification of the element as seen in FIG. 20 may be referred to that of the element as illustrated in FIG. 3B. The difference therebetween is mentioned as below: For the fourteenth type of chip package 220, its semiconductor IC chip 100 may have a portion at a backside thereof removed by a chemical-mechanical-polishing (CMP) or mechanical grinding process such that each of the through silicon vias (TSVs) 157 of its semiconductor IC chip 100 may have a backside substantially coplanar with a backside of the semiconductor substrate 2 of its semiconductor IC chip 100. The semiconductor substrate 2 of its semiconductor IC chip 100 may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of its semiconductor IC chip 100 may have a width, diameter or maximum transverse dimension smaller than 20, 10, 5, 1 or 0.1 micrometers. For example, each of the through silicon vias (TSVs) 157 of its semiconductor IC chip 100 may include the copper layer 156, i.e., copper via, having a width in a horizontal direction between 0.05 and 0.5 micrometers and a thickness in a vertical direction between 0.3 and 10 micrometers. Its semiconductor IC chip 100 may further include a third interconnection scheme for a chip 179 on a bottom surface of the semiconductor substrate 2 of its semiconductor IC chip 100, a passivation layer 180 on a bottom surface of the third interconnection scheme for a chip 179 of its semiconductor IC chip 100 and a fourth interconnection scheme for a chip 181 on a bottom surface of the passivation layer 180 of its semiconductor IC chip 100. The specification and process for the interconnection metal layers 6 and insulating dielectric layers 12 of the third interconnection scheme for a chip 179 of its semiconductor IC chip 100 may be referred to those of the FISC 20 as illustrated in FIG. 3A to be turned upside down and in FIG. 9C. For example, each of the interconnection metal layers 6 of the third interconnection scheme for a chip 179 of its semiconductor IC chip 100 may have a thickness in a vertical direction between 0.05 and 1 micrometers and a trace width for each connection, in a horizontal direction, between 0.05 and 1 micrometers, wherein said each of the interconnection metal layers 6 may have the copper layer 24 with a thickness in a vertical direction between 0.05 and 1 micrometers. The specification and process for its passivation layer 180 may be referred to those of the passivation layer 14 as illustrated in FIG. 3A to be turned upside down and in FIG. 9C. The specification and process for the interconnection metal layers 27 and polymer layers 42 of the fourth interconnection scheme for a chip 181 of its semiconductor IC chip 100 may be referred to those of the SISC 29 as illustrated in FIG. 3A to be turned upside down and in FIG. 9C. For example, each of the interconnection metal layers 27 of the fourth interconnection scheme for a chip 181 of its semiconductor IC chip 100 may have a thickness in a vertical direction between 0.2 and 5 micrometers, wherein said each of the interconnection metal layers 27 may have the copper layer 40 with a thickness in a vertical direction between 0.2 and 5 micrometers. The bottommost one of the interconnection metal layers 27 of the fourth interconnection scheme for a chip 181 of its semiconductor IC chip 100 may have the entire bottom surface covered with the bottommost one of the polymer layers 42 of the fourth interconnection scheme for a chip 181 of its semiconductor IC chip 100.

Referring to FIG. 20, the fourteenth type of chip package 220 may further include (1) a first heat sink or spreader 384, made of a silicon substrate, having a top surface mounted to a bottom surface of the bottommost one of the polymer layers 42 of the fourth interconnection scheme for a chip 181 of its semiconductor IC chip 100 via a glue layer 125, i.e., adhesive material, and (2) a second heat sink or spreader 484, made of a copper or aluminum film, having a top surface mounted to a bottom surface of the first heat sink or spreader 384 via a glue layer 126, i.e., adhesive material. Each of its first and second heat sinks or spreaders 384 and 484 may have a thickness in a vertical direction between 50 micrometers and 3 millimeters. For the fourteenth type of chip package 220, its semiconductor IC chip 100 may have a sidewall coplanar, in a vertical direction, with a sidewall of its first heat sink or spreader 384. Further, the semiconductor IC chip 100 may include the first heat sink or spreader 384 attached to the bottom of the fourth interconnection scheme for a chip 181 of the semiconductor IC chip 100.

Referring to FIG. 20, for the fourteenth type of chip package 220, the bottommost one of the interconnection metal layers 27 of the fourth interconnection scheme for a chip 181 of its semiconductor IC chip 100 may include a ground plane, buses or interconnection scheme 183; one of the interconnection metal layers 27 of the fourth interconnection scheme for a chip 181 of its semiconductor IC chip 100, neighboring to the ground plane, buses or interconnection scheme 183, may include a power plane, buses or interconnection scheme 182 aligned with the ground plane, buses or interconnection scheme 183; the fourth interconnection scheme for a chip 181 of its semiconductor IC chip 100 may include a high dielectric-constant layer (not shown), i.e., insulating dielectric layer, between the power and ground planes, buses or interconnection schemes 182 and 183, wherein the high dielectric-constant layer may have a dielectric constant equal to or greater than 3, 5, 10, 30, 50 or 100, for example, and may be made of silicon oxide, silicon nitride, oxynitride, hafnium silicate, zirconium silicate, hafnium dioxide or zirconium dioxide. Its semiconductor IC chip 100 may be formed with a decoupling capacitor therein provided by the power and ground planes, buses or interconnection schemes 182 and 183 and high dielectric-constant layer of the fourth interconnection scheme for a chip 181 of its semiconductor IC chip 100.

Referring to FIG. 20, for the fourteenth type of chip package 220, the through silicon vias (TSVs) 157 of its semiconductor IC chip 100 may include (1) multiple power vias 157a for delivering a voltage (Vcc) of power supply each coupling to the power plane, buses or interconnection scheme 182 of the fourth interconnection scheme for a chip 181 of its semiconductor IC chip 100 through each of the interconnection metal layers 6 of the third interconnection scheme for a chip 179 of its semiconductor IC chip 100, and (2) multiple ground vias 157b for delivering a voltage (Vss) of ground reference each coupling to the ground plane, buses or interconnection scheme 183 of the fourth interconnection scheme for a chip 181 of its semiconductor IC chip 100 through each of the interconnection metal layers 6 of the third interconnection scheme for a chip 179 of its semiconductor IC chip 100 and one or more of the interconnection metal layers 27 of the fourth interconnection scheme for a chip 181 of its semiconductor IC chip 100.

Referring to FIG. 20, for the fourteenth type of chip package 220, a first one of the micro-bumps, micro-pillars or micro-pads 34 of its semiconductor IC chip 100 may couple, for power (voltage) delivery, to a first one of the semiconductor devices 4, i.e., transistors, of its semiconductor IC chip 100 through, in sequence, a first metal interconnect constructed from each of the interconnection metal layers 27 of the second interconnection scheme for a chip (SISC) 29 of its semiconductor IC chip 100 (optionally formed) and/or each of the interconnection metal layers 6 of the first interconnection scheme for a chip (FISC) 20 of its semiconductor IC chip 100, one of the power vias 157a of its semiconductor IC chip 100, the power plane, buses or interconnection scheme 182 of the fourth interconnection scheme for a chip 181 of its semiconductor IC chip 100, another of the power vias 157a of its semiconductor IC chip 100 and a second metal interconnect constructed from one or more of the interconnection metal layers 6 of the first interconnection scheme for a chip (FISC) 20 of its semiconductor IC chip 100, shown as a metal interconnect 859 in FIG. 20, wherein the first one of the micro-bumps, micro-pillars or micro-pads 34 of its semiconductor IC chip 100 may be vertically over a metal via 6b of an upper one of the interconnection metal layer 6 of the first interconnection scheme for a chip (FISC) 20 of its semiconductor IC chip 100 in an upper one of the insulating dielectric layers 12 of the first interconnection scheme for a chip (FISC) 20 of its semiconductor IC chip and a metal pad 6c of a lower one of the interconnection metal layer 6 of the first interconnection scheme for a chip (FISC) 20 of its semiconductor IC chip 100 in a lower one of the insulating dielectric layers 12 of the first interconnection scheme for a chip (FISC) 20 of its semiconductor IC chip, wherein the metal pad 6c is on a bottom surface of the metal via 6b and a bottom surface of the upper one of the insulating dielectric layers 12 and both of the metal pad 6c and metal via 6b are provided for the metal interconnect 859. A second one of the micro-bumps, micro-pillars or micro-pads 34 of its semiconductor IC chip 100 may couple, for ground (voltage) delivery, to a second one of the semiconductor devices 4, i.e., transistors, of its semiconductor IC chip 100 through, in sequence, a third metal interconnect constructed from each of the interconnection metal layers 27 of the second interconnection scheme for a chip (SISC) 29 of its semiconductor IC chip 100 (optionally formed) and/or each of the interconnection metal layers 6 of the first interconnection scheme for a chip (FISC) 20 of its semiconductor IC chip 100, one of the ground vias 157b of its semiconductor IC chip 100, the ground plane, buses or interconnection scheme 183 of the fourth interconnection scheme for a chip 181 of its semiconductor IC chip 100, another of the ground vias 157b of its semiconductor IC chip 100 and a fourth metal interconnect constructed from one or more of the interconnection metal layers 6 of the first interconnection scheme for a chip (FISC) 20 of its semiconductor IC chip 100, shown as a metal interconnect 860 in FIG. 20. A third one of the micro-bumps, micro-pillars or micro-pads 34 of its semiconductor IC chip 100 may couple, for signal or clock transmission or power or ground (voltage) delivery, to a third one of the semiconductor devices 4, i.e., transistors, of its semiconductor IC chip 100 through, in sequence, each of the interconnection metal layers 27 of the second interconnection scheme for a chip (SISC) 29 of its semiconductor IC chip 100 (optionally formed) and/or each of the interconnection metal layers 6 of the first interconnection scheme for a chip (FISC) 20 of its semiconductor IC chip 100, shown as a metal interconnect 861 in FIG. 20, wherein the metal interconnect 861 has two ends joining the third one of the micro-bump, micro-pillar or micro-pad 34 and the third one of the semiconductor devices 4 respectively, extending only over the semiconductor substrate 2 of its semiconductor IC chip 100.

Referring to FIG. 20, for the fourteenth type of chip package 220, its semiconductor IC chip 100 may be used for (1) an application-specific integrated-circuit (ASIC) chip, (2) a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, or (3) a memory IC chip, such as volatile memory IC chip, non-volatile memory (NVM) IC chip, NAND or NOR flash chip, magnetoresistive random-access-memory (MRAM) IC chip, resistive random-access-memory (RRAM) IC chip, ferroelectric random access memory (FRAM) IC chip, high-bandwidth-memory (HBM) IC chip, static-random-access-memory (SRAM) IC chip or dynamic-random-access-memory (DRAM) IC chip.

Fifteenth Type of Chip Package

Figure 21:
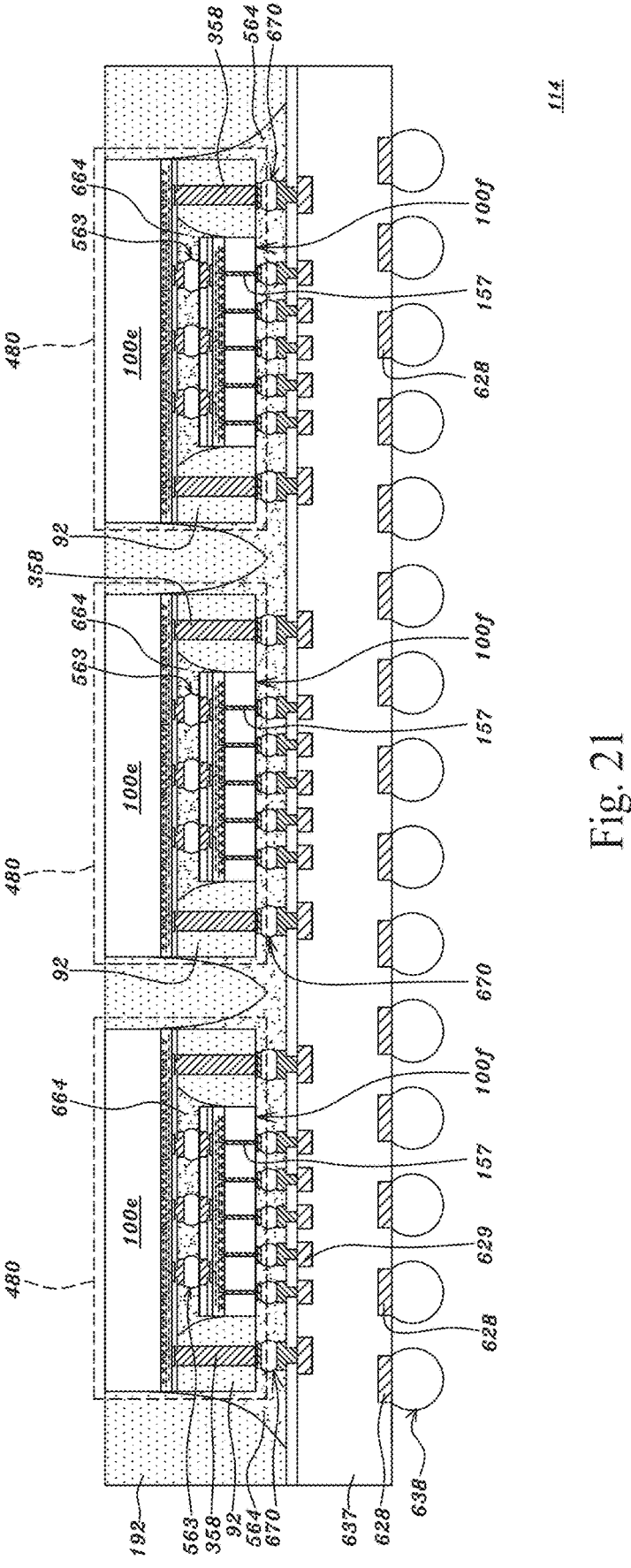
FIG. 21 is a schematically cross-sectional view showing a fifteenth type of chip package in accordance with an embodiment of the present application.

FIG. 21 is a schematically cross-sectional view showing a fifteenth type of chip package in accordance with an embodiment of the present application. Referring to FIG. 21, a fifteenth type of chip package 114 may include (1) a circuit substrate 637 having multiple metal pads 629 at a top surface thereof and multiple metal pads 628 at a bottom surface thereof, wherein its circuit substrate 637 may include multiple metal traces therein each coupling one of the metal pads 629 thereof to one of the metal pads 628 thereof, (2) multiple solder balls 638, made of a tin-lead alloy or tin-silver-copper alloy, each on one of the metal pads 628 of its circuit substrate 637, wherein its solder balls 638 may act as external pins of the fifteenth type of chip package 114 to couple or bond to its external circuits, and (3) multiple subsystem units 480 bonded to a top surface of its circuit substrate 637. For the fifteenth type of chip package 114, each of its subsystem units 480 may include (1) a top semiconductor IC chip 100e having the specification for the first type of semiconductor IC chip 100 illustrated in FIG. 3A to be turned upside down, which may be used for an application-specific integrated-circuit (ASIC) chip, a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip or digital-signal-processing (DSP) IC chip, a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip, or an input/output IC chip, (2) a bottom semiconductor IC chip 100f under its top semiconductor IC chip 100e, wherein its bottom semiconductor IC chip 100f may have the specification for the second type of semiconductor IC chip 100 illustrated in FIG. 3B, which may be used for an application-specific integrated-circuit (ASIC) chip, a logic IC chip, such as FPGA IC chip or chiplet, graphic-processing unit (GPU) IC chip, data-processing-unit (DPU) IC chip, central-processing-unit (CPU) IC chip, application-processing-unit (APU) IC chip, tensor-flow-processing-unit (TPU) IC chip, micro-control-unit (MCU) IC chip, artificial-intelligent-unit (AIU) IC chip, machine-learning-unit (MLU) IC chip, application-specific-integrated-circuit (ASIC) chip or digital-signal-processing (DSP) IC chip, a memory IC chip, such as volatile memory IC chip, non-volatile memory IC chip, NAND or NOR flash chip, MRAM IC chip, RRAM IC chip, FRAM IC chip, HBM IC chip, SRAM IC chip or DRAM IC chip, or an input/output IC chip, and (3) multiple through package vias (TPVs) 358 under its top semiconductor IC chip 100e and at a same horizontal level as its bottom semiconductor IC chip 100f. For example, in a first combination, the top semiconductor IC chip 100e of each of the subsystem units 480 of the fifteenth type of chip package 114 may be the logic IC chip, and the bottom semiconductor IC chip 100f of each of the subsystem units 480 of the fifteenth type of chip package 114 may be the memory IC chip; in a second combination, the top semiconductor IC chip 100e of each of the subsystem units 480 of the fifteenth type of chip package 114 may be the logic IC chip, and the bottom semiconductor IC chip 100f of each of the subsystem units 480 of the fifteenth type of chip package 114 may be the input/output (IO) IC chip 411; in a third combination, the bottom semiconductor IC chip 100f of each of the subsystem units 480 of the fifteenth type of chip package 114 may be the logic IC chip, and the top semiconductor IC chip 100e of each of the subsystem units 480 of the fifteenth type of chip package 114 may be the memory IC chip; in a fourth combination, the bottom semiconductor IC chip 100f of each of the subsystem units 480 of the fifteenth type of chip package 114 may be the logic IC chip, and the top semiconductor IC chip 100e of each of the subsystem units 480 of the fifteenth type of chip package 114 may be the input/output (I/O) IC chip 411. Alternatively, the top semiconductor IC chip 100e of each of the subsystem units 480 of the fifteenth type of chip package 114 may be replaced with the first type of field programmable chip-on-chip module 400 as seen in FIG. 5A to be turned upside down. Alternatively, the bottom semiconductor IC chip 100f of each of the subsystem units 480 of the fifteenth type of chip package 114 may be replaced with the second type of field programmable chip-on-chip module 400 as seen in FIG. 5B.

Referring to FIG. 21, for the fifteenth type of chip package 114, the bottom semiconductor IC chip 100f of each of its subsystem units 480, or the second FPGA IC chip or chiplet 200b of the second type of field programmable chip-on-chip module 400 of said each of its subsystem units 480 in case of replacing the bottom semiconductor IC chip 100f of said each of its subsystem units 480, may have the first, second, third or fourth type of micro-bumps, micro-pillars or micro-pads 34 to be bonded to the top semiconductor IC chip 100e of said each of its subsystem units 480, or the second FPGA IC chip or chiplet 200b of the first type of field programmable chip-on-chip module 400 of said each of its subsystem units 480 in case of replacing the top semiconductor IC chip 100e of said each of its subsystem units 480, to form multiple metal contacts 563 between the top semiconductor IC chip 100e of said each of its subsystem units 480, or the second FPGA IC chip or chiplet 200b of the first type of field programmable chip-on-chip module 400 of said each of its subsystem units 480 in case of replacing the top semiconductor IC chip 100e of said each of its subsystem units 480, and the bottom semiconductor IC chip 100f of said each of its subsystem units 480, or the second FPGA IC chip or chiplet 200b of the second type of field programmable chip-on-chip module 400 of said each of its subsystem units 480 in case of replacing the bottom semiconductor IC chip 100f of said each of its subsystem units 480, wherein each of its metal contacts 563 may include (1) a copper layer having a thickness between 2 μm and 20 μm and a largest transverse dimension 1 μm and 15 μm between the top semiconductor IC chip 100e of each of its subsystem units 480, or the second FPGA IC chip or chiplet 200b of the first type of field programmable chip-on-chip module 400 of said each of its subsystem units 480 in case of replacing the top semiconductor IC chip 100e of said each of its subsystem units 480, and the bottom semiconductor IC chip 100f of said each of its subsystem units 480, or the second FPGA IC chip or chiplet 200b of the second type of field programmable chip-on-chip module 400 of said each of its subsystem units 480 in case of replacing the bottom semiconductor IC chip 100f of said each of its subsystem units 480, and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and the top semiconductor IC chip 100e of said each of its subsystem units 480, or the second FPGA IC chip or chiplet 200b of the first type of field programmable chip-on-chip module 400 of said each of its subsystem units 480 in case of replacing the top semiconductor IC chip 100e of said each of its subsystem units 480. Each of its subsystem units 480 may further include an underfill 664, i.e., polymer layer, between the top semiconductor IC chip 100e of said each of its subsystem units 480, or the second FPGA IC chip or chiplet 200b of the first type of field programmable chip-on-chip module 400 of said each of its subsystem units 480 in case of replacing the top semiconductor IC chip 100e of said each of its subsystem units 480, and the bottom semiconductor IC chip 100f of said each of its subsystem units 480, or the second FPGA IC chip or chiplet 200b of the second type of field programmable chip-on-chip module 400 of said each of its subsystem units 480 in case of replacing the bottom semiconductor IC chip 100f of said each of its subsystem units 480, covering a sidewall of each of its metal contacts 563 between the top semiconductor IC chip 100e of said each of its subsystem units 480, or the second FPGA IC chip or chiplet 200b of the first type of field programmable chip-on-chip module 400 of said each of its subsystem units 480 in case of replacing the top semiconductor IC chip 100e of said each of its subsystem units 480, and the bottom semiconductor IC chip 100f of said each of its subsystem units 480, or the second FPGA IC chip or chiplet 200b of the second type of field programmable chip-on-chip module 400 of said each of its subsystem units 480 in case of replacing the bottom semiconductor IC chip 100f of said each of its subsystem units 480.

Referring to FIG. 21, for the fifteenth type of chip package 114, each of its subsystem units 480 may further include a polymer layer 92, i.e., insulating dielectric layer, made of molding compound, epoxy-based material, polyimide or silicon oxide for example, in multiple gaps each between neighboring two of the through package vias (TPVs) 358 thereof and a gap between the bottom semiconductor IC chip 100f thereof and each of the through package vias (TPVs) 358 thereof adjacent to the bottom semiconductor IC chip 100f thereof, or between the second type of field programmable chip-on-chip module 400 thereof, in case of replacing the bottom semiconductor IC chip 100f thereof, and each of the through package vias (TPVs) 358 thereof adjacent to the second type of field programmable chip-on-chip module 400 thereof, wherein each of the through package vias (TPVs) 358 thereof may extend vertically through the polymer layer 92 thereof from a bottom surface of the top semiconductor IC chip 100e thereof, or a bottom surface of the second FPGA IC chip or chiplet 200b of the first type of field programmable chip-on-chip module 400 thereof in case of replacing the top semiconductor IC chip 100e thereof, and each of the through package vias (TPVs) 358 may be made of a copper layer having a thickness between 20 μm and 300 μm, 30 μm and 200 μm, 50 μm and 150 μm, 50 μm and 120 μm, 20 μm and 100 μm, 10 μm and 100 μm, 20 μm and 60 μm, 20 μm and 40 μm, or 20 μm and 30 μm, or greater than or equal to 100 μm, 50 μm, 30 μm or 20 μm. Each of the through package vias (TPVs) 358 of each of its subsystem units 480 may couple to a voltage of power supply for delivering a power supply or a voltage of ground reference for delivering a ground reference or may pass signals or clocks for signal or clock transmission. For the fifteenth type of chip package 114, the polymer layer 92 of each of its subsystem units 480, the semiconductor substrate 2 of the bottom semiconductor IC chip 100f of said each of its subsystem units 480 and the semiconductor substrate 2 of the first FPGA IC chip or chiplet 200a of the second type of field programmable chip-on-chip module 400 of said each of its subsystem units 480 in case of replacing the bottom semiconductor IC chip 100f of said each of its subsystem units 480 may have a portion at a backside thereof removed by a chemical-mechanical-polishing (CMP) or mechanical grinding process such that each of the through silicon vias (TSVs) 157 of the bottom semiconductor IC chip 100*f* of said each of its subsystem units 480, or each of the through silicon vias (TSVs) 157 of the first FPGA IC chip or chiplet 200*a* of the second type of field programmable chip-on-chip module 400 of said each of its subsystem units 480 in case of replacing the bottom semiconductor IC chip 100*f* of said each of its subsystem units 480, that is, the electroplated copper layer 156 of said each of the through silicon vias (TSVs) 157, may have a backside substantially coplanar with the backside of the semiconductor substrate 2 of the bottom semiconductor IC chip 100*f* of said each of its subsystem units 480, the backside of the semiconductor substrate 2 of the first FPGA IC chip or chiplet 200*a* of the second type of field programmable chip-on-chip module 400 of said each of its subsystem units 480 in case of replacing the bottom semiconductor IC chip 100*f* of said each of its subsystem units 480 and a bottom surface of the polymer layer 92 of said each of its subsystem units 480. The semiconductor substrate 2 of the bottom semiconductor IC chip 100*f* of said each of its subsystem units 480, or the semiconductor substrate 2 of the first FPGA IC chip or chiplet 200*a* of the second type of field programmable chip-on-chip module 400 of said each of its subsystem units 480 in case of replacing the bottom semiconductor IC chip 100*f* of said each of its subsystem units 480, may have a thickness thinner than 20, 10, 5, or 3 micrometers, or between 0.5 and 20 micrometers, 0.5 and 10 micrometers, 0.3 and 5 micrometers or 0.3 and 3 micrometers, and each of the through silicon vias (TSVs) 157 of the bottom semiconductor IC chip 100*f* of said each of its subsystem units 480, or each of the through silicon vias (TSVs) 157 of the first FPGA IC chip or chiplet 200*a* of the second type of field programmable chip-on-chip module 400 of said each of its subsystem units 480 in case of replacing the bottom semiconductor IC chip 100*f* of said each of its subsystem units 480, may have a width, diameter or maximum transverse dimension smaller than 20, 10, 5, 1 or 0.1 micrometers.

Referring to FIG. 21, for the fifteenth type of chip package 114, each of its subsystem units 480 may further include multiple metal bumps, pillars or pads 670 in an array at a bottom thereof, each of which may be one type of the first, second, third and fourth types having the same specification as that of the first, second, third and fourth types of micro-bumps, micro-pillars or micro-pads 34 respectively as illustrated in FIG. 3A to be turned upside down. Each of the first, second, third or fourth type of metal bumps, pillars or pads 670 of said each of its subsystem units 480 may have the adhesion layer 26*a* on a bottom surface of one of the through silicon vias (TSVs) 157 of the bottom semiconductor IC chip 100*f* of said each of its subsystem units 480, on a bottom surface of one of the through silicon vias (TSVs) 157 of the first FPGA IC chip or chiplet 200*a* of the second type of field programmable chip-on-chip module 400 of said each of its subsystem units 480 in case of replacing the bottom semiconductor IC chip 100*f* of said each of its subsystem units 480, or on a bottom surface of one of the through package vias (TPVs) 358 of said each of its subsystem units 480.

Referring to FIG. 21, for the fifteenth type of chip package 114, each of its subsystem units 480 may have the first, second, third or fourth type of metal bumps, pillars or pads 670 each bonded to one of the metal pads 629 of its circuit substrate 637. The fifteenth type of chip package 114 may further include (1) an underfill 564, i.e., polymer layer, between each of its subsystem units 480 and its circuit substrate 637, covering a sidewall of each of the first, second, third or fourth type of metal bumps, pillars or pads 670 of said each of its subsystem units 480, and (2) a polymer layer 192, i.e., insulating dielectric layer, made of molding compound, epoxy-based material, polyimide or silicon oxide for example, on its circuit substrate 637 and underfill 564, wherein its polymer layer 192 may have a top surface coplanar with a top surface of the top semiconductor IC chip 100*e* of each of its subsystem units 480, or a top surface of the first FPGA IC chip or chiplet 200*a* of the first type of field programmable chip-on-chip module 400 of said each of its subsystem units 480 in case of replacing the top semiconductor IC chip 100*e* of said each of its subsystem units 480.

For the fifteenth type of chip package 114 as seen in FIG. 21, the bottom semiconductor IC chip 100*f* of each of its subsystem units 480 may have a first set of small I/O circuits coupling respectively to a second set of small I/O circuits of the top semiconductor IC chip 100*a* of said each of its subsystem units 480 through a set of metal contacts 563 of said each of its subsystem units 480. Alternatively, the top semiconductor IC chip 100*e* of any first one of its subsystem units 480 may be replaced with the first type of field programmable chip-on-chip module 400 as seen in FIG. 5A to be turned upside down, wherein the bottom semiconductor IC chip 100*f* of the first one of its subsystem units 480 may have the first set of small I/O circuits coupling respectively to a third set of small I/O circuits of the second FPGA IC chip or chiplet 200*b* of the first type of field programmable chip-on-chip module 400 of the first one of its subsystem units 480 through a set of metal contacts 563 of said each of its subsystem units 480 respectively. Alternatively, the bottom semiconductor IC chip 100*f* of any second one of its subsystem units 480 may be replaced with the second type of field programmable chip-on-chip module 400 as seen in FIG. 5B, wherein the top semiconductor IC chip 100*e* of the second one of its subsystem units 480 may have the second set of small I/O circuits coupling respectively to a fourth set of small I/O circuits of the second FPGA IC chip or chiplet 200*b* of the second type of field programmable chip-on-chip module 400 of the second one of its subsystem units 480 through a set of metal contacts 563 of said each of its subsystem units 480 respectively. It is noted that each of the first, second, third and fourth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For a specific example, for the fifteenth type of chip package 114, in the case that the number of its subsystem units 480 is three as seen in FIG. 21, the top semiconductor IC chip 100*e* of a middle one of its subsystem units 480 may be a central-processing-unit (CPU) IC chip, the top semiconductor IC chip 100*e* of a right one of its subsystem units 480 may be a graphic-processing unit (GPU) IC chip, i.e., data-processing-unit (DPU) IC chip, the top semiconductor IC chip 100*e* of a left one of its subsystem units 480 may be the FPGA IC chip, and the bottom semiconductor IC chip 100*f* of each of its subsystem units 480 is the HEM IC chip, such as SRAM IC chip or DRAM IC chip. The bottom semiconductor IC chip 100*f* of each of its subsystem units 480 may couple to the top semiconductor IC chip 100*e* of said each of its subsystem units 480 for parallel data transmission with a data bit width of equal to or greater than 64, 128, 256, 512, 1024, 2048, 4096, 8K, or 16K. Alternatively, the FPGA IC chip for the top semiconductor IC chip 100*e* of the left one of its subsystem units 480 may be replaced with the first type of field programmable chip-on-chip module 400 as seen in FIG. 5A to be turned upside down, wherein the bottom semiconductor IC chip 100*f* of the left one of its subsystem units 480 may couple to the second FPGA IC chip or chiplet 200*b* of the first type of field programmable chip-on-chip module 400 of the left one of its subsystem units 480 for parallel data transmission with a data bit width of equal to or greater than 64, 128, 256, 512, 1024, 2048, 4096, 8K, or 16K.

Further, for the fifteenth type of chip package 114 as seen in FIG. 21, the top semiconductor IC chip 100*e* of each of its subsystem units 480, or each of the first and second FPGA IC chips or chiplets 200*a* and 200*b* of the first type of field programmable chip-on-chip module 400 of said each of its subsystem units 480 in case of replacing the top semiconductor IC chip 100*e* of said each of its subsystem units 480, may be fabricated or implemented in a technology node equal to or more advanced than 10 nm or 5 nm, for example, in 10 nm, 7 nm, 5 nm, 3 nm or 2 nm. A voltage (Vcc or Vdd) of power supply used in the top semiconductor IC chip 100*e* of each of its subsystem units 480, or each of the first and second FPGA IC chips or chiplets 200*a* and 200*b* of the first type of field programmable chip-on-chip module 400 of said each of its subsystem units 480 in case of replacing the top semiconductor IC chip 100*e* of said each of its subsystem units 480, may be between 0.1 and 0.5 volts, between 0.1 and 0.4 volts or between 0.1 and 0.3 volts, or may be smaller than or equal to 0.5, 0.4, 0.3 or 0.2 volts. For example, the top semiconductor IC chip 100*e* of said each of its subsystem units 480, or each of the first and second FPGA IC chips or chiplets 200*a* and 200*b* of the first type of field programmable chip-on-chip module 400 of said each of its subsystem units 480 in case of replacing the top semiconductor IC chip 100*e* of said each of its subsystem units 480, may be formed with fin field effective transistors (FINFETs) or gate-all-around field effective transistors (GAAFETs), each of which may be referred to those as illustrated in either of FIGS. 5G and 5H, with a threshold voltage between 0.1 and 0.4 volts, between 0.1 and 0.3 volts, between 0.1 and 0.2 volts, or smaller than or equal to 0.4, 0.3 or 0.2 volts, wherein the threshold voltage is defined when the drain current thereof is at 30 nano-amperes and the voltage (Vcc or Vdd) of power supply is between 0.1 and 0.5 volts, between 0.1 and 0.4 volts or between 0.1 and 0.3 volts or smaller than or equal to 0.5, 0.4, 0.3 or 0.2 volts.

Sixteenth Type of Chip Package for Fan-Out Interconnection Technology (FOIT)

Figure 22A:
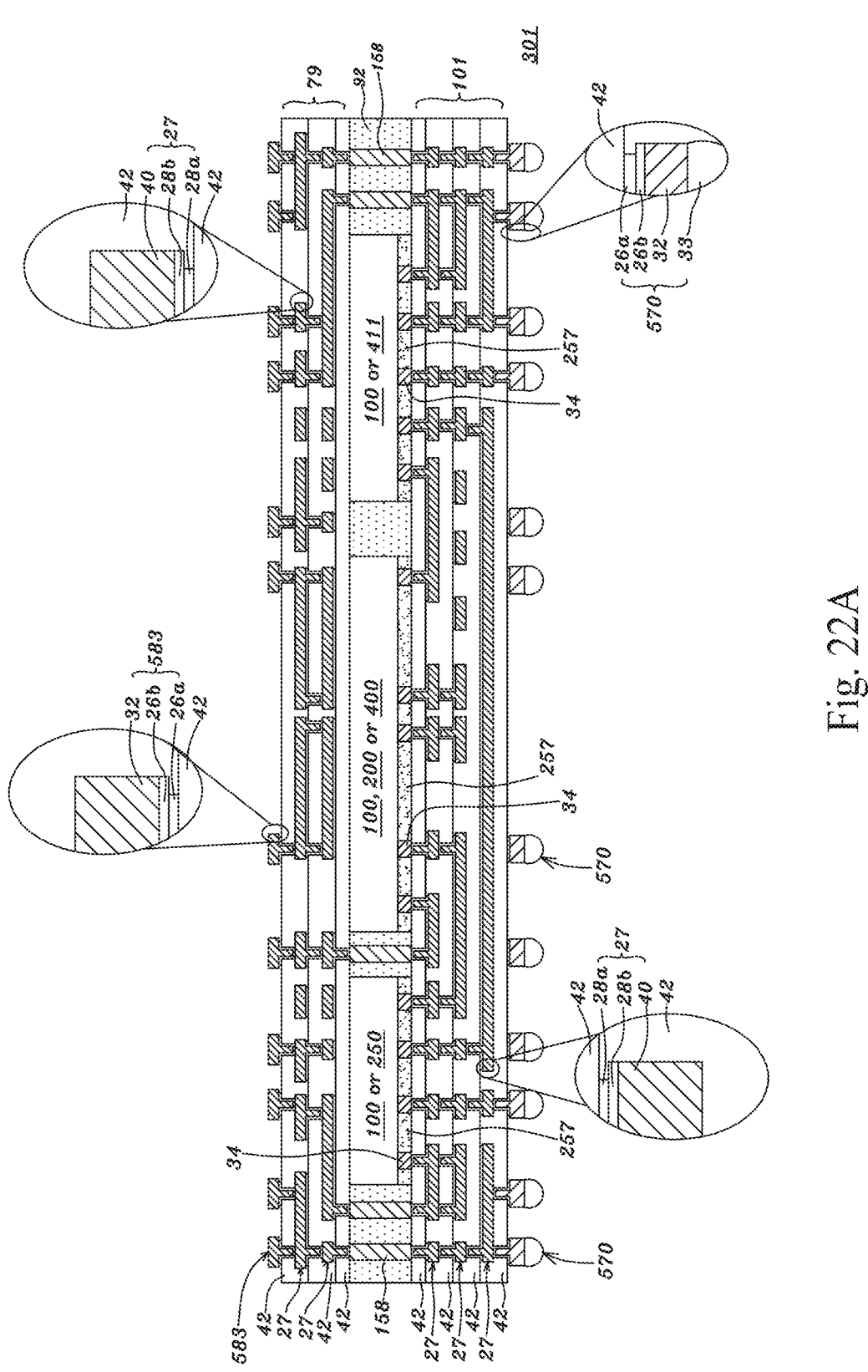
FIG. 22A is a schematically cross-sectional view showing a sixteenth type of chip package in accordance with an embodiment of the present application.

FIG. 22A is a schematically cross-sectional view showing a sixteenth type of chip package in accordance with an embodiment of the present application. Referring to FIG. 22A, a sixteenth type of chip package 301 may include multiple semiconductor IC chips 100, each of which may have the specification for the third type of semiconductor IC chips 100 as illustrated in FIG. 3C to be turned upside down, arranged in a horizontal level, wherein each of its semiconductor IC chips 100 may be a application-specific integrated-circuit (ASIC) chip, standard commodity FPGA IC chip or chiplet, graphic-processing unit (GPU) IC chip, central-processing-unit (CPU) IC chip, digital-signal-processing (DSP) IC chip, tensor-flow-processing-unit (TPU) IC chip, micro-control-unit (MCU) IC chip, artificial-intelligent-unit (MU) IC chip, machine-learning-unit (MLU) IC chip, data-processing-unit (DPU) IC chip, application-processing-unit (APU) IC chip, high-bandwidth-memory (HBM) IC chip, non-volatile memory (NVM) IC chip, IAC chip, dedicated control and input/output (I/O) chip, cooperating and supporting (CS) IC chip or dedicated input/output (I/O) chip. For a specific example of the sixteenth type of chip package 301, in the case that the number of its semiconductor IC chips 100 is three as seen in FIG. 22A, a middle one of its semiconductor IC chips 100 may be a FPGA IC chip or chiplet 200, a right one of its semiconductor IC chips 100 may be a cooperating and supporting (CS) IC chip 411 and a left one of its semiconductor IC chips 100 may be a non-volatile memory (NVM) IC chip 250, such as NAND or NOR flash chip, MRAM IC chip, RRAM IC chip or FRAM IC chip. Alternatively, its FPGA IC chip or chiplet 200 may be replaced with the third type of field programmable chip-on-chip module 400 as seen in FIG. 5C to be turned upside down. The sixteenth type of chip package 301 may further include (1) a polymer layer 92, i.e., insulating dielectric layer, made of molding compound, epoxy-based material, polyimide or silicon oxide for example, in a space extending horizontally from each sidewall of each of its semiconductor IC chips 100 and in multiple gaps each between neighboring two of its semiconductor IC chips 100 and third type of field programmable chip-on-chip modules 400 in case of replacing its standard commodity FPGA IC chips or chiplets 200, (2) multiple through package vias (TPVs) 158 in the polymer layer 92, wherein each of its through package vias (TPVs) 158 may be made of a copper layer having a height or thickness between 20 μm and 300 μm, 30 μm and 200 μm, 50 μm and 150 μm, 50 μm and 120 μm, 20 μm and 100 μm, 10 μm and 100 μm, 20 μm and 60 μm, 20 μm and 40 μm, or 20 μm and 30 μm, or greater than or equal to 100 μm, 50 μm, 30 μm or 20 μm, (3) a frontside interconnection scheme for a logic drive or device (FISD) 101 under its semiconductor IC chips 100, or third type of field programmable chip-on-chip modules 400 in case of replacing its standard commodity FPGA IC chips or chiplets 200, polymer layer 92 and through package vias (TPVs) 158, (4) a backside interconnection scheme 79 for a logic drive or device (BISD) over its semiconductor IC chips 100, or third type of field programmable chip-on-chip modules 400 in case of replacing its standard commodity FPGA IC chips or chiplets 200, polymer layer 92 and through package vias (TPVs) 158, (5) multiple metal bumps, pillars or pads 570 in an array at a bottom of the sixteenth type of chip package 301 and on a bottom surface of its FISD 101 to act as external pins of the sixteenth type of chip package 301, and (6) multiple metal pads 583 in an array at a top of the sixteenth type of chip package 301 and on a top surface of its BISD 79. Each of its through package vias (TPVs) 158 may couple to a voltage of power supply for delivering a power supply or a voltage of ground reference for delivering a ground reference or may pass signals or clocks for signal or clock transmission.

Referring to FIG. 22A, for each of the semiconductor IC chips 100 of the sixteenth type of chip package 301, or the second FPGA IC chip or chiplet 200*b* of each of the third type of field programmable chip-on-chip modules 400 of the sixteenth type of chip package 301 in case of replacing the standard commodity FPGA IC chips or chiplets 200 of the sixteenth type of chip package 301, its micro-bumps, micro-pillars or micro-pads 34 may have a bottom surface joining a top surface of the FISD 101 of the sixteenth type of chip package 301, and its polymer layer 257 may have a bottom surface substantially coplanar with the bottom surface of each of its micro-bumps, micro-pillars or micro-pads 34, a bottom surface of the polymer layer 92 of the sixteenth type of chip package 301 and a bottom surface of each of the through package vias (TPVs) 158 of the sixteenth type of chip package 301, and joining the top surface of the FISD 101 of the sixteenth type of chip package 301.

Referring to FIG. 22A, for the sixteenth type of chip package 301, its FISD 101 may be provided with (1) one or more interconnection metal layers 27 coupling to each of the micro-bumps, micro-pillars or micro-pads 34 of each of its semiconductor IC chips 100, or each of the micro-bumps, micro-pillars or micro-pads 34 of the second FPGA IC chip or chiplet 200b of each of its third type of field programmable chip-on-chip modules 400 in case of replacing its standard commodity FPGA IC chips or chiplets 200, and (2) one or more polymer layers 42, i.e., insulating dielectric layers, each between neighboring two of the interconnection metal layers 27 of its FISD 101, under the bottommost one of the interconnection metal layers 27 of its FISD 101 or over the topmost one of the interconnection metal layers 27 of its FISD 101, wherein an upper one of the interconnection metal layers 27 of its FISD 101 may couple to a lower one of the interconnection metal layers 27 of its FISD 101 through an opening in one of the polymer layers 42 of its FISD 101 between the upper and lower ones of the interconnection metal layers 27 of its FISD 101. The topmost one of the polymer layers 42 of its FISD 101 may have a top surface in contact with the bottom surface of the polymer layer 257 of each of its semiconductor IC chips 100, or the bottom surface of the polymer layer 257 of the second FPGA IC chip or chiplet 200b of each of its third type of field programmable chip-on-chip modules 400 in case of replacing its standard commodity FPGA IC chips or chiplets 200, and the bottom surface of its polymer layer 92. The topmost one of the polymer layers 42 of its FISD 101 may be between the topmost one of the interconnection metal layers 27 of its FISD 101 and its polymer layer 92 and between the topmost one of the interconnection metal layers 27 of its FISD 101 and the frontside of each of its semiconductor IC chips 100, or the frontside of the second FPGA IC chip or chiplet 200b of each of its third type of field programmable chip-on-chip modules 400 in case of replacing its standard commodity FPGA IC chips or chiplets 200, wherein each opening in the topmost one of polymer layers 42 of its FISD 101 may be under one of the micro-bumps, micro-pillars or micro-pads 34 of one of its semiconductor IC chips 100, or one of the micro-bumps, micro-pillars or micro-pads 34 of the second FPGA IC chip or chiplet 200b of one of its third type of field programmable chip-on-chip modules 400 in case of replacing its standard commodity FPGA IC chips or chiplets 200, or one of its through package vias (TPVs) 158, and thus the topmost one of the interconnection metal layers 27 of its FISD 101 may extend through said each opening to couple to said one of the micro-bumps, micro-pillars or micro-pads 34 or said one of its through package vias (TPVs) 158. Each of the interconnection metal layers 27 of its FISD 101 may extend horizontally across an edge of each of its semiconductor IC chips 100, or an edge of each of its third type of field programmable chip-on-chip modules 400 in case of replacing its standard commodity FPGA IC chips or chiplets 200. The bottommost one of the interconnection metal layers 27 of its FISD 101 may have multiple metal contacts at tops of multiple respective openings 42a in the bottommost one of the polymer layers 42 of its FISD 101. The specification and process for the interconnection metal layers 27 and polymer layers 42 for the frontside interconnection scheme for a logic drive or device (FISD) 101 may be referred to those for the SISC 29 as illustrated in FIG. 3A to be turned upside down.

Referring to FIG. 22A, for the frontside interconnection scheme for a logic drive or device (FISD) 101 of the sixteenth type of chip package 301, each of its polymer layers 42 may be a layer of polyimide, benzocyclobutene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more upper portions in openings in one of its polymer layers 42, and a lower portion having a thickness 0.3 μm and 20 μm under said one of its polymer layers 42, (2) an adhesion layer 28a, such as titanium or titanium nitride having a thickness between 1 nm and 50 nm, at a top and sidewall of each of the one or more upper portions of the copper layer 40 of said each of the metal traces or lines and at a top of the lower portion of the copper layer 40 of said each of the metal traces or lines, and (3) a seed layer 28b, such as copper, between the copper layer 40 and adhesion layer 28a of said each of the metal traces or lines, wherein the lower portion of the copper layer 40 of said each of the metal traces or lines may have a sidewall not covered by the adhesion layer 28a of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Referring to FIG. 22A, the BISD 79 of the sixteenth type of chip package 301 may be provided with one or more interconnection metal layers 27 coupling to each of the through package vias (TPVs) 158 of the sixteenth type of chip package 301 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the sixteenth type of chip package 301, the bottommost one of the polymer layers 42 of its BISD 79 may be between the bottommost one of the interconnection metal layers 27 of its BISD 79 and its polymer layer 92 and between the bottommost one of the interconnection metal layers 27 of its BISD 79 and the backside of each of its semiconductor IC chips 100, or the backside of the first FPGA IC chip or chiplet 200a of each of its third type of field programmable chip-on-chip modules 400 in case of replacing its standard commodity FPGA IC chips or chiplets 200, wherein each opening in the bottommost one of the polymer layers 42 of its BISD 79 may be vertically over one of its through package vias (TPVs) 158, and thus the bottommost one of the interconnection metal layers 27 of its BISD 79 may extend through said each opening to couple to said one of its through package vias (TPVs) 158. Each of the interconnection metal layers 27 of its BISD 79 may extend horizontally across an edge of each of its semiconductor IC chips 100, or an edge of each of its third type of field programmable chip-on-chip modules 400 in case of replacing its standard commodity FPGA IC chips or chiplets 200. The specification and process for the interconnection metal layers 27 and polymer layers 42 for its backside interconnection scheme for a logic drive or device (BISD) 79 may be referred to those for the SISC 29 as illustrated in FIG. 3A.

Referring to FIG. 22A, each of the metal bumps, pillars or pads 570 of the sixteenth type of chip package 301 may be of various types. A first type of metal bumps, pillars or pads 570 of the sixteenth type of chip package 301 each may include (1) an adhesion layer 26a, such as titanium (Ti) or titanium nitride (TiN) layer having a thickness between 1 nm and 50 nm, on a bottom surface of one of the metal contacts of the bottommost one of the interconnection metal layers 27 of the FISD 101 of the sixteenth type of chip package 301, (2) a seed layer 26b, such as copper, on and under its adhesion layer 26a and (3) a copper layer 32 having a thickness between 1 μm and 60 μm on and under its seed layer 26b. Alternatively, a second type of metal bumps, pillars or pads 570 of the sixteenth type of chip package 301 each may include the adhesion layer 26a, seed layer 26b and copper layer 32 as mentioned above, and may further include a tin-containing solder cap 33 made of tin or a tin-silver alloy having a thickness between 1 μm and 50 μm or between 20 μm and 100 μm on and under its copper layer 32. Alternatively, a third type of metal bumps, pillars or pads 570 of the sixteenth type of chip package 301 each may include a gold layer having a thickness between 3 and 15 micrometers under one of the metal contacts of the bottommost one of the interconnection metal layers 27 of the FISD 101 of the sixteenth type of chip package 301.

Referring to FIG. 22A, each of the metal pads 583 of the sixteenth type of chip package 301 may include (1) an adhesion layer 26a, such as titanium (Ti) or titanium nitride (TiN) layer having a thickness between 1 nm and 50 nm, on the topmost one of the interconnection metal layers 27 of the BISD 101 of the sixteenth type of chip package 301, (2) a seed layer 26b, such as copper, on its adhesion layer 26a and (3) a copper layer 32 having a thickness between 1 μm and 60 μm on its seed layer 26b.

For the specific example of the sixteenth type of chip package 301 as seen in FIG. 22A, its standard commodity FPGA IC chip or chiplet 200, or each of the first and second FPGA IC chips or chiplets 200a and 200b of its third type of field programmable chip-on-chip module 400 in case of replacing its standard commodity FPGA IC chip or chiplet 200, may include any type of the first through third types of field programmable logic cell or element (LCE) 2014 as illustrated in FIGS. 1A-1C and any type of the first and second types of field programmable switch cells 379 as illustrated in FIGS. 2A and 2B. Its CS IC chip 411 include (1) multiple buffering memory cells, such as SRAM cells, to latch data associated with encrypted configuration programming memory (CPM) data, i.e., the resulting values and/or programmable codes, downloaded from multiple non-volatile memory cells of its non-volatile memory (NVM) IC chip 250 through one or more of the interconnection metal layers 27 of its FISD 101, (2) a cryptography block to decrypt the encrypted CPM data as decrypted CPM data, and (2) multiple drivers to amplify the decrypted CPM data to be passed with an increased data bit width through one or more of the interconnection metal layers 27 of its FISD 101 to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200a and 200b of its third type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its third type of field programmable chip-on-chip module 400 in case of replacing its FPGA IC chip or chiplet 200 to be stored therein. For example, the data passed through one or more of the interconnection metal layers 27 of its FISD 101 from its non-volatile memory (NVM) IC chip 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of each of its CS IC chip 411 may simultaneously output and amplify the data to be passed in parallel with an increased data bit width equal to or more than 4, 8, 16, 32 or 64, for example, through one or more of the interconnection metal layers 27 of its FISD 101 to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200a and 200b of its third type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its third type of field programmable chip-on-chip module 400 in case of replacing its FPGA IC chip or chiplet 200 to be stored therein. For another example, the data passed through one or more of the interconnection metal layers 27 of its FISD 101 from its non-volatile memory (NVM) IC chip 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data to be passed in parallel with an increased data bit width equal to or more than 64, 128 or 256, for example, through one or more of the interconnection metal layers 27 of its FISD 101 to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200a and 200b of its third type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells

379 of said either of the first and second FPGA IC chips or chiplets 200a and 200b of its third type of field programmable chip-on-chip module 400 in case of replacing its FPGA IC chip or chiplet 200 to be stored therein.

For the specific example of the sixteenth type of chip package 301 as seen in FIG. 22A, its CS IC chip 411 may include a first set of small I/O circuits each coupling to one of a second set of small I/O circuits of its FPGA IC chip or chiplet 200, or one of a third set of small I/O circuits of either of the first and second FPGA IC chips or chiplets 200a and 200b of its third type of field programmable chip-on-chip module 400 in case of replacing its standard commodity FPGA IC chip or chiplet 200, through one or more of the interconnection metal layers 27 of its frontside interconnection scheme for a logic drive or device (FISD) 101. Its CS IC chip 411 may include a first set of large I/O circuits each coupling to external circuits outside of the sixteenth type of chip package 301 or one of a second set of large I/O circuits of its NVM IC chip 250 through one or more of the interconnection metal layers 27 of its frontside interconnection scheme for a logic drive or device (FISD) 101. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For the specific example of the sixteenth type of chip package 301 as seen in FIG. 22A, its CS IC chip 411 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of its standard commodity FPGA IC chip or chiplet 200, or (2) a data input of one of multiple center-processing-unit cores (CPUC) of its standard commodity FPGA IC chip or chiplet 200, through, in sequence, the first set of small I/O circuits, one or more of the interconnection metal layers 27 of its frontside interconnection scheme for a logic drive or device (FISD) 101 and the second set of small I/O circuits, or as (1) a data input of the input data set of one of any type of the first, second and third types of field programmable logic cells or elements (LCE) 2014 of either of the first and second FPGA IC chips and chiplets 200a and 200b of its third type of field programmable chip-on-chip module 400 in case of replacing its standard commodity FPGA IC chip or chiplet 200, or (2) a data input of one of multiple center-processing-unit cores (CPUC) of either of the first and second FPGA IC chips and chiplets 200a and 200b of its third type of field programmable chip-on-chip modules 400 in case of replacing its standard commodity FPGA IC chip or chiplet 200, through, in sequence, the first set of small I/O circuits, one or more of the interconnection metal layers 27 of its frontside interconnection scheme for a logic drive or device (FISD) 101 and the third set of small I/O circuits. Further, said each of the first group of hard macros of its CS IC chip may have input data passed from (1) the data output of one of any type of the first, second and third types of field programmable logic cells or elements (LCEs) 2014 of its standard commodity FPGA IC chip or chiplet 200, or (2) one of multiple data outputs of one of the center-processing-unit cores (CPUC) of its standard commodity FPGA IC chip or chiplet 200, through, in sequence, the second set of small I/O circuits, one or more of the interconnection metal layers 27 of its frontside interconnection scheme for a logic drive or device (FISD) 101 and the first set of small I/O circuits, or from (1) the data output of one of any type of the first, second and third types of field programmable logic cells or elements (LCEs) 2014 of either of the first and second FPGA IC chips or chiplets 200a and 200b of its third type of field programmable chip-on-chip module 400 in case of replacing its standard commodity FPGA IC chip or chiplet 200, or (2) one of multiple data outputs of one of the center-processing-unit cores (CPUC) of either of the first and second FPGA IC chips and chiplets 200a and 200b of its third type of field programmable chip-on-chip module 400 in case of replacing its standard commodity FPGA IC chip or chiplet 200 through, in sequence, the third set of small I/O circuits, one or more of the interconnection metal layers 27 of its frontside interconnection scheme for a logic drive or device (FISD) 101 and the first set of small I/O circuits. Further, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its third type of field programmable chip-on-chip module 400 in case of replacing its standard commodity FPGA IC chip or chiplet 200, may be used as a networking circuit or smart interface between two of the first group of hard macros of its CS IC chip 411 for controlling coupling therebetween. For example, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its third type of field programmable chip-on-chip module 400 in case of replacing its standard commodity FPGA IC chip or chiplet 200, may be used as a networking circuit or smart interface between two of multiple central-processing-unit (CPU) cores of its CS IC chip 411 for controlling coupling therebetween, wherein the number of the central-processing-unit (CPU) cores of its CS IC chip 411 may be equal to or greater than 4, 8, 16, 32, 64, 128, 256 or 512. Each of a second group of hard macros of its CS IC chip 411 may be a phase locked loop (PLL) circuit or digital clock manager (DCM) configured to generate a clock signal to be passed to (1) its standard commodity FPGA IC chip or chiplet 200 through, in sequence, the first set of small I/O circuits, one or more of the interconnection metal layers 27 of its frontside interconnection scheme for a logic drive or device (FISD) 101 and the second set of small I/O circuits, or (2) either of the first and second FPGA IC chips or chiplets 200a and 200b of its third type of field programmable chip-on-chip module 400 in case of replacing its standard commodity FPGA IC chip or chiplet 200 through, in sequence, the first set of small I/O circuits, one or more of the interconnection metal layers 27 of its frontside interconnection scheme for a logic drive or device (FISD) 101 and the third set of small I/O circuits, and to (2) its non-volatile memory (NVM) IC chip 250 through, in sequence, the first set of large I/O circuits, one or more of the interconnection metal layers 27 of its frontside interconnection scheme for a logic drive or device (FISD) 101 and the second set of large I/O circuits.

Figure 22B:
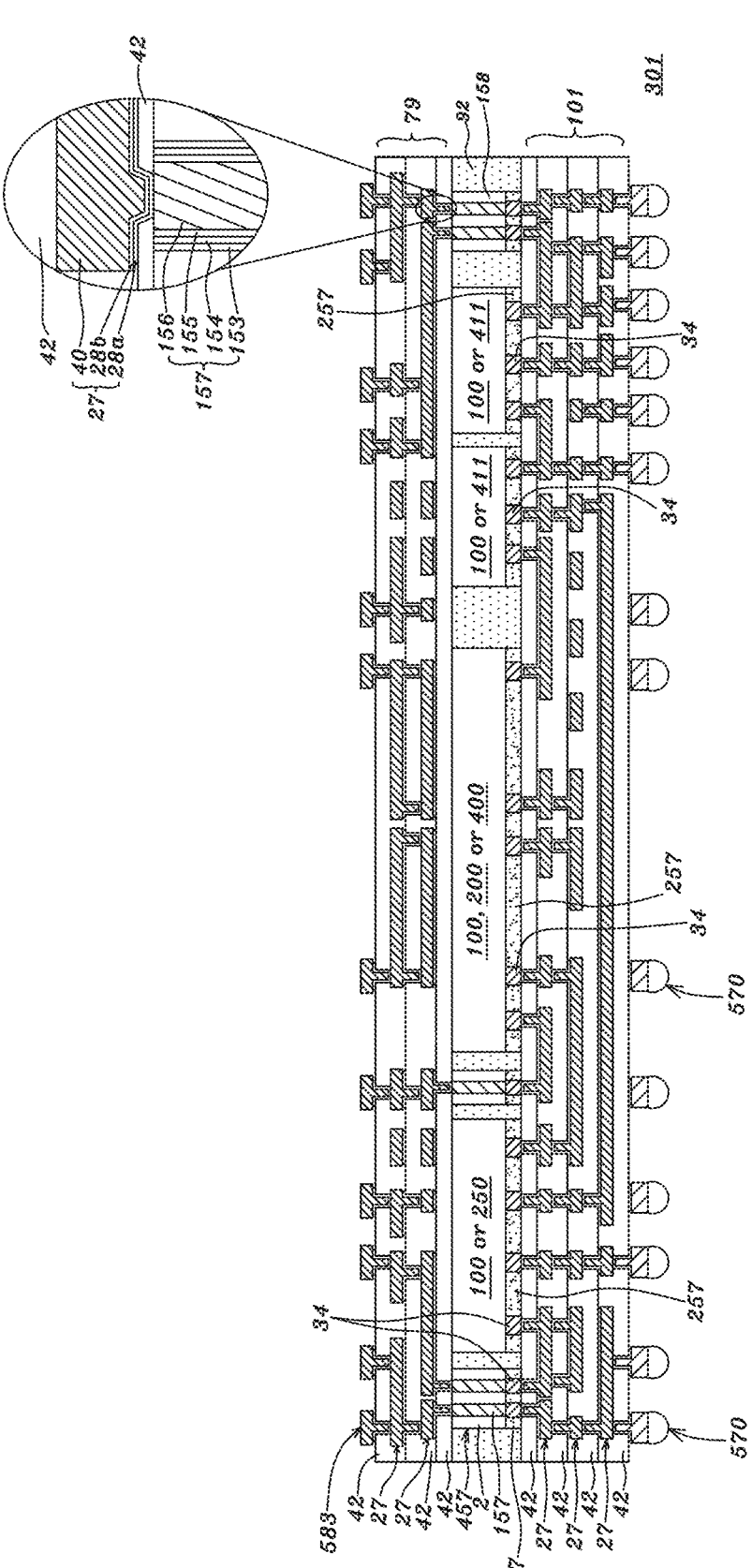
FIG. 22B is a schematically cross-sectional view showing a sixteenth type of chip package in accordance with another embodiment of the present application.

Alternatively, FIG. 22B is a schematically cross-sectional view showing a sixteenth type of chip package in accordance with another embodiment of the present application. The sixteenth type of chip package 301 as seen in FIG. 22B may have a similar structure to the first type of chip package 301 as seen in FIG. 22A. For an element indicated by the same reference number shown in FIGS. 22A and 22B, the specification of the element as seen in FIG. 22B may be referred to that of the element as illustrated in FIG. 22A. The difference therebetween is mentioned as below: For another specific example of the sixteenth type of chip package 301 as seen in FIG. 22B, the number of its semiconductor IC chips 100 may be four, and its four semiconductor IC chips 100 may be, from left to right, a non-volatile memory (NVM) IC chip 250, FPGA IC chip or chiplet 200 and two cooperating and supporting (CS) IC chips 411 to perform the above function as illustrated in FIG. 22A, wherein the non-volatile memory (NVM) IC chip 250 may be a NAND or NOR flash chip, MRAM IC chip, RRAM IC chip or FRAM IC chip. The through package vias (TPVs) as seen in FIG. 22A may be replaced with one or more vertical-through-via (VTV) connectors 467, which may have the specification for the second type of vertical-through-via (VTV) connector 467 as illustrated in FIG. 4B to be turned upside down.

For the sixteenth type of chip package 301 as seen in FIG. 22B, the polymer layer 257 of each of its vertical-through-via (VTV) connectors 467 may have a bottom surface substantially coplanar with (1) a bottom surface of each of the micro-bumps, micro-pillars or micro-pads 34 of each of its vertical-through-via (VTV) connectors 467, (2) the bottom surface of each of the micro-bumps, micro-pillars or micro-pads 34 of each of its semiconductor IC chips 100, or the bottom surface of each of the micro-bumps, micro-pillars or micro-pads 34 of the second FPGA IC chip or chiplet 200b of each of its third type of field programmable chip-on-chip modules 400 in case of replacing its standard commodity FPGA IC chips or chiplets 200, (3) the bottom surface of the polymer layer 257 of each of its semiconductor IC chips 100, or the bottom surface of the polymer layer 257 of the second FPGA IC chip or chiplet 200b of each of its third type of field programmable chip-on-chip modules 400 in case of replacing its standard commodity FPGA IC chips or chiplets 200, and (4) the bottom surface of its polymer layer 92. The semiconductor substrate 2 of each of its vertical-through-via (VTV) connectors 467 may have a portion at a backside thereof removed by a chemical-mechanical-polishing (CMP) or mechanical grinding process, and thereby each of the through silicon vias (TSVs) 157 of each of its vertical-through-via (VTV) connectors 467, that is, the electroplated copper layer 156 thereof, may have a backside substantially coplanar with the backside of the semiconductor substrate 2 of each of its vertical-through-via (VTV) connectors 467. Any of the through silicon vias (TSVs) 157 of each of its vertical-through-via (VTV) connectors 467 may couple to a voltage of power supply for delivering a power supply or a voltage of ground reference for delivering a ground reference or may pass signals or clocks for signal or clock transmission.

For the sixteenth type of chip package 301 as seen in FIG. 22B, each opening in the topmost one of polymer layers 42 of its FISD 101 may be under one of the micro-bumps, micro-pillars or micro-pads 34 of one of its semiconductor IC chips 100, or one of the micro-bumps, micro-pillars or micro-pads 34 of the second FPGA IC chip or chiplet 200b of one of its third type of field programmable chip-on-chip modules 400 in case of replacing its standard commodity FPGA IC chips or chiplets 200, or one of the micro-bumps, micro-pillars or micro-pads 34 of one of its vertical-through-via (VTV) connector 467, and thus the topmost one of the interconnection metal layers 27 of its FISD 101 may extend through said each opening to couple to said one of the micro-bumps, micro-pillars or micro-pads 34 of said one of its semiconductor IC chips 100, or said one of the micro-bumps, micro-pillars or micro-pads 34 of the second FPGA IC chip or chiplet 200b of said one of its third type of field programmable chip-on-chip modules 400 in case of replacing its standard commodity FPGA IC chips or chiplets 200, or said one of the micro-bumps, micro-pillars or micro-pads 34 of said one of its vertical-through-via (VTV) connector 467. Each opening in the bottommost one of the polymer layers 42 of its BISD 79 may be vertically over the backside of the electroplated copper layer 156 of one of the through silicon vias (TSVs) 157 of one of its vertical-through-via (VTV) connectors 467, and thus the bottommost one of the interconnection metal layers 27 of its BISD 79 may extend through said each opening to couple to the backside of the electroplated copper layer 156 of said one of the through silicon vias (TSVs) 157.

Figure 23:
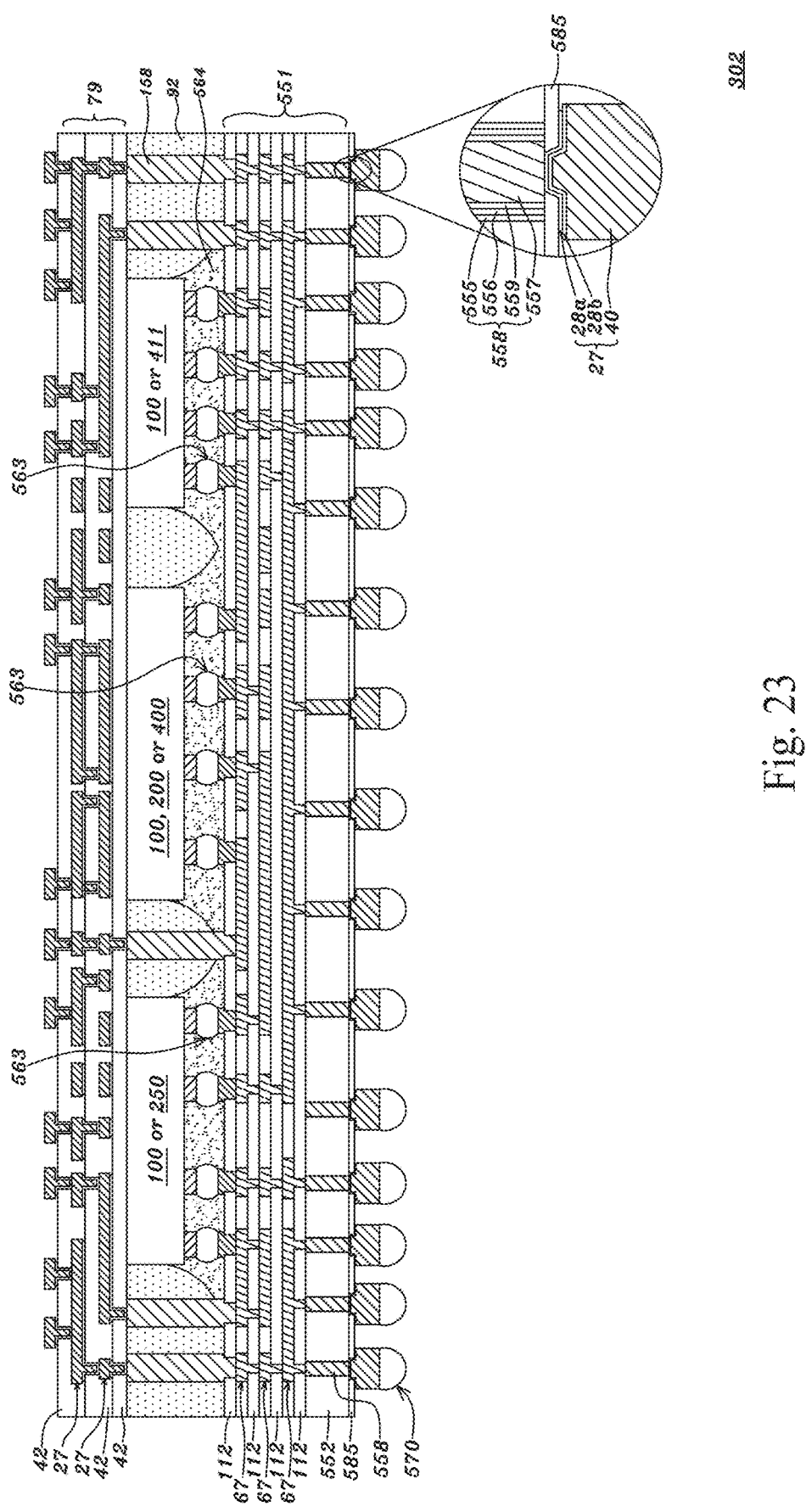
FIG. 23 is a schematically cross-sectional view showing a seventeenth type of chip package in accordance with an embodiment of the present application.

Seventeenth Type of Chip Package Based on Multichip-On-Interposer (COIB) Flip-Chip Packaging Method FIG. 23 is a schematically cross-sectional view showing a seventeenth type of chip package in accordance with an embodiment of the present application. The seventeenth type of chip package 302 as seen in FIG. 23 may have a similar structure to the sixteenth type of chip package 301 as seen in FIG. 22A. For an element indicated by the same reference number shown in FIGS. 22A and 23, the specification of the element as seen in FIG. 23 may be referred to that of the element as illustrated in FIG. 22A. The difference therebetween is that the FISD 101 of the sixteenth type of chip package 301 as seen in FIG. 22A may be replaced with an interposer 551 as seen in FIG. 23. The interposer 551 of the seventeenth type of chip package 302 may have the specification for the interposer 551 of the first type of chip package 310 as illustrated in FIG. 6. For the seventeenth type of chip package 302 as seen in FIG. 23, each of its semiconductor IC chips 100 may have the specification for the first type of semiconductor IC chip 100 as illustrated in FIG. 3A to be turned upside down, and alternatively, each of its FPGA IC chips or chiplets 200 may be replaced with the first type of field programmable chip-on-chip module 400 as seen in FIG. 5A to be turned upside down. Each of its semiconductor IC chips 100, or the second FPGA IC chip or chiplet 200b of each of its first type of field programmable chip-on-chip modules 400 in case of replacing its standard commodity FPGA IC chips or chiplets 200, may have the first, second, third or fourth type of micro-bumps, micro-pillars or micro-pads 34 bonded to its interposer 551 to form multiple metal contacts 563 between said each of its semi-conductor IC chips 100, or the second FPGA IC chip or chiplet 200b of said each of its first type of field program-mable chip-on-chip modules 400 in case of replacing its standard commodity FPGA IC chips or chiplets 200, and its interposer 551, wherein each of its metal contacts 563 may include (1) a copper layer having a thickness between 2 μm and 20 μm and a largest transverse dimension 1 μm and 15 μm between said each of its semiconductor IC chips 100, or the second FPGA IC chip or chiplet 200b of said each of its first type of field programmable chip-on-chip modules 400 in case of replacing its standard commodity FPGA IC chips or chiplets 200, and its interposer 551 and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The seventeenth type of chip package 302 may further include an underfill 564, i.e., polymer layer, between each of its semi-conductor IC chips 100, or the second FPGA IC chip or chiplet 200b of each of its first type of field programmable chip-on-chip modules 400 in case of replacing its standard commodity FPGA IC chips or chiplets 200, and its inter-poser 551, covering a sidewall of each of its metal contacts 563 between said each of its semiconductor IC chips 100, or the second FPGA IC chip or chiplet 200b of said each of its first type of field programmable chip-on-chip modules 400 in case of replacing its standard commodity FPGA IC chips or chiplets 200, and its interposer 551. Each of its through package vias (TPVs) 158 may be formed on the topmost one of interconnection metal layers 67 of its interposer 551, coupling one or more of the interconnection metal layers 67 of its interposer 551 to one or more of the interconnection metal layers 27 of its BISD 79. Each of its through package vias (TPVs) 158 may couple to a voltage of power supply for delivering a power supply or a voltage of ground reference for delivering a ground reference or may pass signals or clocks for signal or clock transmission. Its polymer layer 92 may be formed on its interposer 551 and underfill 564 and around each of its semiconductor IC chips 100, or each of its first type of field programmable chip-on-chip modules 400 in case of replacing its standard commodity FPGA IC chips or chiplets 200, and its through package vias (TPVs) 158. Each of its metal bumps, pillars or pads 570, acting as external pins of the seventeenth type of chip package 302, may be of various types, i.e., first, second and third types, which may have the same specification as that of the first, second and third types of metal bumps, pillars or pads 570 respectively as illustrated in FIG. 22A, wherein each of its metal bumps, pillars or pads 570 may have the adhesion layer 26a on the backside of one of the through silicon vias 558 of its interposer 551, i.e., a backside of the copper layer 557 thereof.

Alternatively, for the seventeenth type of chip package 302 as seen in FIG. 23, its through package vias (TPVs) may be replaced with one or more vertical-through-via (VTV) connectors 467, which may have the specification for the first type of vertical-through-via (VTV) connector 467 as illustrated in FIG. 4A, provided in its polymer layer 92. Each of its vertical-through-via (VTV) connectors 467 may have the first, second, third or fourth type of micro-bumps, micro-pillars or micro-pads 34 bonded to its interposer 551 to form multiple metal contacts between said each of its vertical-through-via (VTV) connectors 467 and its inter-poser 551, each of which may have the same specification as illustrated for its metal contacts 563 between said each of its semiconductor IC chips 100 and its interposer 551. The seventeenth type of chip package 302 may further include an underfill 564, i.e., polymer layer, between said each of its vertical-through-via (VTV) connectors 467 and its inter-poser 551, covering a sidewall of each of its metal contacts 563 between said each of its vertical-through-via (VTV) connectors 467 and its interposer 551. Each opening in the bottommost one of the polymer layers 42 of its BISD 79 may be vertically over the backside of the electroplated copper layer 156 of one of the through silicon vias (TSVs) 157 of one of its first type of vertical-through-via (VTV) connector 467, and thus the bottommost one of the interconnection metal layers 27 of its BISD 79 may extend through said each opening to couple to the backside of the electroplated copper layer 156 of said one of the through silicon vias (TSVs) 157, as seen in FIG. 22B.

For the specific example of the seventeenth type of chip package 302 as seen in FIG. 23, its standard commodity FPGA IC chip or chiplet 200, or each of the first and second FPGA IC chips or chiplets 200a and 200b of its first type of field programmable chip-on-chip module 400 in case of replacing its standard commodity FPGA IC chip or chiplet 200, may include any type of the first through third types of field programmable logic cell or element (LCE) 2014 as illustrated in FIGS. 1A-1C and any type of the first and second types of field programmable switch cells 379 as illustrated in FIGS. 2A and 2B. Its CS IC chip 411 include (1) multiple buffering memory cells, such as SRAM cells, to latch data associated with encrypted configuration program-ming memory (CPM) data, i.e., the resulting values and/or programmable codes, downloaded from multiple non-vola-tile memory cells of its non-volatile memory (NVM) IC chip 250 through one or more of the interconnection metal layers 67 of its interposer 551, (2) a cryptography block to decrypt the encrypted CPM data as decrypted CPM data, and (3) multiple drivers to amplify the decrypted CPM data to be passed with an increased data bit width through one or more of the interconnection metal layers 67 of its interposer 551 to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field program-mable logic cell or element (LCE) 2014 of either of the first and second FPGA IC chips or chiplets 200a and 200b of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its first type of field programmable chip-on-chip module 400 in case of replacing its FPGA IC chip or chiplet 200 to be stored therein. For example, the data passed through one or more of the interconnection metal layers 67 of its inter-poser 551 from its non-volatile memory (NVM) IC chip 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of each of its CS IC chip 411 may simultaneously output and amplify the data to be passed in parallel with an increased data bit width equal to or more than 4, 8, 16, 32 or 64, for example, through one or more of the interconnection metal layers 67 of its interposer 551 to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200a and 200b of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its first type of field programmable chip-on-chip module 400 in case of replacing its FPGA IC chip or chiplet 200 to be stored therein. For another example, the data passed through one or more of the interconnection metal layers 67 of its interposer 551 from its non-volatile memory (NVM) IC chip 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data to be passed in parallel with an increased data bit width equal to or more than 64, 128 or 256, for example, through one or more of the interconnection metal layers 67 of its interposer 551 to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200a and 200b of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its first type of field programmable chip-on-chip module 400 in case of replacing its FPGA IC chip or chiplet 200 to be stored therein.

For the specific example of the seventeenth type of chip package 302 as seen in FIG. 23, its CS IC chip 411 may include a first set of small I/O circuits each coupling to one of a second set of small I/O circuits of its FPGA IC chip or chiplet 200, or one of a third set of small I/O circuits of either of the first and second FPGA IC chips or chiplets 200a and 200b of its first type of field programmable chip-on-chip module 400 in case of replacing its standard commodity FPGA IC chip or chiplet 200, through one or more of the interconnection metal layers 67 of its interposer 551. Its CS IC chip 411 may include a first set of large I/O circuits each coupling to external circuits outside of the sixteenth type of chip package 301 or one of a second set of large I/O circuits of its NVM IC chip 250 through one or more of the interconnection metal layers 67 of its interposer 551. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For the specific example of the seventeenth type of chip package 302 as seen in FIG. 23, its CS IC chip 411 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of its standard commodity FPGA IC chip or chiplet 200, or (2) a data input of one of multiple center-processing-unit cores (CPUC) of its standard commodity FPGA IC chip or chiplet 200, through, in sequence, the first set of small I/O circuits, one or more of the interconnection metal layers 67 of its interposer 551 and the second set of small I/O circuits, or as (1) a data input of the input data set of one of any type of the first, second and third types of field programmable logic cells or elements (LCE) 2014 of either of the first and second FPGA IC chips and chiplets 200a and 200b of its first type of field programmable chip-on-chip module 400 in case of replacing its standard commodity FPGA IC chip or chiplet 200, or (2) a data input of one of multiple center-processing-unit cores (CPUC) of either of the first and second FPGA IC chips and chiplets 200a and 200b of its first type of field programmable chip-on-chip modules 400 in case of replacing its standard commodity FPGA IC chip or chiplet 200, through, in sequence, the first set of small I/O circuits, one or more of the interconnection metal layers 67 of its interposer 551 and the third set of small I/O circuits. Further, said each of the first group of hard macros may have input data passed from (1) the data output of one of any type of the first, second and third types of field programmable logic cells or elements (LCEs) 2014 of its standard commodity FPGA IC chip or chiplet 200, or (2) one of multiple data outputs of one of the center-processing-unit cores (CPUC) of its standard commodity FPGA IC chip or chiplet 200, through, in sequence, the second set of small I/O circuits, one or more of the interconnection metal layers 67 of its interposer 551 and the first set of small I/O circuits, or from (1) the data output of one of any type of the first, second and third types of field programmable logic cells or elements (LCEs) 2014 of either of the first and second FPGA IC chips or chiplets 200a and 200b of its first type of field programmable chip-on-chip module 400 in case of replacing its standard commodity FPGA IC chip or chiplet 200, or (2) one of multiple data outputs of one of the center-processing-unit cores (CPUC) of either of the first and second FPGA IC chips and chiplets 200a and 200b of its first type of field programmable chip-on-chip module 400 in case of replacing its standard commodity FPGA IC chip or chiplet 200 through, in sequence, the third set of small I/O circuits, one or more of the interconnection metal layers 67 of its interposer 551 and the first set of small I/O circuits. Further, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its first type of field programmable chip-on-chip module 400 in case of replacing its standard commodity FPGA IC chip or chiplet 200, may be used as a networking circuit or smart interface between two of the first group of hard macros of its CS IC chip 411 for controlling coupling therebetween. For example, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its first type of field programmable chip-on-chip module 400 in case of replacing its standard commodity FPGA IC chip or chiplet 200, may be used as a networking circuit or smart interface between two of multiple central-processing-unit (CPU) cores of its CS IC chip 411 for controlling coupling therebetween, wherein the number of the central-processing-unit (CPU) cores of its CS IC chip 411 may be equal to or greater than 4, 8, 16, 32, 64, 128, 256 or 512. Each of a second group of hard macros of its CS IC chip 411 may be a phase locked loop (PLL) circuit or digital clock manager (DCM) configured to generate a clock signal to be passed to (1) its standard commodity FPGA IC chip or chiplet 200 through, in sequence, the first set of small I/O circuits, one or more of the interconnection metal layers 67 of its interposer 551 and the second set of small I/O circuits, or (2) either of the first and second FPGA IC chips or chiplets 200a and 200b of its first type of field programmable chip-on-chip module 400 in case of replacing its standard commodity FPGA IC chip or chiplet 200 through, in sequence, the first set of small I/O circuits, one or more of the interconnection metal layers 67 of its interposer 551 and the third set of small I/O circuits, and to (2) its non-volatile memory (NVM) IC chip 250 through, in sequence, the first set of large I/O circuits, one or more of the interconnection metal layers 67 of its interposer 551 and the second set of large I/O circuits.

Figure 24:
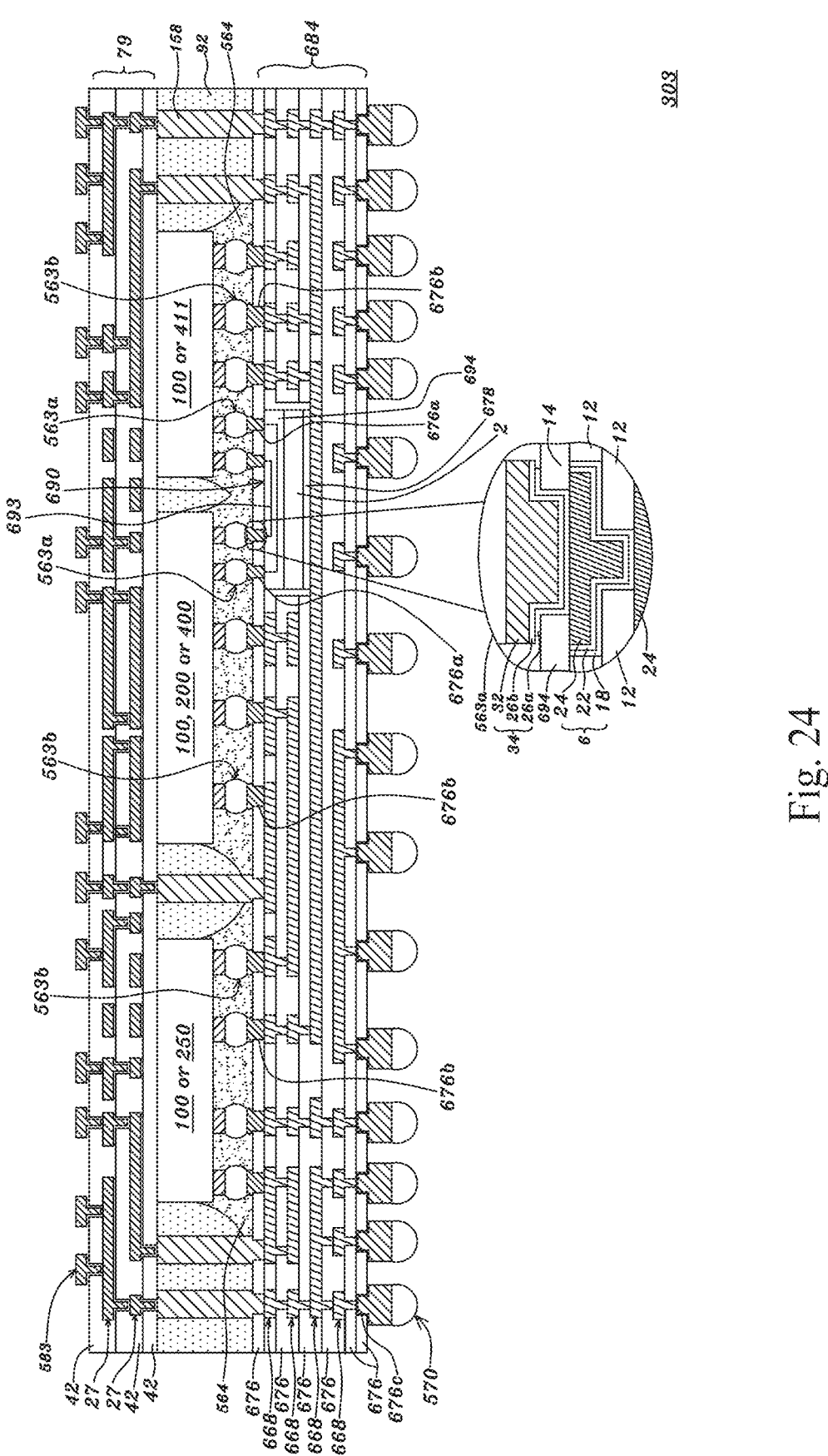
FIG. 24 is a schematically cross-sectional view showing an eighteenth type of chip package in accordance with an embodiment of the present application.

Eighteenth Type of Chip Package Based on Multichip-On-Interconnection-Substrate (COIS) Packaging Method FIG. 24 is a schematically cross-sectional view showing an eighteenth type of chip package in accordance with an embodiment of the present application. An eighteenth type of chip package 303 as seen in FIG. 24 may have a similar structure to the sixteenth type of chip package 301 as seen in FIG. 22A. For an element indicated by the same reference number shown in FIGS. 22A and 24, the specification of the element as seen in FIG. 24 may be referred to that of the element as illustrated in FIG. 22A. The difference therebetween is that the FISD 101 of the sixteenth type of chip package 301 as seen in FIG. 22A may be replaced with an interconnection substrate 684 as seen in FIG. 24. Referring to FIG. 24, the interconnection substrate 684 of the eighteenth type of chip package 303 may be a coreless substrate including (1) multiple interconnection metal layers 668, made of copper, (2) multiple polymer layers 676 each between neighboring two of its interconnection metal layers 668, and (3) one or more fine-line interconnection bridges (FIBs) 690 (only one is shown) embedded in its interconnection substrate 684 and attached onto one of its interconnection metal layers 668 via an adhesive 678. One or more of its interconnection metal layers 668 may surround four sidewalls of each of its fine-line interconnection bridges (FIBS) 690.

Referring to FIG. 24, each of the fine-line interconnection bridges (FIBs) 690 of the interconnection substrate 684 of the eighteenth type of chip package 303 may include (1) a silicon substrate 2 and (2) an interconnection scheme 694 over its silicon substrate 2 thereof, having the specification for the FISC 20, SISC 29 or combination of FISC 20 and SISC 29 as illustrated in FIGS. 3A, wherein its interconnection scheme 694 may include multiple interconnection metal layers over its silicon substrate 2, each having the same specification as that of the interconnection metal layer 6 of the FISC 20 or that of the interconnection metal layer 27 of the SISC 27, and multiple insulating dielectric layers each between neighboring two of the interconnection metal layers of its interconnection scheme 694, under the bottommost one of the interconnection metal layers of its interconnection scheme 694 or over the topmost one of the interconnection metal layers of its interconnection scheme 694, each having the same specification as that of the insulating dielectric layer 12 of the FISC 20 or that of the polymer layer 42 of the SISC 29. Each of the fine-line interconnection bridges (FIBs) 690 of the interconnection substrate 684 of the eighteenth type of chip package 303 may include (1) multiple metal pads provided by the topmost one of the interconnection metal layers of its interconnection scheme 694, and (2) metal lines or traces 693 provided by one or more of the interconnection metal layers of its interconnection scheme 694, each coupling two of its metal pads at its two opposite sides.

Referring to FIG. 24, for the interconnection substrate 684 of the eighteenth type of chip package 303, the topmost one of its polymer layers 676 may be provided over its fine-line interconnection bridges (FIBs) 690. A first group of openings 676a in the topmost one of its polymer layers 676 may be formed vertically over the metal pads of its fine-line interconnection bridges (FIBs) 690, a second group of openings 676b in the topmost one of its polymer layers 676 may be formed vertically over multiple metal pads of the topmost one of its interconnection metal layers 668 and a third group of openings 676c in the bottommost one of its polymer layers 676 may be formed respectively vertically under multiple metal pads of the bottommost one of its interconnection metal layers 668, which are provided in one of its polymer layers 676 on and over the bottommost one of its polymer layers 676. Each of its interconnection metal layers 668 may be made of copper and have a thickness, for example, between 5 and 100 micrometers, between 5 and 50 micrometers or between 10 and 50 micrometers, and thicker than that of each of the interconnection metal layers of the interconnection scheme 694 of each of its fine-line interconnection bridges (FIBS) 690.

Referring to FIG. 24, for the eighteenth type of chip package 303, each of its semiconductor IC chips 100 may have the specification for the first type of semiconductor IC chip as illustrated in FIG. 3A to be turned upside down, and alternatively, each of its FPGA IC chips or chiplets 200 may be replaced with the first type of field programmable chip-on-chip module 400 as seen in FIG. 5A to be turned upside down. Each of its semiconductor IC chips 100, or the second FPGA IC chip or chiplet 200b of each of its first type of field programmable chip-on-chip modules 400 in case of replacing its standard commodity FPGA IC chips or chiplets 200, may have the micro-bumps, micro-pillars or micro-pads 34 bonded respectively to multiple micro-bumps, micro-pillars or micro-pads of its interconnection substrate 684, in which each of the micro-bumps, micro-pillars or micro-pads of its interconnection substrate 684 may be of any type of the first, second, third and fourth types having the same specification as the first, second, third and fourth types of micro-bumps, micro-pillars or micro-pads 34 respectively as illustrated in FIG. 3A, to form (1) multiple high-density metal contacts 563a between said each of its semiconductor IC chips 100, or the second FPGA IC chip or chiplet 200b of said each of its first type of field programmable chip-on-chip modules 400 in case of replacing its standard commodity FPGA IC chips or chiplets 200, and one of the fine-line interconnection bridges (FIBs) 690 of its interconnection substrate 684, each coupling said each of its semiconductor IC chips 100, or the second FPGA IC chip or chiplet 200b of said each of its first type of field programmable chip-on-chip modules 400 in case of replacing its standard commodity FPGA IC chips or chiplets 200, to one of the metal pads of said one of the fine-line interconnection bridges (FIBs) 690 of its interconnection substrate 684, and (2) multiple low-density metal contacts 563b between said each of its semiconductor IC chips 100, or the second FPGA IC chip or chiplet 200b of said each of its first type of field programmable chip-on-chip modules 400 in case of replacing its standard commodity FPGA IC chips or chiplets 200, and its interconnection substrate 684 and horizontally offset from each of the fine-line interconnection bridges (FIBs) 690 of its interconnection substrate 684, each coupling said each of its semiconductor IC chips 100, or the second FPGA IC chip or chiplet 200b of said each of its first type of field programmable chip-on-chip modules 400 in case of replacing its standard commodity FPGA IC chips or chiplets 200, to one of the metal pads of the topmost one of the interconnection metal layers 668 of its interconnection substrate 684, wherein each of its high-density and low-density metal contacts 563a and 563b may include a copper layer having a thickness between 2 μm and 20 μm between said each of its semiconductor IC chips 100, or the second FPGA IC chip or chiplet 200b of said each of its first type of field programmable chip-on-chip modules 400 in case of replacing its standard commodity FPGA IC chips or chiplets 200, and its interconnection substrate 684 and a solder cap, made of a tin-silver alloy, a tin-gold alloy, a tin-copper alloy, a tin-indium alloy, indium or tin, having a thickness of between 1 μm and 15 μm between the copper layer of said each of its high-density and low-density metal contacts 563a and 563b and its interconnection substrate 684. Accordingly, neighboring two of its semiconductor IC chips 100, and its first type of field programmable chip-on-chip modules 400 in case of replacing its standard commodity FPGA IC chips or chiplets 200, may couple to each other through, in sequence, (1) one of its high-density metal contacts 563a under one of said neighboring two of its semiconductor IC chips 100, and its first type of field programmable chip-on-chip modules 400 in case of replacing its standard commodity FPGA IC chips or chiplets 200, (2) one of the metal lines or traces 693 of one of the fine-line interconnection bridges (FIBs) 690 of its interconnection substrate 684 across under an edge of each of said neighboring two of its semiconductor IC chips 100, and its first type of field programmable chip-on-chip modules 400 in case of replacing its standard commodity FPGA IC chips or chiplets 200, and (3) one of its high-density metal contacts 563a under the other of said neighboring two of its semiconductor IC chips 100, and its first type of field programmable chip-on-chip modules 400 in case of replacing its standard commodity FPGA IC chips or chiplets 200.

Referring to FIG. 24, for the eighteenth type of chip package 303, each of its high-density metal contacts 563a may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of its high-density metal contacts 563a may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. Each of its low-density metal contacts 563b may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of its low-density metal contacts 563b may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The ratio of the largest dimension in a horizontal cross section of each of its low-density metal contacts 563b to that of each of its high-density metal contacts 563a may be between 1.1 and 5 or greater than 1.2, 1.5 or 2, for example. The ratio of the smallest space between neighboring two of its low-density metal contacts 563b to that between neighboring two of its high-density metal contacts 563a may be between 1.1 and 5 or greater than 1.2, 1.5 or 2, for example.

Referring to FIG. 24, the eighteenth type of chip package 303 may further include an underfill 564, i.e., polymer layer, between each of its semiconductor IC chips 100, or the second FPGA IC chip or chiplet 200b of each of its first type of field programmable chip-on-chip modules 400 in case of replacing its standard commodity FPGA IC chips or chiplets 200, and its interconnection substrate 684, covering a sidewall of each of its high-density and low-density metal contacts 563a and 563b between said each of its semiconductor IC chips 100, or the second FPGA IC chip or chiplet 200b of said each of its first type of field programmable chip-on-chip modules 400 in case of replacing its standard commodity FPGA IC chips or chiplets 200, and its interconnection substrate 684. Each of its through package vias (TPVs) 158 may be formed on the topmost one of interconnection metal layers 676 of its interconnection substrate 684, coupling one or more of the interconnection metal layers 676 of its interconnection substrate 684 to one or more of the interconnection metal layers 27 of its BISD 79. Each of its through package vias (TPVs) 158 may couple to a voltage of power supply for delivering a power supply or a voltage of ground reference for delivering a ground reference or may pass signals or clocks for signal or clock transmission. Its polymer layer 92 may be formed on its interconnection substrate 684 and its underfill 564 and around each of its semiconductor IC chips 100, or each of its first type of field programmable chip-on-chip modules 400 in case of replacing its standard commodity FPGA IC chips or chiplets 200, and its through package vias (TPVs) 158. Each of its metal bumps, pillars or pads 570, acting as external pins of the eighteenth type of chip package 303, may be of various types, i.e., first, second and third types, which may have the same specification as that of the first, second and third types of metal bumps, pillars or pads 570 respectively as illustrated in FIG. 22A, wherein each of its metal bumps, pillars or pads 570 may have the adhesion layer 26a on a bottom surface of one of the metal pad of the bottommost one of the interconnection metal layers 668 of its interconnection substrate 684.

Alternatively, for the eighteenth type of chip package 303, its through package vias (TPVs) as seen in FIG. 24 may be replaced with one or more vertical-through-via (VTV) connectors 467, which may have the specification for the first type of vertical-through-via (VTV) connector 467 as illustrated in FIG. 4A, provided in its polymer layer 92. Each of its vertical-through-via (VTV) connectors 467 may have the first, second, third or fourth type of micro-bumps, micro-pillars or micro-pads 34 bonded to its interconnection substrate 684 to form (1) multiple high-density metal contacts between said each of its vertical-through-via (VTV) connectors 467 and one of the fine-line interconnection bridges (FIBs) 690 of its interconnection substrate 684, each of which may have the same specification as illustrated for its high-density metal contacts 563a and couple said each of its vertical-through-via (VTV) connectors 467 to one of the metal pads of said one of the fine-line interconnection bridges (FIBs) 690 of its interconnection substrate 684, and (2) multiple low-density metal contacts between said each of its vertical-through-via (VTV) connectors 467 and one of the metal pads of the topmost one of the interconnection metal layers 668 of its interconnection substrate 684, each of which may have the same specification as illustrated for its low-density metal contacts 563b and couple said each of its vertical-through-via (VTV) connectors 467 to said one of the metal pads of the topmost one of the interconnection metal layers 668 of its interconnection substrate 684. The underfill 564 of the eighteenth type of chip package 303 may be further formed between said each of its vertical-through-via (VTV) connectors 467 and its interconnection substrate 684, covering a sidewall of each of its high-density and low-density metal contacts between said each of its vertical-through-via (VTV) connectors 467 and its interconnection substrate 684. Each opening in the bottommost one of the polymer layers 42 of its BISD 79 may be vertically over the backside of the electroplated copper layer 156 of one of the through silicon vias (TSVs) 157 of one of its vertical-through-via (VTV) connectors 467, and thus the bottommost one of the interconnection metal layers 27 of its BISD 79 may extend through said each opening to couple to the backside of the electroplated copper layer 156 of said one of the through silicon vias (TSVs) 157, as seen in FIG. 22B. Accordingly, each of the through silicon vias (TSVs) 157 of each of its vertical-through-via (VTV) connectors 467 may couple one or more of the interconnection metal layers 27 of its BISD 79 to one of the metal line or traces 693 of one of the fine-line interconnection bridges (FIBs) 690 of its interconnection substrate 684 under said each of its vertical-through-via (VTV) connectors 467 or to one of the metal pads of the topmost one of the interconnection metal layers 668 of its interconnection substrate 684.

For the specific example of the eighteenth type of chip package 303 as seen in FIG. 24, its standard commodity FPGA IC chip or chiplet 200, or each of the first and second FPGA IC chips or chiplets 200a and 200b of its first type of field programmable chip-on-chip module 400 in case of replacing its standard commodity FPGA IC chip or chiplet 200, may include any type of the first through third types of field programmable logic cell or element (LCE) 2014 as illustrated in FIGS. 1A-1C and any type of the first and second types of field programmable switch cells 379 as illustrated in FIGS. 2A and 2B. Its CS IC chip 411 include (1) multiple buffering memory cells, such as SRAM cells, to latch data associated with encrypted configuration programming memory (CPM) data, i.e., the resulting values and/or programmable codes, downloaded from multiple non-volatile memory cells of its non-volatile memory (NVM) IC chip 250 through one or more of the interconnection metal layers 668 of its interconnection substrate 684, (2) a cryptography block to decrypt the encrypted CPM data as decrypted CPM data, and (2) multiple drivers to amplify the decrypted CPM data to be passed with an increased data bit width through one or more of the metal line or traces 693 of one of the fine-line interconnection bridges (FIBs) 690 of its interconnection substrate 684 across under an edge of each of its CS IC chip 411 and its standard commodity FPGA IC chip or chiplet 200, or first type of field programmable chip-on-chip module 400 in case of replacing its standard commodity FPGA IC chip or chiplet 200, to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200a and 200b of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its first type of field programmable chip-on-chip module 400 in case of replacing its FPGA IC chip or chiplet 200 to be stored therein. For example, the data passed through one or more of the interconnection metal layers 668 of its interconnection substrate 684 from its non-volatile memory (NVM) IC chip 250 to its CS IC chip 411 may have a bit-width of 1 bit in a standard of serial advanced technology attachment (SATA), and the buffer of its CS IC chip 411 may latch the data in multiple memory cells, i.e., SRAM cells, therein. Next, the buffer of each of its CS IC chip 411 may simultaneously output and amplify the data to be passed in parallel with an increased data bit width equal to or more than 4, 8, 16, 32 or 64, for example, through one or more of the metal line or traces 693 of one of the fine-line interconnection bridges (FIBs) 690 of its interconnection substrate 684 across under an edge of each of its CS IC chip 411 and its standard commodity FPGA IC chip or chiplet 200, or first type of field programmable chip-on-chip module 400 in case of replacing its standard commodity FPGA IC chip or chiplet 200, to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200*a* and 200*b* of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200*a* and 200*b* of its first type of field programmable chip-on-chip module 400 in case of replacing its FPGA IC chip or chiplet 200 to be stored therein. For another example, the data passed through one or more of the interconnection metal layers 668 of its interconnection substrate 684 from its non-volatile memory (NVM) IC chip 250 to its CS IC chip 411 may have a bit-width of 32 bit in a standard of peripheral component interconnect express (PCIe), and the buffer of its CS IC chip 411 may latch the data in multiple memory cells, i.e., SRAM cells, therein. Next, the buffer of its CS IC chip 411 may simultaneously output and amplify the data to be passed in parallel with an increased data bit width equal to or more than 64, 128 or 256, for example, through one or more of the metal line or traces 693 of one of the fine-line interconnection bridges (FIBs) 690 of its interconnection substrate 684 across under an edge of each of its CS IC chip 411 and its standard commodity FPGA IC chip or chiplet 200, or first type of field programmable chip-on-chip module 400 in case of replacing its standard commodity FPGA IC chip or chiplet 200, to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of either of the first and second FPGA IC chips or chiplets 200*a* and 200*b* of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200*a* and 200*b* of its first type of field programmable chip-on-chip module 400 in case of replacing its FPGA IC chip or chiplet 200 to be stored therein.

For the specific example of the eighteenth type of chip package 303 as seen in FIG. 24, its CS IC chip 411 may include a first set of small I/O circuits each coupling to one of a second set of small I/O circuits of its FPGA IC chip or chiplet 200, or one of a third set of small I/O circuits of either of the first and second FPGA IC chips or chiplets 200*a* and 200*b* of its first type of field programmable chip-on-chip module 400 in case of replacing its standard commodity FPGA IC chip or chiplet 200, through one or more of the metal line or traces 693 of one of the fine-line interconnection bridges (FIBs) 690 of its interconnection substrate 684 across under an edge of each of its CS IC chip 411 and its standard commodity FPGA IC chip or chiplet 200, or first type of field programmable chip-on-chip module 400 in case of replacing its standard commodity FPGA IC chip or chiplet 200. Its CS IC chip 411 may include a first set of large I/O circuits each coupling to external circuits outside of the sixteenth type of chip package 301 or one of a second set of large I/O circuits of its NVM IC chip 250 through one or more of the interconnection metal layers 668 of its interconnection substrate 684. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

For the specific example of the eighteenth type of chip package 303 as seen in FIG. 24, its CS IC chip 411 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of its standard commodity FPGA IC chip or chiplet 200, or (2) a data input of one of multiple center-processing-unit cores (CPUC) of its standard commodity FPGA IC chip or chiplet 200, through, in sequence, the first set of small I/O circuits, one or more of the metal line or traces 693 of one of the fine-line interconnection bridges (FIBs) 690 of its interconnection substrate 684 across under an edge of each of its CS IC chip 411 and standard commodity FPGA IC chip or chiplet 200 and the second set of small I/O circuits, or as (1) a data input of the input data set of one of any type of the first, second and third types of field programmable logic cells or elements (LCE) 2014 of either of the first and second FPGA IC chips and chiplets 200*a* and 200*b* of its first type of field programmable chip-on-chip module 400 in case of replacing its standard commodity FPGA IC chip or chiplet 200, or (2) a data input of one of multiple center-processingunit cores (CPUC) of either of the first and second FPGA IC chips and chiplets 200a and 200b of its first type of field programmable chip-on-chip modules 400 in case of replacing its standard commodity FPGA IC chip or chiplet 200, through, in sequence, the first set of small I/O circuits, one or more of the metal line or traces 693 of one of the fine-line interconnection bridges (FIBS) 690 of its interconnection substrate 684 across under an edge of each of its CS IC chip 411 and first type of field programmable chip-on-chip module 400 in case of replacing its standard commodity FPGA IC chip or chiplet 200 and the third set of small I/O circuits. Further, said each of the first group of hard macros may have input data passed from (1) the data output of one of any type of the first, second and third types of field programmable logic cells or elements (LCEs) 2014 of its standard commodity FPGA IC chip or chiplet 200, or (2) one of multiple data outputs of one of the center-processing-unit cores (CPUC) of its standard commodity FPGA IC chip or chiplet 200, through, in sequence, the second set of small I/O circuits, one or more of the metal line or traces 693 of one of the fine-line interconnection bridges (FIBs) 690 of its interconnection substrate 684 across under an edge of each of its CS IC chip 411 and standard commodity FPGA IC chip or chiplet 200 and the first set of small I/O circuits, or from (1) the data output of one of any type of the first, second and third types of field programmable logic cells or elements (LCEs) 2014 of either of the first and second FPGA IC chips or chiplets 200a and 200b of its first type of field programmable chip-on-chip module 400 in case of replacing its standard commodity FPGA IC chip or chiplet 200, or (2) one of multiple data outputs of one of the center-processing-unit cores (CPUC) of either of the first and second FPGA IC chips and chiplets 200a and 200b of its first type of field programmable chip-on-chip module 400 in case of replacing its standard commodity FPGA IC chip or chiplet 200 through, in sequence, the third set of small I/O circuits, one or more of the metal line or traces 693 of one of the fine-line interconnection bridges (FIBs) 690 of its interconnection substrate 684 across under an edge of each of its CS IC chip 411 and first type of field programmable chip-on-chip module 400 in case of replacing its standard commodity FPGA IC chip or chiplet 200 and the first set of small I/O circuits. Further, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its first type of field programmable chip-on-chip module 400 in case of replacing its standard commodity FPGA IC chip or chiplet 200, may be used as a networking circuit or smart interface between two of the first group of hard macros of its CS IC chip 411 for controlling coupling therebetween. For example, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its first type of field programmable chip-on-chip module 400 in case of replacing its standard commodity FPGA IC chip or chiplet 200, may be used as a networking circuit or smart interface between two of multiple central-processing-unit (CPU) cores of its CS IC chip 411 for controlling coupling therebetween, wherein the number of the central-processing-unit (CPU) cores of its CS IC chip 411 may be equal to or greater than 4, 8, 16, 32, 64, 128, 256 or 512. Each of a second group of hard macros of its CS IC chip 411 may be a phase locked loop (PLL) circuit or digital clock manager (DCM) configured to generate a clock signal to be passed to (1) its standard commodity FPGA IC chip or chiplet 200 through, in sequence, the first set of small I/O circuits, one or more of the metal line or traces 693 of one of the fine-line interconnection bridges (FIBs) 690 of its interconnection substrate 684 across under an edge of each of its CS IC chip 411 and standard commodity FPGA IC chip or chiplet 200 and the second set of small I/O circuits, or (2) either of the first and second FPGA IC chips or chiplets 200a and 200b of its first type of field programmable chip-on-chip module 400 in case of replacing its standard commodity FPGA IC chip or chiplet 200 through, in sequence, the first set of small I/O circuits, one or more of the metal line or traces 693 of one of the fine-line interconnection bridges (FIBs) 690 of its interconnection substrate 684 across under an edge of each of its CS IC chip 411 and first type of field programmable chip-on-chip module 400 in case of replacing its standard commodity FPGA IC chip or chiplet 200 and the third set of small I/O circuits, and to (2) its non-volatile memory (NVM) IC chip 250 through, in sequence, the first set of large I/O circuits, one or more of the interconnection metal layers 668 of its interconnection substrate 684 and the second set of large I/O circuits.

Nineteenth Type of Chip Package

Figure 25:
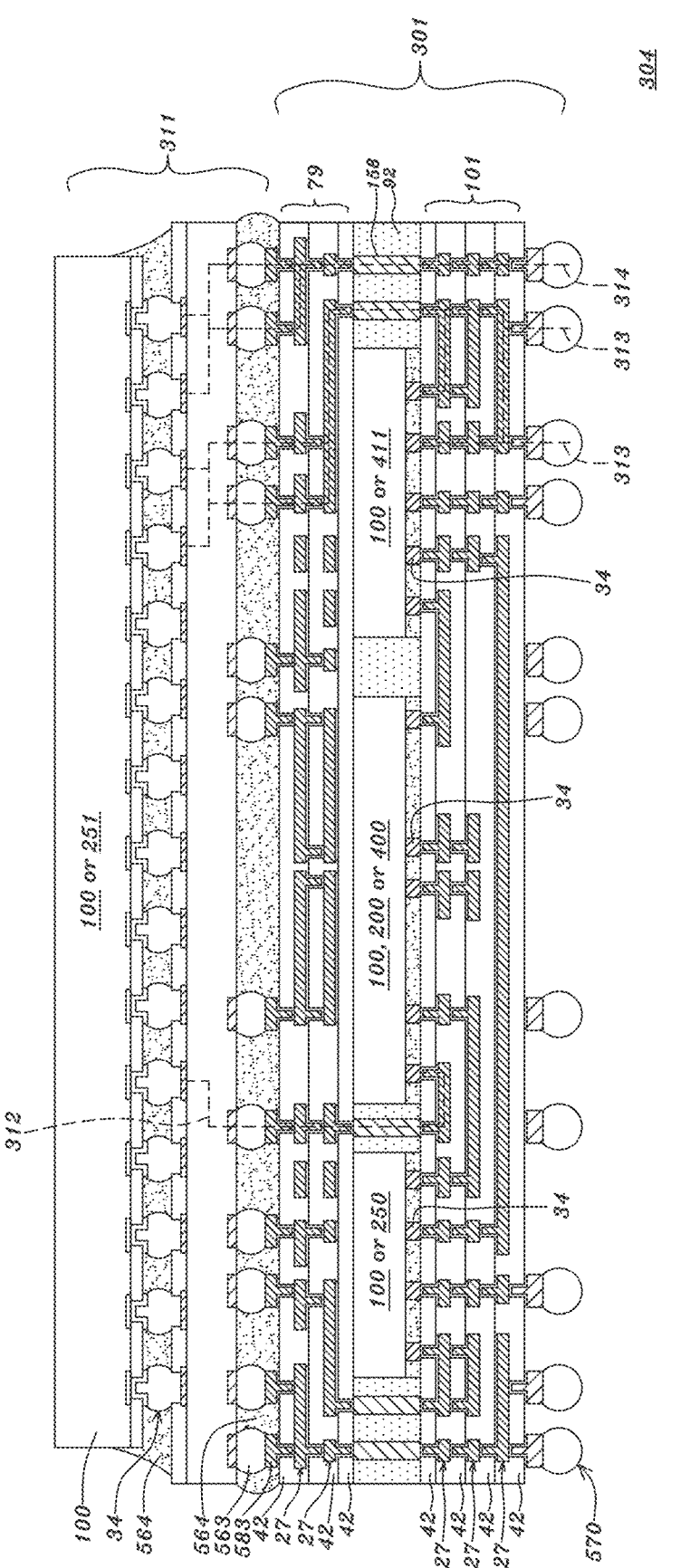
FIG. 25 is a schematically cross-sectional view showing a nineteenth type of chip package in accordance with an embodiment of the present application.

FIG. 25 is a schematically cross-sectional view showing a nineteenth type of chip package in accordance with an embodiment of the present application. Referring to FIG. 25, another chip package 311 may be stacked over any of the sixteenth, seventeenth and eighteenth types of chip packages 301, 302 and 303 as illustrated in FIGS. 22A, 22B, 23 and 24 to form a nineteenth type of chip package 304, i.e., package-on-package (POP) assembly, but only shown to be stacked over the first type of chip package 301 seen in FIG. 22A. For an element indicated by the same reference number shown in FIGS. 22A and 25, the specification of the element as seen in FIG. 25 may be referred to that of the element as illustrated in FIG. 22A. The chip package 311 may include (1) a ball-grid-array (BGA) substrate 321, (2) a semiconductor IC chip 100, which may have the specification for the first type of semiconductor IC chip 100 as illustrated in FIG. 3A, over its ball-grid-array (BGA) substrate 321, wherein its semiconductor IC chip 100 may be a memory IC chip 251, such as HBM IC chip, SRAM IC chip or DRAM IC chip, and (3) multiple solder balls 322 under and in contact with a bottom surface of its ball-grid-array (BGA) substrate 321, each joining its ball-grid-array (BGA) substrate 321 to one of the metal pads 583 of the sixteenth type of chip package 301. For the chip package 311, its memory IC chip 251 may have multiple micro-bumps, micro-pillars or micro-pads 34, each of which may be of any type of the first, second, third and fourth types having the same specification as that of the first, second, third and fourth types of micro-bumps, micro-pillars or micro-pads 34 respectively as illustrated in FIG. 3A, to be turned upside down to be bonded to its ball-grid-array (BGA) substrate 321 to form multiple metal contact 563 between its memory IC chip 251 and its ball-grid-array (BGA) substrate 321, wherein each of its metal contacts 563 may include a copper layer having a thickness between 2 μm and 20 μm and a largest transverse dimension 1 μm and 15 μm between its memory IC chip 251 and its ball-grid-array (BGA) substrate 321, and a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its ball-grid-array (BGA) substrate 321. The chip package 311 may further include an underfill 564, i.e., polymer layer, between its memory IC chip 251 and ball-grid-array (BGA) substrate 321, covering a sidewall of each of its metal contacts 563 between its memory IC chip 251 and ball-grid-array (BGA) substrate 321. The nineteenth type of chip package 304 may further include an underfill 564, i.e., polymer layer, between its chip package 311 and its sixteenth type of chip package 301, covering a sidewall of each of the solder balls 322 of its chip package 311. Alternatively, the chip package 311 may be achieved by a thin small outline package (TSOP) based on a lead frame, a BGA package based on wirebonding or flipchip bonding on a ball grid array substrate, or a FOIT package as illustrated in FIGS. 22A and 22B.

Referring to FIG. 25, for the nineteenth type of chip package 304, in the case the specific example as mentioned in FIG. 22A is taken for its sixteenth type of chip package 301, the memory IC chip 251 of its chip package 311 may have a fourth set of small I/O circuits coupling respectively to the second set of small I/O circuits, or third set of small I/O circuits, for parallel data transmission therebetween with a data bit width of equal to or greater than 64, 128, 256, 512, 1024, 2048, 4096, 8K, or 16K. The memory IC chip 251 of its chip package 311 may couple to its FPGA IC chip or chiplet 200, or either of the first and second FPGA IC chips or chiplets 200*a* and 200*b* of its third type of field programmable chip-on-chip module 400 in case of replacing its standard commodity FPGA IC chip or chiplet 200, for interpackage signal transmission or power or ground (voltage) delivery through, in sequence, one of the metal contacts 563 of its chip package 311, the ball-grid-array (BGA) substrate 321 of its chip package 311, the solder balls 322 of its chip package 311, one of the metal pads 583 of its sixteenth type of chip package 301, the interconnection metal layers 27 of the BISD 79 of its sixteenth type of chip package 301, one of the through package vias 158 of its sixteenth type of chip package 301, one or more of the interconnection metal layers 27 of the FISD 101 of its sixteenth type of chip package 301, shown as a metal interconnect 312. The memory IC chip 251 of its chip package 311 and the CS IC chip 411 of its sixteenth type of chip package 301 may couple to one or more common metal bumps, pillars or pads 570 of its sixteenth type of chip package 301, acting as external pins of the nineteenth type of chip package 304 for signal transmission or power or ground (voltage) delivery, shown as a metal interconnect 313. The memory IC chip 251 of its chip package 311 may couple to one or more metal bumps, pillars or pads 570 of its sixteenth type of chip package 301 for signal transmission or power or ground (voltage) delivery, shown as a metal interconnect 314, without coupling to any of the semiconductor IC chips 100 of its sixteenth type of chip package 301 and either of the first and second FPGA IC chips or chiplets 200*a* and 200*b* of the third type of field programmable chip-on-chip module 400 of its sixteenth type of chip package 301 in case of replacing the standard commodity FPGA IC chip or chiplet 200 of its sixteenth type of chip package 301.

Twentieth Type of Chip Package

Figure 26:
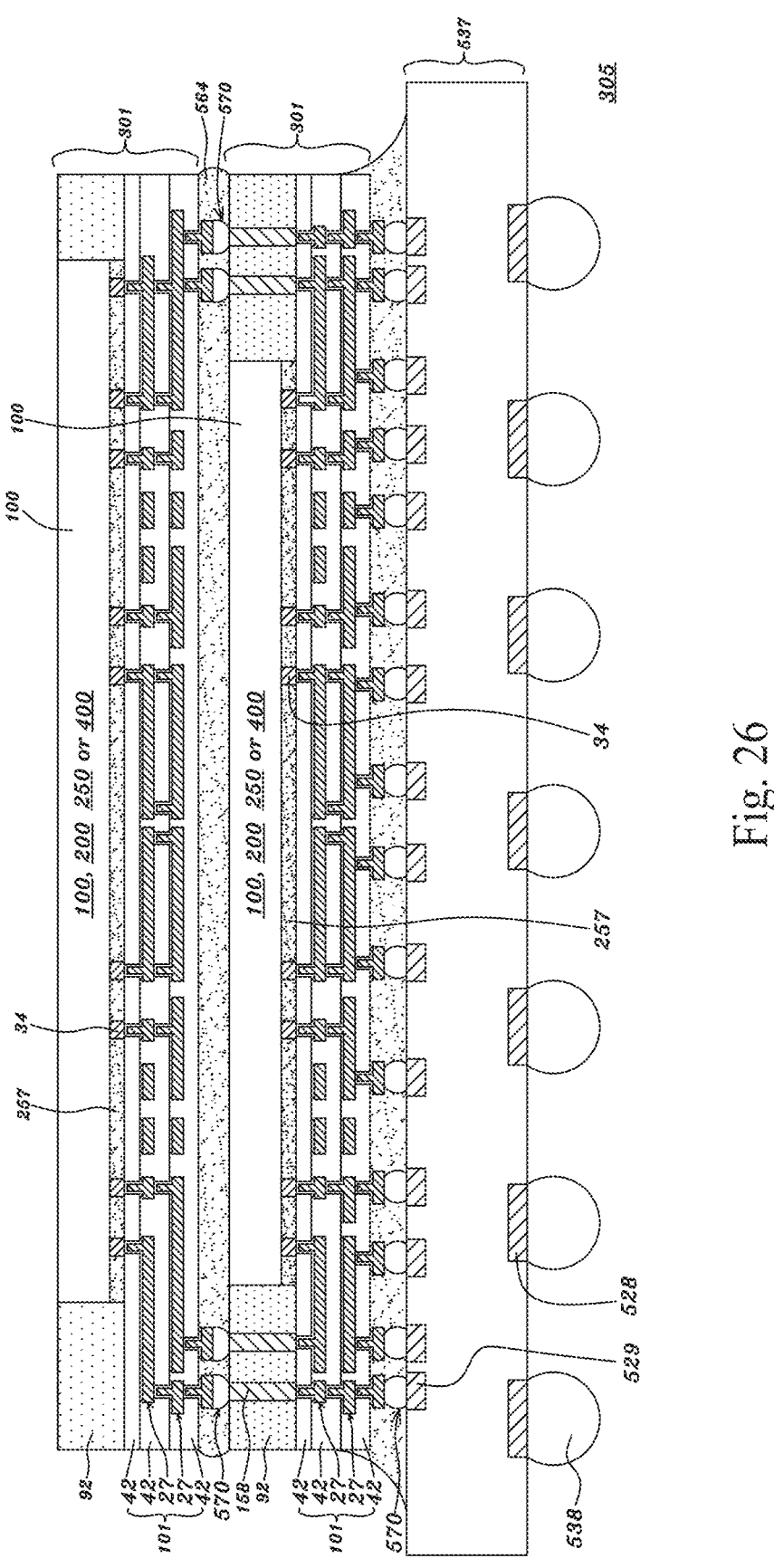
FIG. 26 is a schematically cross-sectional view showing a twentieth type of chip package in accordance with an embodiment of the present application.

FIG. 26 is a schematically cross-sectional view showing a twentieth type of chip package in accordance with an embodiment of the present application. Referring to FIG. 26, the twentieth type of chip package 305 may include two sixteenth type of chip packages 301, each of which may have the similar structure to that as illustrated in FIG. 22A, stacked with each other, i.e., top and bottom ones. For an element indicated by the same reference number shown in FIGS. 22A and 26, the specification of the element as seen in FIG. 26 may be referred to that of the element as illustrated in FIG. 22A.

Referring to FIG. 26, for the bottom one of the sixteenth type of chip packages 301 of the twentieth type of chip package 305, the BISD 79 as illustrated in FIG. 22A may be saved. Thereby, the top one of the sixteenth type of chip packages 301 of the twentieth type of chip package 305 may include the metal bumps, pillars or pads 570 each mounted to a top surface of one of the through package vias (TPVs) 158 of the bottom one of the sixteenth type of chip packages 301 of the twentieth type of chip package 305. For the top one of the sixteenth type of chip packages 301 of the twentieth type of chip package 305, the BISD 79 and through package vias (TPVs) 158 as illustrated in FIG. 22A may be saved. For the twentieth type of chip package 305, each of the semiconductor IC chips 100 of the bottom one of its sixteenth type of chip packages 301 may be an application-specific IC chip or logic IC chip, such as FPGA IC chip or chiplet, graphic-processing unit (GPU) IC chip or chiplet, data-processing-unit (DPU) IC chip, central-processing-unit (CPU) IC chip or chiplet, digital-signal-processing (DSP) IC chip, tensor-flow-processing-unit (TPU) IC chip, micro-control-unit (MCU) IC chip, artificial-intelligent-unit (MU) IC chip, machine-learning-unit (MLU) IC chip, application-processing-unit (APU) IC chip, and each of the semiconductor IC chips 100 of the top one of its sixteenth type of chip packages 301 may be a NVM IC chip 250, such as NAND or NOR flash chip, MRAM IC chip, RRAM IC chip or FRAM IC chip. Alternatively, each of the semiconductor IC chips 100 of the bottom one of its sixteenth type of chip packages 301 may be replaced with the third type of field programmable chip-on-chip module 400 as seen in FIG. 5C to be turned upside down. The twentieth type of chip package 305 may further include (1) a ball-grid-array (BGA) substrate 537 having multiple metal pads 529 at a top surface thereof and multiple metal pads 528 at a bottom surface thereof, wherein its ball-grid-array (BGA) substrate 537 may include multiple metal traces therein each coupling one of the metal pads 529 thereof to one of the metal pads 528 thereof, wherein the bottom one of its sixteenth type of chip packages 301 may have the metal bumps, pillars or pads 570 bonded respectively to the metal pads 529 of its ball-grid-array (BGA) substrate 537, (2) multiple solder balls 538, made of a tin-lead alloy or tin-silver-copper alloy, each on one of the metal pads 528 of its ball-grid-array (BGA) substrate 537, wherein its solder balls 538 may act as external pins of the twentieth type of chip package 305 to couple or bond to external circuits, (3) an underfill 564 between the top and bottom ones of its sixteenth type of chip packages 301, covering a sidewall of each of the metal bumps, pillars or pads 570 of the top one of its sixteenth type of chip packages 301, and (4) an underfill 564 between the bottom one of its sixteenth type of chip packages 301 and its ball-grid-array (BGA) substrate 537, covering a sidewall of each of the metal bumps, pillars or pads 570 of the bottom one of its sixteenth type of chip packages 301.

Alternatively, referring to FIG. 26, for the twentieth type of chip package 305, each of the semiconductor IC chips 100 of the top one of its sixteenth type of chip packages 301 may be an application-specific integrated-circuit (ASIC) chip or logic IC chip, such as FPGA IC chip or chiplet, graphic-processing unit (GPU) IC chip or chiplet, data-processing-unit (DPU) IC chip, central-processing-unit (CPU) IC chip or chiplet, digital-signal-processing (DSP) IC chip, tensor-flow-processing-unit (TPU) IC chip, micro-control-unit (MCU) IC chip, artificial-intelligent-unit (AIU) IC chip, machine-learning-unit (MLU) IC chip, application-processing-unit (APU) IC chip, and each of the semiconductor IC chips 100 of the bottom one of its sixteenth type of chip packages 301 may be a NVM IC chip 250, such as NAND or NOR flash chip, MRAM IC chip, RRAM IC chip or FRAM IC chip. Alternatively, each of the semiconductor IC chips 100 of the top one of its sixteenth type of chip packages 301 may be replaced with the third type of field programmable chip-on-chip module 400 as seen in FIG. 5C to be turned upside down.

Referring to FIG. 26, for the twentieth type of chip package 305, each of the through package vias (TPVs) 158 of the bottom one of its sixteenth type of chip packages 301 may couple to a voltage of power supply for delivering a power supply or a voltage of ground reference for delivering a ground reference or may pass signals or clocks for signal or clock transmission.

Referring to FIG. 26, for a specific example of the twentieth type of chip package 305, the semiconductor IC chips 100 of the bottom one of its sixteenth type of chip packages 301 may be a FPGA IC chip or chiplet 200, and the top one of its sixteenth type of chip packages 301 may be a NVM IC chip 250. Alternatively, the FPGA IC chip or chiplet 200 of the bottom one of its sixteenth type of chip packages 301 may be replaced with the third type of field programmable chip-on-chip module 400 as seen in FIG. 5C to be turned upside down. The FPGA IC chip or chiplet 200 of the bottom one of its sixteenth type of chip packages 301, or each of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, may include any type of the first through third types of field programmable logic cell or element (LCE) 2014 as illustrated in FIGS. 1A-1C and any type of the first and second types of field programmable switch cells 379 as illustrated in FIGS. 2A and 2B. The NVM IC chip 250 of the top one of its sixteenth type of chip packages 301 may include a first set of large I/O circuits 341 coupling to a second set of large I/O circuits of the FPGA IC chip or chiplet 200 of the bottom one of its sixteenth type of chip packages 301, or a third set of large I/O circuits of either of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, via the interconnection metal layers 27 of the FISD 101 of the top one of its sixteenth type of chip packages 301, one of the metal bumps, pillars or pads 570 of the top one of its sixteenth type of chip packages 301, one of the through package vias (TPVs) 158 of the bottom one of its sixteenth type of chip packages 301 and one or more of the interconnection metal layers 27 of the FISD 101 of the bottom one of its sixteenth type of chip packages 301 for passing first encrypted configuration programming memory (CPM) data from the first set of large I/O circuits to the second set of large I/O circuits, or third set of large I/O circuits. Next, the FPGA IC chip or chiplet 200 of the bottom one of its sixteenth type of chip packages 301, or said either of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, may include a cryptography block configured to decrypt the first encrypted CPM data as first decrypted CPM data, to be passed to (1) the memory cells 490 of any type of the first through third types of field programmable logic cell or element (LCE) 2014 of the standard commodity FPGA IC chip or chiplet 200 of the bottom one of its sixteenth type of chip packages 301 to be stored therein, or the memory cells 490 of any type of the first through third types of field programmable logic cell or element (LCE) 2014 of said either of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301 to be stored therein, and (2) the memory cells 362 of any type of the first and second types of field programmable switch cells 379 of the standard commodity FPGA IC chip or chiplet 200 of the bottom one of its sixteenth type of chip packages 301 to be stored therein, or the memory cells 362 of any type of the first and second types of field programmable switch cells 379 of said either of the first and second FPGA IC chips or chiplets 200*a* and 200*b* of the third type of field programmable chip-on-chip module 400 of the bottom one of its sixteenth type of chip packages 301 in case of replacing the FPGA IC chip or chiplet 200 of the bottom one of its sixteenth type of chip packages 301 to be stored therein. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF.

Further, referring to FIG. 26, for the specific example of the twentieth type of chip package 305, the standard commodity FPGA IC chip or chiplet 200 of the bottom one of its sixteenth type of chip packages 301, or said each of the first and second FPGA IC chips or chiplets 200*a* and 200*b* of the third type of field programmable chip-on-chip module 400 of the bottom one of its sixteenth type of chip packages 301 in case of replacing the FPGA IC chip or chiplet 200 of the bottom one of its sixteenth type of chip packages 301, may encrypt second CPM data as second encrypted CPM data, wherein the second CPM data is stored in (1) the memory cells 490 of any type of the first through third types of field programmable logic cell or element (LCE) 2014 of the standard commodity FPGA IC chip or chiplet 200 of the bottom one of its sixteenth type of chip packages 301 to be stored therein, or the memory cells 490 of any type of the first through third types of field programmable logic cell or element (LCE) 2014 of each of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, and (2) the memory cells 362 of any type of the first and second types of field programmable switch cells 379 of the standard commodity FPGA IC chip or chiplet 200 of the bottom one of its sixteenth type of chip packages 301, or the memory cells 362 of any type of the first and second types of field programmable switch cells 379 of each of the first and second FPGA IC chips or chiplets 200*a* and 200*b* of the third type of field programmable chip-on-chip module 400 of the bottom one of its sixteenth type of chip packages 301 in case of replacing the FPGA IC chip or chiplet 200 of the bottom one of its sixteenth type of chip packages 301. Next, the second encrypted CPM data may be passed from the second set of large I/O circuits to the first set of large I/O circuits to be stored in the NVM IC chip 250 of the top one of its sixteenth type of chip packages 301.

Twenty-First Type of Chip Package

Figure 27A:
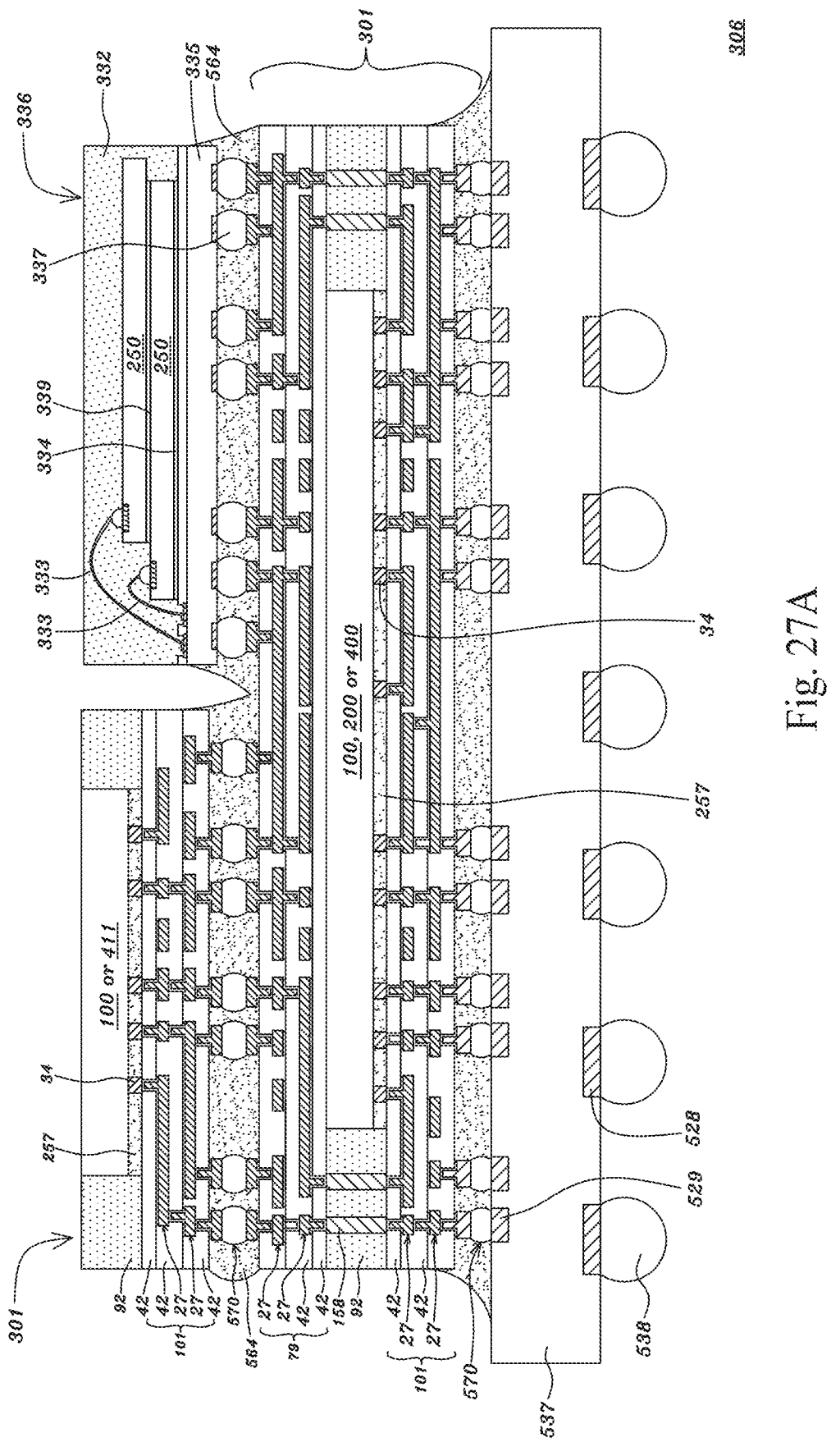
FIG. 27A is a schematically cross-sectional view showing a twenty-first type of chip package in accordance with an embodiment of the present application.

FIG. 27A is a schematically cross-sectional view showing a twenty-first type of chip package in accordance with an embodiment of the present application. Referring to FIG. 27A, a twenty-first type of chip package 306 for a first alternative may include two sixteenth type of chip packages 301, each of which may have the similar structure to that as illustrated in FIG. 22A, stacked with each other, i.e., top and bottom ones, and a non-volatile-memory (NVM) chip package 336 stacked on the bottom one of its sixteenth type of chip packages 301. For an element indicated by the same reference number shown in FIGS. 22A and 27A, the specification of the element as seen in FIG. 27A may be referred to that of the element as illustrated in FIG. 22A.

Referring to FIG. 27A, the non-volatile-memory (NVM) chip package 336 of the twenty-first type of chip package 306 for the first alternative may include (1) two non-volatile memory (NVM) IC chips 250, each of which may be a NAND flash memory chip, NOR flash memory chip, magnetoresistive random access memory (MRAM) IC chip, resistive random access memory (RRAM) IC chip or ferroelectric random access memory (FRAM) IC chip, or each of which may include NAND flash memory cells, NOR flash memory cells, magnetoresistive random access memory (MRAM) cells, resistive random access memory (RRAM) cells or ferroelectric random access memory (FRAM) cells, stacked with each other and mounted to each other via an adhesive layer 339 such as silver paste or a heat conductive paste, wherein an upper one of the non-volatile memory IC chips 250 may overhang from an edge of a lower one of the non-volatile memory IC chips 250, wherein each of the ferroelectric random access memory (FRAM) cells of said each of its two non-volatile memory (NVM) IC chips 250 may include two electrodes and a thin ferroelectric film made of lead zirconate titanate (PZT) between the two electrodes thereof, (2) a circuit board 335 under the non-volatile memory IC chips 250 to have the lower one of the non-volatile memory IC chips 250 to be attached to a top surface thereof via an adhesive layer 334 such as silver paste or a heat conductive paste, (3) multiple wirebonded wires 333 each coupling one of the non-volatile memory IC chips 250 to the circuit board 335, (4) a molded polymer 332 over the circuit board 335, encapsulating the non-volatile memory IC chips 250 and wirebonded wires 333 and (5) multiple solder balls 337 at the bottom thereof each attached to one of the metal pads 583 of the bottom one of the sixteenth type of chip packages 301 of the twenty-first type of chip package 306 for the first alternative.

Referring to FIG. 27A, for the top one of the sixteenth type of chip packages 301 of the twenty-first type of chip package 306 for the first alternative, the BISD 79 and through package vias (TPVs) 158 as illustrated in FIG. 27A may be saved, and each of its metal bumps, pillars or pads 570 may be bonded to one the metal pads 583 of the bottom one of the sixteenth type of chip packages 301 of the twenty-first type of chip package 306 for the first alternative. For the twenty-first type of chip package 306 for the first alternative, the one or more semiconductor IC chips 100 of the bottom one of its sixteenth type of chip packages 301 may be an application-specific integrated-circuit (ASIC) chip or logic IC chip, such as FPGA IC chip or chiplet, graphic-processing unit (GPU) IC chip or chiplet, data-processing-unit (DPU) IC chip, central-processing-unit (CPU) IC chip or chiplet, digital-signal-processing (DSP) IC chip, tensor-flow-processing-unit (TPU) IC chip, micro-control-unit (MCU) IC chip, artificial-intelligent-unit (MU) IC chip, machine-learning-unit (MLU) IC chip, application-processing-unit (APU) IC chip, and the one or more semiconductor IC chips 100 of the top one of its sixteenth type of chip packages 301 may be one or more cooperating and supporting (CS) IC chips. The twenty-first type of chip package 306 for the first alternative may further include (1) a ball-grid-array (BGA) substrate 537 having multiple metal pads 529 at a top surface thereof and multiple metal pads 528 at a bottom surface thereof, wherein the bottom one of its sixteenth type of chip packages 301 may have the metal bumps, pillars or pads 570 bonded respectively to the metal pads 529 of its ball-grid-array (BGA) substrate 537, (2) multiple solder balls 538, made of a tin-lead alloy or tin-silver-copper alloy, each on one of the metal pads 528 of its ball-grid-array (BGA) substrate 537, wherein its solder balls 538 may act as external pins of the twenty-first type of chip package 306 for the first alternative to couple or bond to its external circuits, (3) an underfill 564 between the top and bottom ones of its sixteenth type of chip packages 301, covering a sidewall of each of the metal bumps, pillars or pads 570 of the top one of its sixteenth type of chip packages 301, (4) an underfill 564 between its non-volatile-memory (NVM) chip package 336 and the bottom one of its sixteenth type of chip packages 301, covering a sidewall of each of the solder balls 337 of its NVM chip package 336, and (5) an underfill 564 between the bottom one of its sixteenth type of chip packages 301 and its ball-grid-array (BGA) substrate 537, covering a sidewall of each of the metal bumps, pillars or pads 570 of the bottom one of its sixteenth type of chip packages 301.

Figure 27B:
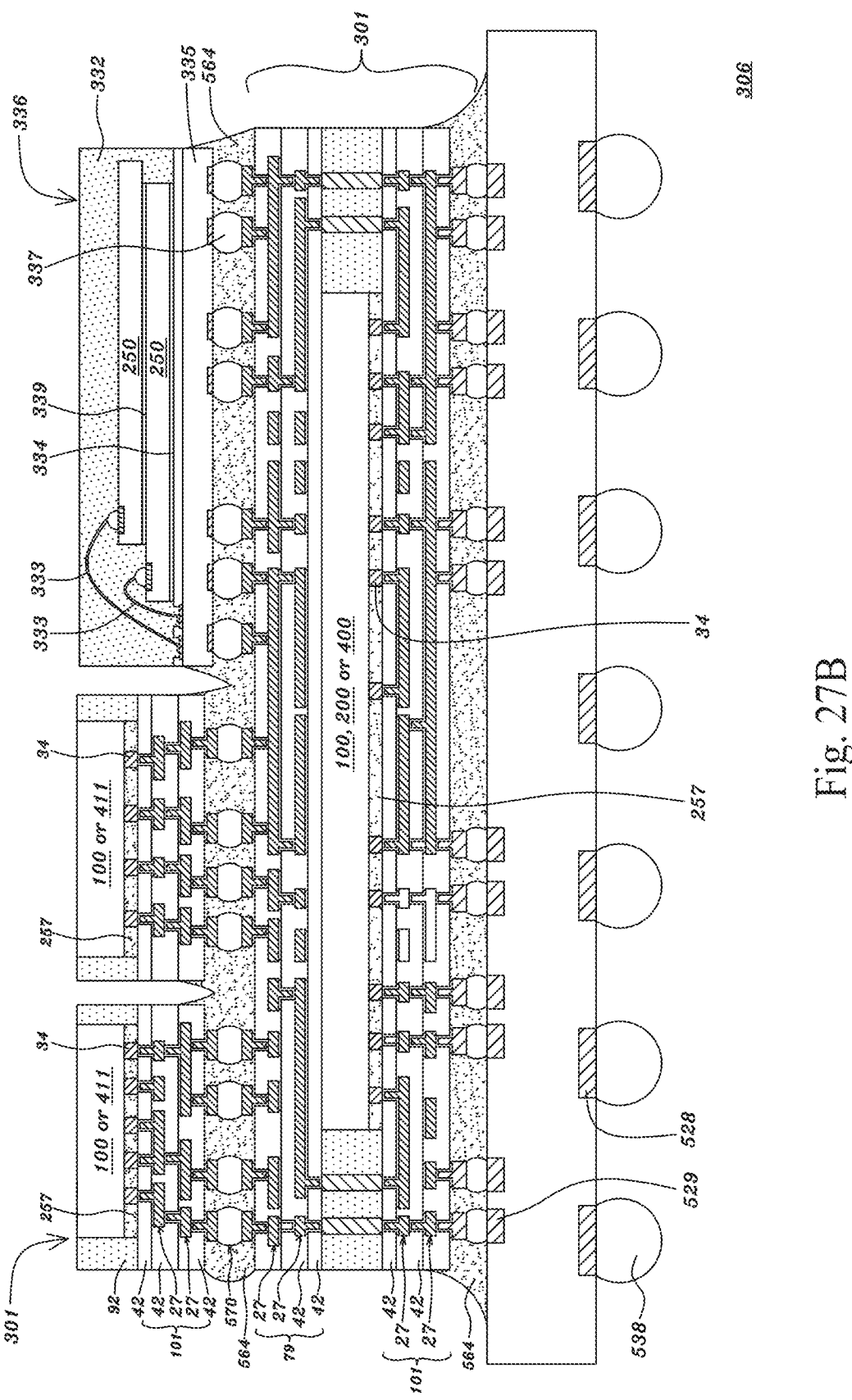
FIG. 27B is a schematically cross-sectional view showing a twenty-first type of chip package in accordance with another embodiment of the present application.

Alternatively, FIG. 27B is a schematically cross-sectional view showing a twenty-first type of chip package in accordance with another embodiment of the present application. The twenty-first type of chip package 306 for a second alternative as seen in FIG. 27B may have a similar structure to the twenty-first type of chip package 306 for the first alternative as seen in FIG. 27A. For an element indicated by the same reference number shown in FIGS. 27A and 27B, the specification of the element as seen in FIG. 27B may be referred to that of the element as illustrated in FIG. 27A. The difference therebetween is that for the twenty-first type of chip package 306 for the second alternative multiple sixteenth type of chip packages 301 as illustrated in FIG. 22A, i.e., top ones, may be stacked over the bottom one of its sixteenth type of chip packages 301. For each of the top ones of the sixteenth type of chip packages 301 of the twenty-first type of chip package 306 for the second alternative, the BISD 79 and through package vias (TPVs) 158 as illustrated in FIG. 22A may be saved, and each of its metal bumps, pillars or pads 570 may be bonded to one the metal pads 583 of the bottom one of the sixteenth type of chip packages 301 of the twenty-first type of chip package 306 for the second alternative. For the twenty-first type of chip package 306 for the second alternative, each of one or more semiconductor IC chips 100 of each of the top ones of its sixteenth type of chip packages 301 may be a cooperating and supporting (CS) IC chip. The CS IC chips 411 of the top ones of the sixteenth type of chip packages 301 of the twenty-first type of chip package 306 for the second alternative as seen in FIG. 27B may be combined to perform functions like the CS IC chip 411 of the top one of the sixteenth type of chip packages 301 of the twenty-first type of the chip package 306 for the first alternative as illustrated in FIG. 27A.

Referring to FIGS. 27A and 27B, each of the twenty-first type of chip packages 306 for the first and second alternatives may further include an underfill 564 between each of the top ones of its sixteenth type of chip packages 301 and the bottom one of its sixteenth type of chip packages 301, covering a sidewall of each of the metal bumps, pillars or pads 570 of said each of the top ones of its sixteenth type of chip packages 301.

Referring to FIGS. 27A and 27B, for a specific example of the twenty-first type of chip package 306, the semiconductor IC chips 100 of the bottom one of its sixteenth type of chip packages 301 may be a FPGA IC chip or chiplet 200, and each of the one or more semiconductor IC chips 100 of each of the top one(s) of its sixteenth type of chip packages 301 may be a CS IC chip 411. Alternatively, the FPGA IC chip or chiplet 200 of the bottom one of its sixteenth type of chip packages 301 may be replaced with the third type of field programmable chip-on-chip module 400 as seen in FIG. 5C to be turned upside down. The FPGA IC chip or chiplet 200 of the bottom one of its sixteenth type of chip packages 301, or each of the first and second FPGA IC chips or chiplets 200a and 200b of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, may include any type of the first through third types of field programmable logic cell or element (LCE) 2014 as illustrated in FIGS. 1A-1C and any type of the first and second types of field programmable switch cells 379 as illustrated in FIGS. 2A and 2B. Each of the NVM IC chips 250 of its non-volatile-memory (NVM) chip package 336 may include a first set of large I/O circuits 341 coupling to a second set of large I/O circuits of any of the one or more CS IC chips 411 of any of the top one(s) of its sixteenth type of chip packages 301 through, in sequence, one of the wirebonded wires 333 of its NVM chip package 336, the circuit board 335 of its NVM chip package 336, one of the solder balls 337 of its NVM chip package 336, one or more of the interconnection metal layers 27 of the BISD 79 of the bottom one of its sixteenth type of chip packages 301, one of the metal bumps, pillars or pads 570 of said any of the top one(s) of its sixteenth type of chip packages 301, and the interconnection metal layers 27 of the FISD 101 of said any of the top one(s) of its sixteenth type of chip packages 301 for passing first encrypted configuration programming memory (CPM) data from the first set of large I/O circuits to the second set of large I/O circuits. Next, the first encrypted CPM data may be decrypted by a cryptography block of said any of the one or more CS IC chips 411 of said any of the top one(s) of its sixteenth type of chip packages 301 as first decrypted CPM data. Next, said any of the one or more CS IC chips 411 of said any of the top one(s) of its first type of chip packages 301 may have a first set of small I/O circuits coupling to a second set of small I/O circuits of the FPGA IC chip or chiplet 200 of the bottom one of its sixteenth type of chip packages 301, or a third set of small I/O circuits of either of the first and second FPGA IC chips or chiplets 200a and 200b of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, through, in sequence, the interconnection metal layers 27 of the FISD 101 of said any of the top one(s) of its sixteenth type of chip packages 301, one of the metal bumps, pillars or pads 570 of said any of the top one(s) of its sixteenth type of chip packages 301, the interconnection metal layers 27 of the BISD 79 of the bottom one of its sixteenth type of chip packages 301, one of the through package vias (TPVs) 158 of the bottom one of its sixteenth type of chip packages 301 and one or more of the interconnection metal layers 27 of the FISD 101 of the bottom one of its sixteenth type of chip packages 301 for passing the first decrypted CPM data in parallel with an increased data bit width equal to or more than 4, 8, 16, 32, 64, 128 or 256 for example, from the first set of small I/O circuits to the second set of small I/O circuits, or third set of small I/O circuits. Next, the first decrypted CPM data may be passed to (1) the memory cells 490 of any type of the first through third types of field programmable logic cell or element (LCE) 2014 of the standard commodity FPGA IC chip or chiplet 200 of the bottom one of its sixteenth type of chip packages 301 to be stored therein, or the memory cells 490 of any type of the first through third types of field programmable logic cell or element (LCE) 2014 of said either of the first and second FPGA IC chips or chiplets 200a and 200b of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301 to be stored therein, and (2) the memory cells 362 of any type of the first and second types of field programmable switch cells 379 of the standard commodity FPGA IC chip or chiplet 200 of the bottom one of its sixteenth type of chip packages 301 to be stored therein, or the memory cells 362 of any type of the first and second types of field programmable switch cells 379 of said either of the first and second FPGA IC chips or chiplets 200a and 200b of the third type of field programmable chip-on-chip module 400 of the bottom one of its sixteenth type of chip packages 301 in case of replacing the FPGA IC chip or chiplet 200 of the bottom one of its sixteenth type of chip packages 301 to be stored therein. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIGS. 27A and 27B, for the specific example of the twenty-first type of chip package 306, second CPM data may be passed from the second set of small I/O circuits, or third set of small I/O circuits, to the first set of small I/O circuits, through, in sequence, one or more of the interconnection metal layers 27 of the FISD 101 of the bottom one of its sixteenth type of chip packages 301, one of the through package vias (TPVs) 158 of the bottom one of its sixteenth type of chip packages 301, the interconnection metal layers 27 of the BISD 79 of the bottom one of its sixteenth type of chip packages 301, one of the metal bumps, pillars or pads 570 of said any of the top one(s) of its sixteenth type of chip packages 301 and the interconnection metal layers 27 of the FISD 101 of said any of the top one(s) of its sixteenth type of chip packages 301, wherein the second CPM data is associated with the resulting value or programming codes stored in (1) the memory cells 490 of any type of the first through third types of field programmable logic cell or element (LCE) 2014 of the standard commodity FPGA IC chip or chiplet 200 of the bottom one of its sixteenth type of chip packages 301, or the memory cells 490 of any type of the first through third types of field programmable logic cell or element (LCE) 2014 of each of the first and second FPGA IC chips or chiplets 200a and 200b of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, and (2) the memory cells 362 of any type of the first and second types of field programmable switch cells 379 of the standard commodity FPGA IC chip or chiplet 200 of the bottom one of its sixteenth type of chip packages 301, or the memory cells 362 of any type of the first and second types of field programmable switch cells 379 of each of the first and second FPGA IC chips or chiplets 200a and 200b of the third type of field programmable chip-on-chip module 400 of the bottom one of its sixteenth type of chip packages 301 in case of replacing the FPGA IC chip or chiplet 200 of the bottom one of its sixteenth type of chip packages 301. Next, said any of the one or more CS IC chips 411 of said any of the top one(s) of its sixteenth type of chip packages 301 may encrypt the second CPM data as second encrypted CPM data to be passed from the second set of large I/O circuits to the first set of large I/O circuits through, in sequence, the interconnection metal layers 27 of the FISD 101 of said any of the top one(s) of its sixteenth type of chip packages 301, one of the metal bumps, pillars or pads 570 of said any of the top one(s) of its sixteenth type of chip packages 301, one or more of the interconnection metal layers 27 of the BISD 79 of the bottom one of its sixteenth type of chip packages 301, one of the solder balls 337 of its NVM chip package 336, the circuit board 335 of its NVM chip package 336 and one of the wirebonded wires 333 of its NVM chip package 336 to be stored in any of the NVM IC chips 250 of its non-volatile-memory (NVM) chip package 336.

For the specific example of the twenty-first type of chip package 306 for the first and second alternatives as seen in FIGS. 27A and 27B, each of the one or more CS IC chips 411 of each of the top one(s) of its sixteenth type of chip packages 301 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of the FPGA IC chip or chiplet 200 of the bottom one of its sixteenth type of chip packages 301, or (2) a data input of one of multiple center-processing-unit cores (CPUC) of the FPGA IC chip or chiplet 200 of the bottom one of its sixteenth type of chip packages 301, through, in sequence, the first set of small I/O circuits, the interconnection metal layers 27 of the FISD 101 of said each of the top one(s) of its sixteenth type of chip packages 301, one of the metal bumps, pillars or pads 570 of said each of the top one(s) of its sixteenth type of chip packages 301, the interconnection metal layers 27 of the BISD 79 of the bottom one of its sixteenth type of chip packages 301, one of the through package vias (TPVs) 158 of the bottom one of its sixteenth type of chip packages 301, one or more of the interconnection metal layers 27 of the FISD 101 of the bottom one of its sixteenth type of chip packages 301 and the second set of small I/O circuits, or as (1) a data input of the input data set of one of any type of the first, second and third types of field programmable logic cells or elements (LCE) 2014 of said either of the first and second FPGA IC chips and chiplets 200a and 200b of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, or (2) a data input of one of multiple center-processing-unit cores (CPUC) of said either of the first and second FPGA IC chips and chiplets 200a and 200b of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, through, in sequence, the first set of small I/O circuits, the interconnection metal layers 27 of the FISD 101 of said each of the top one(s) of its sixteenth type of chip packages 301, one of the metal bumps, pillars or pads 570 of said each of the top one(s) of its sixteenth type of chip packages 301, the interconnection metal layers 27 of the BISD 79 of the bottom one of its sixteenth type of chip packages 301, one of the through package vias (TPVs) 158 of the bottom one of its sixteenth type of chip packages 301, one or more of the interconnection metal layers 27 of the FISD 101 of the bottom one of its sixteenth type of chip packages 301 and the third set of small I/O circuits. Further, said each of the first group of hard macros may have input data passed from (1) the data output of one of any type of the first, second and third types of field programmable logic cells or elements (LCEs) 2014 of the standard commodity FPGA IC chip or chiplet 200 of the bottom one of its sixteenth type of chip packages 301, or (2) one of multiple data outputs of one of the center-processing-unit cores (CPUC) of the standard commodity FPGA IC chip or chiplet 200 of the bottom one of its sixteenth type of chip packages 301, through, in sequence, the second set of small I/O circuits, one or more of the interconnection metal layers 27 of the FISD 101 of the bottom one of its sixteenth type of chip packages 301, one of the through package vias (TPVs) 158 of the bottom one of its sixteenth type of chip packages 301, the interconnection metal layers 27 of the BISD 79 of the bottom one of its sixteenth type of chip packages 301, one of the metal bumps, pillars or pads 570 of said each of the top one(s) of its sixteenth type of chip packages 301 and the interconnection metal layers 27 of the FISD 101 of said each of the top one(s) of its sixteenth type of chip packages 301 and the first set of small I/O circuits, or from (1) the data output of one of any type of the first, second and third types of field programmable logic cells or elements (LCEs) 2014 of said either of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, or (2) one of multiple data outputs of one of the center-processing-unit cores (CPUC) of said either of the first and second FPGA IC chips and chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301 through, in sequence, the third set of small I/O circuits, one or more of the interconnection metal layers 27 of the FISD 101 of the bottom one of its sixteenth type of chip packages 301, one of the through package vias (TPVs) 158 of the bottom one of its sixteenth type of chip packages 301, the interconnection metal layers 27 of the BISD 79 of the bottom one of its sixteenth type of chip packages 301, one of the metal bumps, pillars or pads 570 of said each of the top one(s) of its sixteenth type of chip packages 301 and the interconnection metal layers 27 of the FISD 101 of said each of the top one(s) of its sixteenth type of chip packages 301 and the first set of small I/O circuits. Further, one or more of any type of the first and second types of field programmable switch cells 379 of the FPGA IC chip or chiplet 200 of the bottom one of its sixteenth type of chip packages 301, or one or more of any type of the first and second types of field programmable switch cells 379 of each of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301, may be used as a networking circuit or smart interface between two of the first group of hard macros of said each of the one or more CS IC chips 411 for controlling coupling therebetween. For example, one or more of any type of the first and second types of field programmable switch cells 379 of the FPGA IC chip or chiplet 200 of the bottom one of its sixteenth type of chip packages 301, or one or more of any type of the first and second types of field programmable switch cells 379 of each of the first and second FPGA IC chips or chiplets 200*a* and 200*b* of the first type of field programmable chip-on-chip module 400 of the bottom one of its sixteenth type of chip packages 301 in case of replacing the standard commodity FPGA IC chip or chiplet 200 of the bottom one of its sixteenth type of chip packages 301, may be used as a networking circuit or smart interface between two of multiple central-processing-unit (CPU) cores of said each of the one or more CS IC chips 411 for controlling coupling therebetween, wherein the number of the central-processing-unit (CPU) cores of said each of the one or more CS IC chips 411 may be equal to or greater than 4, 8, 16, 32, 64, 128, 256 or 512. Each of a second group of hard macros of said each of the one or more CS IC chips 411 may be a phase locked loop (PLL) circuit or digital clock manager (DCM) configured to generate a clock signal to be passed to (1) the standard commodity FPGA IC chip or chiplet 200 of the bottom one of its sixteenth type of chip packages 301 through, in sequence, the first set of small I/O circuits, the interconnection metal layers 27 of the FISD 101 of said each of the top one(s) of its sixteenth type of chip packages 301, one of the metal bumps, pillars or pads 570 of said each of the top one(s) of its sixteenth type of chip packages 301, the interconnection metal layers 27 of the BISD 79 of the bottom one of its sixteenth type of chip packages 301, one of the through package vias (TPVs) 158 of the bottom one of its sixteenth type of chip packages 301, one or more of the interconnection metal layers 27 of the FISD 101 of the bottom one of its sixteenth type of chip packages 301 and the second set of small I/O circuits, or (2) either of the first and second FPGA IC chips or chiplets 200*a* and 200*b* of the third type of field programmable chip-on-chip module 400 of the bottom one of its sixteenth type of chip packages 301 in case of replacing the standard commodity FPGA IC chip or chiplet 200 of the bottom one of its sixteenth type of chip packages 301 through, in sequence, the first set of small I/O circuits, the interconnection metal layers 27 of the FISD 101 of said each of the top one(s) of its sixteenth type of chip packages 301, one of the metal bumps, pillars or pads 570 of said each of the top one(s) of its sixteenth type of chip packages 301, the interconnection metal layers 27 of the BISD 79 of the bottom one of its sixteenth type of chip packages 301, one of the through package vias (TPVs) 158 of the bottom one of its sixteenth type of chip packages 301, one or more of the interconnection metal layers 27 of the FISD 101 of the bottom one of its sixteenth type of chip packages 301 and the third set of small I/O circuits, and to (2) its non-volatile memory (NVM) IC chip 250 through, in sequence, the second set of large I/O circuits, the interconnection metal layers 27 of the FISD 101 of said each of the top one(s) of its sixteenth type of chip packages 301, one of the metal bumps, pillars or pads 570 of said each of the top one(s) of its sixteenth type of chip packages 301, one or more of the interconnection metal layers 27 of the BISD 79 of the bottom one of its sixteenth type of chip packages 301, one of the solder balls 337 of its NVM chip package 336, the circuit board 335 of its NVM chip package 336, one of the wirebonded wires 333 of its NVM chip package 336 and the first set of large I/O circuits.

Referring to FIGS. 27A and 27B, for the twenty-first type of chip packages 306 for the first and second alternatives, any of the one or more CS IC chips 411 of any of the top one(s) of its sixteenth type of chip packages 301 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to the semiconductor IC chips 100 of the bottom one of its sixteenth type of chip packages 301, or each of the first and second FPGA IC chips or chiplets 200*a* and 200*b* of the third type of field programmable chip-on-chip module 400 of the bottom one of its sixteenth type of chip packages 301 in case of replacing the semiconductor IC chips 100 of the bottom one of its sixteenth type of chip packages 301, and/or each of the NVM IC chips 250 of its non-volatile-memory (NVM) chip package 336. Each of the through package vias (TPVs) 158 of the bottom one of its sixteenth type of chip packages 301 may couple to a voltage of power supply for delivering a power supply or a voltage of ground reference for delivering a ground reference or may pass signals or clocks for signal or clock transmission.

Twenty-Second Type of Chip Package

Figure 28:
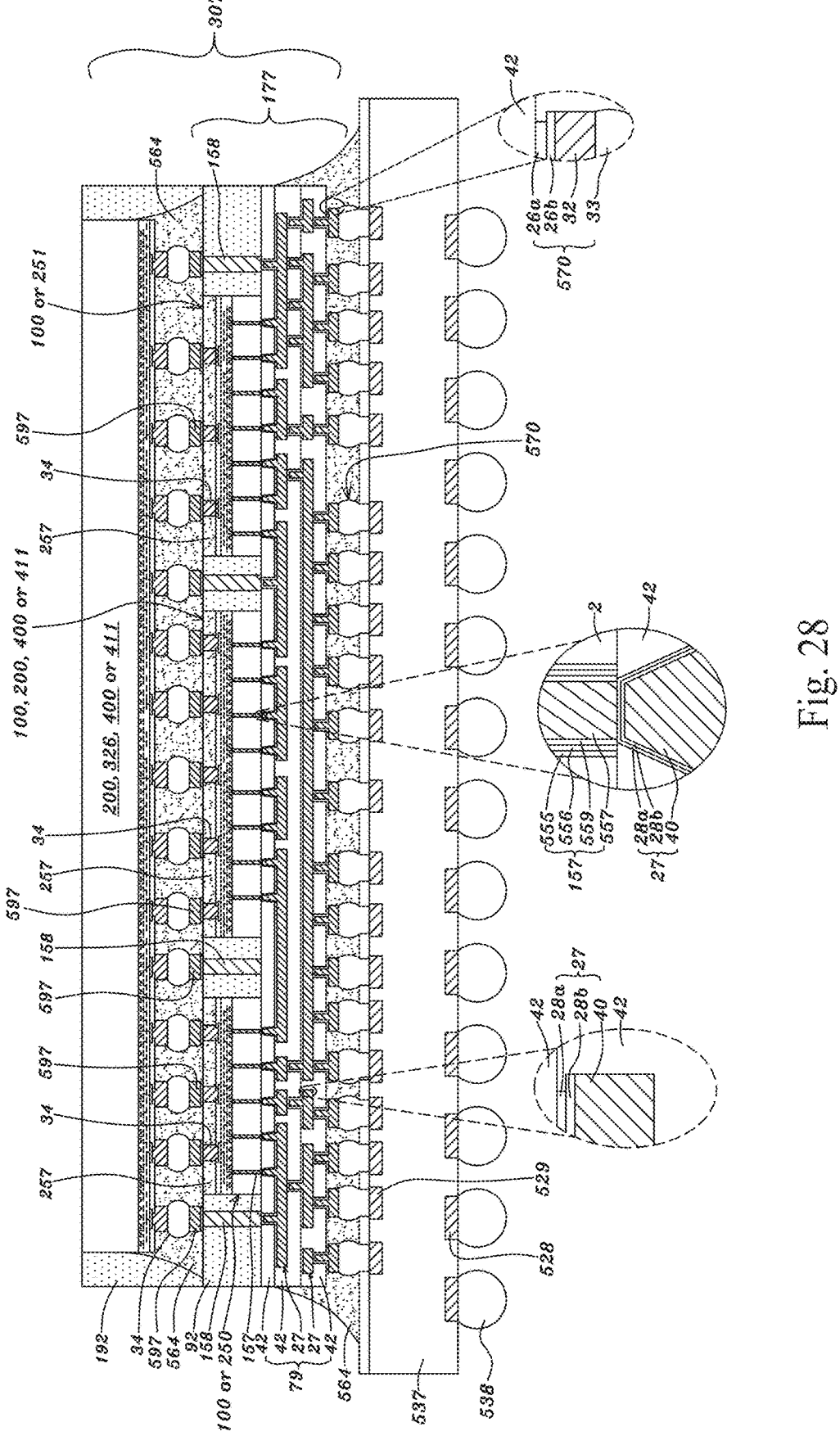
FIG. 28 is a schematically cross-sectional view showing a twenty-second type of chip package for first and second alternatives in accordance with an embodiment of the present application.

FIG. 28 is a schematically cross-sectional view showing a twenty-second type of chip package for first and second alternatives in accordance with an embodiment of the present application.

1. First Alternative

Referring to FIG. 28, a twenty-second type of chip package 307 for a first alternative may be provided with a chip embedded substrate 177, i.e., chip package, including multiple semiconductor IC chips 100, each of which may have the specification for the fourth type of semiconductor IC chip 100 as illustrated in FIG. 3D, arranged in a horizontal level, wherein each of its semiconductor IC chips 100 may be a non-volatile memory (NVM) IC chip 250, such as NAND or NOR flash chip, MRAM IC chip, RRAM IC chip or FRAM IC chip, a high-band-width (HBM) IC chip 251, such as SRAM IC chip or DRAM IC chip, or a CS IC chip 411. The chip embedded substrate 177 of the twenty-second type of chip package 307 may further include (1) a polymer layer 92, i.e., insulating dielectric layer, made of molding compound, epoxy-based material, polyimide or silicon oxide, for example, in multiple gaps each between neighboring two of its semiconductor IC chips 100, wherein its polymer layer 92 may have a top surface coplanar with a top surface of the polymer layer 257 of each of its semiconductor IC chips 100 and a top surface of each of the micro-bumps, micro-pillars or micro-pads 34 of each of its semiconductor IC chips 100, (2) multiple through package vias (TPVs) 158 in its polymer layer 92, wherein each of its through package vias (TPVs) 158 may be made of a copper layer having a height between 20 μm and 300 μm, 30 μm and 200 μm, 50 μm and 150 μm, 50 μm and 120 μm, 20 μm and 100 μm, 20 μm and 60 μm, 20 μm and 40 μm, or 20 μm and 30 μm, or greater than or equal to 100 μm, 50 μm, 30 μm or 20 μm, and may have a top surface coplanar with the top surface of its polymer layer 92 and (3) a backside interconnection scheme for a logic drive or device (BISD) 79 under its semiconductor IC chips 100, polymer layer 92 and through package vias (TPVs) 158.

Referring to FIG. 28, for each of the semiconductor IC chips 100 of the chip embedded substrate 177 of the twenty-second type of chip package 307 for the first alternative, its semiconductor substrate 2 may have a portion at a backside thereof removed by a chemical-mechanical-polishing (CMP) or mechanical grinding process such that each of its through silicon vias (TSVs) 157, that is, the electroplated copper layer 156 thereof, may have a backside substantially coplanar with the backside of its semiconductor substrate 2 and a bottom surface of the polymer layer 92 of the chip embedded substrate 177 of the twenty-second type of chip package 307.

Referring to FIG. 28, the BISD 79 of the chip embedded substrate 177 of the twenty-second type of chip package 307 for the first alternative may be provided with one or more interconnection metal layers 27 coupling to each of the through silicon vias (TSVs) 157 of each of the semiconductor IC chips 100 of the chip embedded substrate 177 of the twenty-second type of chip package 307 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the chip embedded substrate 177 of the twenty-second type of chip package 307, the topmost one of the polymer layers 42 of its BISD 79 may have a top surface in contact with the bottom surface of its polymer layer 92. The topmost one of the polymer layers 42 of its BISD 79 may be between the topmost one of the interconnection metal layers 27 of its BISD 79 and its polymer layer 92 and between the topmost one of the interconnection metal layers 27 of its BISD 79 and the backside of each of its semiconductor IC chips 100, wherein each opening in the topmost one of polymer layers 42 of its BISD 79 may be under one of the through silicon vias (TSVs) 157 of one of its semiconductor IC chips 100 or one of its through package vias (TPVs) 158, and thus the topmost one of the interconnection metal layers 27 of its BISD 79 may extend through said each opening to couple to said one of the through silicon vias (TSVs) 157 or said one of its through package vias (TPVs) 158. Each of its through package vias (TPVs) 158 may couple to a voltage of power supply for delivering a power supply or a voltage of ground reference for delivering a ground reference or may pass signals or clocks for signal or clock transmission. Each of the interconnection metal layers 27 of its BISD 79 may extend horizontally across an edge of each of its semiconductor IC chips 100. The bottommost one of the interconnection metal layers 27 of its BISD 79 may have multiple metal pads at tops of multiple respective openings 42_a_ in the bottommost one of the polymer layers 42 of its BISD 79. The specification and process for the interconnection metal layers 27 and polymer layers 42 for the backside interconnection scheme for a logic drive or device (BISD) 79 may be referred to those for the SISC 29 as illustrated in FIG. 3A to be turned upside down.

Referring to FIG. 28, the twenty-second type of chip package 307 for the first alternative may further include multiple metal bumps, pillars or pads 570 in an array at a bottom thereof, each of which may be of any type of the first, second, third and fourth types having the same specification as that of the first, second, third and fourth types of micro-bumps, micro-pillars or micro-pads 34 respectively as illustrated in FIG. 34A to be turned upside down. Each of its first, second, third or fourth type of metal bumps, pillars or pads 570 may have the adhesion layer 26_a_ on a bottom surface of one of the metal pads of the bottommost one of the interconnection metal layers 27 of the BISD 79 of its chip embedded substrate 177. For the twenty-second type of chip package 307, its first, second, third or fourth type of metal bumps, pillars or pads 570 may act as external pins of the twenty-second type of chip package 307 to couple or bond to external circuits, i.e., a ball-grid-array (BGA) substrate 537.

Referring to FIG. 28, the twenty-second type of chip package 307 for the first alternative may further include a semiconductor IC chip 326, which may have the specification for the first type of semiconductor IC chip 100 as illustrated in FIG. 3A to be turned upside down, mounted to its chip embedded substrate 177, wherein its semiconductor IC chip 326 may be an application-specific integrated-circuit (ASIC) chip or logic IC chip, such as standard commodity FPGA IC chip, graphic-processing unit (GPU) IC chip, data-processing-unit (DPU) IC chip, central-processing-unit (CPU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip, data-processing-unit (DPU) IC chip, application-processing-unit (APU) IC chip or digital-signal-processing (DSP) IC chip. Alternatively, its semiconductor IC chip 326 may be replaced with the first type of field programmable chip-on-chip module 400 as seen in FIG. 5A to be turned upside down. For the twenty-second type of chip package 307, its semiconductor IC 326, or the second FPGA IC chip or chiplet 200_b_ of its first type of field programmable chip-on-chip module 400 in case of replacing its semiconductor IC 326, may have the first, second, third or fourth type of micro-bumps, micro-pillars or micro-pads 34 as illustrated in FIG. 3A each bonded to a metal pad 597, such as copper pad, preformed on the top surface of one of the micro-bumps, micro-pillars or micro-pads 34 of one of the semiconductor IC chips 100 of its chip embedded substrate 177 or the top surface of one of the through package vias (TPVs) 158 of its chip embedded substrate 177.

The twenty-second type of chip package 307 for the first alternative may further include an underfill 564, i.e., polymer layer, between its semiconductor IC chip 326, or the second FPGA IC chip or chiplet 200b of its first type of field programmable chip-on-chip module 400 in case of replacing its semiconductor IC chip 326, and its chip embedded substrate 177, covering a sidewall of each of the first, second, third or fourth type of micro-bumps, micro-pillars or micro-pads 34 of its semiconductor IC chip 326, or a sidewall of each of the first, second, third or fourth type of micro-bumps, micro-pillars or micro-pads 34 of the second FPGA IC chip or chiplet 200b of its first type of field programmable chip-on-chip module 400 in case of replacing its semiconductor IC chip 326, and a polymer layer 192, i.e., insulating dielectric layer, made of molding compound, epoxy-based material, polyimide or silicon oxide, for example, on its chip embedded substrate 177 and around its semiconductor IC chip 326, or its first type of field programmable chip-on-chip module 400 in case of replacing its semiconductor IC chip 326, wherein its polymer layer 192 may have a top surface coplanar with a top surface of its semiconductor IC chip 326, or a top surface of the first FPGA IC chip or chiplet 200a of its first type of field programmable chip-on-chip module 400 in case of replacing its semiconductor IC chip 326. For the twenty-second type of chip package 307 for the first alternative, its metal bumps, pillars or pads 570 may be bonded respectively to multiple metal pads 529 of the ball-grid-array (BGA) substrate 537 at a top of the ball-grid-array (BGA) substrate 537. The ball-grid-array (BGA) substrate 537 may include multiple solder balls 538, made of a tin-lead alloy or tin-silver-copper alloy, on multiple metal pads 528 of the ball-grid-array (BGA) substrate 537 at a bottom of the ball-grid-array (BGA) substrate 537 respectively. An underfill 564 may be filled into a gap between its chip embedded substrate 177 and the ball-grid-array (BGA) substrate 537, covering a sidewall of each of its metal bumps, pillars, or pads 570.

Referring to FIG. 28, for a specific example of the twenty-second type of chip package 307 for the first alternative, its semiconductor IC chip 326 may be a FPGA IC chip or chiplet 200, a left one of the semiconductor IC chips 100 of its chip embedded substrate 177 may be a NVM IC chip 250 and a middle one of the semiconductor IC chips 100 of its chip embedded substrate 177 may be a CS IC chip 411. Alternatively, its FPGA IC chip or chiplet 200 may be replaced with the first type of field programmable chip-on-chip module 400 as seen in FIG. 5A to be turned upside down. Its FPGA IC chip or chiplet 200, or each of the first and second FPGA IC chips or chiplets 200a and 200b of its first type of field programmable chip-on-chip module 400 in case of replacing its FPGA IC chip or chiplet 200, may include any type of the first through third types of field programmable logic cell or element (LCE) 2014 as illustrated in FIGS. 1A-1C and any type of the first and second types of field programmable switch cells 379 as illustrated in FIGS. 2A and 2B. The NVM IC chip 250 of its chip embedded substrate 177 may include a first set of large I/O circuits coupling to a second set of large I/O circuits of the CS IC chip 411 of its chip embedded substrate 177 through, in sequence, one of the through silicon vias (TSVs) 157 of the NVM IC chip 250 of its chip embedded substrate 177, one or more of the interconnection metal layers 27 of the BISD 79 of its chip embedded substrate 177 and one of the through silicon vias (TSVs) 157 of the CS IC chip 411 of its chip embedded substrate 177 for passing first encrypted configuration programming memory (CPM) data from the first set of large I/O circuits to the second set of large I/O circuits. Next, the first encrypted CPM data may be decrypted by a cryptography block of the CS IC chip 411 of its chip embedded substrate 177 as first decrypted CPM data. Next, the CS IC chip 411 of its chip embedded substrate 177 may have a first set of small I/O circuits coupling to a second set of small I/O circuits of its standard commodity FPGA IC chip or chiplet 200, or a third set of small I/O circuits of either of the first and second FPGA IC chips or chiplets 200a and 200b of its first type of field programmable chip-on-chip module 400 in case of replacing its standard commodity FPGA IC chip or chiplet 200, through, in sequence, (1) one of the micro-bumps, micro-pillars or micro-pads 34 of the CS IC chip 411 of its chip embedded substrate 177, (2) one of its metal pads 597 and (3) one of the micro-bumps, micro-pillars or micro-pads 34 of its standard commodity FPGA IC chip or chiplet 200, or one of the micro-bumps, micro-pillars or micro-pads 34 of the second FPGA IC chip or chiplet 200b of its first type of field programmable chip-on-chip module 400 in case of replacing its standard commodity FPGA IC chip or chiplet 200, for passing the first decrypted CPM data in parallel with an increased data bit width equal to or more than 4, 8, 16, 32, 64, 128 or 256 for example, from the first set small I/O circuits to the second set of small I/O circuits, or third set of small I/O circuits. Next, the first decrypted CPM data may be passed to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of said either of the first and second FPGA IC chips or chiplets 200a and 200b of its first type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its first type of field programmable chip-on-chip module 400 in case of replacing its FPGA IC chip or chiplet 200 to be stored therein. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIG. 28, for the specific example of the twenty-second type of chip package 307 for the first alternative, second CPM data may be passed from the second set of small I/O circuits, or third set of small I/O circuits, to the first set of small I/O circuits, through, in sequence, (1) one of the micro-bumps, micro-pillars or micro-pads 34 of its standard commodity FPGA IC chip or chiplet 200, or one of the micro-bumps, micro-pillars or micro-pads 34 of the second FPGA IC chip or chiplet 200b of its first type of field programmable chip-on-chip module 400 in case of replacing its standard commodity FPGA IC chip or chiplet 200, (2) one of its metal pads 597 and (3) one of the micro-bumps, micro-pillars or micro-pads 34 of the CS IC chip 411 of its chip embedded substrate 177, wherein the second CPM data is associated with the resulting value or programming codes stored in (1) the memory cells 490 of any type of the first through third types of field programmable logic cell or element (LCE) 2014 of its standard commodity FPGA IC chip or chiplet 200, or the memory cells 490 of any type of the first through third types of field programmable logic cell or element (LCE) 2014 of each of the first and second FPGA IC chips or chiplets 200a and 200b of its first type of field programmable chip-on-chip module 400 in case of replacing its standard commodity FPGA IC chip or chiplet 200, and (2) the memory cells 362 of any type of the first and second types of field programmable switch cells 379 of its standard commodity FPGA IC chip or chiplet 200, or the memory cells 362 of any type of the first and second types of field programmable switch cells 379 of each of the first and second FPGA IC chips or chiplets 200a and 200b of its first type of field programmable chip-on-chip module 400 in case of replacing its FPGA IC chip or chiplet 200. Next, the CS IC chip 411 of its chip embedded substrate 177 may encrypt the second CPM data as second encrypted CPM data to be passed from the second set of large I/O circuits to the first set of large I/O circuits through, in sequence, one of the through silicon vias (TSVs) 157 of the CS IC chip 411 of its chip embedded substrate 177, one or more of the interconnection metal layers 27 of the BISD 79 of its chip embedded substrate 177 and one of the through silicon vias (TSVs) 157 of the NVM IC chip 250 of its chip embedded substrate 177 to be stored in the NVM IC chip 250 of its chip embedded substrate 177.

For the specific example of the twenty-second type of chip package 307 for the first alternative as seen in FIG. 28, the CS IC chip 411 of its chip embedded substrate 177 may include multiple hard macros that may be divided into two groups: each of a first group of hard macros of the CS IC chip 411 of its chip embedded substrate 177 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU)

circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of its FPGA IC chip or chiplet 200, or (2) a data input of one of multiple center-processing-unit cores (CPUC) of its FPGA IC chip or chiplet 200, through, in sequence, the first set of small I/O circuits, one of the micro-bumps, micro-pillars or micro-pads 34 of the CS IC chip 411 of its chip embedded substrate 177, one of its metal pads 597, one of the micro-bumps, micro-pillars or micro-pads 34 of its standard commodity FPGA IC chip or chiplet 200 and the second set of small I/O circuits, or as (1) a data input of the input data set of one of any type of the first, second and third types of field programmable logic cells or elements (LCE) 2014 of said either of the first and second FPGA IC chips and chiplets 200a and 200b of its first type of field programmable chip-on-chip module 400 in case of replacing its standard commodity FPGA IC chip or chiplet 200, or (2) a data input of one of multiple center-processing-unit cores (CPUC) of said either of the first and second FPGA IC chips and chiplets 200a and 200b of its first type of field programmable chip-on-chip module 400 in case of replacing its standard commodity FPGA IC chip or chiplet 200, through, in sequence, the first set of small I/O circuits, one of the micro-bumps, micro-pillars or micro-pads 34 of the CS IC chip 411 of its chip embedded substrate 177, one of its metal pads 597, one of the micro-bumps, micro-pillars or micro-pads 34 of the second FPGA IC chip or chiplet 200b of its first type of field programmable chip-on-chip module 400 and the third set of small I/O circuits. Further, said each of the first group of hard macros may have input data passed from (1) the data output of one of any type of the first, second and third types of field programmable logic cells or elements (LCEs) 2014 of its standard commodity FPGA IC chip or chiplet 200, or (2) one of multiple data outputs of one of the center-processing-unit cores (CPUC) of its standard commodity FPGA IC chip or chiplet 200, through, in sequence, the second set of small I/O circuits, one of the micro-bumps, micro-pillars or micro-pads 34 of its standard commodity FPGA IC chip or chiplet 200, one of its metal pads 597, one of the micro-bumps, micro-pillars or micro-pads 34 of the CS IC chip 411 of its chip embedded substrate 177 and the first set of small I/O circuits, or from (1) the data output of one of any type of the first, second and third types of field programmable logic cells or elements (LCEs) 2014 of said either of the first and second FPGA IC chips or chiplets 200a and 200b of its first type of field programmable chip-on-chip module 400 in case of replacing its standard commodity FPGA IC chip or chiplet 200, or (2) one of multiple data outputs of one of the center-processing-unit cores (CPUC) of said either of the first and second FPGA IC chips and chiplets 200a and 200b of its first type of field programmable chip-on-chip module 400 in case of replacing its standard commodity FPGA IC chip or chiplet 200 through, in sequence, the third set of small I/O circuits, one of the micro-bumps, micro-pillars or micro-pads 34 of the second FPGA IC chip or chiplet 200b of its first type of field programmable chip-on-chip module 400 in case of replacing its standard commodity FPGA IC chip or chiplet 200, one of its metal pads 597, one of the micro-bumps, micro-pillars or micro-pads 34 of the CS IC chip 411 of its chip embedded substrate 177 and the first set of small I/O circuits. Further, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its first type of field programmable chip-on-chip module 400 in case of replacing its standard commodity FPGA IC chip or chiplet 200, may be used as a networking circuit or smart interface between two of the first group of hard macros of the CS IC chip 411 of its chip embedded substrate 177 for controlling coupling therebetween. For example, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its first type of field programmable chip-on-chip module 400 in case of replacing its standard commodity FPGA IC chip or chiplet 200, may be used as a networking circuit or smart interface between two of multiple central-processing-unit (CPU) cores of the CS IC chip 411 of its chip embedded substrate 177 for controlling coupling therebetween, wherein the number of the central-processing-unit (CPU) cores of the CS IC chip 411 of its chip embedded substrate 177 may be equal to or greater than 4, 8, 16, 32, 64, 128, 256 or 512. Each of a second group of hard macros of the CS IC chip 411 of its chip embedded substrate 177 may be a phase locked loop (PLL) circuit or digital clock manager (DCM) configured to generate a clock signal to be passed to (1) its standard commodity FPGA IC chip or chiplet 200 through, in sequence, the first set of small I/O circuits, one of the micro-bumps, micro-pillars or micro-pads 34 of the CS IC chip 411 of its chip embedded substrate 177, one of its metal pads 597, one of the micro-bumps, micro-pillars or micro-pads 34 of its standard commodity FPGA IC chip or chiplet 200 and the second set of small I/O circuits, or (2) either of the first and second FPGA IC chips or chiplets 200a and 200b of its first type of field programmable chip-on-chip module 400 in case of replacing its standard commodity FPGA IC chip or chiplet 200 through, in sequence, the first set of small I/O circuits, one of the micro-bumps, micro-pillars or micro-pads 34 of the CS IC chip 411 of its chip embedded substrate 177, one of its metal pads 597, one of the micro-bumps, micro-pillars or micro-pads 34 of the second FPGA IC chip or chiplet 200b of its first type of field programmable chip-on-chip module 400 and the third set of small I/O circuits, and to (2) the non-volatile memory (NVM) IC chip 250 of its chip embedded substrate 177 through, in sequence, the second set of large I/O circuits, one of the through silicon vias (TSVs) 157 of the CS IC chip 411 of its chip embedded substrate 177, one or more of the interconnection metal layers 27 of the BISD 79 of its chip embedded substrate 177, one of the through silicon vias (TSVs) 157 of the NVM IC chip 250 of its chip embedded substrate 177 and the first set of large I/O circuits.

For another specific example of the twenty-second type of chip package 307 for the first alternative as seen in FIG. 28, in case that a right one of the semiconductor IC chips 100 of its chip embedded substrate 177 may be a high-band-width (HBM) IC chip 251. Its semiconductor IC chip 326, or either of the first and second FPGA IC chips and chiplets 200a and 200b of its first type of field programmable chip-on-chip module 400 in case of replacing its semiconductor IC chip 326, may have a fourth set of small I/O circuits coupling respectively to a fifth set of small I/O circuits of the HBM IC chip 251 of its chip embedded substrate 177 through a set of the micro-bumps, micro-pillars or micro-pads 34 of its semiconductor IC chip 326, a set of its metal pads 597 and a set of the micro-bumps, micro-pillars or micro-pads 34 of the HBM IC chip 251 of its chip embedded substrate 177. It is noted that each of the fourth and fifth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF. Further, the fourth set of small I/O circuits may couple to the fifth set of small I/O circuits for parallel data transmission between its HBM IC chip 251 and semiconductor IC chip 326 with a data bit width of equal to or greater than 64, 128, 256, 512, 1024, 2048, 4096, 8K, or 16K.

Referring to FIG. 28, for the twenty-second type of chip packages 307 for the first alternative, the CS IC chip 411 of its chip embedded substrate 177 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its semiconductor IC chip 326, or each of the first and second FPGA IC chips and chiplets 200a and 200b of its first type of field programmable chip-on-chip module 400 in case of replacing its semiconductor IC chip 326, and the others of the semiconductor IC chips 100 of its chip embedded substrate 177. Each of the through package vias (TPVs) 158 of its chip embedded substrate 177 may couple to a voltage of power supply for delivering a power supply or a voltage of ground reference for delivering a ground reference or may pass signals or clocks for signal or clock transmission.

Alternatively, for the twenty-second type of chip package 307 for the first alternative as seen in FIG. 28, the FISD 101 as illustrated in FIGS. 22A and 22B to be turned upside down may be provided on its chip embedded substrate 177, including (1) one or more of the interconnection metal layers 27 over its chip embedded substrate 177 and coupling to each of the micro-bumps, micro-pillars or micro-pads 34 of each of the semiconductor IC chips 100 of its chip embedded substrate 177 and each of the through package vias (TPVs) 158 of its chip embedded substrate 177, and (2) one or more polymer layers 42, i.e., insulating dielectric layers, each between neighboring two of the interconnection metal layers 27 of its FISD 101. Its semiconductor IC chip 326, or the second FPGA IC chip or chiplet 200b of its first type of field programmable chip-on-chip module 400 in case of replacing its semiconductor IC chip 326, may have the first, second, third or fourth type of micro-bumps, micro-pillars or micro-pads 34 as illustrated in FIG. 3A to be turned upside down each bonded to a metal pad, such as copper pad, preformed on a top surface of the topmost one of the interconnection metal layers 27 of its FISD 101 to couple to (1) one of the micro-bumps, micro-pillars or micro-pads 34 of one of the semiconductor IC chips 100 of its chip embedded substrate 177 through each of the interconnection metal layers 27 of its FISD 101 or (2) one of the through package vias (TPVs) 158 of its chip embedded substrate 177 through each of the interconnection metal layers 27 of its FISD 101. Its underfill 564, i.e., polymer layer, may be formed between its semiconductor IC chip 326, or the second FPGA IC chip or chiplet 200b of its first type of field programmable chip-on-chip module 400 in case of replacing its semiconductor IC chip 326, and its FISD 101. Its polymer layer 192 may be formed on its FISD 101 and around its semiconductor IC chip 326, or its first type of field programmable chip-on-chip module 400 in case of replacing its semiconductor IC chip 326, wherein its polymer layer 192 has a top surface coplanar with a top surface of its semiconductor IC chip 326, or a top surface of the first FPGA IC chip or chiplet 200*a* of its first type of field programmable chip-on-chip module 400 in case of replacing its semiconductor IC chip 326.

2. Second Alternative

Referring to FIG. 42, the difference between the twenty-second type of chip packages 307 for the first and second alternatives is that the semiconductor IC chip 326 of the twenty-second type of chip package 307 for the first alternative may be provided for a CS IC chip 411 for the twenty-second type of chip package 307 for the second alternative, which may perform the same function as the CS IC chip 411 of the twenty-second type of chip package 307 for the first alternative, while the middle one of the semiconductor IC chips 100 of the chip embedded substrate 177 may be provided for an application-specific integrated-circuit (ASIC) chip or logic IC chip, such as standard commodity FPGA IC chip, graphic-processing unit (GPU) IC chip, data-processing-unit (DPU) IC chip, central-pro-cessing-unit (CPU) IC chip, tensor-flow-processing-unit (TPU) IC chip, micro-control-unit (MCU) IC chip, artificial-intelligent-unit (AIU) IC chip, machine-learning-unit (MLU) IC chip, application-specific-integrated-circuit (ASIC) chip, data-processing-unit (DPU) IC chip, applica-tion-processing-unit (APU) IC chip or digital-signal-pro-cessing (DSP) IC chip. Alternatively, the middle one of the semiconductor IC chips 100 of the chip embedded substrate 177 may be replaced with the fourth type of field program-mable chip-on-chip module 400 as seen in FIG. 5D for the twenty-second type of chip package 307 for the second alternative.

For the twenty-second type of chip package 307 for the second alternative, the semiconductor substrate 2 of the first FPGA IC chip or chiplet 200*a* of the fourth type of field programmable chip-on-chip module 400 of its chip embed-ded substrate 177 in case of replacing the middle one of the semiconductor IC chips 100 of its chip embedded substrate 177 may have a portion at a backside thereof removed by a chemical-mechanical-polishing (CMP) or mechanical grind-ing process such that each of the through silicon vias (TSVs) 157 of the first FPGA IC chip or chiplet 200*a* of the fourth type of field programmable chip-on-chip module 400 of its chip embedded substrate 177, that is, the electroplated copper layer 156 thereof, may have a backside substantially coplanar with the backside of the semiconductor substrate 2 of the first FPGA IC chip or chiplet 200*a* of the fourth type of field programmable chip-on-chip module 400 of its chip embedded substrate 177 and a bottom surface of the polymer layer 92 of its chip embedded substrate 177.

Referring to FIG. 28, for a specific example of the twenty-second type of chip package 307 for the second alternative, its semiconductor IC chip 326 may be a CS IC chip 411, a left one of the semiconductor IC chips 100 of its chip embedded substrate 177 may be an NVM IC chip 250 and a middle one of the semiconductor IC chips 100 of its chip embedded substrate 177 may be a FPGA IC chip or chiplet 200. Alternatively, its FPGA IC chip or chiplet 200 may be replaced with the fourth type of field programmable chip-on-chip module 400 as seen in FIG. 5D. The semicon-ductor substrate 2 of the first FPGA IC chip or chiplet 200*a* of the fourth type of field programmable chip-on-chip mod-ule 400 of its chip embedded substrate 177 in case of replacing the middle one of the semiconductor IC chips 100 of its chip embedded substrate 177 may have a portion at a backside thereof removed by a chemical-mechanical-polish-ing (CMP) or mechanical grinding process such that each of the through silicon vias (TSVs) 157 of the first FPGA IC chip or chiplet 200*a* of the fourth type of field programmable chip-on-chip module 400 of its chip embedded substrate 177, that is, the electroplated copper layer 156 thereof, may have a backside substantially coplanar with the backside of the semiconductor substrate 2 of the first FPGA IC chip or chiplet 200*a* of the fourth type of field programmable chip-on-chip module 400 of its chip embedded substrate 177 and a bottom surface of the polymer layer 92 of its chip embedded substrate 177.

Referring to FIG. 28, for the specific example of the twenty-second type of chip package 307 for the second alternative, the FPGA IC chip or chiplet 200 of its chip embedded substrate 177, or each of the first and second FPGA IC chips or chiplets 200*a* and 200*b* of the fourth type of field programmable chip-on-chip module 400 of its chip embedded substrate 177 in case of replacing the FPGA IC chip or chiplet 200 of its chip embedded substrate 177, may include any type of the first through third types of field programmable logic cell or element (LCE) 2014 as illus-trated in FIGS. 1A-1C and any type of the first and second types of field programmable switch cells 379 as illustrated in FIGS. 2A and 2B. The NVM IC chip 250 of its chip embedded substrate 177 may include a first set of large I/O circuits coupling to a second set of large I/O circuits of its CS IC chip 411 through, in sequence, one of the micro-bumps, micro-pillars or micro-pads 34 of the NVM IC chip 250 of its chip embedded substrate 177, one of its metal pads 597 and one of the micro-bumps, micro-pillars or micro-pads 34 of its CS IC chip 411 for passing first encrypted configuration programming memory (CPM) data from the first set of large I/O circuits to the second set of large I/O circuits. Next, the first encrypted CPM data may be decrypted by a cryptography block of its CS IC chip 411 as first decrypted CPM data. Next, its CS IC chip 411 may have a first set of small I/O circuits coupling to a second set of small I/O circuits of the standard commodity FPGA IC chip or chiplet 200 of its chip embedded substrate 177, or a third set of small I/O circuits of either of the first and second FPGA IC chips or chiplets 200*a* and 200*b* of the fourth type of field programmable chip-on-chip module 400 of its chip embedded substrate 177 in case of replacing the standard commodity FPGA IC chip or chiplet 200 of its chip embed-ded substrate 177, through, in sequence, (1) one of the micro-bumps, micro-pillars or micro-pads 34 of its CS IC chip 411, (2) one of its metal pads 597 and (3) one of the micro-bumps, micro-pillars or micro-pads 34 of the standard commodity FPGA IC chip or chiplet 200 of its chip embed-ded substrate 177, or one of the micro-bumps, micro-pillars or micro-pads 34 of the second FPGA IC chip or chiplet 200*b* of the fourth type of field programmable chip-on-chip module 400 of its chip embedded substrate 177 in case of replacing the standard commodity FPGA IC chip or chiplet 200 of its chip embedded substrate 177, for passing the first decrypted CPM data in parallel with an increased data bit width equal to or more than 4, 8, 16, 32, 64, 128 or 256 for example, from the first set small I/O circuits to the second set of small I/O circuits, or third set of small I/O circuits. Next, the first decrypted CPM data may be passed to (1) the memory cells 490 of any type of the first through third types of field programmable logic cell or element (LCE) 2014 of the standard commodity FPGA IC chip or chiplet 200 of its chip embedded substrate 177 to be stored therein, or the memory cells 490 of any type of the first through third types of field programmable logic cell or element (LCE) 2014 of said either of the first and second FPGA IC chips or chiplets 200*a* and 200*b* of the fourth type of field programmable chip-on-chip module 400 of its chip embedded substrate 177 in case of replacing the standard commodity FPGA IC chip or chiplet 200 of its chip embedded substrate 177 to be stored therein, and (2) the memory cells 362 of any type of the first and second types of field programmable switch cells 379 of the standard commodity FPGA IC chip or chiplet 200 of its chip embedded substrate 177 to be stored therein, or the memory cells 362 of any type of the first and second types of field programmable switch cells 379 of said either of the first and second FPGA IC chips or chiplets 200*a* and 200*b* of the fourth type of field programmable chip-on-chip module 400 of its chip embedded substrate 177 in case of replacing the FPGA IC chip or chiplet 200 of its chip embedded substrate 177 to be stored therein. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIG. 28, for the specific example of the twenty-second type of chip package 307 for the second alternative, second CPM data may be passed from the second set of small I/O circuits, or third set of small I/O circuits, to the first set of small I/O circuits, through, in sequence, (1) one of the micro-bumps, micro-pillars or micro-pads 34 of the standard commodity FPGA IC chip or chiplet 200 of its chip embedded substrate 177, or one of the micro-bumps, micro-pillars or micro-pads 34 of the second FPGA IC chip or chiplet 200*b* of the fourth type of field programmable chip-on-chip module 400 of its chip embedded substrate 177 in case of replacing the standard commodity FPGA IC chip or chiplet 200 of its chip embedded substrate 177, (2) one of its metal pads 597 and (3) one of the micro-bumps, micro-pillars or micro-pads 34 of its CS IC chip 411, wherein the second CPM data is associated with the resulting value or programming codes stored in (1) the memory cells 490 of any type of the first through third types of field programmable logic cell or element (LCE) 2014 of the standard commodity FPGA IC chip or chiplet 200 of its chip embedded substrate 177, or the memory cells 490 of any type of the first through third types of field programmable logic cell or element (LCE) 2014 of each of the first and second FPGA IC chips or chiplets 200*a* and 200*b* of the fourth type of field programmable chip-on-chip module 400 of its chip embedded substrate 177 in case of replacing the standard commodity FPGA IC chip or chiplet 200 of its chip embedded substrate 177, and (2) the memory cells 362 of any type of the first and second types of field programmable switch cells 379 of the standard commodity FPGA IC chip or chiplet 200 of its chip embedded substrate 177, or the memory cells 362 of any type of the first and second types of field programmable switch cells 379 of each of the first and second FPGA IC chips or chiplets 200*a* and 200*b* of the fourth type of field programmable chip-on-chip module 400 of its chip embedded substrate 177 in case of replacing the FPGA IC chip or chiplet 200 of its chip embedded substrate 177. Next, its CS IC chip 411 may encrypt the second CPM data as second encrypted CPM data to be passed from the second set of large I/O circuits to the first set of large I/O circuits through, in sequence, one of the micro-bumps, micro-pillars or micro-pads 34 of its CS IC chip 411, one of its metal pads 597 and one of the micro-bumps, micro-pillars or micro-pads 34 of the NVM IC chip 250 of its chip embedded substrate 177.

For the specific example of the twenty-second type of chip package 307 for the second alternative as seen in FIG. 28, its CS IC chip 411 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of the FPGA IC chip or chiplet 200 of its chip embedded substrate 177, or (2) a data input of one of multiple center-processing-unit cores (CPUC) of the FPGA IC chip or chiplet 200 of its chip embedded substrate 177, through, in sequence, the first set of small I/O circuits, one of the micro-bumps, micro-pillars or micro-pads 34 of its CS IC chip 411, one of its metal pads 597, one of the micro-bumps, micro-pillars or micro-pads 34 of the standard commodity FPGA IC chip or chiplet 200 of its chip embedded substrate 177 and the second set of small I/O circuits, or as (1) a data input of the input data set of one of any type of the first, second and third types of field programmable logic cells or elements (LCE) 2014 of said either of the first and second FPGA IC chips and chiplets 200*a* and 200*b* of the fourth type of field programmable chip-on-chip module 400 of its chip embedded substrate 177 in case of replacing the standard commodity FPGA IC chip or chiplet 200 of its chip embedded substrate 177, or (2) a data input of one of multiple center-processing-unit cores (CPUC) of said either of the first and second FPGA IC chips and chiplets 200*a* and 200*b* of the fourth type of field programmable chip-on-chip module 400 of its chip embedded substrate 177 in case of replacing the standard commodity FPGA IC chip or chiplet 200 of its chip embedded substrate 177, through, in sequence, the first set of small I/O circuits, one of the micro-bumps, micro-pillars or micro-pads 34 of its CS IC chip 411, one of its metal pads 597, one of the micro-bumps, micro-pillars or micro-pads 34 of the second FPGA IC chip or chiplet 200*b* of the fourth type of field programmable chip-on-chip module 400 of its chip embedded substrate 177 and the third set of small I/O circuits. Further, said each of the first group of hard macros may have input data passed from (1) the data output of one of any type of the first, second and third types of field programmable logic cells or elements (LCEs) 2014 of the standard commodity FPGA IC chip or chiplet 200 of its chip embedded substrate 177, or (2) one of multiple data outputs of one of the center-processing-unit cores (CPUC) of the standard commodity FPGA IC chip or chiplet 200 of its chip embedded substrate 177, through, in sequence, the second set of small I/O circuits, one of the micro-bumps, micro-pillars or micro-pads 34 of the standard commodity FPGA IC chip or chiplet 200 of its chip embedded substrate 177, one of its metal pads 597, one of the micro-bumps, micro-pillars or micro-pads 34 of its CS IC chip 411 and the first set of small I/O circuits, or from (1) the data output of one of any type of the first, second and third types of field programmable logic cells or elements (LCEs) 2014 of said either of the first and second FPGA IC chips or chiplets 200a and 200b of the fourth type of field programmable chip-on-chip module 400 of its chip embedded substrate 177 in case of replacing the standard commodity FPGA IC chip or chiplet 200 of its chip embedded substrate 177, or (2) one of multiple data outputs of one of the center-processing-unit cores (CPUC) of said either of the first and second FPGA IC chips and chiplets 200a and 200b of the fourth type of field programmable chip-on-chip module 400 of its chip embedded substrate 177 in case of replacing the standard commodity FPGA IC chip or chiplet 200 of its chip embedded substrate 177 through, in sequence, the third set of small I/O circuits, one of the micro-bumps, micro-pillars or micro-pads 34 of the second FPGA IC chip or chiplet 200b of the fourth type of field programmable chip-on-chip module 400 of its chip embedded substrate 177 in case of replacing the standard commodity FPGA IC chip or chiplet 200 of its chip embedded substrate 177, one of its metal pads 597, one of the micro-bumps, micro-pillars or micro-pads 34 of its CS IC chip 411 and the first set of small I/O circuits. Further, one or more of any type of the first and second types of field programmable switch cells 379 of the FPGA IC chip or chiplet 200 of its chip embedded substrate 177, or one or more of any type of the first and second types of field programmable switch cells 379 of each of the first and second FPGA IC chips or chiplets 200a and 200b of the fourth type of field programmable chip-on-chip module 400 of its chip embedded substrate 177 in case of replacing the standard commodity FPGA IC chip or chiplet 200 of its chip embedded substrate 177, may be used as a networking circuit or smart interface between two of the first group of hard macros of its CS IC chip 411 for controlling coupling therebetween. For example, one or more of any type of the first and second types of field programmable switch cells 379 of the FPGA IC chip or chiplet 200 of its chip embedded substrate 177, or one or more of any type of the first and second types of field programmable switch cells 379 of each of the first and second FPGA IC chips or chiplets 200a and 200b of the fourth type of field programmable chip-on-chip module 400 of its chip embedded substrate 177 in case of replacing the standard commodity FPGA IC chip or chiplet 200 of its chip embedded substrate 177, may be used as a networking circuit or smart interface between two of multiple central-processing-unit (CPU) cores of its CS IC chip 411 for controlling coupling therebetween, wherein the number of the central-processing-unit (CPU) cores of its CS IC chip 411 may be equal to or greater than 4, 8, 16, 32, 64, 128, 256 or 512. Each of a second group of hard macros of its CS IC chip 411 may be a phase locked loop (PLL) circuit or digital clock manager (DCM) configured to generate a clock signal to be passed to (1) the standard commodity FPGA IC chip or chiplet 200 of its chip embedded substrate 177 through, in sequence, the first set of small I/O circuits, one of the micro-bumps, micro-pillars or micro-pads 34 of its CS IC chip 411, one of its metal pads 597, one of the micro-bumps, micro-pillars or micro-pads 34 of the standard commodity FPGA IC chip or chiplet 200 of its chip embedded substrate 177 and the second set of small I/O circuits, or (2) either of the first and second FPGA IC chips or chiplets 200a and 200b of the fourth type of field programmable chip-on-chip module 400 of its chip embedded substrate 177 in case of replacing the standard commodity FPGA IC chip or chiplet 200 of its chip embedded substrate 177 through, in sequence, the first set of small I/O circuits, one of the micro-bumps, micro-pillars or micro-pads 34 of its CS IC chip 411, one of its metal pads 597, one of the micro-bumps, micro-pillars or micro-pads 34 of the second FPGA IC chip or chiplet 200b of the fourth type of field programmable chip-on-chip module 400 of its chip embedded substrate 177 and the third set of small I/O circuits, and to (2) the non-volatile memory (NVM) IC chip 250 of its chip embedded substrate 177 through, in sequence, the second set of large I/O circuits, one of the micro-bumps, micro-pillars or micro-pads 34 of its CS IC chip 411, one of its metal pads 597 and one of the micro-bumps, micro-pillars or micro-pads 34 of the non-volatile memory (NVM) IC chip 250 of its chip embedded substrate 177.

Referring to FIG. 28, for the twenty-second type of chip packages 307 for the second alternative, its CS IC chip 411 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to each of the semiconductor IC chips 100 of its chip embedded substrate 177, or each of the first and second FPGA IC chips and chiplets 200a and 200b of the fourth type of field programmable chip-on-chip module 400 of its chip embedded substrate 177 in case of replacing the semiconductor IC chips 100 of its chip embedded substrate 177. Each of the through package vias (TPVs) 158 of its chip embedded substrate 177 may couple to a voltage of power supply for delivering a power supply or a voltage of ground reference for delivering a ground reference or may pass signals or clocks for signal or clock transmission.

Twenty-Third Type of Chip Package

Figure 29:
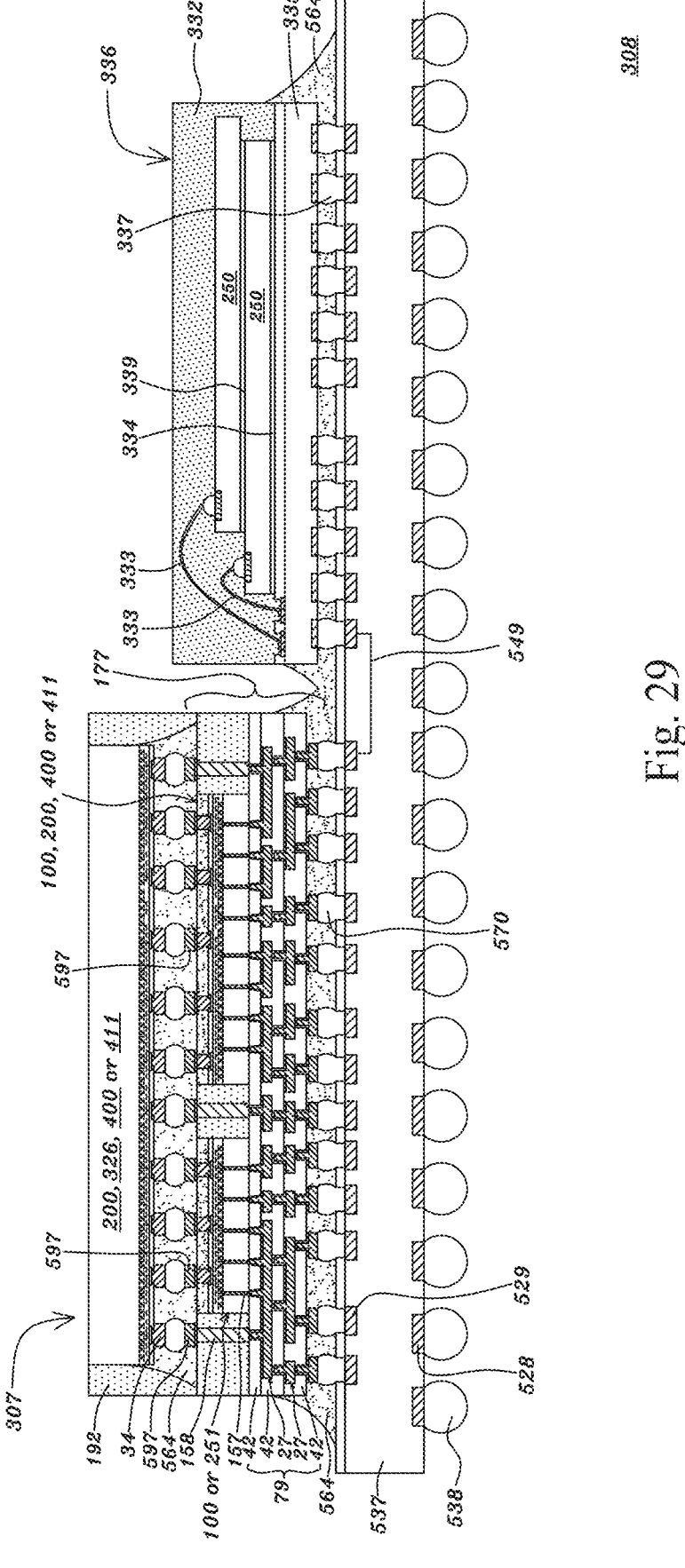
FIG. 29 is a schematically cross-sectional view showing a twenty-third type of chip package for first and second alternatives in accordance with an embodiment of the present application.

FIG. 29 is a schematically cross-sectional view showing a twenty-third type of chip package for first and second alternatives in accordance with an embodiment of the present application.

1. First Alternative

Referring to FIG. 29, a twenty-third type of chip package 308 for a first alternative may have a subsystem unit 307 similar to the twenty-second type of chip package 307 as seen in FIG. 28. For an element indicated by the same reference number shown in FIGS. 28 and 29, the specification of the element as seen in FIG. 29 may be referred to that of the element as illustrated in FIG. 28. The twenty-third type of chip package 308 may further include a non-volatile-memory (NVM) chip package 336, which may have the specification for one as illustrated in FIGS. 27A and 27B. The twenty-third type of chip package 308 may further include the ball-grid-array (BGA) substrate 537 having the specification as illustrated in FIG. 28. For the twenty-third type of chip package 308, its ball-grid-array (BGA) substrate 537 may have the metal pads 529 at a top of its ball-grid-array (BGA) substrate 537 to have the metal bumps, pillars or pads 570 of its subsystem unit 307 for each of the first and second alternatives and the solder balls 337 of its non-volatile-memory (NVM) chip package 336 to be bonded thereto, and the metal pads 528 at a bottom of its ball-grid-array (BGA) substrate 537. The twenty-third type of chip package 308 may further include multiple solder balls 538, made of a tin-lead alloy or tin-silver-copper alloy, on and under the metal pads 528 of its ball-grid-array (BGA) substrate 537 respectively, wherein its solder balls 538 may act as external pins of the twenty-third type of chip package 308 to couple or bond to external circuits, and an underfill 564 filled into a gap between its subsystem unit 307 and ball-grid-array (BGA) substrate 537 and a gap between its non-volatile-memory (NVM) chip package 336 and ball-grid-array (BGA) substrate 537, covering a sidewall of each of the metal bumps, pillars or pads 570 of its subsystem unit 307 and a sidewall of each of the solder balls 337 of its non-volatile-memory (NVM) chip package 336. For the twenty-third type of chip package 308, the NVM IC chip 250 may be removed from the twenty-second type of chip package 307 as seen in FIG. 28 for its subsystem unit 307.

Referring to FIG. 29, for a specific example of the twenty-third type of chip package 308 for the first alternative, in the case that the semiconductor IC chip 326 of its subsystem unit 307 is a FPGA IC chip or chiplet, a left one of the semiconductor IC chips 100 of the chip embedded substrate 177 of its subsystem unit 307 may be a high-bandwidth (HBM) IC chip 251 and a right one of the semiconductor IC chips 100 of the chip embedded substrate 177 of its subsystem unit 307 may be a CS IC chip 411. Alternatively, the FPGA IC chip or chiplet 200 of its subsystem unit 307 may be replaced with the first type of field programmable chip-on-chip module 400 as seen in FIG. 5A to be turned upside down. The FPGA IC chip or chiplet 200 of its subsystem unit 307, or each of the first and second FPGA IC chips or chiplets 200a and 200b of the first type of field programmable chip-on-chip module 400 of its subsystem unit 307 in case of replacing the FPGA IC chip or chiplet 200 of its subsystem unit 307, may include any type of the first through third types of field programmable logic cell or element (LCE) 2014 as illustrated in FIGS. 1A-1C and any type of the first and second types of field programmable switch cells 379 as illustrated in FIGS. 2A and 2B. For the subsystem unit 307 of the twenty-third type of chip package 308 for the first alternative, either of the NVM IC chips 250 of the non-volatile-memory (NVM) chip package 336 of the twenty-third type of chip package 308 for the first alternative may include a first set of large I/O circuits coupling to a second set of large I/O circuits of the CS IC chip 411 of its chip embedded substrate 177 through, in sequence, one of the wirebonded wires 333 of the NVM chip package 336 of the twenty-third type of chip package 308 for the first alternative, the circuit board 335 of the NVM chip package 336 of the twenty-third type of chip package 308 for the first alternative, one of the solder balls 337 of the NVM chip package 336 of the twenty-third type of chip package 308 for the first alternative, a metal line or trace 549 of the ball-grid-array (BGA) substrate 537 of the twenty-third type of chip package 308 for the first alternative, one of its metal bumps, pillars or pads 570, one or more of the interconnection metal layers 27 of the BISD 79 of its chip embedded substrate 177 and one of the through silicon vias (TSVs) 157 of the CS IC chip 411 of its chip embedded substrate 177 for passing first encrypted configuration programming memory (CPM) data from the first set of large I/O circuits to the second set of large I/O circuits. Next, the first encrypted CPM data may be processed in its subsystem unit 307, as above illustrated for the twenty-second type of chip package 307 for the first alternative in FIG. 28. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIG. 29, for the specific example of the twenty-third type of chip package 308 for the first alternative, the second CPM data, as above illustrated for the twenty-second type of chip package 307 for the first alternative in FIG. 28, passed from the second set of small I/O circuits, or third set of small I/O circuits, to the first set of small I/O circuits, may be encrypted as the second encrypted CPM data. Next, the second encrypted CPM data may be passed to the first set of large I/O circuits of said either of the NVM IC chips 250 of its non-volatile-memory (NVM) chip package 336 to be stored therein through, in sequence, one of the through silicon vias (TSVs) 157 of the CS IC chip 411 of the chip embedded substrate 177 of its subsystem unit 307, one or more of the interconnection metal layers 27 of the BISD 79 of the chip embedded substrate 177 of its subsystem unit 307, one of the metal bumps, pillars or pads 570 of its subsystem unit 307, a metal line or trace 549 of its ball-grid-array (BGA) substrate 537, one of the solder balls 337 of its NVM chip package 336, the circuit board 335 of its NVM chip package 336 and one of the wirebonded wires 333 of its NVM chip package 336.

2. Second Alternative

Referring to FIG. 29, the difference between the twenty-third type of chip packages 308 for the first and second alternatives is that the semiconductor IC chip 326 of the subsystem unit 307 of the twenty-third type of chip package 308 for the second alternative may be provided for a CS IC chip 411, while the right one of the semiconductor IC chips 100 of the chip embedded substrate 177 of the subsystem unit 307 of the twenty-third type of chip package 308 for the second alternative may be provided for an application-specific integrated-circuit (ASIC) chip or logic IC chip, such as standard commodity FPGA IC chip, graphic-processing unit (GPU) IC chip, data-processing-unit (DPU) IC chip, central-processing-unit (CPU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip, data-processing-unit (DPU) IC chip, application-processing-unit (APU) IC chip or digital-signal-processing (DSP) IC chip.

Referring to FIG. 29, for a specific example of the twenty-third type of chip package 308 for the second alternative, the semiconductor IC chip 326 of its subsystem unit 307 may be a CS IC chip 411, a left one of the semiconductor IC chips 100 of the chip embedded substrate 177 of its subsystem unit 307 may be a HBM IC chip 251 and a right one of the semiconductor IC chips 100 of the chip embedded substrate 177 of its subsystem unit 307 may be a FPGA IC chip or chiplet 200. Alternatively, the right one of the semiconductor IC chips 100 of the chip embedded substrate 177 of its subsystem unit 307 may be replaced with the fourth type of field programmable chip-on-chip module 400 as seen in FIG. 5D. The semiconductor substrate 2 of the first FPGA IC chip or chiplet 200*a* of the fourth type of field programmable chip-on-chip module 400 of the chip embedded substrate 177 of its subsystem unit 307 in case of replacing the middle one of the semiconductor IC chips 100 of the chip embedded substrate 177 of its subsystem unit 307 may have a portion at a backside thereof removed by a chemical-mechanical-polishing (CMP) or mechanical grinding process such that each of the through silicon vias (TSVs) 157 of the first FPGA IC chip or chiplet 200*a* of the fourth type of field programmable chip-on-chip module 400 of the chip embedded substrate 177 of its subsystem unit 307, that is, the electroplated copper layer 156 thereof, may have a backside substantially coplanar with the backside of the semiconductor substrate 2 of the first FPGA IC chip or chiplet 200*a* of the fourth type of field programmable chip-on-chip module 400 of the chip embedded substrate 177 of its subsystem unit 307 and a bottom surface of the polymer layer 92 of the chip embedded substrate 177 of its subsystem unit 307.

Referring to FIG. 29, for the specific example of the twenty-third type of chip package 308 for the second alternative, the FPGA IC chip or chiplet 200 of the chip embedded substrate 177 of its subsystem unit 307, or each of the first and second FPGA IC chips or chiplets 200*a* and 200*b* of its fourth type of field programmable chip-on-chip module 400 of the chip embedded substrate 177 of its subsystem unit 307 in case of replacing the FPGA IC chip or chiplet 200 of the chip embedded substrate 177 of its subsystem unit 307, may include any type of the first through third types of field programmable logic cell or element (LCE) 2014 as illustrated in FIGS. 1A-1C and any type of the first and second types of field programmable switch cells 379 as illustrated in FIGS. 2A and 2B. For the subsystem unit 307 of the twenty-third type of chip package 308 for the second alternative, either of the NVM IC chips 250 of the non-volatile-memory (NVM) chip package 336 of the twenty-third type of chip package 308 for the second alternative may include a first set of large I/O circuits coupling to a second set of large I/O circuits of its CS IC chip 411 through, in sequence, one of the wirebonded wires 333 of the NVM chip package 336 of the twenty-third type of chip package 308 for the first alternative, the circuit board 335 of the NVM chip package 336 of the twenty-third type of chip package 308 for the first alternative, one of the solder balls 337 of the NVM chip package 336 of the twenty-third type of chip package 308 for the first alternative, a metal line or trace 549 of the ball-grid-array (BGA) substrate 537 of the twenty-third type of chip package 308 for the first alternative, one of its metal bumps, pillars or pads 570, one or more of the interconnection metal layers 27 of the BISD 79 of its chip embedded substrate 177, one of the through package vias (TPVs) 158 of its chip embedded substrate 177, one of its metal pads 597 and one of the micro-bumps, micro-pillars or micro-pads 34 of its CS IC chip 411 for passing first encrypted configuration programming memory (CPM) data from the first set of large I/O circuits to the second set of large I/O circuits. Next, the first encrypted CPM data may be processed in its subsystem unit 307, as above illustrated for the twenty-second type of chip package 307 for the second alternative in FIG. 28. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIG. 29, for the specific example of the twenty-third type of chip package 308 for the second alternative, the second CPM data, as above illustrated for the twenty-second type of chip package 307 for the second alternative in FIG. 28, passed from the second set of small I/O circuits, or third set of small I/O circuits, to the first set of small I/O circuits, may be encrypted as the second encrypted CPM data. Next, the second encrypted CPM data may be passed to the first set of large I/O circuits of said either of the NVM IC chips 250 of its non-volatile-memory (NVM) chip package 336 to be stored therein through, in sequence, one of the micro-bumps, micro-pillars or micro-pads 34 of the CS IC chip 411 of its subsystem unit 307, one of the metal pads 597 of its subsystem unit 307, one of the through package vias (TPVs) 158 of the chip embedded substrate 177 of its subsystem unit 307, one of the metal bumps, pillars or pads 570 of its subsystem unit 307, a metal line or trace 549 of its ball-grid-array (BGA) substrate 537, one of the solder balls 337 of its NVM chip package 336, the circuit board 335 of its NVM chip package 336 and one of the wirebonded wires 333 of its NVM chip package 336.

Twenty-Fourth Type of Chip Package

Figure 30:
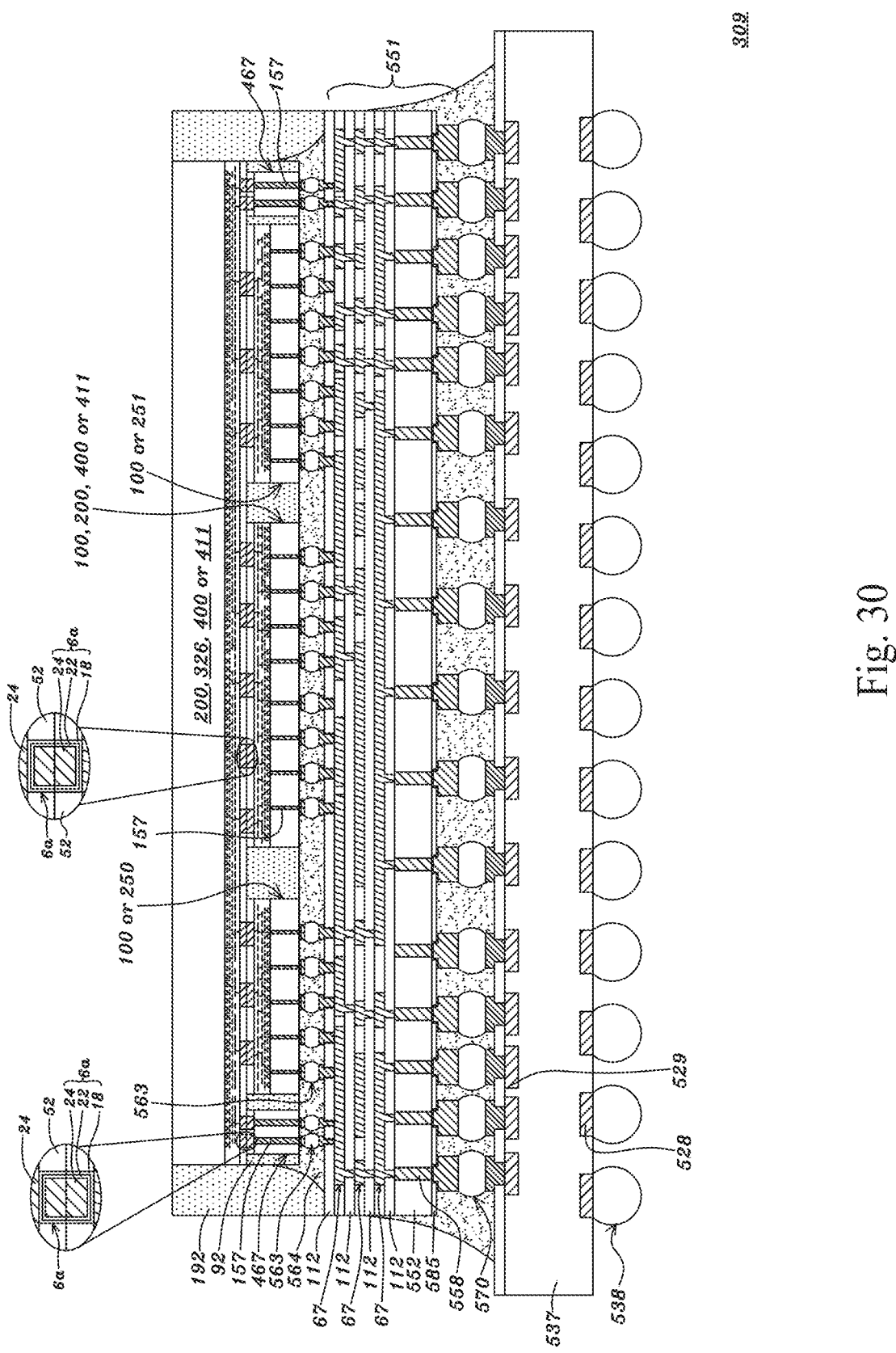
FIG. 30 is a schematically cross-sectional view showing a twenty-fourth type of chip package in accordance with an embodiment of the present application.

FIG. 30 is a schematically cross-sectional view showing a twenty-fourth type of chip package in accordance with an embodiment of the present application.

1. First Alternative

Referring to FIG. 30, a twenty-fourth type of chip package 309 for a first alternative may include (1) a semiconductor IC chip 326 having the specification for the fifth type of semiconductor IC chip 100 as illustrated in FIG. 3E to be turned upside down, which may be used for an application-specific integrated-circuit (ASIC) chip or logic IC chip, such as FPGA IC chip, graphic-processing unit (GPU) IC chip, i.e., data-processing-unit (DPU) IC chip, central-processingunit (CPU) IC chip, tensor-flow-processing-unit (TPU) IC chip, micro-control-unit (MCU) IC chip, artificial-intelligent-unit (MU) IC chip, machine-learning-unit (MLU) IC chip, application-specific-integrated-circuit (ASIC) chip, data-processing-unit (DPU) IC chip, application-processing-unit (APU) IC chip or digital-signal-processing (DSP) IC chip, wherein its semiconductor IC chip 326 may be alternatively replaced with the fifth type of field programmable chip-on-chip module 400 as seen in FIG. 5C to be turned upside down, (2) multiple semiconductor IC chips 100 each having the specification for the sixth type of semiconductor IC chip 100 as illustrated in FIG. 3F, each of which may be a non-volatile memory (NVM) IC chip 250, such as NAND or NOR flash chip, MRAM IC chip, RRAM IC chip or FRAM IC chip, an HBM IC chip 251, such as SRAM IC chip or DRAM IC chip, or a CS IC chip 411 as illustrated in FIG. 29, and (3) multiple vertical-through-via (VTV) connectors 467 each having the specification for the third type of vertical-through-via (VTV) connector 467 as illustrated in FIG. 4C.

Referring to FIG. 30, for the twenty-fourth type of chip package 309 for the first alternative, each of its semiconductor IC chips 100 and vertical-through-via (VTV) connectors 467 may be provided, for hybrid bonding, with (1) the insulating bonding layer 52, i.e., silicon oxide or silicon oxynitride, having a top surface attached to and in contact with a bottom surface of the insulating bonding layer 52, i.e., silicon oxide or silicon oxynitride, of its semiconductor IC chip 326, or a bottom surface of the insulating bonding layer 52, i.e., silicon oxide or or silicon oxynitride, of the second FPGA IC chip or chiplet 200b of its fifth type of field programmable chip-on-chip module 400 in case of replacing its semiconductor IC chip 326, and (2) the metal pads 6a, i.e., copper layer 24 thereof, each having a top surface bonded to and in contact with a bottom surface of one of the metal pads 6a, i.e., copper layer 24 thereof, of its semiconductor IC chip 326, or a bottom surface of one of the metal pads 6a, i.e., copper layer 24 thereof, of the second FPGA IC chip or chiplet 200b of its fifth type of field programmable chip-on-chip module 400 in case of replacing its semiconductor IC chip 326. Each of the metal pads 6a of each of its semiconductor IC chips 100 and 326, and/or each of the metal pads 6a of the second FPGA IC chip or chiplet 200b of its fifth type of field programmable chip-on-chip module 400 in case of replacing its semiconductor IC chip 326, may have a width, diameter or transverse dimension smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6a of each of its semiconductor IC chips 100 and 326, and/or the pitch between neighboring two of the metal pads 6a of the second FPGA IC chip or chiplet 200b of its fifth type of field programmable chip-on-chip module 400 in case of replacing its semiconductor IC chip 326 may be smaller than 10, 5, 2 or 1 micrometers, or between 0.2 and 10 micrometers, 0.2 and 5 micrometers, 0.2 and 2 micrometers, or 0.2 and 1 micrometers.

Referring to FIG. 30, the twenty-fourth type of chip package 309 for the first alternative may include a polymer layer 92, i.e., insulating dielectric layer, made of molding compound, epoxy-based material, polyimide or silicon oxide, in multiple gaps each between neighboring two of its semiconductor IC chips 100 and vertical-through-via (VTV) connectors 467. For each of the semiconductor IC chips 100 and vertical-through-via (VTV) connectors 467 of the twenty-fourth type of chip package 309 for the first alternative, its semiconductor substrate 2 may have a portion at a backside thereof removed by a chemical-mechanical-polishing (CMP) or mechanical grinding process such that each of its through silicon vias (TSVs) 157, that is, the electroplated copper layer 156 thereof, may have a backside substantially coplanar with the backside of its semiconductor substrate 2 and a bottom surface of the polymer layer 92 of the twenty-fourth type of chip package 309 for the first alternative. Each of the through silicon vias (TSVs) 157 of each of the vertical-through-via (VTV) connectors 467 of the twenty-fourth type of chip package 309 for the first alternative may couple to a voltage of power supply for delivering a power supply or a voltage of ground reference for delivering a ground reference or may pass signals or clocks for signal or clock transmission. The semiconductor substrate 2 of each of the semiconductor IC chips 100 of the twenty-fourth type of chip package 309 for the first alternative may have a thickness thinner than 20, 10, 5, or 3 micrometers, or between 0.3 and 20 micrometers, between 0.3 and 10 micrometers, between 0.5 and 20 micrometers, 0.5 and 10 micrometers, 0.3 and 5 micrometers or 0.3 and 3 micrometers, and each of the through silicon vias (TSVs) 157 of each of the semiconductor IC chips 100 of the twenty-fourth type of chip package 309 for the first alternative may have a thickness between 0.3 and 10 micrometers and a width, diameter or maximum transverse dimension smaller than 20, 10, 5, 1 or 0.1 micrometers, or between 0.05 and 0.5 micrometers.

Referring to FIG. 30, the twenty-fourth type of chip package 309 for the first alternative may further include multiple metal bumps, pillars or pads in an array at a bottom of each of its semiconductor IC chips 100 and vertical-through-via (VTV) connectors 467, each of which may be of any type of the first, second, third and fourth types having the same specification as that of the first, second, third and fourth types of micro-bumps, micro-pillars or micro-pads 34 respectively as illustrated in FIG. 3A to be turned upside down. Each of its metal bumps, pillars or pads may have the adhesion layer 26a on a bottom surface of one of the through silicon vias (TSVs) 157 of one of its semiconductor IC chip 100 and vertical-through-via (VTV) connectors 467.

Referring to FIG. 30, the twenty-fourth type of chip package 309 for the first alternative may include an interposer 551 having the specification as illustrated in FIG. 6. For the twenty-fourth type of chip package 309, each of the first, second, third or fourth type of metal bumps, pillars or pads at the bottom of each of its semiconductor IC chips 100 and vertical-through-via (VTV) connectors 467 may be bonded to its interposer 551 to form multiple metal contacts 563 between said each of its semiconductor IC chips 100 and vertical-through-via (VTV) connectors 467 and its interposer 551, wherein each of its metal contacts 563 may include a copper layer having a thickness between 2 μm and 20 μm and a largest transverse dimension between 1 μm and 15 μm between said each of its semiconductor IC chips 100 and vertical-through-via (VTV) connectors 467 and its interposer 551 and a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The twenty-fourth type of chip package 309 may further include (1) an underfill 564, i.e., polymer layer, between each of its semiconductor IC chips 100 and vertical-through-via (VTV) connectors 467 and its interposer 551 and between its polymer layer 92 and its interposer 551, covering a sidewall of each of its metal contacts 563 between said each of its semiconductor IC chips 100 and vertical-through-via (VTV) connectors 467 and its interposer 551, (2) a polymer layer 192, i.e., insulating dielectric layer, made of molding compound, epoxy-based material, polyimide or silicon oxide, on its interposer 551 and underfill 564, wherein its polymer layer 192 has a top surface coplanar with a top surface of its semiconductor IC chip 326, or a top surface of the first FPGA IC chip or chiplet 200a of its fifth type of field programmable chip-on-chip module 400 in case of replacing its semiconductor IC chip 326, and (3) multiple metal bumps, pillars or pads 570 in an array on a bottom surface of its interposer 551. Each of its metal bumps, pillars or pads 570 may have various types, i.e., first, second and third types, which may have the same specification as that of the first, second and third types of metal bumps, pillars or pads 570 respectively as illustrated in FIG. 6, wherein each of its metal bumps, pillars or pads 570 may have the adhesion layer 26a on the backside of one of the through silicon vias 558 of its interposer 551, i.e., a backside of the copper layer 557 thereof.

Referring to FIG. 30, the twenty-fourth type of chip package 309 for the first alternative may further include (1) a ball-grid-array (BGA) substrate 537 having multiple metal pads 529 at a top surface thereof and multiple metal pads 528 at a bottom surface thereof, wherein its metal bumps, pillars or pads 570 may be bonded respectively to the metal pads 529 of its ball-grid-array (BGA) substrate 537, (2) multiple solder balls 538 each on one of the metal pads 528 of its ball-grid-array (BGA) substrate 537, wherein its solder balls 538 may act as external pins of the twenty-fourth type of chip package 309 to couple or bond to its external circuits, and (3) an underfill 564 between its interposer 511 and its ball-grid-array (BGA) substrate 537, covering a sidewall of each of its metal bumps, pillars or pads 570.

Referring to FIG. 30, for a specific example of the twenty-fourth type of chip package 309 for the first alternative, a left one of its semiconductor IC chips 100 may be a NVM IC chip, a middle one of its semiconductor IC chips 100 may be a CS IC chip and its semiconductor IC chip 326 may be a standard commodity FPGA IC chip or chiplet 200. Alternatively, its standard commodity FPGA IC chip or chiplet 200 may be alternatively replaced with the fifth type of field programmable chip-on-chip module 400 as seen in FIG. 5E. Its FPGA IC chip or chiplet 200, or each of the first and second FPGA IC chips or chiplets 200a and 200b of its fifth type of field programmable chip-on-chip module 400 in case of replacing its FPGA IC chip or chiplet 200, may include any type of the first through third types of field programmable logic cell or element (LCE) 2014 as illustrated in FIGS. 1A-1C and any type of the first and second types of field programmable switch cells 379 as illustrated in FIGS. 2A and 2B. Its NVM IC chip 250 may include a first set of large I/O circuits coupling to a second set of large I/O circuits of its CS IC chip 411 through, in sequence, one of the through silicon vias (TSVs) 157 of its NVM IC chip 250, one of its metal contacts 563 under its NVM IC chip 250, one or more of the interconnection metal layers 67 of its interposer 551, one of its metal contacts 563 under its CS IC chip 411, and one of the through silicon vias (TSVs) 157 of its CS IC chip 411 for passing first encrypted configuration programming memory (CPM) data from the first set of large I/O circuits to the second set of large I/O circuits. Next, the first encrypted CPM data may be decrypted by a cryptography block of its CS IC chip 411 as first decrypted CPM data. Next, its CS IC chip 411 may have a first set of small I/O circuits coupling to a second set of small I/O circuits of its standard commodity FPGA IC chip or chiplet 200, or a third set of small I/O circuits of either of the first and second FPGA IC chips or chiplets 200a and 200b of its fifth type of field programmable chip-on-chip module 400 in case of replacing its standard commodity FPGA IC chip or chiplet 200, through, in sequence, one of the metal pads 6a of its CS IC chip 411 and one of the metal pads 6a of its standard commodity FPGA IC chip or chiplet 200, or one of the metal pads 6a of the second FPGA IC chip or chiplet 200b of its fifth type of field programmable chip-on-chip module 400 in case of replacing its standard commodity FPGA IC chip or chiplet 200, for passing the first decrypted CPM data in parallel with an increased data bit width equal to or more than 4, 8, 16, 32, 64, 128 or 256 for example, from the first set small I/O circuits to the second set of small I/O circuits, or third set of small I/O circuits. Next, the first decrypted CPM data may be passed to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field programmable logic cell or element (LCE) 2014 of said either of the first and second FPGA IC chips or chiplets 200a and 200b of its fifth type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its fifth type of field programmable chip-on-chip module 400 in case of replacing its FPGA IC chip or chiplet 200 to be stored therein. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIG. 30, for the specific example of the twenty-fourth type of chip package 307 for the first alternative, second CPM data may be passed from the second set of small I/O circuits, or third set of small I/O circuits, to the first set of small I/O circuits, through, in sequence, (1) one of the metal pads 6a of its standard commodity FPGA IC chip or chiplet 200, or one of the metal pads 6a of the second FPGA IC chip or chiplet 200b of its fifth type of field programmable chip-on-chip module 400 in case of replacing its standard commodity FPGA IC chip or chiplet 200 and (2) one of the metal pads 6a of its CS IC chip 411, wherein the second CPM data is associated with the resulting value or programming codes stored in (1) the memory cells 490 of any type of the first through third types of field programmable logic cell or element (LCE) 2014 of its standard commodity FPGA IC chip or chiplet 200, or the memory cells 490 of any type of the first through third types of field programmable logic cell or element (LCE) 2014 of each of the first and second FPGA IC chips or chiplets 200a and 200b of its fifth type of field programmable chip-on-chip module 400 in case of replacing its standard commodity FPGA IC chip or chiplet 200, and (2) the memory cells 362 of any type of the first and second types of field programmable switch cells 379 of its standard commodity FPGA IC chip or chiplet 200, or the memory cells 362 of any type of the first and second types of field programmable switch cells 379 of each of the first and second FPGA IC chips or chiplets 200a and 200b of its fifth type of field programmable chip-on-chip module 400 in case of replacing its FPGA IC chip or chiplet 200. Next, its CS IC chip 411 may encrypt the second CPM data as second encrypted CPM data to be passed from the second set of large I/O circuits to the first set of large I/O circuits through, in sequence, one of the through silicon vias (TSVs) 157 of its CS IC chip 411, one or more of the interconnection metal layers 67 of its interposer 551 and one of the through silicon vias (TSVs) 157 of its NVM IC chip 250.

For the specific example of the twenty-fourth type of chip package 309 for the first alternative as seen in FIG. 30, its CS IC chip 411 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of its FPGA IC chip or chiplet 200, or (2) a data input of one of multiple center-processing-unit cores (CPUC) of its FPGA IC chip or chiplet 200, through, in sequence, the first set of small I/O circuits, one of the metal pads 6a of its CS IC chip 411, one of the metal pads 6a of its FPGA IC chip or chiplet 200 and the second set of small I/O circuits, or as (1) a data input of the input data set of one of any type of the first, second and third types of field programmable logic cells or elements (LCE) 2014 of said either of the first and second FPGA IC chips and chiplets 200a and 200b of its fifth type of field programmable chip-on-chip module 400 in case of replacing its standard commodity FPGA IC chip or chiplet 200, or (2) a data input of one of multiple center-processing-unit cores (CPUC) of said either of the first and second FPGA IC chips and chiplets 200a and 200b of its fifth type of field programmable chip-on-chip module 400 in case of replacing its standard commodity FPGA IC chip or chiplet 200, through, in sequence, the first set of small I/O circuits, one of the metal pads 6a of its CS IC chip 411, one of the metal pads 6a of the second FPGA IC chip or chiplet 200b of its fifth type of field programmable chip-on-chip module 400 and the third set of small I/O circuits. Further, said each of the first group of hard macros may have input data passed from (1) the data output of one of any type of the first, second and third types of field programmable logic cells or elements (LCEs) 2014 of its standard commodity FPGA IC chip or chiplet 200, or (2) one of multiple data outputs of one of the center-processing-unit cores (CPUC) of its standard commodity FPGA IC chip or chiplet 200, through, in sequence, the second set of small I/O circuits, one of the metal pads 6a of its FPGA IC chip or chiplet 200, one of the metal pads 6a of its CS IC chip 411 and the first set of small I/O circuits, or from (1) the data output of one of any type of the first, second and third types of field programmable logic cells or elements (LCEs) 2014 of said either of the first and second FPGA IC chips or chiplets 200a and 200b of its fifth type of field programmable chip-on-chip module 400 in case of replacing its standard commodity FPGA IC chip or chiplet 200, or (2) one of multiple data outputs of one of the center-processing-unit cores (CPUC) of said either of the first and second FPGA IC chips and chiplets 200a and 200b of its fifth type of field programmable chip-on-chip module 400 in case of replacing its standard commodity FPGA IC chip or chiplet 200 through, in sequence, the third set of small I/O circuits, one of the metal pads 6a of the second FPGA IC chip or chiplet 200b of its fifth type of field programmable chip-on-chip module 400 in case of replacing its standard commodity FPGA IC chip or chiplet 200, one of the metal pads 6a of its CS IC chip 411 and the first set of small I/O circuits. Further, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its fifth type of field programmable chip-on-chip module 400 in case of replacing its standard commodity FPGA IC chip or chiplet 200, may be used as a networking circuit or smart interface between two of the first group of hard macros of its CS IC chip 411 for controlling coupling therebetween. For example, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its fifth type of field programmable chip-on-chip module 400 in case of replacing its standard commodity FPGA IC chip or chiplet 200, may be used as a networking circuit or smart interface between two of multiple central-processing-unit (CPU) cores of its CS IC chip 411 for controlling coupling therebetween, wherein the number of the central-processing-unit (CPU) cores of its CS IC chip 411 may be equal to or greater than 4, 8, 16, 32, 64, 128, 256 or 512. Each of a second group of hard macros of its CS IC chip 411 may be a phase locked loop (PLL) circuit or digital clock manager (DCM) configured to generate a clock signal to be passed to (1) its standard commodity FPGA IC chip or chiplet 200 through, in sequence, the first set of small I/O circuits, one of the metal pads 6a of its CS IC chip 411, one of the metal pads 6a of its FPGA IC chip or chiplet 200 and the second set of small I/O circuits, or (2) either of the first and second FPGA IC chips or chiplets 200a and 200b of its fifth type of field programmable chip-on-chip module 400 in case of replacing its standard commodity FPGA IC chip or chiplet 200 through, in sequence, the first set of small I/O circuits, one of the metal pads 6a of its CS IC chip 411, one of the metal pads 6a of the second FPGA IC chip or chiplet 200b of its fifth type of field programmable chip-on-chip module 400 and the third set of small I/O circuits, and to (2) its non-volatile memory (NVM) IC chip 250 through, in sequence, the second set of large I/O circuits, one of the through silicon vias (TSVs) 157 of its CS IC chip 411, one or more of the interconnection metal layers 67 of its inter- poser 551 and one of the through silicon vias (TSVs) 157 of its NVM IC chip 250 and the first set of large I/O circuits.

For another specific example of the twenty-fourth type of chip package 309 for the first alternative as seen in FIG. 30, in case that a right one of its semiconductor IC chips 100 may be a high-band-width (HBM) IC chip 251. Its semi- conductor IC chip 326, or either of the first and second FPGA IC chips and chiplets 200a and 200b of its fifth type of field programmable chip-on-chip module 400 in case of replacing its semiconductor IC chip 326, may have a fourth set of small I/O circuits coupling respectively to a fifth set of small I/O circuits of its HBM IC chip 251 through a set of the metal pads 6a of its semiconductor IC chip 326, a set of its metal pads 597 and a set of the metal pads 6a of its HBM IC chip 251. It is noted that each of the fourth and fifth sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF. Further, the fourth set of small I/O circuits may couple to the fifth set of small I/O circuits for parallel data transmission between its HBM IC chip 251 and semi- conductor IC chip 326 with a data bit width of equal to or greater than 64, 128, 256, 512, 1024, 2048, 4096, 8K, or 16K.

Referring to FIG. 30, for the twenty-fourth type of chip packages 309 for the first alternative, its CS IC chip 411 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its semiconductor IC chip 326, or each of the first and second FPGA IC chips and chiplets 200a and 200b of its fifth type of field programmable chip-on-chip module 400 in case of replacing its semicon- ductor IC chip 326, and the others of its semiconductor IC chips 100.

2. Second Alternative

Referring to FIG. 30, the difference between the twenty- fourth type of chip packages 309 for the first and second alternatives is that the semiconductor IC chip 326 of the twenty-fourth type of chip package 309 for the second alternative may be provided for a CS IC chip 411, while the middle one of the semiconductor IC chips 100 of the twenty-fourth type of chip package 309 for the second alternative may be provided for an application-specific inte- grated-circuit (ASIC) chip or logic IC chip, such as standard commodity FPGA IC chip, graphic-processing unit (GPU) IC chip, data-processing-unit (DPU) IC chip, central-pro- cessing-unit (CPU) IC chip, tensor-flow-processing-unit (TPU) IC chip, micro-control-unit (MCU) IC chip, artificial- intelligent-unit (AIU) IC chip, machine-learning-unit (MLU) IC chip, application-specific-integrated-circuit (ASIC) chip, data-processing-unit (DPU) IC chip, applica- tion-processing-unit (APU) IC chip or digital-signal-pro- cessing (DSP) IC chip.

Referring to FIG. 30, for a specific example of the twenty-fourth type of chip package 309 for the second alternative, its semiconductor IC chip 326 may be a CS IC chip 411, a middle one of its semiconductor IC chips 100 may be a FPGA IC chip or chiplet 200. Alternatively, the middle one of its semiconductor IC chips 100 may be replaced with the sixth type of field programmable chip-on- chip module 400 as seen in FIG. 5F. The semiconductor substrate 2 of the first FPGA IC chip or chiplet 200a of its sixth type of field programmable chip-on-chip module 400 in case of replacing the middle one of its semiconductor IC chips 100 may have a portion at a backside thereof removed by a chemical-mechanical-polishing (CMP) or mechanical grinding process such that each of the through silicon vias (TSVs) 157 of the first FPGA IC chip or chiplet 200a of its sixth type of field programmable chip-on-chip module 400, that is, the electroplated copper layer 156 thereof, may have a backside substantially coplanar with the backside of the semiconductor substrate 2 of the first FPGA IC chip or chiplet 200a of its sixth type of field programmable chip- on-chip module 400 and a bottom surface of its polymer layer 92.

Referring to FIG. 30, for the specific example of the twenty-fourth type of chip package 309 for the second alternative, its FPGA IC chip or chiplet 200, or each of the first and second FPGA IC chips or chiplets 200a and 200b of its sixth type of field programmable chip-on-chip module 400 in case of replacing its FPGA IC chip or chiplet 200, may include any type of the first through third types of field programmable logic cell or element (LCE) 2014 as illus- trated in FIGS. 1A-1C and any type of the first and second types of field programmable switch cells 379 as illustrated in FIGS. 2A and 2B. Its NVM IC chip 250 may include a first set of large I/O circuits coupling to a second set of large I/O circuits of its CS IC chip 411 through, in sequence, one of the metal pads 6a of its NVM IC chip 250 and one of the metal pads 6a of its CS IC chip 411 for passing first encrypted configuration programming memory (CPM) data from the first set of large I/O circuits to the second set of large I/O circuits. Next, the first encrypted CPM data may be decrypted by a cryptography block of its CS IC chip 411 as first decrypted CPM data. Next, its CS IC chip 411 may have a first set of small I/O circuits coupling to a second set of small I/O circuits of its standard commodity FPGA IC chip or chiplet 200, or a third set of small I/O circuits of either of the first and second FPGA IC chips or chiplets 200a and 200b of its sixth type of field programmable chip-on-chip module 400 in case of replacing its standard commodity FPGA IC chip or chiplet 200, through, in sequence, one of the metal pads 6a of its CS IC chip 411 and one of the metal pads 6a of its standard commodity FPGA IC chip or chiplet 200, or one of the metal pads 6a of the second FPGA IC chip or chiplet 200b of its sixth type of field programmable chip-on-chip module 400 in case of replacing its standard commodity FPGA IC chip or chiplet 200, for passing the first decrypted CPM data in parallel with an increased data bit width equal to or more than 4, 8, 16, 32, 64, 128 or 256 for example, from the first set small I/O circuits to the second set of small I/O circuits, or third set of small I/O circuits. Next, the first decrypted CPM data may be passed to (1) the memory cells 490 of any type of the first through third types of field programmable logic cell or element (LCE) 2014 of its standard commodity FPGA IC chip or chiplet 200 to be stored therein, or the memory cells 490 of any type of the first through third types of field program- mable logic cell or element (LCE) 2014 of said either of the first and second FPGA IC chips or chiplets 200a and 200b of its sixth type of field programmable chip-on-chip module 400 in case of replacing its standard commodity FPGA IC chip or chiplet 200 to be stored therein, and (2) the memory cells 362 of any type of the first and second types of field programmable switch cells 379 of its standard commodity FPGA IC chip or chiplet 200 to be stored therein, or the memory cells 362 of any type of the first and second types of field programmable switch cells 379 of said either of the first and second FPGA IC chips or chiplets 200a and 200b of its fourth type of field programmable chip-on-chip module 400 in case of replacing its FPGA IC chip or chiplet 200 to be stored therein. A voltage (Vcc) of power supply supplied for each of the first and second sets of large I/O circuits may be higher than that supplied for each of the first, second and third sets of small I/O circuits, wherein the voltage (Vcc) of power supply supplied for each of the first set of small I/O circuits may be the same as that supplied for each of the second and third sets of small I/O circuits. Further, gate oxide of each of the first and second sets of large I/O circuits may have a thickness greater than that of each of the first, second and third sets of small I/O circuits. It is noted that each of the first and second sets of large I/O circuits may have an I/O power efficiency greater than 3, 5 or 10 pico-Joules per bit, per switch or per voltage swing, or have output capacitance, driving capability or loading or input capacitance between 2 pF and 100 pF, between 2 pF and 50 pF, between 2 pF and 30 pF, between 2 pF and 20 pF, between 2 pF and 15 pF, between 2 pF and 10 pF, between 2 pF and 5 pF or between 1 pF and 5 pF, or greater than 1 pF, 2 pF, 5 pF, 10 pF, 15 pF or 20 pF. Each of the first, second and third sets of small I/O circuits may have an I/O power efficiency smaller than 0.5 pico-Joules per bit, per switch or per voltage swing, or between 0.01 and 0.5 pico-Joules per bit, per switch or per voltage swing, have output capacitance or driving capability or loading between 0.05 pF and 2 pF, between 0.1 pF and 2 pF, between 0.05 pF and 1 pF or between 0.1 pF and 1 pF, or smaller than 2 pF or 1 pF, and have input capacitance between 0.05 pF and 2 pF or between 0.05 pF and 1 pF.

Further, referring to FIG. 30, for the specific example of the twenty-fourth type of chip package 309 for the second alternative, second CPM data may be passed from the second set of small I/O circuits, or third set of small I/O circuits, to the first set of small I/O circuits, through, in sequence, one of the metal pads 6a of its standard commodity FPGA IC chip or chiplet 200, or one of the metal pads 6a of the second FPGA IC chip or chiplet 200b of its sixth type of field programmable chip-on-chip module 400 in case of replacing its standard commodity FPGA IC chip or chiplet 200, and one of the metal pads 6a of its CS IC chip 411, wherein the second CPM data is associated with the resulting value or programming codes stored in (1) the memory cells 490 of any type of the first through third types of field programmable logic cell or element (LCE) 2014 of its standard commodity FPGA IC chip or chiplet 200, or the memory cells 490 of any type of the first through third types of field programmable logic cell or element (LCE) 2014 of each of the first and second FPGA IC chips or chiplets 200a and 200b of its sixth type of field programmable chip-on-chip module 400 in case of replacing its standard commodity FPGA IC chip or chiplet 200, and (2) the memory cells 362 of any type of the first and second types of field programmable switch cells 379 of its standard commodity FPGA IC chip or chiplet 200, or the memory cells 362 of any type of the first and second types of field programmable switch cells 379 of each of the first and second FPGA IC chips or chiplets 200a and 200b of its sixth type of field programmable chip-on-chip module 400 in case of replacing its FPGA IC chip or chiplet 200. Next, its CS IC chip 411 may encrypt the second CPM data as second encrypted CPM data to be passed from the second set of large I/O circuits to the first set of large I/O circuits through, in sequence, one of the metal pads 6a of its CS IC chip 411 and one of the metal pads 6a of its NVM IC chip 250.

For the specific example of the twenty-fourth type of chip package 309 for the second alternative as seen in FIG. 30, its CS IC chip 411 may include multiple hard macros that may be divided into two groups: each of a first group of hard macros of its CS IC chip 411 may be a digital-signal-processing (DSP) slice for multiplication or division, block static-random-access memory (SRAM) cells for logic operation, central-processing-unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data to be passed as (1) a data input of the input data set of one of any type of the first, second and third types of field programmable logic cells or elements (LCE) 2014 of its FPGA IC chip or chiplet 200, or (2) a data input of one of multiple center-processing-unit cores (CPUC) of its FPGA IC chip or chiplet 200, through, in sequence, the first set of small I/O circuits, one of the metal pads 6a of its CS IC chip 411, one of the metal pads 6a of its standard commodity FPGA IC chip or chiplet 200 and the second set of small I/O circuits, or as (1) a data input of the input data set of one of any type of the first, second and third types of field programmable logic cells or elements (LCE) 2014 of said either of the first and second FPGA IC chips and chiplets 200a and 200b of its sixth type of field programmable chip-on-chip module 400 in case of replacing its standard commodity FPGA IC chip or chiplet 200, or (2) a data input of one of multiple center-processing-unit cores (CPUC) of said either of the first and second FPGA IC chips and chiplets 200a and 200b of its sixth type of field programmable chip-on-chip module 400 in case of replacing its standard commodity FPGA IC chip or chiplet 200, through, in sequence, the first set of small I/O circuits, one of the metal pads 6a of its CS IC chip 411, one of the metal pads 6a of the second FPGA IC chip or chiplet 200b of its sixth type of field programmable chip-on-chip module 400 and the third set of small I/O circuits. Further, said each of the first group of hard macros may have input data passed from (1) the data output of one of any type of the first, second and third types of field programmable logic cells or elements (LCEs) 2014 of its standard commodity FPGA IC chip or chiplet 200, or (2) one of multiple data outputs of one of the center-processing-unit cores (CPUC) of its standard commodity FPGA IC chip or chiplet 200, through, in sequence, the second set of small I/O circuits, one of the metal pads 6a of its standard commodity FPGA IC chip or chiplet 200, one of the metal pads 6a of its CS IC chip 411 and the first set of small I/O circuits, or from (1) the data output of one of any type of the first, second and third types of field programmable logic cells or elements (LCEs) 2014 of said either of the first and second FPGA IC chips or chiplets 200a and 200b of its sixth type of field programmable chip-on-chip module 400 in case of replacing its standard commodity FPGA IC chip or chiplet 200, or (2) one of multiple data outputs of one of the center-processing-unit cores (CPUC) of said either of the first and second FPGA IC chips and chiplets 200a and 200b of its sixth type of field programmable chip-on-chip module 400 in case of replacing its standard commodity FPGA IC chip or chiplet 200 through, in sequence, the third set of small I/O circuits, one of the metal pads 6a of the second FPGA IC chip or chiplet 200b of its sixth type of field programmable chip-on-chip module 400 in case of replacing its standard commodity FPGA IC chip or chiplet 200, one of the metal pads 6a of its CS IC chip 411 and the first set of small I/O circuits. Further, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its sixth type of field programmable chip-on-chip module 400 in case of replacing its standard commodity FPGA IC chip or chiplet 200, may be used as a networking circuit or smart interface between two of the first group of hard macros of its CS IC chip 411 for controlling coupling therebetween. For example, one or more of any type of the first and second types of field programmable switch cells 379 of its FPGA IC chip or chiplet 200, or one or more of any type of the first and second types of field programmable switch cells 379 of each of the first and second FPGA IC chips or chiplets 200a and 200b of its sixth type of field programmable chip-on-chip module 400 in case of replacing its standard commodity FPGA IC chip or chiplet 200, may be used as a networking circuit or smart interface between two of multiple central-processing-unit (CPU) cores of its CS IC chip 411 for controlling coupling therebetween, wherein the number of the central-processing-unit (CPU) cores of its CS IC chip 411 may be equal to or greater than 4, 8, 16, 32, 64, 128, 256 or 512. Each of a second group of hard macros of its CS IC chip 411 may be a phase locked loop (PLL) circuit or digital clock manager (DCM) configured to generate a clock signal to be passed to (1) its standard commodity FPGA IC chip or chiplet 200 through, in sequence, the first set of small I/O circuits, one of the metal pads 6a of its CS IC chip 411, one of the metal pads 6a of its standard commodity field-programmable-gate-array (FPGA) IC chip or chiplet 200 and the second set of small I/O circuits, or (2) either of the first and second FPGA IC chips or chiplets 200a and 200b of its sixth type of field programmable chip-on-chip module 400 in case of replacing its standard commodity FPGA IC chip or chiplet 200 through, in sequence, the first set of small I/O circuits, one of the metal pads 6a of its CS IC chip 411, one of the metal pads 6a of the second FPGA IC chip or chiplet 200b of its sixth type of field programmable chip-on-chip module 400 and the third set of small I/O circuits, and to (2) its non-volatile memory (NVM) IC chip 250 through, in sequence, the second set of large I/O circuits, one of the metal pads 6a of its CS IC chip 411, one of the metal pads 6a of its non-volatile memory (NVM) IC chip 250 and the first set of large I/O circuits.

Figure 31A:
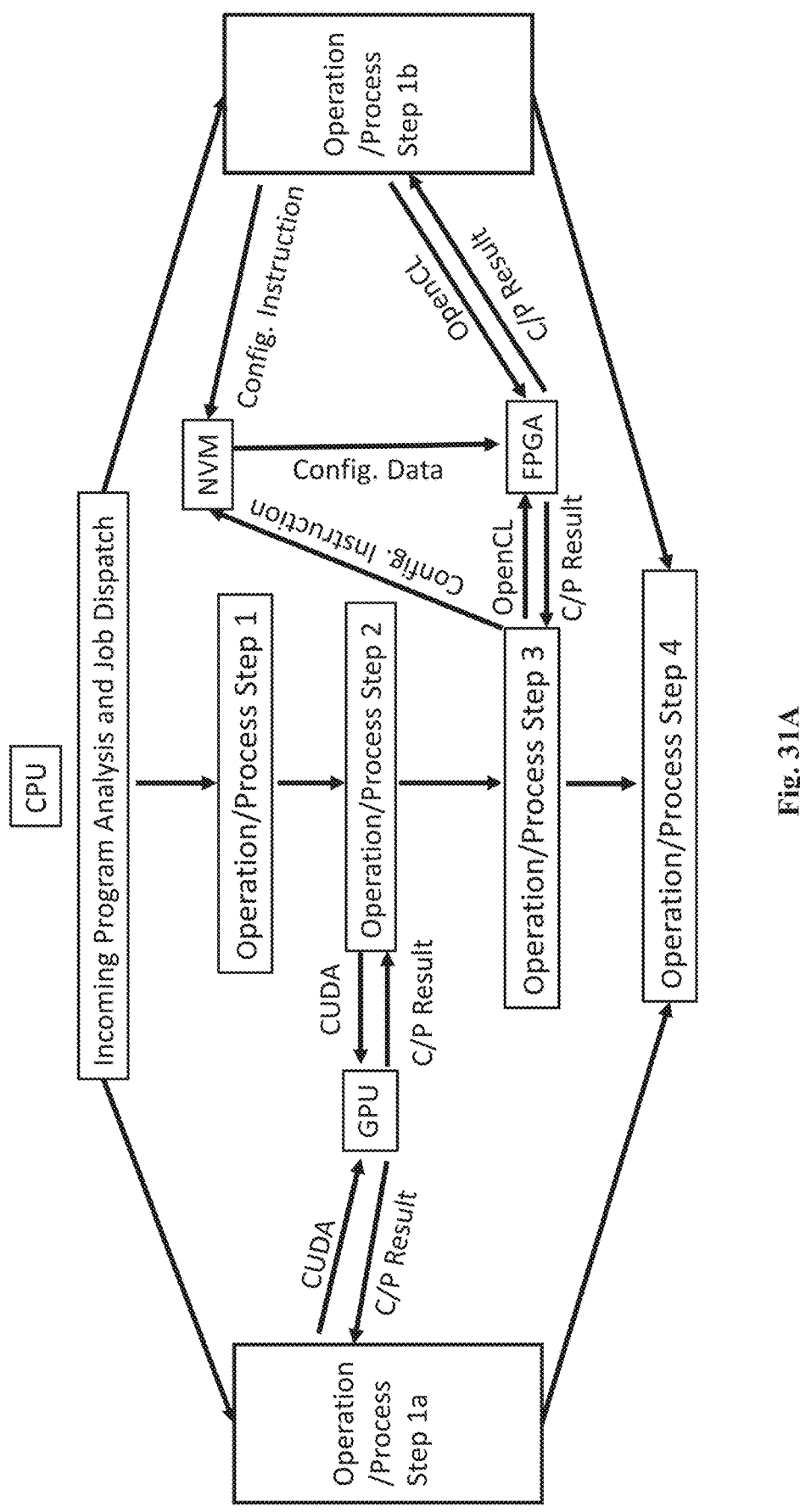
FIG. 31A is a block diagram for illustrating a first method for optimizing performance of a multichip package in accordance with an embodiment of the present application.

Referring to FIG. 30, for the twenty-fourth type of chip packages 309 for the second alternative, its CS IC chip 411 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to each of its semiconductor IC chips 100, or each of the first and second FPGA IC chips and chiplets 200a and 200b of is sixth type of field programmable chip-on-chip module 400 in case of replacing its semiconductor IC chips 100. Each of the through silicon vias (TSVs) 157 of each of its vertical-through-via (VTV) connectors 467 may couple to a voltage of power supply for delivering a power supply or a voltage of ground reference for delivering a ground reference or may pass signals or clocks for signal or clock transmission. Algorithm or Method for Optimizing Performance of Multichip Package FIG. 31A is a block diagram for illustrating a first method for optimizing performance of a multichip package in accordance with an embodiment of the present application. Referring to FIG. 31A, the performance optimization may be exercised on the CPU IC chip(s), GPU IC chip(s), i.e., DPU IC chip(s), and field programmable integrated-circuit (FPIC) chips in any type of the first, second, third, fourth, fifteenth, sixteenth, seventeenth and eighteenth types of chip packages 310, 111, 212, 113, 114, 301, 302 and 303 as illustrated in FIGS. 6, 7, 8, 9A, 9B, 21, 22A, 22B, 23 and 24. Each type of the first, second, third, fourth, fifteenth, sixteenth, seventeenth and eighteenth types of chip packages 310, 111, 212, 113, 114, 301, 302 and 303 may be operated based on a CPU common programming language, such as python, JavaScript, Java, C#, C, or C++, Scala, Swift, Matlab, Assembly Language, Pascal, Visual Basic, or PL/SQL language, for the operations/processes of its CPU IC chip(s). For each type of the first, second, third, fourth, fifteenth, sixteenth, seventeenth and eighteenth types of chip packages 310, 111, 212, 113, 114, 301, 302 and 303, its CPU IC chip is configured to (1) analyze and assess an incoming software program for a requested job, written by one of the CPU common programming languages, to perform multiple operation/process steps, and (2) decide which of its CPU IC chip, its GPU IC chips and its field programmable integrated-circuit (FPIC) chips 200, or the first and second field programmable IC chips or chiplets 200a and 200b of each of its field programmable chip-on-chip modules 400 in case of replacing its standard commodity field programmable integrated-circuit (FPIC) chips or chiplets 200, is used for performance optimization to perform which of the operation/process steps. For example, in the performance optimization for each type of the first, second, third, fourth, fifteenth, sixteenth, seventeenth and eighteenth types of chip packages 310, 111, 212, 113, 114, 301, 302 and 303, the incoming software program for a requested job may be first analyzed by its CPU IC chip to determine six operation/process steps, comprising (1) a first stream for multiple operation/process steps 1-4 to be processed or performed in series, (2) a second stream for an operation/process step 1a to be processed or performed in parallel with the first stream, and (3) a third stream for an operation/process step 1b to be processed or performed in parallel with the first and second streams. Its CPU IC chip may assign or dispatch the operation/process steps 1a and 2 to any of its GPU IC chips and the operation/process steps 1b and 3 to any of its field programmable integrated-circuit (FPIC) chips 200 or either of the first and second field programmable IC chips or chiplets 200a and 200b of any of its field programmable chip-on-chip modules 400 in case of replacing its standard commodity field programmable integrated-circuit (FPIC) chips or chiplets 200. Its CPU IC chip may compile or translate a first programming language, i.e., one of the CPU common languages, for the operation/process step 1a in the second stream and the operation/process step 2 in the first stream into a second programming language, such as language of compute unified device architecture (CUDA), for said any of its GPU IC chips, and the first programming language for the operation/process step 1b in the third stream and the operation/process step 3 in the first stream into a third programming language, such as language of open computing language (OpenCL), for said any of its field programmable integrated-circuit (FPIC) chips 200 or said either of the first and second field programmable IC chips or chiplets 200a and 200b of said any of its field programmable chip-on-chip modules 400 in case of replacing its standard commodity field programmable integrated-circuit (FPIC)

chips or chiplets 200. The programming language of CUDA is developed for a GPU IC chip for general-purpose computing, called as general-purpose computing on graphic processing units (GPGPU), comprising reduced-instruction-set-computer (RISC) instructions in an instruction set for highly-parallel operation/process with a bit width equal to or greater than 256, 512, 1024, 2048, 5120, 10240 bits for example.

Referring to FIG. 31A, for the second stream, said any of its GPU IC chips may perform the operation/process step 1a based on the second programming language for the operation/process step 1a, in parallel with the first and third streams, to generate or return a computing/process (C/P) result out of the operation/process step 1a to its CPU IC chip as a first input data set for the operation/process step 4. For the first stream, after its CPU IC chip performs the operation/process step 1 based on the first programming language for the operation/process step 1 to generate a computing/process (C/P) result as an output data set for the operation/process step 1, said any of its GPU IC chips may perform the operation/process step 2 on the output data set for the operation/process step 1 based on the second programming language for the operation/process step 2, in parallel with the second and third streams, to generate or return a computing/process (C/P) result out of the operation/process step 2 to its CPU IC chip as an input data set for the operation/process step 3. In an example, said any of its GPU IC chips may perform the operation/process step 2 before said any of its GPU IC chips performs the operation/process step 1a. Alternatively, said any of its GPU IC chips may perform the operation/process step 2 after said any of its GPU IC chips performs the operation/process step 1a. Alternatively, said any of its GPU IC chips may perform the operation/process steps 1a and 2 at the same time.

Referring to FIG. 31A, for the third stream, its CPU IC chip may pass a set of configuration instruction to any of its NVM IC chips 250 to select, in accordance with the first programming language for the operation/process step 1b, a first specific configuration set from multiple configuration sets, including encrypted and currently self-configured CPM data, encrypted and immediately-previously self-configured CPM data and encrypted original CPM data, stored in said any of its NVM IC chips 250 to be decrypted as decrypted CPM data to be stored in any of its field programmable integrated-circuit (FPIC) chips 200, or either of the first and second field programmable IC chips or chiplets 200*a* and 200*b* of any of its field programmable chip-on-chip modules 400 in case of replacing its standard commodity field programmable integrated-circuit (FPIC) chips or chiplets 200, for configuring said any of its field programmable integrated-circuit (FPIC) chips 200, or said either of the first and second field programmable IC chips or chiplets 200*a* and 200*b*, and said any of its field programmable integrated-circuit (FPIC) chips 200 or said either of the first and second field programmable IC chips or chiplets 200*a* and 200*b* may perform or execute the operation/process step 1b based on the third programming language for the operation/process step 1b, in parallel with the first and second streams, to generate or return a computing/process (C/P) result out of the operation/process step 1b to its CPU IC chip as a second input data set for the operation/process step 4.

For the first stream, after said any of its field programmable integrated-circuit (FPIC) chips 200 or said either of the first and second field programmable IC chips or chiplets 200*a* and 200*b* performs the operation/process step 1b, said any of its field programmable integrated-circuit (FPIC) chips 200 or said either of the first and second field programmable IC chips or chiplets 200*a* and 200*b* may pass a set of configuration instruction to said any of its NVM IC chips 250 to select, in accordance with the first programming language for the operation/process step 3, a second specific configuration set from the multiple configuration sets stored in said any of its NVM IC chips 250 to be decrypted as decrypted CPM data to be stored in said any of its field programmable integrated-circuit (FPIC) chips 200 or said either of the first and second field programmable IC chips or chiplets 200*a* and 200*b* for configuring said any of its field programmable integrated-circuit (FPIC) chips 200 or said either of the first and second field programmable IC chips or chiplets 200*a* and 200*b*, and after its CPU IC chip receives the input data set for the operation/process step 3 from said any of its GPU IC chips, said any of its field programmable integrated-circuit (FPIC) chips 200 or said either of the first and second field programmable IC chips or chiplets 200*a* and 200*b* may perform the operation/process step 3 on the input data set for the operation/process step 3 based on the third programming language for the operation/process step 3, in parallel with the second and third streams, to generate or return a computing/process (C/P) result out of the operation/process step 3 to its CPU IC chips as a third input data set for the operation/process step 4. For more elaboration, each of the multiple configuration sets was developed, compiled, verified and debugged for a specific purpose or application before stored in said any of its NVM IC chips 250. The number of the multiple configuration sets may be equal to or greater than 2, 3, 4, 5, 10, 20, 50 or 100. Said any of its field programmable integrated-circuit (FPIC) chips 200 or said either of the first and second field programmable IC chips or chiplets 200*a* and 200*b* may be configured as a computing/processing accelerator to speed up the operation/process steps 1b and 3.

Next, referring to FIG. 31A, after its CPU IC chip receive the first input data set for the operation/process step 4 from said any of its GPU IC chips and the second and third input data sets for the operation/process step 4 from said any of its field programmable integrated-circuit (FPIC) chips 200 or said either of the first and second field programmable IC chips or chiplets 200*a* and 200*b*, its CPU IC chip may perform the operation/process step 4 on the first, second and third input data sets for the operation/process step 4 based on the first programming language for the operation/process step 4.

Figure 31B:
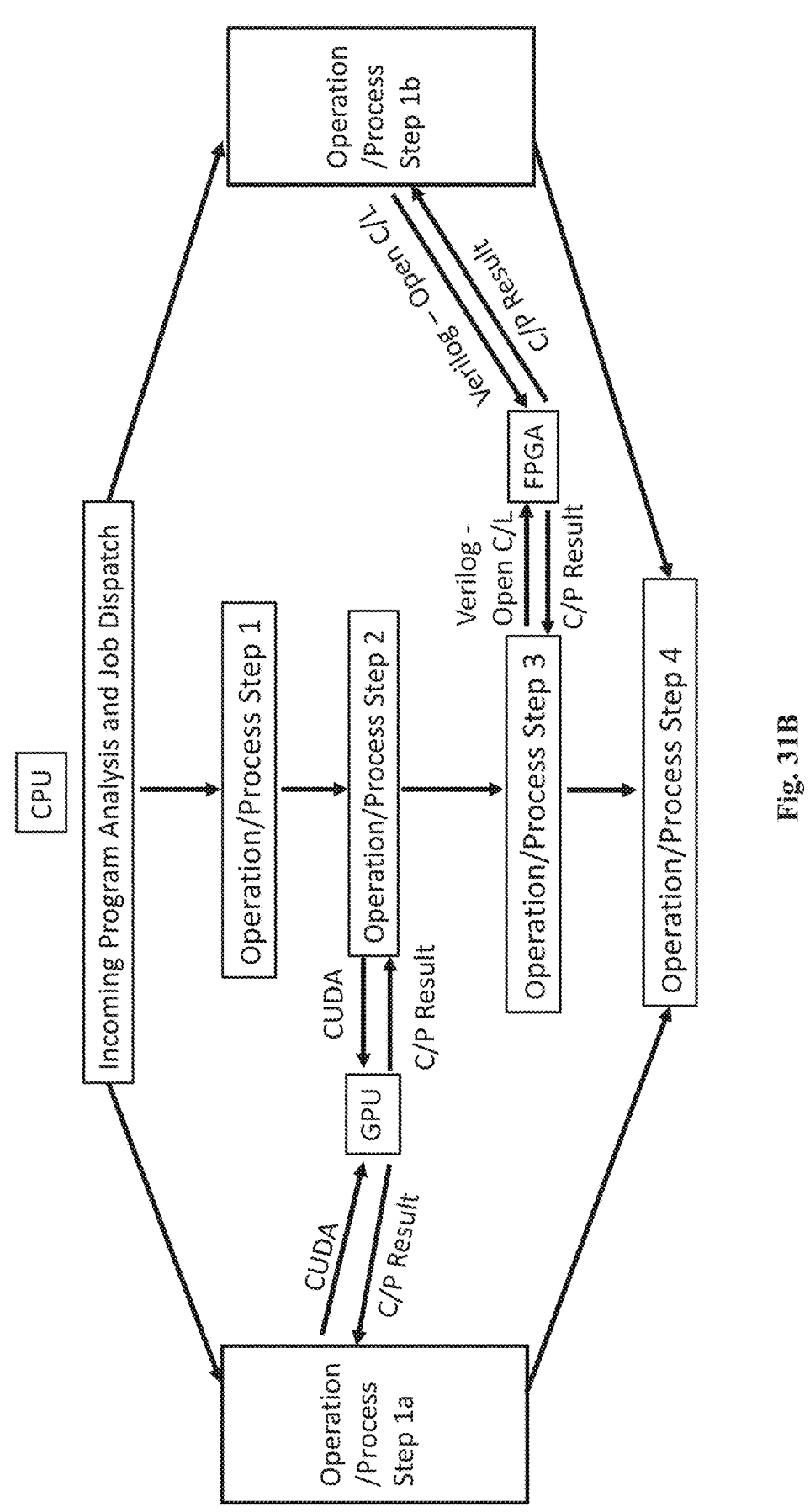
FIG. 31B is a block diagram for illustrating a second method for optimizing performance of a multichip package in accordance with an embodiment of the present application.

Alternatively, FIG. 31B is a block diagram for illustrating a second method for optimizing performance of a multichip package in accordance with an embodiment of the present application. The second method for optimizing performance of a multichip package as seen in FIG. 31B is similar to the first method therefor as illustrated in FIG. 31A and can be referred to the first method therefor. The difference therebetween is that in the second method therefor as seen in FIG. 31B for the third stream said any of its field programmable integrated-circuit (FPIC) chips 200 or said either of the first and second field programmable IC chips or chiplets 200*a* and 200*b* may be configured based on the operation/process step 1b using a hardware description language or instruction language, such as Verilog. Next, the first programming language for the operation/process step 1b in the third stream may be translated or compiled into the third programming language, such as language of open computing language (OpenCL), for said any of its field programmable integrated-circuit (FPIC) chips 200 or said either of the first and second field programmable IC chips or chiplets 200*a* and 200*b*. The language of OpenCL is a software written in a standard open computing language (OpenCL, Open Computing Language) for parallel programming of heterogeneous systems. Next, said any of its field programmable integrated-circuit (FPIC) chips 200 or said either of the first and second field programmable IC chips or chiplets 200*a* and 200*b* may perform or execute the operation/process step 1b based on the third language for the operation/process step 1b, in parallel with the first and second streams, to generate or return a computing/process (C/P) result out of the operation/process step 1b to its CPU IC chip as a second input data set for the operation/process step 4. For the first stream, after said any of its field programmable integrated-circuit (FPIC) chips 200 or said either of the first and second field programmable IC chips or chiplets 200*a* and 200*b* performs the operation/process step 1b, said any of its field programmable integrated-circuit (FPIC) chips 200 or said either of the first and second field programmable IC chips or chiplets 200*a* and 200*b* may be configured based on the operation/process step 3 using the hardware description language or instruction language, such as Verilog. Next, after its CPU IC chip receives the input data set for the operation/process step 3 from said any of its GPU IC chips, said any of its field programmable integrated-circuit (FPIC) chips 200 or said either of the first and second field programmable IC chips or chiplets 200*a* and 200*b* may perform the operation/process step 3 on the input data set for the operation/process step 3 based on the third programming language for the operation/process step 3, in parallel with the second and third streams, to generate or return a computing/process (C/P) result out of the operation/process step 3 to its CPU IC chip as a third input data set for the operation/process step 4.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A semiconductor integrated-circuit (IC) chip comprising:

a silicon layer;

a first transistor having a portion in the silicon layer;

a first interconnection scheme over a top surface of the silicon layer and over the first transistor, wherein the first interconnection scheme comprises:

a first insulating dielectric layer, a first interconnection metal layer extending on a top surface of the first insulating dielectric layer and further extending downwards into an opening in the first insulating dielectric layer, wherein the first interconnection metal layer comprises a first copper layer having a sidewall over the top surface of the first insulating dielectric layer and a first adhesion metal layer at a bottom of the first copper layer and at the sidewall of the first copper layer, a second interconnection metal layer over the first interconnection metal layer, and a second insulating dielectric layer between the first and second interconnection metal layers;

a second interconnection scheme for power and ground distribution, wherein the second interconnection scheme is under a bottom surface of the silicon layer and comprises:

a third insulating dielectric layer, a third interconnection metal layer extending on a bottom surface of the third insulating dielectric layer and further extending upwards into an opening in the third insulating dielectric layer, wherein the third interconnection metal layer comprises a second copper layer having a sidewall under the bottom surface of the third insulating dielectric layer and a second adhesion metal layer at a top of the second copper layer and at the sidewall of the second copper layer, a fourth insulating dielectric layer under the third interconnection metal layer, and a fourth interconnection metal layer extending on a bottom surface of the fourth insulating dielectric layer and further extending upwards into an opening in the fourth insulating dielectric layer, wherein the fourth interconnection metal layer comprises a conductive metal layer having a sidewall under the bottom surface of the fourth insulating dielectric layer and a third adhesion metal layer at a top of the conductive metal layer and not at the sidewall of the conductive metal layer;

a first metal via between the first and second interconnection schemes and in contact with the second interconnection scheme, wherein the second interconnection scheme couples to the first transistor through the first metal via; and a first metal contact at a bottom of the semiconductor integrated-circuit (IC) chip and under and in contact with the second interconnection scheme, wherein the first metal contact couples to the first transistor through, in sequence, the second interconnection scheme and first metal via.

2. The semiconductor integrated-circuit (IC) chip of claim 1, wherein the second interconnection scheme comprises a power distribution network coupling the first metal contact to the first metal via.

3. The semiconductor integrated-circuit (IC) chip of claim 1, wherein the second interconnection scheme comprises a ground distribution network coupling the first metal contact to the first metal via.

4. The semiconductor integrated-circuit (IC) chip of claim 1, wherein the first metal via comprises a copper via having a width in a horizontal direction between 0.05 and 0.5 micrometers and a thickness in a vertical direction between 0.3 and 10 micrometers.

5. The semiconductor integrated-circuit (IC) chip of claim 1, wherein the second copper layer has a thickness in a vertical direction between 0.05 and 1 micrometers.

6. The semiconductor integrated-circuit (IC) chip of claim 1, wherein the first metal contact comprises a metal bump containing tin.

7. The semiconductor integrated-circuit (IC) chip of claim 1 is a central-processing-unit (CPU) integrated-circuit (IC) chip.

8. The semiconductor integrated-circuit (IC) chip of claim 1, wherein the first metal via has a maximum transverse dimension smaller than 0.1 micrometers.

9. The semiconductor integrated-circuit (IC) chip of claim 1 is a graphic-processing-unit (GPU) integrated-circuit (IC) chip.

10. The semiconductor integrated-circuit (IC) chip of claim 1, wherein the first metal via couples to the first transistor through the first interconnection scheme.

11. The semiconductor integrated-circuit (IC) chip of claim 1, wherein the first metal via is at a same horizontal level as the first transistor.

12. The semiconductor integrated-circuit (IC) chip of claim 3 further comprising:

a second transistor having a portion in the silicon layer;

a second metal contact at the bottom of the semiconductor integrated-circuit (IC) chip and under and in contact with the second interconnection scheme; and a second metal via between the first and second interconnection schemes, in contact with the second interconnection scheme and coupling the second interconnection scheme to the second transistor, wherein the second interconnection scheme further comprises a power distribution network coupling the second metal contact to the second metal via.

13. The semiconductor integrated-circuit (IC) chip of claim 1 further comprising a second transistor having a portion in the silicon layer; and a second metal via between the first and second interconnection schemes and in contact with the second interconnection scheme, wherein the first metal contact couples to the second transistor through, in sequence, the second interconnection scheme and second metal via.

14. The semiconductor integrated-circuit (IC) chip of claim 1 further comprising a second metal via between the first and second interconnection schemes and in contact with the second interconnection scheme, wherein the first interconnection scheme comprises a first metal interconnect coupling the first metal via to the second metal via, and wherein the second interconnection scheme comprises a second metal interconnect coupling the first metal via to the second metal via.

15. The semiconductor integrated-circuit (IC) chip of claim 1 further comprising a second transistor having a portion in the silicon layer, wherein the first interconnection scheme comprises a signal interconnect coupling to the second transistor.

16. The semiconductor integrated-circuit (IC) chip of claim 1, wherein the conductive metal layer comprises a third copper layer.

17. The semiconductor integrated-circuit (IC) chip of claim 1, wherein the third adhesion metal layer comprises titanium.

18. The semiconductor integrated-circuit (IC) chip of claim 1, wherein each of the first, second and third interconnection metal layers comprises a metal trace having a thickness between 0.05 and 2 micrometers.

19. The semiconductor integrated-circuit (IC) chip of claim 1, wherein the fourth interconnection metal layer comprises a metal trace having a thickness between 0.5 and 10 micrometers.

20. The semiconductor integrated-circuit (IC) chip of claim 1, wherein the fourth interconnection metal layer has a thickness greater than that of each of the first and second interconnection metal layers.

21. The semiconductor integrated-circuit (IC) chip of claim 1, wherein each of the first, second and third insulating dielectric layers comprises silicon oxide.

22. The semiconductor integrated-circuit (IC) chip of claim 1, wherein the fourth insulating dielectric layer comprises silicon oxynitride.

23. The semiconductor integrated-circuit (IC) chip of claim 1, wherein the first interconnection scheme comprises a first insulating bonding layer over the second interconnection metal layer and at a top of the first interconnection scheme, wherein the first insulating bonding layer is configured to be bonded to an external element, wherein the external element comprises a silicon substrate and a second insulating bonding layer under the silicon substrate, at a bottom of the external element and bonded to and in contact with the first insulating bonding layer, wherein each of the first and second insulating bonding layers comprises silicon.

24. The semiconductor integrated-circuit (IC) chip of claim 23, wherein the first insulating bonding layer comprises silicon oxide.

25. The semiconductor integrated-circuit (IC) chip of claim 23, wherein the first insulating bonding layer comprises silicon oxynitride.

26. The semiconductor integrated-circuit (IC) chip of claim 1, wherein the second interconnection scheme comprises a fifth insulating dielectric layer under the fourth interconnection metal layer and at a bottom of the semiconductor integrated-circuit (IC) chip, wherein the first metal contact extends on a bottom surface of the fifth insulating dielectric layer and further extends upwards into an opening in the fifth insulating dielectric layer and in contact with a bottom surface of the fourth interconnection metal layer.

27. The semiconductor integrated-circuit (IC) chip of claim 26, wherein the first metal contact comprises a third copper layer extending under the bottom surface of the fifth insulating dielectric layer and further extending upwards into the opening in the fifth insulating dielectric layer.

28. The semiconductor integrated-circuit (IC) chip of claim 27, wherein the first metal contact further comprises a tin-containing cap under the third copper layer.

29. The semiconductor integrated-circuit (IC) chip of claim 26, wherein the fifth insulating dielectric layer comprises a polymer layer.

30. The semiconductor integrated-circuit (IC) chip of claim 1 further comprising an oxide layer therein, wherein the first metal via extends through the oxide layer.

31. The semiconductor integrated-circuit (IC) chip of claim 1, wherein the first transistor is a gate-all-around field effective transistor (GAAFET).

32. The semiconductor integrated-circuit (IC) chip of claim 1, wherein the first transistor is a fin field effective transistor (FINFET).

\* \* \* \* \*